(12) United States Patent
Mizuuchi et al.

(10) Patent No.: US 6,711,183 B1
(45) Date of Patent: Mar. 23, 2004

(54) OPTICAL WAVELENGTH CONVERSION DEVICE, COHERENT LIGHT GENERATOR, AND OPTICAL INFORMATION PROCESSING APPARATUS

(75) Inventors: Kiminori Mizuuchi, Neyagawa (JP); Kazuhisa Yamamoto, Takatsuki (JP); Yasuo Kitaoka, Ibaraki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/313,391

(22) Filed: May 18, 1999

(30) Foreign Application Priority Data

| May 18, 1998 | (JP) | ............................................. 10-134857 |
| Oct. 2, 1998 | (JP) | ............................................. 10-281755 |
| May 14, 1999 | (JP) | ............................................. 11-134986 |
| May 14, 1999 | (JP) | ............................................. 11-134987 |

(51) Int. Cl.[7] ................................................. H01S 3/10
(52) U.S. Cl. ........................... 372/22; 372/20; 372/23; 372/50; 372/92; 372/25; 372/26; 372/108
(58) Field of Search ..................... 372/20, 22, 21, 372/23, 50, 92, 25, 26, 108

(56) References Cited

U.S. PATENT DOCUMENTS

| 5,036,220 | A |   | 7/1991  | Byer et al. .................... 372/22 |
| 5,121,250 | A | * | 6/1992  | Shinozaki et al. ............. 372/22 |
| 5,185,752 | A |   | 2/1993  | Welch et al. .................. 372/22 |
| 5,247,389 | A |   | 9/1993  | Beausoleil .................... 372/22 |
| 5,247,528 | A |   | 9/1993  | Shinzoaki et al. ............. 372/22 |
| 5,253,259 | A | * | 10/1993 | Yamamoto et al. ........... 372/22 |
| 5,303,247 | A |   | 4/1994  | Yamamoto .................... 372/22 |
| 5,339,190 | A | * | 8/1994  | Yamamoto et al. |
| 5,357,533 | A |   | 10/1994 | Mizuuchi et al. ............. 372/22 |
| 5,365,539 | A |   | 11/1994 | Mooradian .................... 372/21 |
| 5,436,757 | A | * | 7/1995  | Okazaki et al. ............. 385/122 |
| 5,452,312 | A |   | 9/1995  | Yamsmoto et al. ........... 372/22 |
| 5,504,616 | A | * | 4/1996  | Shinozaki et al. .......... 385/122 |
| 5,506,722 | A | * | 4/1996  | Mizuuchi et al. ........... 385/122 |
| 5,515,471 | A | * | 5/1996  | Yamamoto et al. ........... 372/22 |
| 5,615,042 | A |   | 3/1997  | Delacourt et al. ............. 372/22 |
| 5,617,435 | A | * | 4/1997  | Nagai et al. .................. 372/22 |
| 5,619,369 | A | * | 4/1997  | Yamamoto et al. ........... 372/22 |
| 5,644,584 | A |   | 7/1997  | Nam et al. ..................... 372/22 |
| 5,703,710 | A | * | 12/1997 | Brinkman et al. .......... 359/283 |
| 5,732,177 | A | * | 3/1998  | Deacon et al. .............. 385/122 |
| 5,835,650 | A |   | 11/1998 | Kitaoka et al. ............... 386/49 |
| 5,838,709 | A |   | 11/1998 | Owa ............................. 372/22 |
| 5,852,688 | A | * | 12/1998 | Brinkman et al. ............. 372/6 |
| 5,854,870 | A |   | 12/1998 | Helmfrid et al. ........... 3723/22 |
| 5,912,910 | A |   | 6/1999  | Sanders et al. ............... 372/22 |
| 5,936,985 | A | * | 8/1999  | Yamamoto et al. ........... 372/22 |
| 6,021,141 | A | * | 2/2000  | Nam et al. ..................... 372/22 |

FOREIGN PATENT DOCUMENTS

| JP | 4-70726  | 3/1992 |
| JP | 4-254835 | 9/1992 |

OTHER PUBLICATIONS

T. Suhara et al., "Theoretical Analysis of Waveguide Second–Harmonic Generation Phase Matched with Uniform and Chirped Gratings", IEEE, pp. 1265–1276, vol. 26, No. 7, 7/1990.

K. Yamamoto et al., "Milliwatt–order blue–light generation in a periodically domain–inverted $LiTaO_3$ waveguide", Optics Letters, pp. 1156–1158, vol. 16, No. 15, 8/91.

* cited by examiner

*Primary Examiner*—Leon Scott, Jr.
(74) *Attorney, Agent, or Firm*—RatnerPrestia

(57) ABSTRACT

An optical wavelength conversion device includes: two or more non-linear optical crystals each having approximately identical phase matching conditions for a fundamental wave light and a second harmonic wave light; and a phase adjusting section inserted between the adjacent non-linear optical crystals, wherein the phase adjusting section a dispersion characteristic which is different from that of the non-linear optical crystals, and the phase adjusting section is formed so as to allow at least one of a refractive index or a length thereof to be modulated.

47 Claims, 68 Drawing Sheets

$$t = (2n + \alpha) \cdot \chi / (\beta 2\omega - 2 \cdot \beta \omega)$$

Phase adjusting section

FIG.59  Allowance curve (az^n)
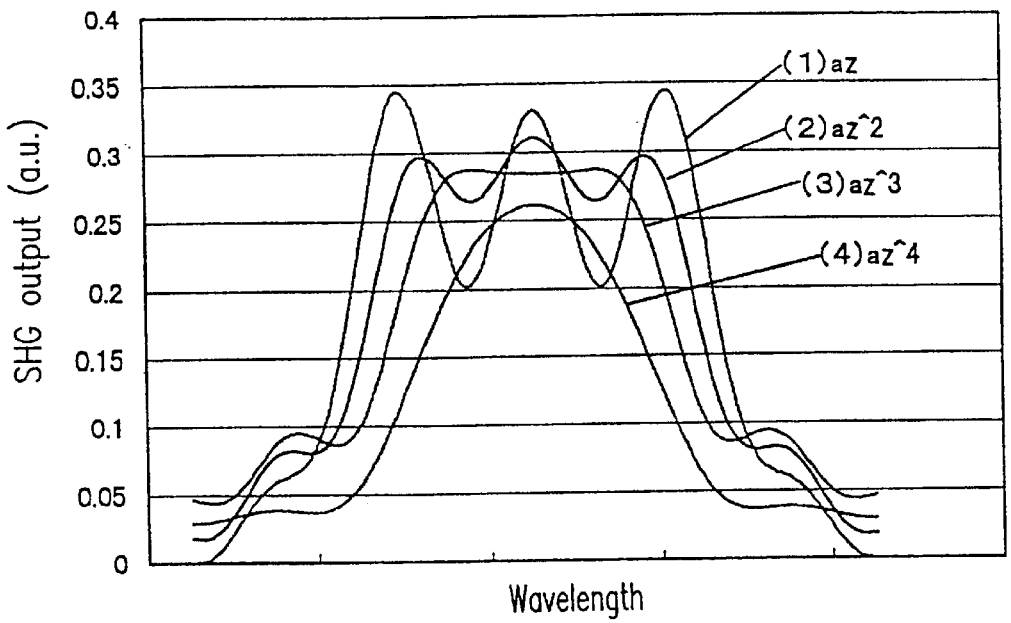
FIG.60  Distribution of phase mismatch amount (a*z^n)
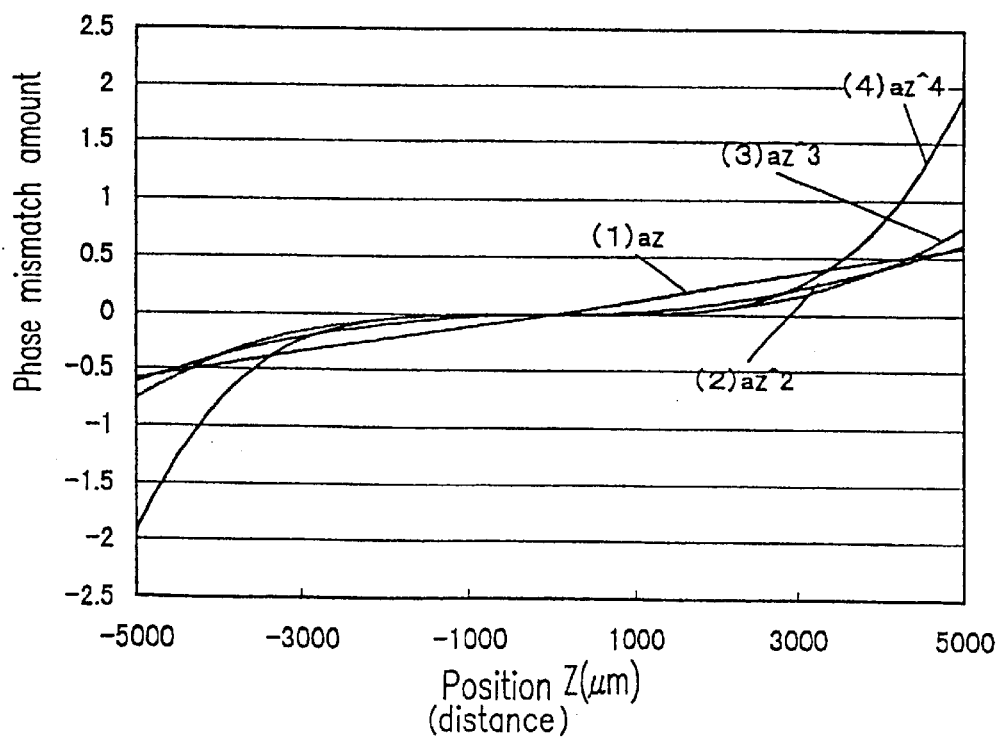

(1) $a/\Lambda_0 = 0.5$, $b = 0.0003$
(2) $a/\Lambda_0 = 0.65$, $b = 0.00025$
(3) $a/\Lambda_0 = 1.05$, $b = 0.0002$
(4) $a/\Lambda_0 = 2.17$, $b = 0.00015$
(5) $a/\Lambda_0 = 6.66$, $b = 0.0001$
(6) $a/\Lambda_0 = 230$, $b = 0.00005$ (1) $a/\Lambda_0=15.5, b=0.0001$
(2) $a/\Lambda_0=4.6, b=0.00015$
(3) $a/\Lambda_0=1.5, b=0.0002$
(4) $a/\Lambda_0=1.1, b=0.00022$
(5) $a/\Lambda_0=0.74, b=0.00025$
(6) $a/\Lambda_0=0.51, b=0.0003$ (1) $a/\Lambda_0 = 3.1$, $b = 0.0002$
(2) $a/\Lambda_0 = 1.2$, $b = 0.00023$
(3) $a/\Lambda_0 = 0.9$, $b = 0.00025$
(4) $a/\Lambda_0 = 0.72$, $b = 0.00027$
(5) $a/\Lambda_0 = 1.47$, $b = 0.0003$

OPTICAL WAVELENGTH CONVERSION DEVICE, COHERENT LIGHT GENERATOR, AND OPTICAL INFORMATION PROCESSING APPARATUS

BACKGROUND OF THE INVENTION

1. Field of the Invention

The present invention relates to an optical wavelength conversion device used for optical information processing and optical measurement fields utilizing a coherent light source, a coherent light generator using such an optical wavelength conversion device, and an optical information processing apparatus using such a coherent light generator.

The present invention also relates to a short-wavelength light source including a semiconductor laser and an optical wavelength conversion device, and an optical disk system using such a short-wavelength light source.

2. Description of the Related Art

An optical wavelength conversion device utilizing a nonlinear optical effect has been used in a variety of fields because such a device serves to widen the range of wavelengths usable by a laser light source by converting the wavelength of light output from the laser light source.

For example, an optical wavelength conversion device utilizing second harmonic generation (SHG) converts laser light into second harmonic wave light having a half wavelength, thereby enabling to realize generation of short-wavelength light which is otherwise difficult. When parametric oscillation is utilized, it is possible to generate light beams having different wavelengths continuously from a single-wavelength light source, thereby realizing a wavelength tunable light source. When a sum frequency is utilized, it is possible to convert two light beams having different wavelengths into a light beam having a third wavelength.

In the above optical wavelength conversion utilizing a nonlinear optical effect, phase matching conditions must be satisfied between the fundamental wave light before conversion and the second harmonic wave light after conversion. Techniques for this phase match includes a birefringence method in which the propagation velocities of the fundamental wave light and the second harmonic wave light in a crystal are made identical to each other by utilizing the birefringence of the crystal, and a quasi phase match method in which a nonlinear grating is used to achieve phase match.

In reality, however, the wavelength allowance range satisfying the phase matching conditions is extremely narrow. It is therefore necessary to control the wavelength of the fundamental wave light with markedly high precision, and thus it is difficult to stabilize the output power.

Studies have been done to widen the wavelength allowance range to increase the stability of optical wavelength conversion. FIG. 33 illustrates a conventional optical wavelength conversion device for widening the wavelength allowance range (see Japanese Application No. 3-16198). Hereinbelow, generation of second harmonic wave light P2 having a wavelength of 0.42 μm from fundamental wave light P1 having a wavelength of 0.84 μm will be described in detail with reference to FIG. 33.

The optical wavelength conversion device shown in FIG. 33 includes an $LiNbO_3$ substrate 1101, an optical waveguide 1102 formed on the substrate 1101, and a layer 1103 in which polarization is periodically inverted (a domain-inverted layer) formed for the optical waveguide 1102. The propagation constant of the fundamental wave light P1 is not matched with that of the second harmonic wave light P2 to be generated. This mismatch in propagation constant is compensated for by the periodic structure of the domain-inverted layer 1103, thereby enabling to generate the second harmonic wave light P2 with high efficiency.

Although the above conventional optical wavelength conversion device which performs wavelength conversion using the periodic domain-inverted layer 1103 exhibits high conversion efficiency, the allowance range of phase match wavelength in which wavelength conversion is possible is extremely narrow. In order to overcome this problem, the optical waveguide 1102 of the optical wavelength conversion device shown in FIG. 33 has portions having different propagation constants so as to widen the wavelength allowance range.

When the propagation constant of the optical waveguide 1102 is varied, the phase match wavelength in the optical waveguide 1102 varies. The phase matching conditions as used herein are conditions under which the optical wavelength conversion device can perform wavelength conversion. The phase match wavelength as used herein is a wavelength of incident light which satisfies the phase matching conditions. By dividing the optical waveguide 1102 into regions A, B, C, and D having different widths as shown in FIG. 33, the phase match wavelength varies depending on the width of the optical waveguide 1102 in the respective regions. By this construction, the phase matching conditions can be satisfied in any of the regions A, B, C, and D having different widths of the optical waveguide even when the wavelength of incident light is changed. Thus, the number of phase match wavelengths increases in the entire device. As a result, the wavelength allowance range for the optical wavelength conversion device is widened and thus a stable wavelength conversion device can be fabricated.

The phase matching conditions for the regions A, B, C, and D can also be established by varying the depth of the optical waveguide 1102 among the regions A, B, C, and D, or varying the period of the domain-inverted layer 1103 among the regions A, B, C, and D. In these cases, also, an optical wavelength conversion device having a wide wavelength allowance range is obtained.

A construction combining a periodic domain-inverted structure and a phase control section is also disclosed (see Japanese Application No. 4-070726). FIG. 34 illustrates a conventional optical wavelength conversion device having such construction for widening the wavelength allowance range.

The optical wavelength conversion device shown in FIG. 34 includes a plurality of domain-inverted regions 1105 and phase control sections 1106 between the adjacent domain-inverted regions 1105, which are both formed on a nonlinear optical crystal 1101. In this device, it is attempted to widen the allowance range of phase match wavelengths by utilizing the difference in the phase matching conditions of the respective domain-inverted regions 1105. It is also attempted to reduce a variation of the output power of second harmonic wave light P2 (i.e., the SHG output power) caused by a wavelength variation of fundamental wave light P1 by adjusting phase mismatch generated between the domain-inverted regions 1105 by the phase control sections 1106.

It is possible to further widen the allowance range of phase match wavelength by increasing the number of the domain-inverted regions 1105. For example, FIGS. 35A and 35B show tuning curves representing the relationship between the wavelength of fundamental wave light and the SHG output power when the domain-inverted layer is segmented into three regions and four regions, respectively. It is observed from these tuning curves that the wavelength allowance range can be greatly widened by increasing the number of segmented regions.

A method for widening the allowance range of phase match wavelength by modulating a periodic structure of domain-inverted is also disclosed.

For example, Suhara et al., IEEE Journal of Quantum Electronics, vol. 26 (1990) pp. 1265–1276 discloses a method for widening the allowance range of phase match wavelength by changing a periodic structure of domain-inverted in a chirping fashion. Specifically, this method uses a linear chirping structure where the period of domain-inverted is increased in proportion to the distance. In this method, since phase displacement linearly changes in the domain-inverted structure, the allowance range of phase match wavelength can be widely increased.

On the other hand, in recent years, optical disk systems using a near-infrared semiconductor laser having a 780 nm wavelength band and a red semiconductor laser having a wavelength of 670 nm have been vigorously developed. On the other hand, in order to realize high-density optical disks, it is desirable to use a small spot to reproduce information from optical disks. To achieve this, it is necessary to increase the numeral aperture (NA) of a light focusing lens and to short the wavelength of a light source.

As one of techniques of shortening the wavelength of a light source, a second harmonic generation (SHG) technique using a near-infrared semiconductor laser and a quasi phase match (OPM) domain-inverted type optical waveguide device (Yamamoto et al., Optics Letters, Vol.16, No.15 (1991) p.1156) is known.

FIG. 15 shows a schematic construction of a conventional short-wavelength light source (an SHG blue laser) using a domain-inverted type optical wavelength conversion device.

Referring to FIG. 15, the short-wavelength light source includes: a 0.85 μm band, 100 mW class, AlGaAs wavelength tunable distributed Bragg reflector (DBR) type semiconductor laser 38; a collimator lens 39 having NA of 0.5; a focusing lens 40 having NA of 0.5; and an optical wavelength conversion device 41. The wavelength tunable DBR semiconductor laser 38 includes a DBR region for fixing an oscillation wavelength and an active region for actually generating laser oscillation. The DBR region includes an internal heater for tuning the oscillation wavelength. The oscillation wavelength can be tuned by applying a current to the DBR region. Typically, a 2 nm wavelength tunable region is obtained by applying a current of 100 mA.

The construction of the optical wavelength conversion device 41 will be described.

The optical wavelength conversion device 41 includes a proton exchange optical waveguide 43 formed on an x-cut, Mg-doped LiNbO$_3$ substrate 42 and periodic domain-inverted regions 44 formed by a two-dimensional electric field application method. The periodic domain-inverted regions 44 are formed in the following manner. First, a comb-shaped electrode having a period of 3.2 μm and a parallel electrode are formed on the top surface of the +X substrate 42. A Ta film is deposited on the bottom surface of the +X substrate 42 as a bottom electrode. While a 4 V voltage is being applied between the top surface and the bottom surface of the substrate 42, a 0.4 V pulse voltage is applied to the top surface of the +X substrate 42 at a pulse width of 100 ms. In this way, the periodic domain-inverted regions 44 are formed.

A stripe-shaped mask is then formed after etching away the electrodes, and proton exchange is performed under pyrophosphoric acid to form the optical waveguide 43. The optical waveguide 43 typically has a width of 4 μm, a depth of 2 μm, and a length of 10 mm. An end face of the optical waveguide 43 is covered with a non-reflection coat.

The wavelength conversion characteristic of the optical wavelength conversion device 41 having the above construction with respect to the wavelength of fundamental wave light was evaluated. As a result, it was found that the full width at half maximum where the power level of blue light (second harmonic wave light) is halved is 0.08 nm.

Laser light output from the wavelength tunable DBR semiconductor laser 38 is coupled to the optical waveguide 43 of the optical wavelength conversion device 41 via the collimator lens 39 and the focusing lens 40. Typically, out of the laser output power of 100 mW, 70 mW laser light is coupled to the optical waveguide 43. Then, about 15 mW blue light (second harmonic wave light) is obtained by controlling the current amount injected to the DBR region of the wavelength tunable DBR semiconductor laser 38 and fixing the oscillation wavelength within an allowable wavelength range of phase match wavelength of the optical wavelength conversion device 41.

A control circuit is added to the above construction, in some cases, in order to stabilize the blue light (second harmonic wave light) power. In such a case, first, a current is injected from the control circuit to the active region of the semiconductor laser so that the intensity of output laser light is a preset value (e.g., 100 mW). Thereafter, SHG light obtained by wavelength conversion is detected by an optical detector to stabilize the SHG output power. An Si-PIN photodiode may be used as the optical detector.

More specifically, when a current injected to the DBR region is changed to vary the oscillation wavelength of the wavelength tunable DBR semiconductor laser, the oscillation wavelength shifts toward a longer wavelength with an increase in the injected current while repeating mode hopping. Accordingly, while the injected current is changed within the range of 0 mA to 100 mA, the oscillation wavelength is scanned and a signal output from the optical detector is detected, to store a current injected to the DBR region, $I_{dbr}$, at which the blue light (second harmonic wave light) power is maximum in the control circuit. For example, assume that the maximum power 5 mW of the second harmonic wave light was obtained when the injected current $I_{dbr}$ is 50 mA. In such a case, the injected current $I_{dbr}$ is first reduced to 40 mA which is lower than 50 mA, and then increased to the stored current value (50 mA), so that the oscillation wavelength of laser light is fixed to the phase match wavelength of the optical wavelength conversion device.

By the operation described above, 5 mW maximum blue light (second harmonic wave light) power is stably obtained.

In such a short-wavelength light source where laser light output from a semiconductor laser is input into an optical wavelength conversion device as fundamental wave light to convert the fundamental wave light into second harmonic wave light, phase matching conditions need to be satisfied in order to realize high-efficiency wavelength conversion. The allowable wavelength width of the phase matching conditions is generally small. Accordingly, in a short-wavelength light source including a semiconductor laser and an optical wavelength conversion device, a wavelength tunable DER semiconductor laser is Used as the semiconductor laser which supplies fundamental wave light. The wavelength tunable DBR semiconductor laser includes a DBR region for fixing and tuning the wavelength. By applying a current to the DBR region, a wavelength tunable region of about 2 nm is obtained.

The aforementioned conventional optical wavelength conversion devices using a domain-inverted structure have the following problem in attempting to widen the allowance range of phase match wavelength. That is, the phase matching characteristic. i.e., the SHG output power characteristic obtained when the phase match wavelength has been tuned, greatly varies near the peak thereof.

In the conventional method described above, where the optical wavelength conversion device having the domain-inverted layer is segmented into two or more regions to have different phase matching conditions between the respective segmented regions thereby to increase the wavelength allowance range for the optical wavelength conversion device, second harmonic wave light (SHG light) is generated over a wide wavelength range since the phase match wavelength is different between the respective segmented regions. In this case, however, the second harmonic wave light beams generated in the respective regions interfere with each other, resulting in increasing the variation of the SHG output power near the peak thereof in response to the wavelength variation of fundamental wave light, as shown in FIGS. 35A and 35B.

The range of phase match wavelength can be greatly widened by adopting the linear chirping structure for the domain-inverted period. However, this method also generates large rippling near the peak of the tuning curve.

Thus, the conventional methods fail to provide a flat power characteristic near the peak of the tuning curve. This causes a change in the SHG output power in response to a small variation of the wavelength of fundamental wave light within the allowance range of phase match wavelength, resulting in failing to obtain stable power.

Another problem of the conventional devices is as follows. In the conventional optical wavelength conversion device described above, interference between second harmonic wave light beams generated in the respective domain-inverted regions is reduced by providing the phase control section between the domain-inverted regions, and thus a variation of the SHG output power in response to the wavelength variation of fundamental wave light is reduced. Even in such a conventional optical wavelength conversion device, the SHG output power still varies by 10% or more. It is therefore difficult to obtain a flat portion near the peak of the tuning curve, which is required to stabilize the output power.

Still another problem of the conventional devices is as follows. In the conventional optical wavelength conversion device, although the wavelength allowance range can be easily widened, the conversion efficiency markedly decreases. For example, the conversion efficiency decreases to 1/5 or less for the crystal of the same length, and the conversion efficiency decreases to 1/10 with the 10 times wide wavelength allowance range. In other words, in the conventional optical wavelength conversion device, it is difficult to widen the wavelength allowance range while high-efficiency wavelength conversion characteristic is maintained to obtain the stable SHG output power.

In a conventional optical wavelength conversion device where a voltage is applied to an entire waveguide, in order to obtain a high-efficiency conversion characteristic, the applied voltage distribution must be highly uniform. It is therefore difficult to change the phase match wavelength while maintaining high-efficiency conversion efficiency. Moreover, in order to maintain a constant temperature over the entire optical wavelength conversion device, temperature control over the wide area is required, resulting in increasing power consumption.

Furthermore, in order to obtain stable power by varying the phase match wavelength of the optical wavelength conversion device, it is required to control the wavelength using the applied voltage and fix the applied voltage after selection of a predetermined wavelength. However, a material having an electro-optic effect, such as $LiNbO_3$ and $LiTaO_3$, has a problem of DC drifting, giving rise to the problem that electric charge offsetting the applied voltage is generated between electrodes when a constant voltage is applied and thus the applied voltage gradually changes. This makes it difficult, not only to apply a constant DC voltage to the entire waveguide, but also to form a uniform electric field distribution over the entire optical waveguide.

Since the refractive index changeable depending on the electro-optic effect is of the order of $10^{-4}$, the resultant range of the phase match wavelength capable of being modulated is limited to about 0.1 nm or less.

The above-described conventional short-wavelength light source has also the following problems.

In the short-wavelength light source including a wavelength tunable DBR semiconductor laser and a domain-inverted type optical wavelength conversion device, the oscillation wavelength of the wavelength tunable DBR semiconductor laser shifts toward a longer wavelength while repeating mode hopping (mode interval; 0.11 nm). In the domain-inverted type optical wavelength conversion device, the allowable wavelength width of phase match wavelength in the operation characteristic (tuning curve characteristic) for a 10 nm device length is 0.05 nm in the full width at half maximum, and the wavelength width in which the power level is 95% of the peak power is as small as 0.02 nm.

FIGS. 16A and 16B schematically show the relationship between the oscillation wavelength A at each mode of the wavelength tunable DBR semiconductor laser as the X-axis and the tuning curve characteristic B of the domain-inverted type optical wavelength conversion device as the Y-axis.

In FIG. 16A, the wavelength in a certain oscillation mode of the wavelength tunable DBR semiconductor laser is located near the peak of the tuning curve characteristic of the domain-inverted type optical wavelength conversion device. It is therefore possible to fix the oscillation wavelength of the wavelength tunable DBR semiconductor laser to the phase match wavelength with which the maximum conversion efficiency is obtained (corresponding to the peak of the characteristic B in FIG. 16A).

However, when the oscillation wavelength is largely displaced from the peak of the tuning curve characteristic as shown in FIG. 16B, the conversion efficiency of only about 50% of the maximum value is obtained since the longitudinal mode interval of the wavelength tunable DBR semiconductor laser is 0.11 nm, for example. In the latter case, it is necessary to adjust the oscillation wavelength of the wavelength tunable DBR semiconductor laser to match with the phase match wavelength with which the maximum conversion efficiency is obtained.

One method for adjusting the oscillation wavelength is as follows. When a driving current for the wavelength tunable DBR semiconductor laser (a current injected to an active region) is changed, the oscillation wavelength changes in the order of 0.01 nm. For example, for an AlGaAs wavelength tunable DBR semiconductor laser, the oscillation wavelength changes at a rate of 0.02 nm/10 mA.

However, as described above with reference to FIGS. 16A and 16B, the wavelength width in which the power level is 95% of the peak power is ±0.01 nm. Accordingly, when the driving current is controlled under auto power control (APC) to make constant the fundamental wave light power and the SHG output power, the oscillation wavelength changes. In other words, the control loop is in a diverging direction, not in a converging direction. For example, when the fundamental wave light power is changed by 5% to change the SHG output power by about 10%, the oscillation wavelength changes by about 0.02 nm, decreasing the conversion efficiency by about 20%. Thus, it is actually very difficult to employ APC driving for the conventional short-wavelength light source including the wavelength tunable DBR semiconductor laser and the domain-inverted type optical wavelength conversion device.

Alternatively, it is possible to control the temperature of the entire module on which the wavelength tunable DBR semiconductor laser and the domain-inverted type optical wavelength conversion device are mounted, by means of an electric cooling element and the like, to adjust the oscillation wavelength of the wavelength tunable DBR semiconductor laser to the phase match wavelength with which the maximum conversion efficiency is obtained.

In relation with the above, FIG. 17 shows the temperature dependency of each of the operation characteristics of the wavelength tunable DBR semiconductor laser and the domain-inverted type optical wavelength conversion device. Typically, the oscillation wavelength of the wavelength tunable DBR semiconductor laser shifts toward a longer wavelength with the temperature increase at a rate of 0.068 nm/° C., and the phase match wavelength of the domain-inverted type optical wavelength conversion device on a Mg:LiNbO$_3$ substrate shifts toward a longer wavelength with the temperature increase at a rate of 0.055 nm/° C. Accordingly, as the temperature of the module changes, the relationship between the oscillation wavelength and the phase match wavelength changes at a rate of 0.013 nm/° C.

Utilizing this relationship, it in possible to fix the oscillation wavelength of the wavelength tunable DBR semiconductor laser at the peak of the phase match wavelength of the domain-inverted type optical wavelength conversion device by raising the module temperature, for example, by 3° C.

However, while the wavelength tuning by the current application to the DBR region is performed at a speed of the order of milliseconds, the temperature control by a Peltier element as described above is performed at a speed of the order of seconds. In consideration that the start-up time of a light source is desirably as short as possible when the light source is applied to an optical disk device, a display, and the like, the above response speed characteristic is not satisfactory. Moreover, a power on the order of several volts and several amperes is required to be applied to operate the Peltier element, increasing power consumption of the light source. This is not desirable for personal-use application, either.

In general, the relationship of SHG output power with respect to the wavelength of fundamental wave light of a domain-inverted type optical wavelength conversion device (the phase match wavelength curve, i.e., the tuning curve) has a profile of a sinc function. The tuning curve characteristic has no flat portion even in the vicinity of the peak of the phase match wavelength. Accordingly, the SHG output power varies with even a slight temperature change of the module. It is therefore necessary to continuously control the temperature of the module.

Thus, in the short-wavelength light source including the optical wavelength conversion device and the wavelength tunable DBR semiconductor laser, the wavelength tunable characteristic is discontinuous when a general wavelength tunable DBR semiconductor laser is used. The wavelength is actually varied while repeating mode hopping at intervals of about 0.1 nm. It is therefore extremely difficult to keep stabilizing the resultant SHG output power. In particular, it is very difficult to stabilize the SHG output power by AFC driving.

A wavelength tunable DBR semiconductor laser of a three-electrode type which includes a phase region in addition to the active region and the DBR region has been developed. However, it is still difficult to control the power and the wavelength stably.

It has been studied to widen the allowable wavelength width of the phase match wavelength by shortening the length of the optical wavelength conversion device. However, in this method, the device length must be shortened to the order of several millimeters in order to widen the allowable wavelength width to the mode hopping interval of the semiconductor laser. This greatly reduces the conversion efficiency and thus is not practical.

Another problem of the power stabilization relates to stabilization of the wavelength of fundamental wave light and the phase match wavelength.

That is, when the wavelength of fundamental wave light and the phase match wavelength of the optical wavelength conversion device vary due to a factor such as a temperature change, it is necessary to monitor the variation amount to stabilize the output power by the feedback of the wavelength of the fundamental wave light. In the conventional optical wavelength conversion device, however, the idea of providing a monitor function to optimize the phase match state is not taken into consideration. The conventional device also has a structural problem that makes it difficult to provide a monitor function.

SUMMARY OF THE INVENTION

A short-wavelength light source of the present invention includes at least an optical wavelength conversion device and a wavelength tunable semiconductor laser, wherein the optical wavelength conversion device receives light output from the wavelength tunable semiconductor laser as a fundamental wave light, and outputs a second harmonic wave light obtained by converting a wavelength of the fundamental wave light, and an output power characteristic of the second harmonic wave light of the optical wavelength conversion device has a flat portion near the maximum power, and an oscillation wavelength of the wavelength tunable semiconductor laser is fixed to the flat portion of the output power characteristic of the optical wavelength conversion device.

An optical wavelength conversion device of the present invention includes: two or more non-linear optical crystals each having approximately identical phase matching conditions for a fundamental wave light and a second harmonic wave light; and a phase adjusting section inserted between the adjacent non-linear optical crystals, wherein the phase adjusting section has a dispersion characteristic which is different from that of the non-linear optical crystals, and the phase adjusting section is formed so as to allow at least one of a refractive index or a length thereof to be modulated.

Another optical wavelength conversion device of the present invention includes a non-linear optical crystal and a refractive index modulating section formed in a portion of the non-linear optical crystal, wherein the refractive index modulating section is formed in a region having a length of ½ or less of a whole length of the nonlinear optical crystal.

Yet another optical wavelength conversion device of the present invention includes two or more non-linear optical crystals and a phase adjusting section inserted between the adjacent non-linear optical crystals, wherein the non-linear optical crystals have phase matching conditions substantially identical to each other.

Yet another optical wavelength conversion device of the present invention includes: a non-linear optical crystal; a periodic domain-inverted structure formed in the non-linear optical crystal and segmented into two or more is regions; and a phase adjusting section disposed between the adjacent segmented regions of the periodic domain-inverted structure, wherein the respective segmented regions of the periodic domain-inverted structure have periods substantially equal to each other.

Yet another optical wavelength conversion device of the present invention includes a non-linear optical crystal in which a fundamental wave light having a wavelength of $\lambda$ is converted into a second harmonic wave light having a wavelength of $\lambda/2$, wherein a propagation loss for the fundamental wave light is substantially ½ of that for the second harmonic wave light in the non-linear optical crystal.

Yet another optical wavelength conversion device of the present invention includes a non-linear optical crystal in which a wavelength conversion is performed between first and second light respectively having wavelengths of $\lambda 1$ and $\lambda 2$ and a third light having a wavelength of $\lambda 3$, wherein the wavelengths satisfy the relationship of $1/\lambda 3 = 1/\lambda 1 + 1/\lambda 2$, and propagation losses for the first, second, and third lights are substantially equal to each other in the non-linear optical crystal.

A coherent light generator of the present invention includes: a semiconductor laser having a function to tune an oscillation wavelength; and an optical wavelength conversion device which receives light output from the wavelength tunable semiconductor laser as a fundamental wave light and performs a wavelength conversion for the fundamental wave light to output a second harmonic wave light, wherein a characteristic curve indicating a relationship between a wavelength of the fundamental wave light and an output of the second harmonic wave light has a flat portion in the vicinity of the maximum output of the second harmonic wave light, and a width of the flat portion is designed to be larger than an interval of longitudinal oscillation modes of the semiconductor laser.

The optical wavelength conversion device can be the one provided in accordance with the present invention.

Another coherent light generator of the present invention includes: an optical wavelength conversion device according to the present invention; and a laser light source, wherein a wavelength of an output light from the laser light source is converted by the optical wavelength conversion device.

Yet another coherent light generator of the present invention includes: a non-linear optical crystal; a wavelength tunable laser light source; and first and second optical detectors, wherein a first light emitted from the laser light source is converted into a second light in the optical wavelength conversion device. With respect to a selected light among the first and second lights, the first optical detector detects an intensity of scattered light from the non-linear optical crystal, and the second optical detector detects an intensity of the selected light in the vicinity of an output portion of the non-linear optical crystal. An oscillation wavelength of the wavelength tunable laser light source is controlled based on the detected result of the first and second optical detectors.

An optical wavelength conversion device of the present invention includes: a nonlinear optical crystal; and a periodic domain-inverted structure formed on the nonlinear optical crystal, wherein the domain-inverted structure includes a single period portion having a single period $\Lambda_0$ and chirping period portions having gradually changing periods.

Another optical wavelength conversion device of the present invention includes: a nonlinear optical crystal; and a periodic domain-inverted structure formed on the nonlinear optical crystal. A period of the domain-inverted structure is a domain-inverted period represented by $\Lambda_{-m}, \Lambda_{-(m-1)}, \ldots, \Lambda_{-2}, \Lambda_{-1}, \Lambda_0, \Lambda_1, \ldots, \Lambda_{m-1}, \Lambda_m$, the domain-inverted period has a distribution f(z) of phase mismatch amount, the distribution f(z) satisfying relationships:

$$f(i \star \Lambda_0) = (\Lambda_1 + \Lambda_2 + \ldots + \Lambda_i) - i \star \Lambda_0 \text{ and}$$

$$f(-i \star \Lambda_0) = (\Lambda_{-1} + \Lambda_{-2} + \ldots + \Lambda_{-i}) - i \star \Lambda_0$$

wherein $i = 1, 2, 3, \ldots$, and $f(z) = 0$ being established when z is in the vicinity of zero. The distribution f(z) further satisfies a relationship of $f(i \star \Lambda_0) - f(-i \star \Lambda_0)$, and a quadratic differential coefficient becomes larger at a position closer to ends of the nonlinear optical crystal.

Yet another optical wavelength conversion device of the present invention includes: a plurality of nonlinear optical crystals having the same domain-inverted structure; and a phase adjusting section disposed between the nonlinear optical crystals, wherein the phase adjusting section includes a domain-inverted structure having a period different from that of the nonlinear optical crystals.

According to another aspect of the present invention, a coherent light generator is provided, which includes: an optical wavelength conversion device according to the present invention; and a laser light source, wherein a wavelength of light output from the laser light source is converted by the optical wavelength conversion device.

According to still another aspect of the present invention, an optical information processing apparatus is provided, which includes: a coherent light generator according to the present invention; and a focusing optical system, wherein coherent light output from the coherent light generator is focused by the focusing optical system.

Thus, the invention described herein makes possible the advantages of (1) providing an optical wavelength conversion device having a phase matching characteristic having a wide flat portion near the maximum of a tuning curve (a flat peak phase matching characteristic), (2) providing an optical wavelength conversion device capable of stably changing the wavelength allowance range of phase match wavelength over a wide range, (3) providing an optical wavelength conversion device having a stable wavelength conversion characteristic by widening the wavelength allowance range while maintaining a phase matching characteristic having a wide flat portion near the peak (a flat peak characteristic), (4) providing a coherent light generator including such an optical wavelength conversion device and a semiconductor laser, which stabilizes a variation of the oscillation wavelength of the semiconductor laser to have a stable power characteristic, (5) providing a short-wavelength light source including a wavelength tunable DBR semiconductor laser and a domain-inverted type optical wavelength conversion device, which can be applied to optical disk systems, display systems, and the like and realizes a stable SHG output power characteristic under any ambient temperature or operation state, and (6) providing an optical information processing apparatus using such a coherent light generator or short-wavelength light source.

These and other advantages of the present invention will become apparent to those skilled in the art upon reading and understanding the following detailed description with reference to the accompanying figures.

BRIEF DESCRIPTION OF THE DRAWINGS

FIGS. 25A and 28B are graphs showing the phase matching characteristics of the optical wavelength conversion device of FIG. 27 in the case of applying no temperature to a heater and in the case of adjusting the temperature of the heater, respectively;

FIG. 59 is a graph showing a phase matching characteristic of the domain-inverted structure according to the present invention in the case where a function f(z) on which the distribution of phase mismatch amount depends is a power function, wherein curve (1) represents the case of the degree m=1, curve (2) represents the case of m=2, curve (3) represents the case of m=3, and curve (4) represents the case of m=4;

FIG. 60 is a graph showing a distribution of phase mismatch amount of the domain-inverted structure according to the present invention in the case where a function f(z) on which the distribution of phase mismatch amount depends is a power function, wherein curve (1) represents the case of the degree m=1, curve (2) represents the case of m=2, curve (3) represents the case of m=3, and curve (4) represents the case of m=4;

DESCRIPTION OF THE PREFERRED EMBODIMENTS

Figure 1:
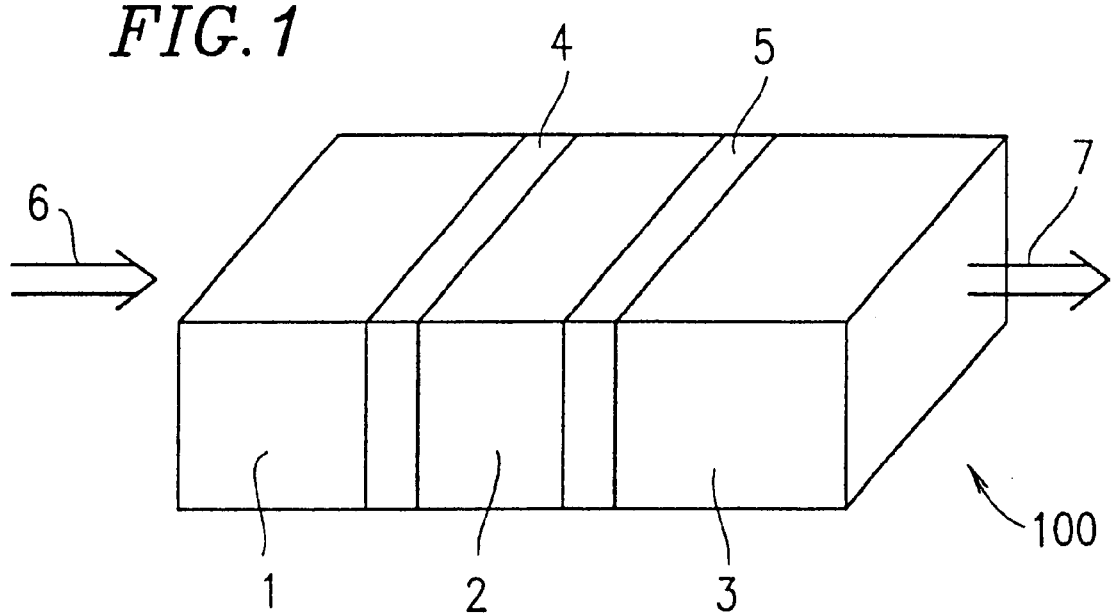
FIG. 1 is a view schematically illustrating an optical wavelength conversion device in Example 1 according to the present invention.

Optical wavelength conversion using a nonlinear optical crystal can be performed, not only by a birefringence phase match method utilizing the birefringence index of the crystal, but also by a method in which the difference in the phase velocity between fundamental wave light and second harmonic wave light is compensated for by a nonlinear grating in a quasi manner while using periodic domain-inverted structure in which non-linear polarization is periodically inverted. The latter method is called as a quasi phase match method. In the quasi phase match method, the phase matching conditions can be arbitrarily controlled by the domain-inverted period.

The present invention realizes a SHG output power characteristic with respect to the fundamental wave light wavelength (a tuning curve characteristic) which has a flat portion near the peak power level, by forming a phase adjusting section in a domain-inverted type optical wavelength conversion device.

The domain-inverted type optical wavelength conversion device employing the optical waveguide type quasi phase match method has the following features:

(1) since the device is of the optical waveguide type, a long interaction distance can be realized, which is effective for optical wavelength conversion by a segmented structure: and (2) since domain-inverted regions can be formed uniformly and with high precision by a seimiconductor process, and phase adjusting sections can be formed simultaneously, device design and fabrication are easy.

EXAMPLE 1

A short-wavelength light source of this example and the operation thereof will be described. The short-wavelength light source of this example includes: an optical wavelength conversion device having a characteristic of the SHG power with respect to the fundamental wave light wavelength (a tuning curve characteristic) which has a flat portion near the peak power; and a wavelength tunable DBR semiconductor laser having two electrodes (an active region and a DBR region).

First, the optical wavelength conversion device having a SHG output power characteristic with respect to the fundamental wave light wavelength (a tuning curve characteristic) which has a flat portion near the peak power will be described, together with the operation thereof.

In optical wavelength conversion utilizing a nonlinear optical effect, the wavelength of fundamental wave light is converted to generate second harmonic wave light. For a high-efficiency wavelength conversion from the fundamental wave light to the second harmonic wave light, it is necessary to satisfy the phase matching conditions for matching the phase velocities of two light beams. In general, however, the allowable range of the fundamental wave light wavelength which satisfies the phase matching conditions is extremely narrow.

In order to overcome this problem, the optical wavelength conversion device of this example is provided with a phase adjusting section between nonlinear optical crystals having identical phase matching conditions, to widen the allowance range of phase match wavelength. In this way, a wide allowable wavelength width is obtained, and the tuning curve characteristic has a flat portion near the peak power. Moreover, the reduction in wavelength conversion efficiency due to the widened allowable wavelength width can be minimized, and thus the widened allowable wavelength width and the high efficiency can be obtained simultaneously.

Referring to FIG. 1, a specific construction of the optical wavelength conversion device of this example, denoted by the reference numeral 100, will be described.

The optical wavelength conversion device 100 includes a plurality of nonlinear optical crystals, i.e., three nonlinear optical crystals 1, 2, and 3 in this example, which satisfy substantially the same phase matching conditions. Phase adjusting sections 4 and 5 are inserted between the adjacent nonlinear optical crystals 1, 2, and 3.

When fundamental wave light 6 is incident on the optical wavelength conversion device 100 having the above construction, the optical wavelength conversion device 100 converts the wavelength of the fundamental wave light 6 to output the second harmonic wave light 7. In the case where the phase matching conditions for the fundamental wave light 6 and the second harmonic wave light 7 are satisfied inside the nonlinear optical crystals 1, 2, and 3, the equation:

$$\beta(2\omega)=2\cdot\beta(\omega)$$

(wherein $\beta(2\omega)$ denotes the propagation constant of second harmonic wave light and $\beta(\omega)$ denotes the propagation constant of fundamental wave light) is established, indicating that the fundamental wave light 6 and the second harmonic wave light 7 are propagating at an identical phase velocity.

Figure 2A:
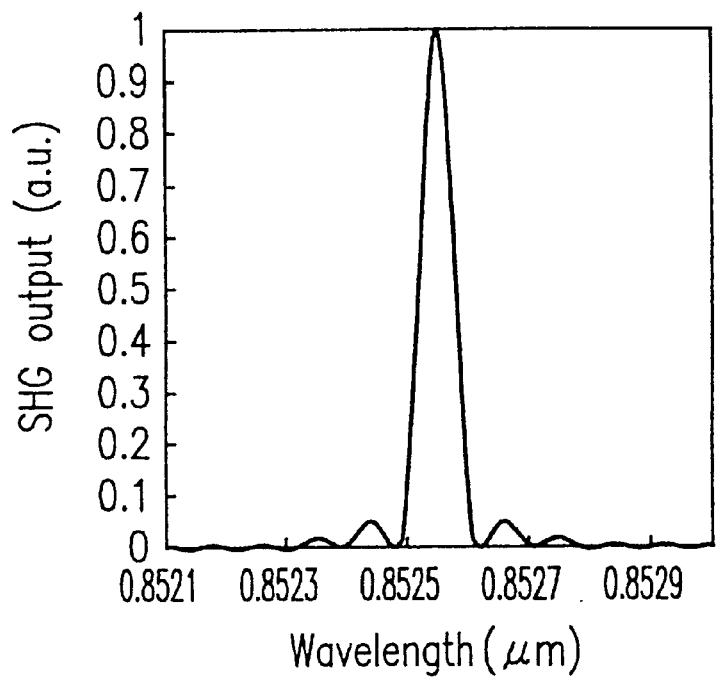
FIGS. 2A and 2B are graphs showing simulation results of the SHG output powers of a conventional optical wavelength conversion device having no phase adjusting section and the optical wavelength conversion device of FIG. 1 according to the present invention, respectively.

When a conventional optical wavelength conversion device composed of a single nonlinear optical crystal satisfying phase matching conditions is used, that is, when no phase adjusting section is formed, the SHG output power characteristic with respect to the fundamental wave light wavelength is as shown in FIG. 2A. The tuning curve characteristic representing the phase match state of the optical wavelength conversion device forms a sinc function having an extremely narrow peak and thus providing an extremely narrow allowable wavelength width.

Figure 2B:
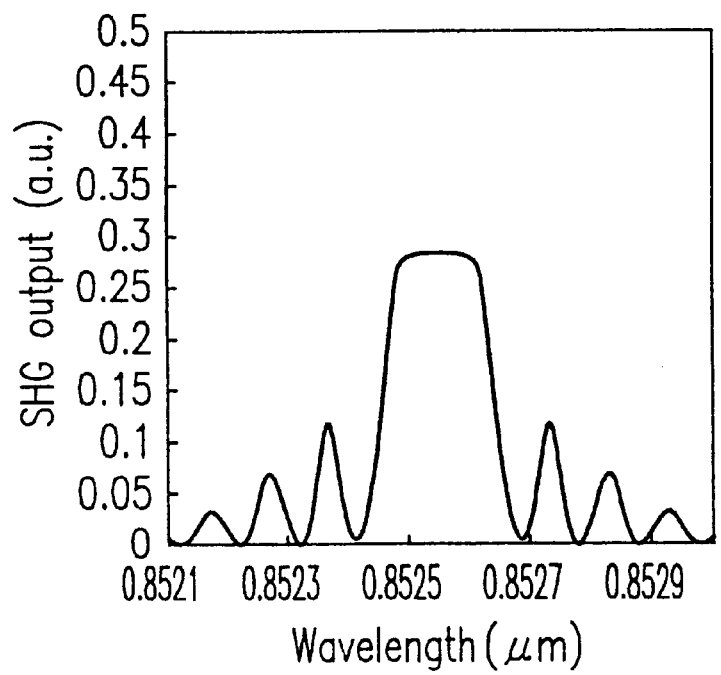

On the contrary, the SHG output power characteristic with respect to the fundamental wave light wavelength of the optical wavelength conversion device 100 shown in FIG. 1 is as shown in FIG. 2B. The power intensity of the second harmonic wave light is very flat at the peak near the maximum value of the tuning curve characteristic, with a power variation within several percent. The scale for the power intensity of the second harmonic wave light represented by the Y-axis of FIG. 2B is normalized using the peak power intensity of the second harmonic wave light in the conventional example as 1.

It is also observed that the wavelength range in which the SHG power level with respect to the fundamental wave light wavelength decreases by 5% from the pea level (allowable wavelength width) in FIG. 2B is about six times as wide as that in FIG. 2A. Further, although the conversion efficiency decreases as the allowable wavelength width increases, the conversion efficiency of a level of 29% of that obtained in FIG. 2A is still obtained, ensuring high-efficiency wavelength conversion.

As described above, by forming the phase adjusting sections 4 and 5 between the adjacent nonlinear optical crystals 1, 2, and 3 having identical phase matching conditions, a tuning curve characteristic having a flat peak is obtained, and comparatively high conversion efficiency is realized.

Figure 3A:
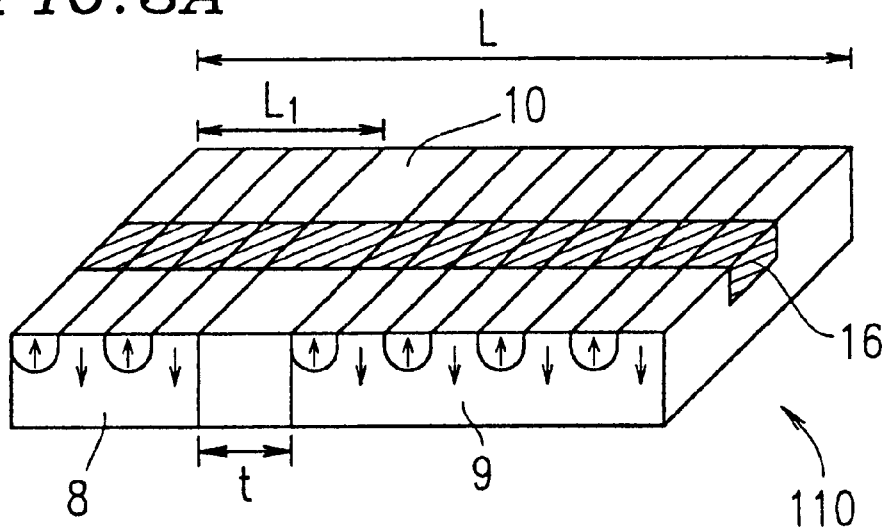
FIGS. 3A and 3B are views schematically illustrating optical wavelength conversion devices having a two-segmented structure and a three-segmented structure, respectively, according to the present invention.
Figure 33:
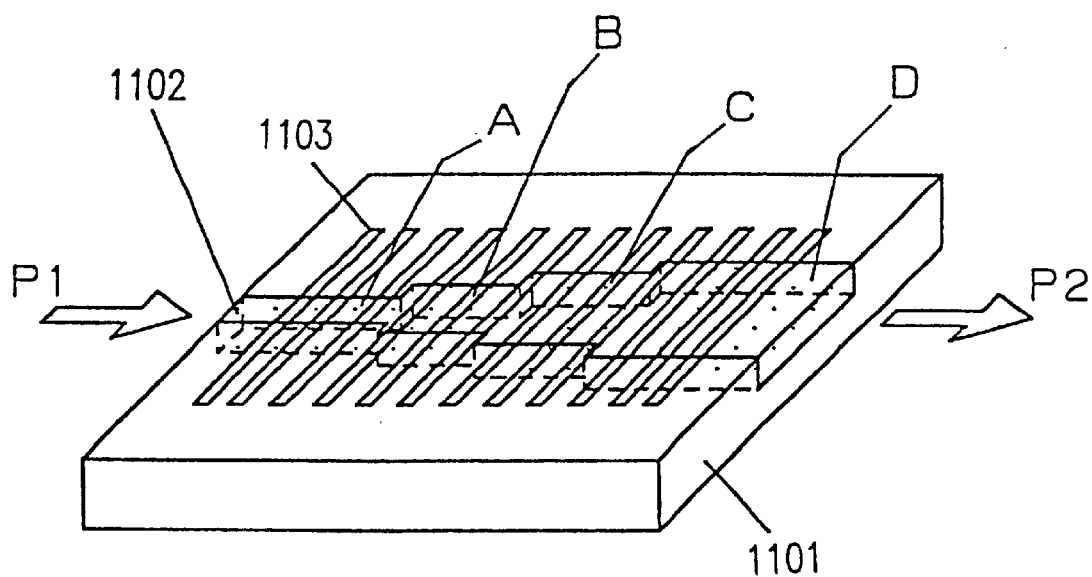
FIG. 33 is a view illustrating a conventional optical wavelength conversion device.
Figure 34:
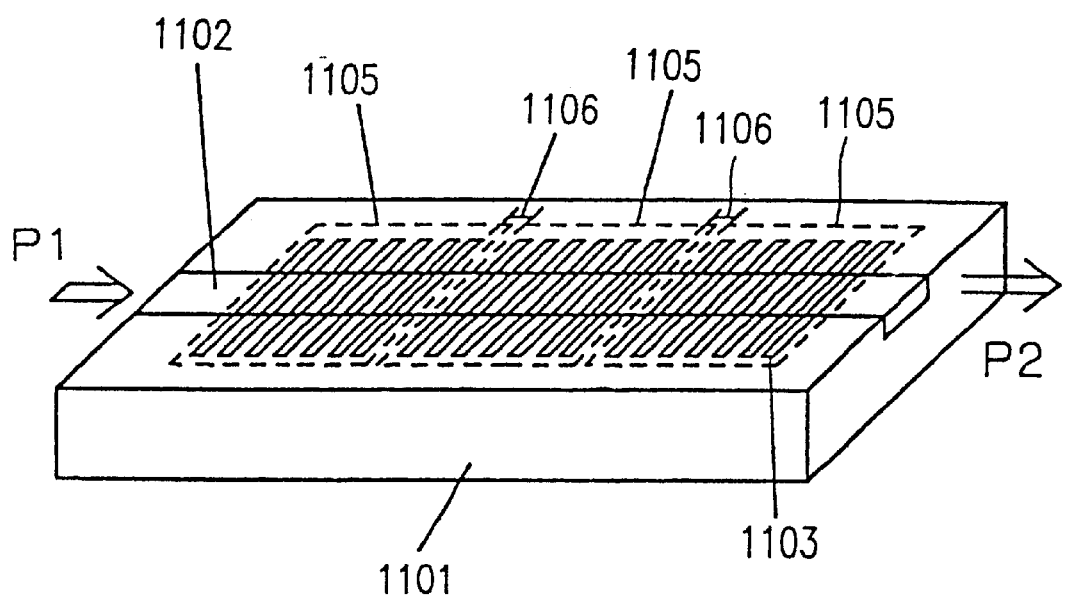
FIG. 34 is a view illustrating another conventional optical wavelength conversion device.
Figure 35A:
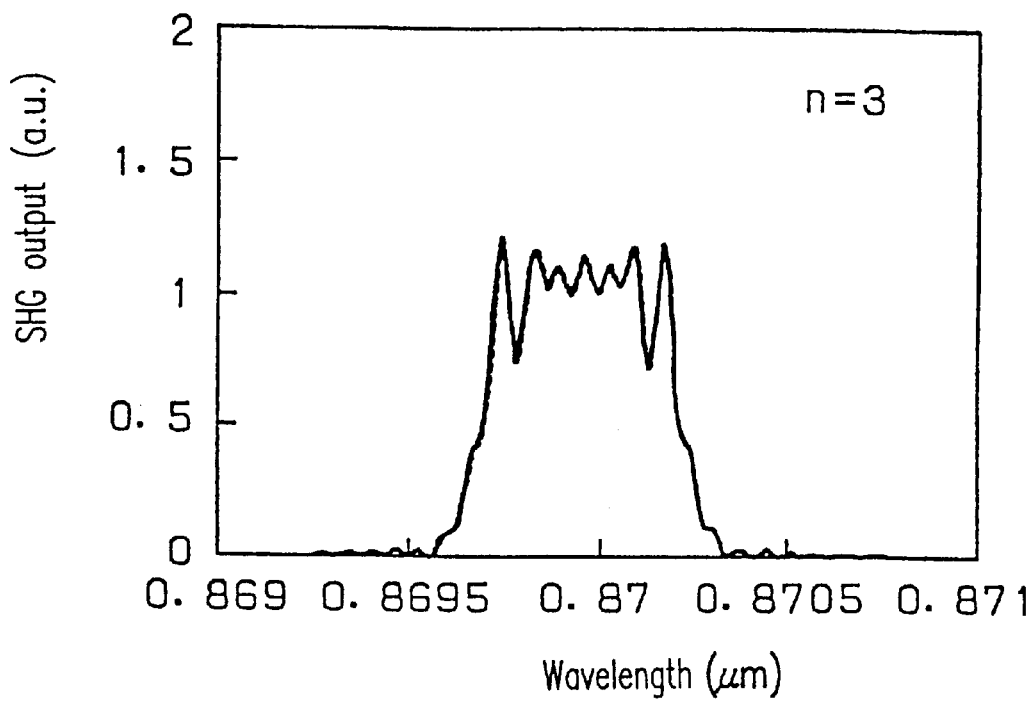
FIGS. 35A and 35B are graphs showing phase matching characteristics of a conventional two-segmented optical wavelength conversion device and a conventional three-segmented optical wavelength conversion device, respectively.
Figure 35B:
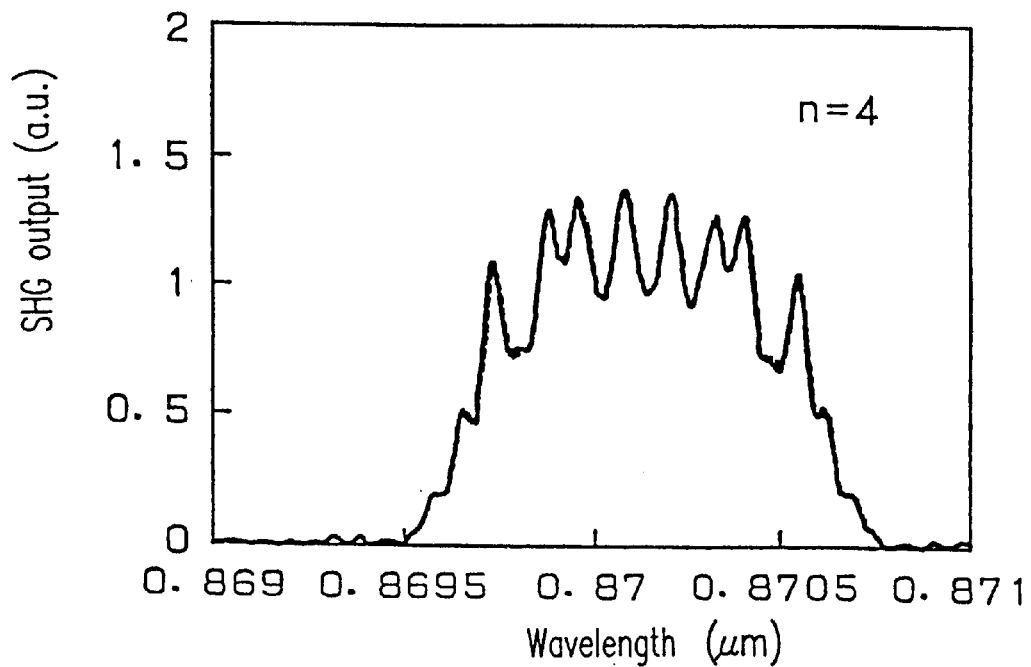

More specifically, according to the present invention, a two-segmented or three-segmented optical wavelength conversion device employing the optical waveguide type quasi phase match method is formed as the optical wavelength conversion device having the SHG output power characteristic with respect to the fundamental wave light wavelength (the tuning curve characteristic) having a flat portion near the peak power. FIGS. 3A and 33 show a two-segmented optical wavelength conversion device 110 and a three-segmented optical wavelength conversion device 120, respectively.

In the two-segmented optical wavelength conversion device 110 shown in FIG. 3A, domain-inverted regions 8 and 9 are formed on a substrate, and a phase adjusting section 10 is formed between the domain-inverted regions 8 and 9. In the three-segmented optical wavelength conversion device 120 shown in FIG. 3B, domain-inverted regions 11, 12, and 13 are formed on a substrate, and phase adjusting sections 14 and 15 are formed between the domain-inverted regions 11, 12, and 13. Each of the domain-inverted regions 8 to 13 includes a plurality of domain-inverted portions formed periodically at predetermined intervals (a domain-inverted period Λ).

In each region, the domain-inverted period Λ satisfies the relationship:

$$\Lambda=2m\pi/(\beta(2\omega)-2\cdot\beta(\omega)) \quad (1)$$

wherein m=0, 1, 2, 3, . . . , $\beta(2\omega)$ denotes the propagation constant of SHG, and $\beta(\omega)$ denotes the propagation constant of fundamental wave light.

In order to have the same phase matching conditions for the domain-inverted regions 8 to 13, the same domain-inverted period is set for the regions 8 to 13.

The length t of the phase adjusting section in the two-segmented optical wavelength conversion device 110 shown in FIG. 3A is set to satisfy the relationship:

$$t=(2n+1)\pi/(\beta(2\omega)-2\cdot\beta(\omega)) \quad (2)$$

wherein n=0, 1, 2, 3, . . . .

In expression (2), it is within the range of α=0.95 to 1.05 that the symmetry of the tuning curve characteristic is less than 5%. The device is usable as long as α is set at a value within the above range. Preferably, α=1. If a fails to fall within the above range, degrading the symmetry of the tuning curve characteristic, the flat peak portion tends to have a slope, causing unfavorable influences such as inability of APC operation and increased variation of the SHG output power.

Figure 3B:
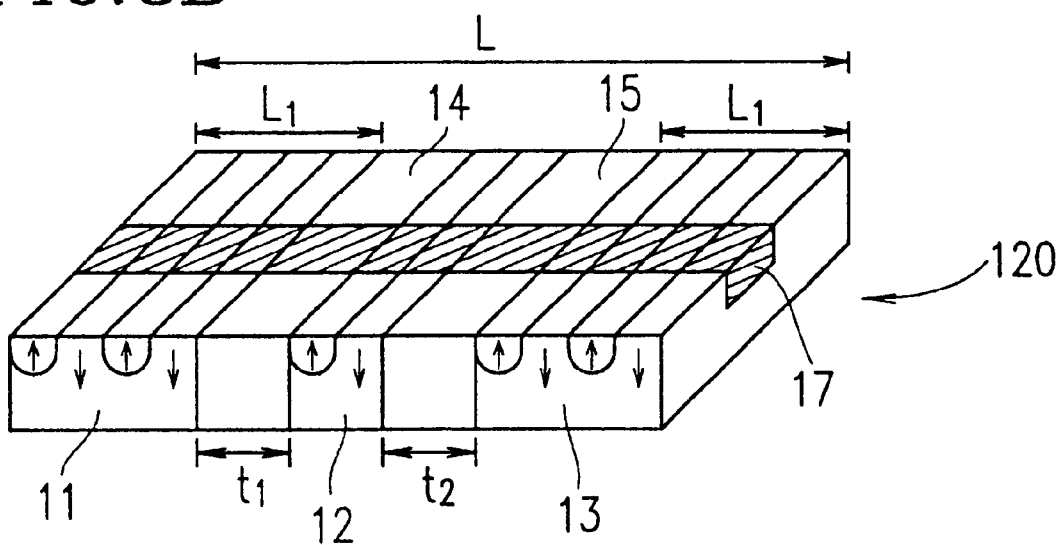

The flatness of the flat peak portion of the tuning curve characteristic is largest when the domain-inverted regions a and 9 located on both sides of the phase adjusting section 10 is set so that the ratio of the length L1 of the domain-inverted region 8 to the total device length L (L1/L) is about 17% (the length of the domain-inverted region 9 is therefore set to be L−L1−t), In the three-segmented optical wavelength conversion device 120 shown in FIG. 3B, the lengths t1 and t2 of the phase adjusting sections 14 and 15 are set to satisfy the relationships:

$$t1=(2n+\alpha 1)\pi/(\beta(2\omega)-2\cdot\beta(\omega)) \quad (3)$$

$$t2=(2m+\alpha 2)\pi/(\beta(2\omega)-2\cdot\beta(\omega)) \quad (4)$$

wherein n and m=0, 1, 2, 3, . . . .

Since α1+α2=2, expressions (3) and (4) are changed to:

$$t1+t2=2J\pi/(\beta(2\omega)-2\cdot\beta(\omega)) \quad (5)$$

wherein J=0, 1, 2, 3, . . . .

The flat peak portion of the tuning curve characteristic is substantially flat when α1=0.79 and α2=1.21. It is within the range of α1=0.7 to 0.9 that the symmetry of the tuning curve characteristic is less than 5%. At this time, α2 is set to be 2−α1.

The domain-inverted regions 11 and 13 are designed to have the same length L1 when the above conditions are satisfied. The flatness of the flat peak portion of the tuning curve characteristic is largest when the ratio of the length L1 to the total device length L (L1/L) is about 13.8%.

Based on the design guideline described above, the optical wavelength conversion device was actually designed and fabricated.

The total device length L was set at 10 mm, the center wavelength of the phase match wavelength was set at 852 nm, and the domain-inverted period was set at 3.2 µm. The two-segmented structure was designed so that t=1.6 µm and L1=1.7 mm, while the three-segmented structure was designed so that t1=1.3 µm, t2=1.9 µm, and L1=1.38 mm.

Figure 4A:
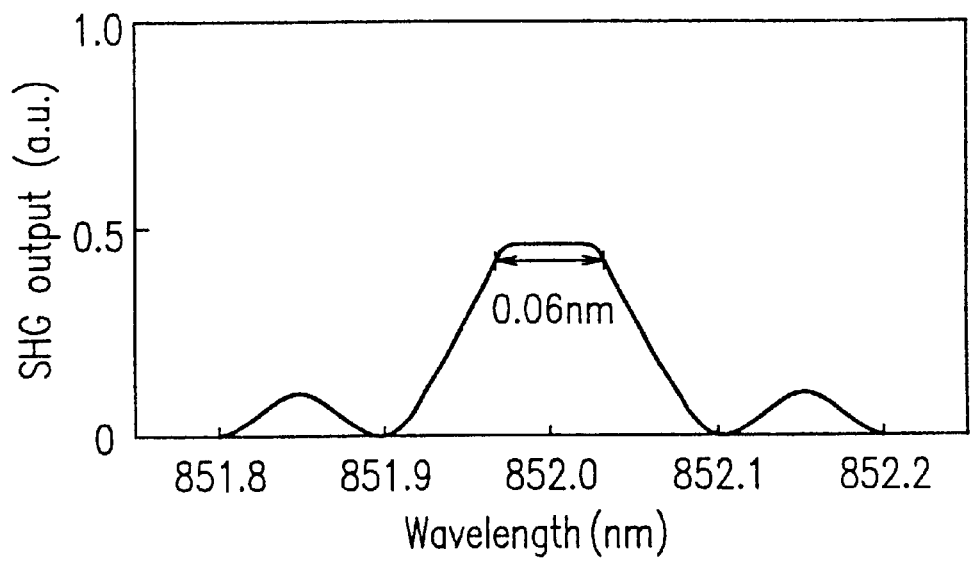
FIGS. 4A and 4B are graphs showing measurement results of the SHG output power characteristics of the optical wavelength conversion device having a two-segmented structure and the optical wavelength conversion device having a three-segmented structure, respectively, according to the present invention.
Figure 48:
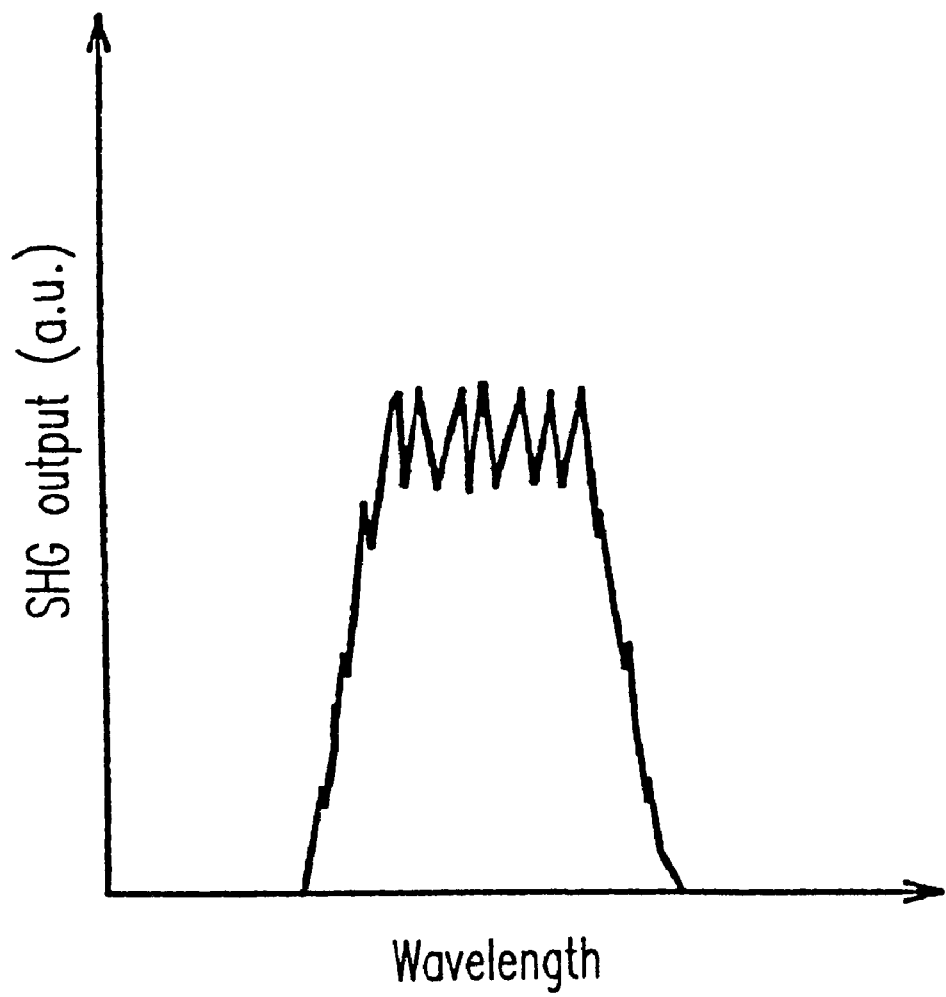
FIG. 48 is a graph showing a power characteristic obtained when the wavelength of fundamental wave light of the coherent light generator is changed.

FIGS. 4A and 48 show simulation results of the SHG output power characteristic with respect to the fundamental wave light wavelength (the tuning curve characteristic) of the two-segmented and three-segmented optical wavelength conversion devices 110 and 120, respectively. The scale for the SHG output power represented by the Y-axis of FIGS. 2A and 2B is normalized using the peak intensity of the SHG output power obtained by the conventional optical wavelength conversion device as 1.

Figure 4B:
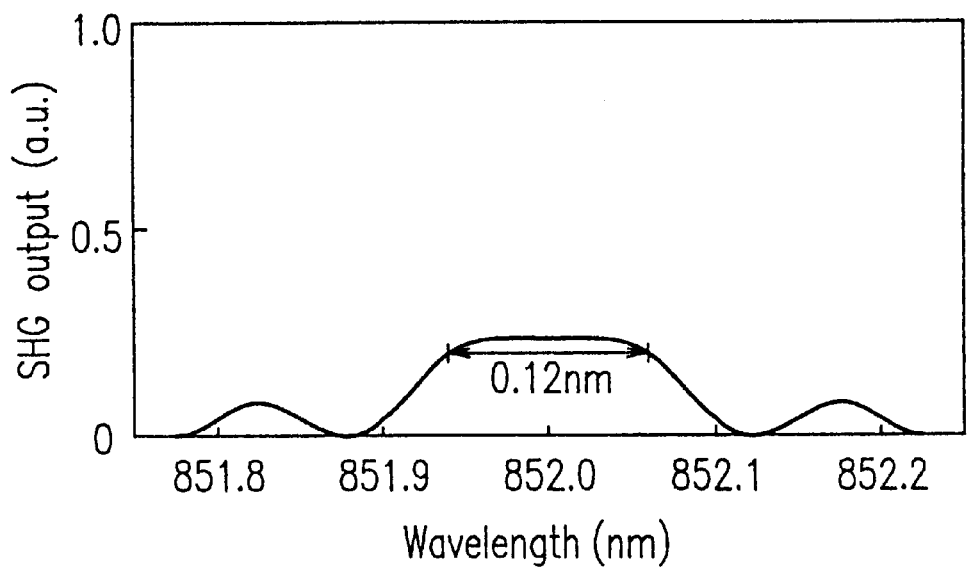

In the conventional optical wavelength conversion device having no phase adjusting section, the allowable wavelength width corresponding to the flat portion (the wavelength width in which the power level decreases by 5% is from the peak power level) is typically 0.02 nm. In the two-segmented structure, as shown in FIG. 4A, the allowable wavelength width corresponding to the flat portion of the tuning curve characteristic was 0.06 nm. The peak power was 45% of the value obtained by the optical wavelength conversion device having a length of 10 mm which includes no phase adjusting section. In the three-segmented structure, as shown in FIG. 4B, the allowable wavelength width corresponding to the flat portion of the tuning curve characteristic was 0.12 nm. The peak power was 29% of the value obtained by the optical wavelength conversion device having a length of 10 mm which includes no phase adjusting section. As used herein, the flat portion of the SHG output power characteristic (tuning curve characteristic) is defined as "the wavelength width in which the power level decreases by 5% from the peak power level." This is because the power variation allowable for a light source in a general application such as an optical disk system is considered to be several percent or less, e.g., or 5% or less.

The optical wavelength conversion device in this example is fabricated in substantially the same manner as that of the conventional domain-inverted type optical wavelength conversion device.

Figure 5:
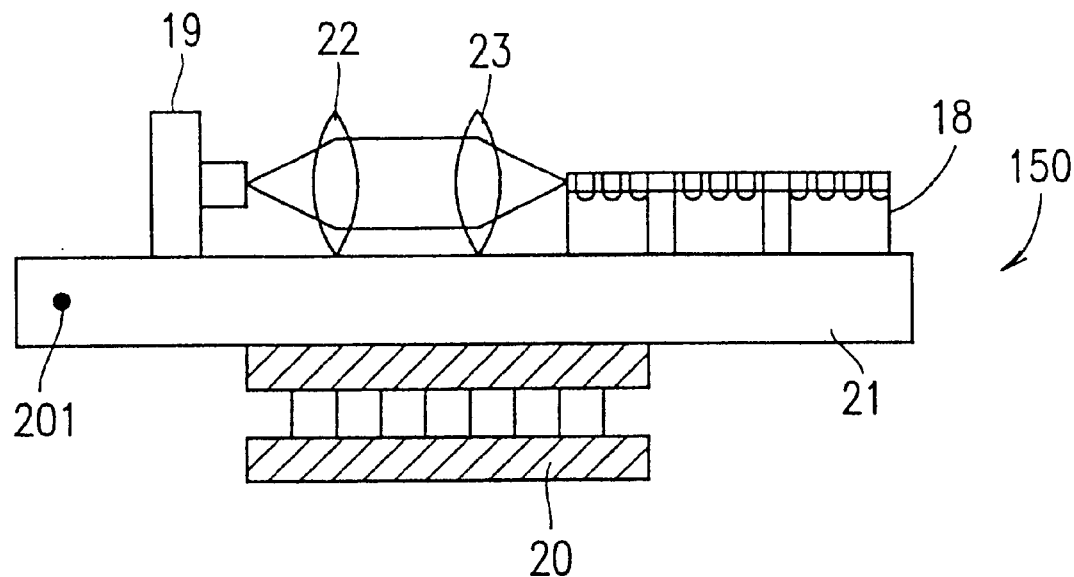
FIG. 5 is a view schematically illustrating a short-wavelength light source of Example 1 according to the present invention.

Specifically, an optical wavelength conversion device 18 having a construction shown in FIG. 5 includes a proton exchange optical waveguide formed on an x-cut, Mg-doped LiNbO$_3$ substrate and periodic domain-inverted regions formed by a two-dimensional electric field application method. The periodic domain-inverted regions are formed in the following manner. Comb-shaped electrode having a period of 3.2 µm and a parallel electrode are formed on the top surface of the +X substrate. A Ta film is deposited on the bottom surface of the +X substrate as a bottom electrode. While a 4 V voltage is being applied between the top surface and the bottom surface of the substrate, a 0.4 Vpulse voltage is applied to the top surface of the +X substrate at a pulse width of 100 ms. In this way, the domain-inverted regions are formed. Proton exchange is performed under pyrophosphoric acid to form the optical waveguide. The optical waveguide typically has a width of 4 µm, a depth of 2 µm, and a length of 10 mm. An end face of the optical waveguide is covered with a non-reflection coat.

The thus-fabricated optical wavelength conversion device 18 was measured for the SHG output power characteristic with respect to the fundamental wave light wavelength (the tuning curve characteristic) using a Ti:Al$_2$O$_3$ laser. As a result, the wavelength width of the flat portion near the peak of the SHG output power characteristic (tuning curve characteristic) was 0.06 nm for the two-segmented structure and 0.13 nm for the three-segmented structure. These measurement results were substantially identical to the simulation results described with reference to FIGS. 4A and 4B. The SEC output powers (wavelength: 426 nm) of 2.5 mW for the two-segmented structure and 1.5 mW for the three-segmented structure were obtained for an incident power of 50 mW on the optical waveguide.

Next, a short-wavelength light source 150 will be described with reference to FIG. 5.

FIG. 5 schematically shows the short-wavelength light source 150 which includes: the three-segmented domain-inverted type optical wavelength conversion device 18 described above having phase adjusting sections formed so that the wavelength width of the flat portion of the SHG output power characteristic (tuning curve characteristic) is 0.13 nm; and a wavelength tunable DBR semiconductor laser 19 having two electrodes (an active region and a DBR region).

The optical wavelength conversion device 18 and the wavelength tunable DBR semiconductor laser 19 are secured to a module 21 which is maintained at a predetermined temperature by means of an electric cooling device 20 and a thermistor 201. Laser light output from the wavelength tunable DBR semiconductor laser 19 is coupled to the optical waveguide of the optical wavelength conversion device 18 via a collimator lens 22 and a focusing lens 23. Since the optical waveguide of the optical wavelength conversion device 18 is formed on the x-cut substrate, it can transmit the TE mode light output from the semiconductor laser 19. Thus, light coupling is possible without using a half-wave plate.

The laser light coupled to the optical wavelength conversion device 18 is wavelength-converted by the periodic domain-inverted regions to be output as second harmonic wave (SHG) light from the output end face of the optical waveguide. Specifically, for light output from the wavelength tunable DBR semiconductor laser 19 having a wavelength of 851 nm and an power of 100 mW, 70 mW light was coupled to the optical waveguide.

In operation, a current was injected to the DBR region of the wavelength tunable DBR semiconductor laser 19 is to match the oscillation wavelength of the wavelength tunable DBR semiconductor laser 19 with the phase match wavelength of 852 nm of the optical wavelength conversion device 18. Specifically, when a current of 50 mA was injected to the DBR region, the oscillation wavelength was tuned to 852 nm to obtain 5 mW blue light (wavelength: 426 nm).

In general, the wavelength tuning characteristic of a wavelength tunable DBR semiconductor laser is discontinuous. For example, in the wavelength tunable DBR semiconductor laser 19 in this example, which has an active region having a length of about 1 mm, the oscillation wavelength changes at intervals of 0.11 nm while repeating mode hopping.

Figure 6:
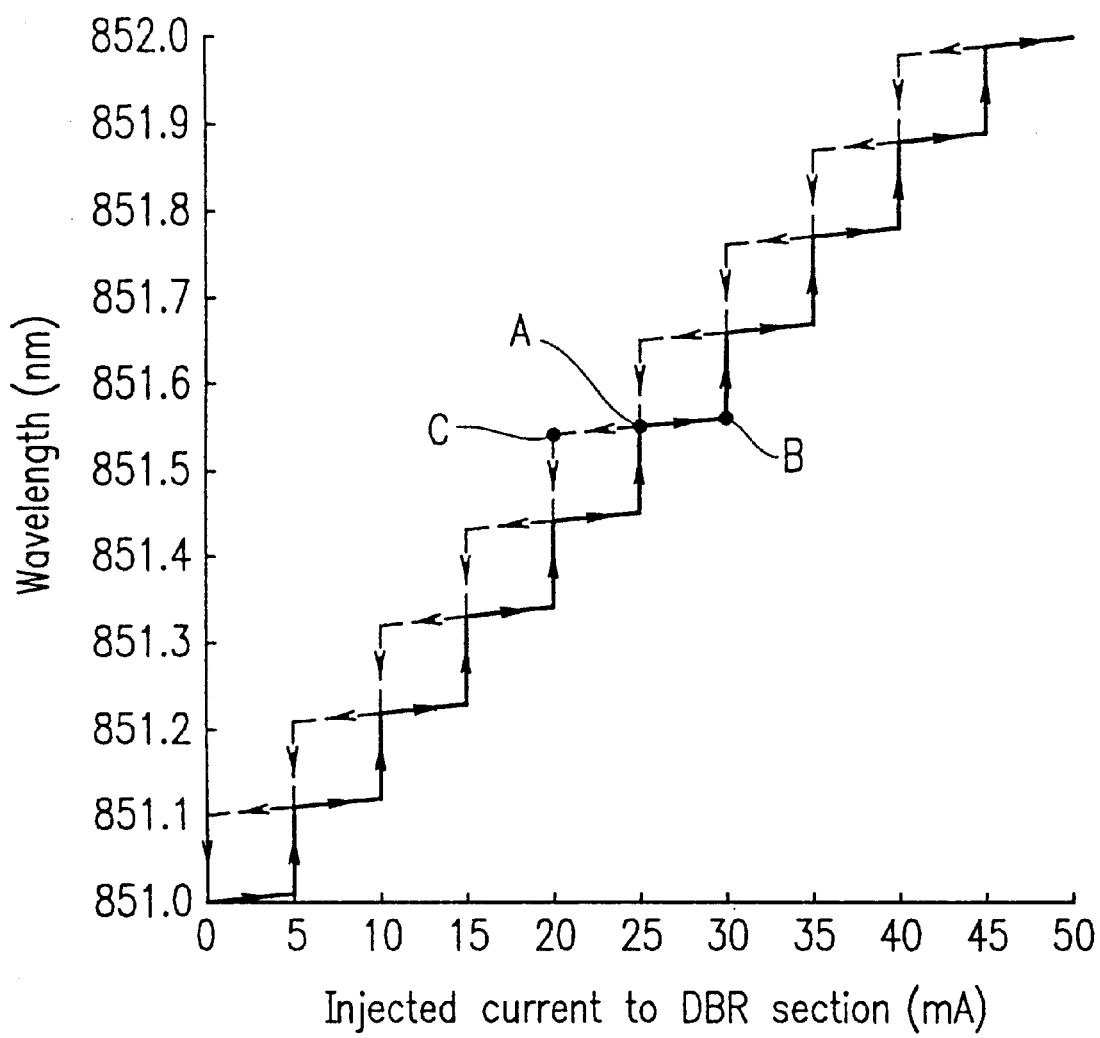
FIG. 6 is a graph showing the relationship between the current injected to a DBR region of a wavelength tunable DBR semiconductor laser and the oscillation wavelength.

FIG. 6 shows the relationship between the current injected to the DBR region and the oscillation wavelength. As is observed from FIG. 6, as the current injected to the DBR region increases, the wavelength shifts toward a longer wavelength while repeating a continuous portion corresponding to the wavelength width of 0.01 nm and a discontinuous portion corresponding to the wavelength width of 0.1 nm. It is also observed that different wavelength characteristics (hysteresis characteristics) are exhibited between the case where the current injected to the DBR region increases and the case where it decreases.

Figure 7A:
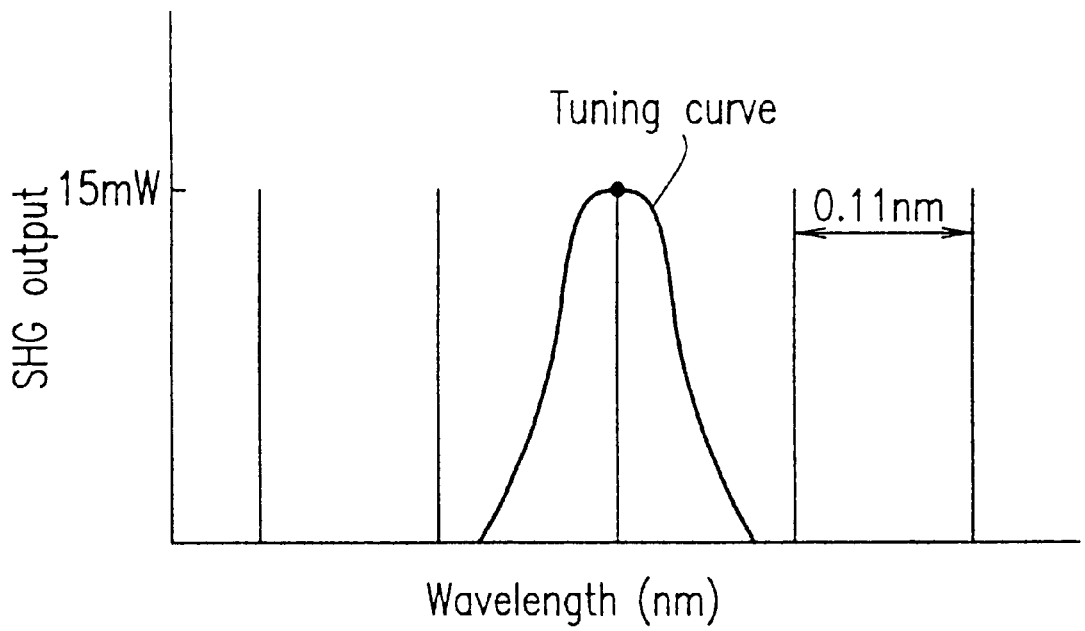
FIGS. 7A and 7B are graphs showing the relationships between the oscillation wavelength of the wavelength tunable DBR semiconductor laser and the SEG output power characteristic of a conventional optical wavelength conversion device.
Figure 7B:
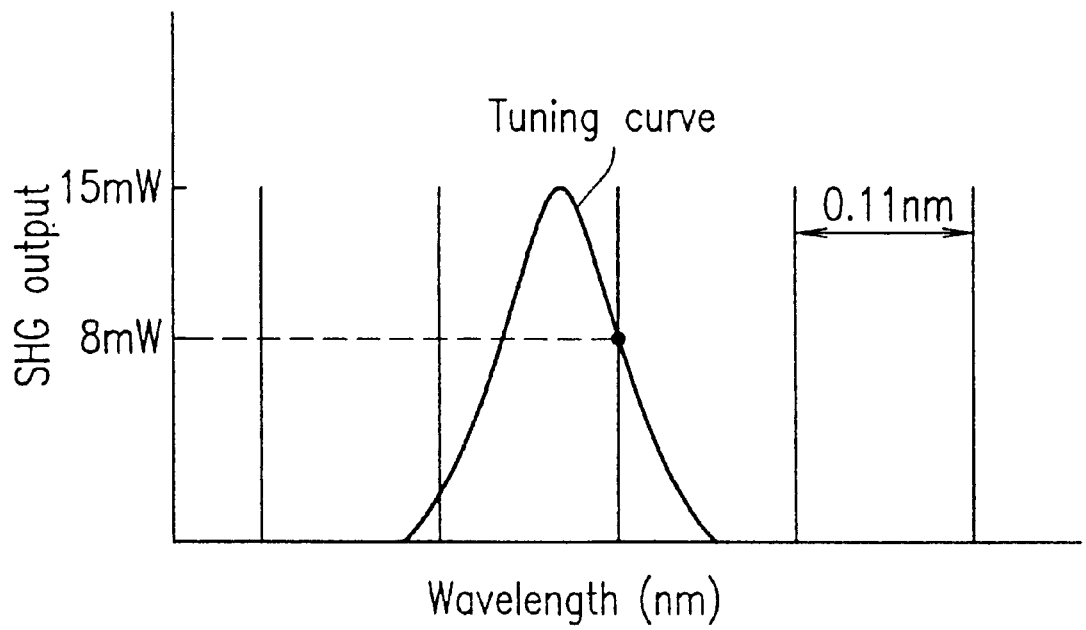
Figure 8A:
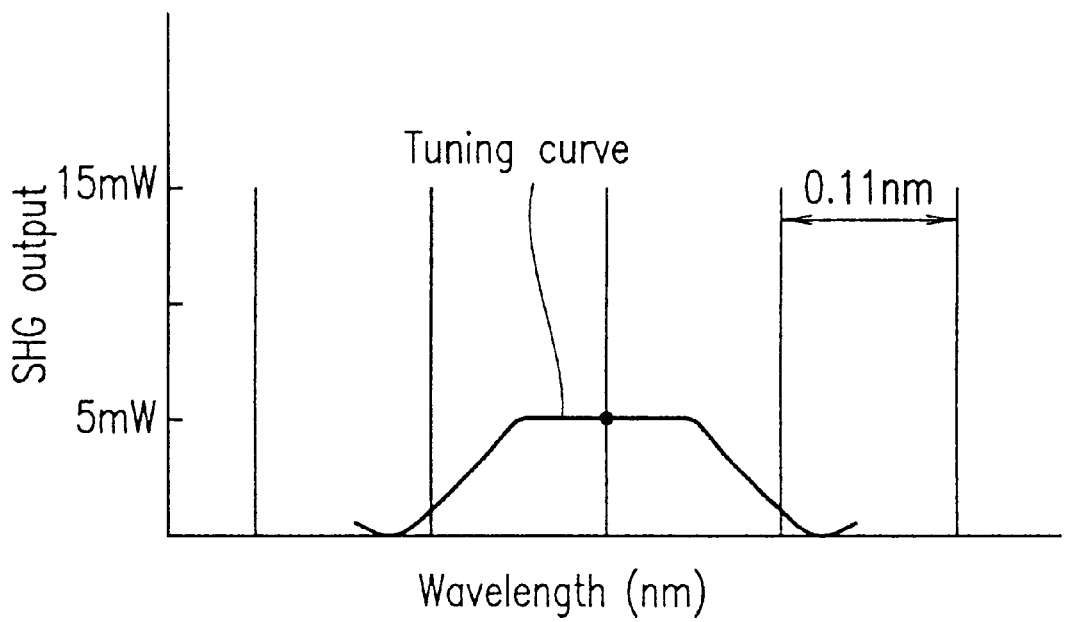
FIGS. 8A and 8B are graphs showing the relationships between the oscillation wavelength of the wavelength tunable DBR semiconductor laser and the SHG output power of the optical wavelength conversion device according to the present invention.
Figure 8B:
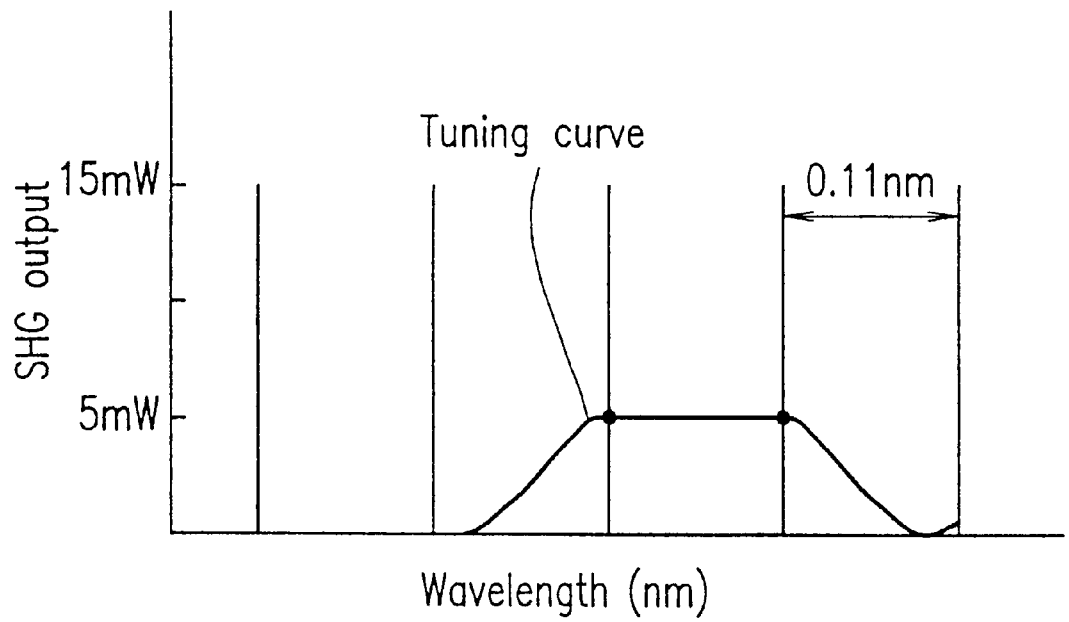

FIGS. 7A and 7B schematically show the characteristics of a conventional optical wavelength conversion device, while FIGS. 8A and 8B schematically show the characteristics of the optical wavelength conversion device of this example. In these graphs, the X-axis represents the wavelength and the Y-axis represents the SHG output power.

In the conventional optical wavelength conversion device, the width of the flat portion near the peak power of the tuning curve characteristic is as small as 0.02 nm. As shown in FIG. 7A, when the wavelength in a certain oscillation mode of the wavelength tunable DBR semiconductor laser is located near the peak of the phase match wavelength range, the peak power of 15 mW is obtained. However, as shown in FIG. 7B, when it is greatly displaced from the peak of the phase match wavelength range, a power of only 8 mW, for example, is obtained. Therefore, it is difficult to keep obtaining the same SHG output power in response to the same fundamental wave light power (semiconductor laser power) stably. In order to obtain the peak power stably, the temperature of the entire module or the current injected to the active region must be controlled. This results in complicating the control system and delaying the response speed (start-up speed) due to temperature control, which causes problems in practice.

On the contrary, in the three-segmented domain-inverted type optical wavelength conversion device in this example, the wavelength width of the flat portion of the tuning curve characteristic, in which the power level decreases by 5% from the peak level, is about 0.13 nm. This value is larger than the longitudinal mode interval of the wavelength tunable DBR semiconductor laser used in combination with the optical wavelength conversion device. Accordingly, substantially the same SHG output power of about 5 mW is obtained, both in the case of FIG. 8A where the wavelength in a certain oscillation mode of the wavelength tunable DBR semiconductor laser is located near the peak of the phase match wavelength range of the domain-inverted type optical wavelength conversion device and in the case of FIG. 8B where there exists considerably a large displacement therebetween.

Thus, according to the present invention, it is possible to fix the wavelength of the fundamental wave light at the peak phase match wavelength only by controlling the current injected to the DBR region by auto current control (ACC) so that the power of the wavelength tunable DBR semiconductor laser is constant. This markedly simplifies stabilizing control of the SHG output power. Moreover, since power control by temperature control is not required, high-speed start-up control is possible.

Hereinbelow, a control method will be described.

Figure 9:
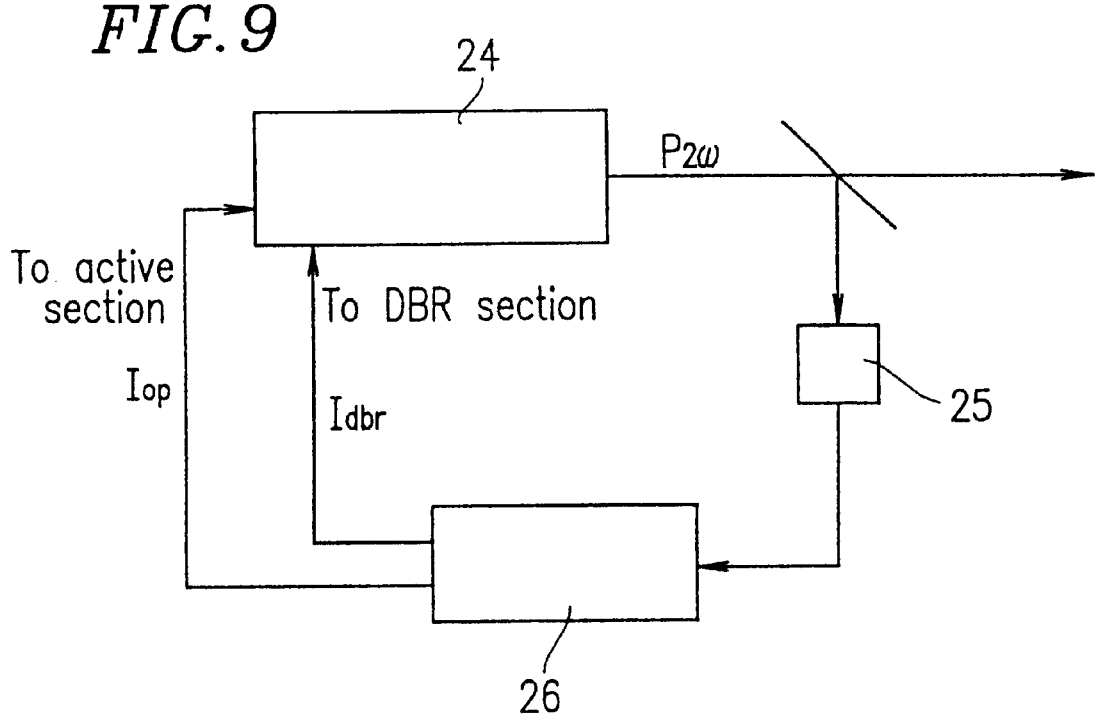
FIG. 9 is a block diagram of a short-wavelength light source including a control circuit according to the present invention.
Figure 10:
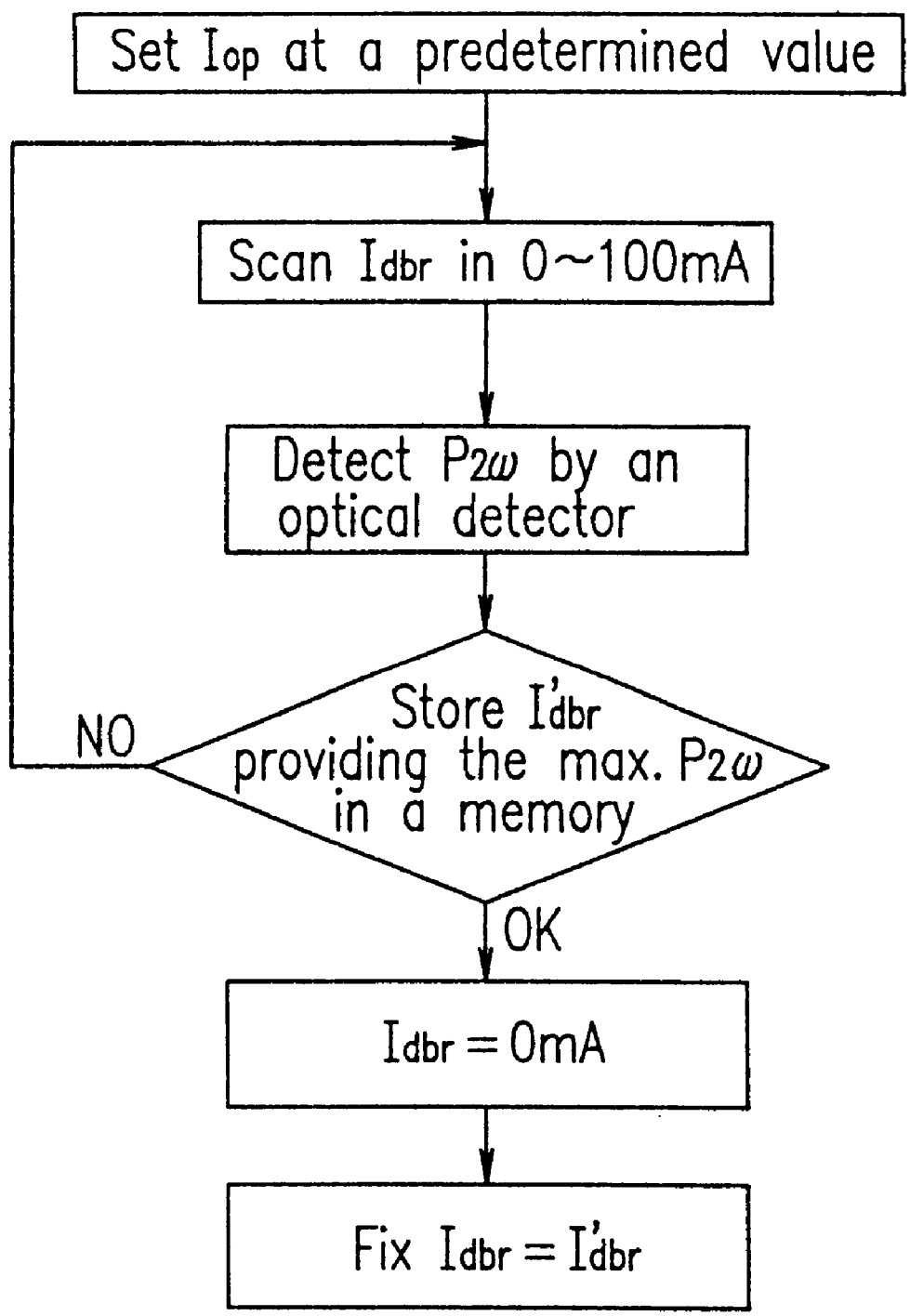
FIG. 10 is a flowchart of a control method executed for the short-wavelength light source of FIG. 9 to stabilize the SHG output power.
Figure 11A:
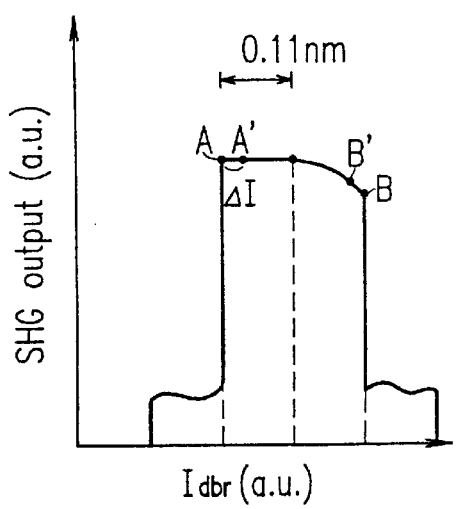
FIGS. 11A to 11D are graphs showing the SHG output powers with respect to the current injected to the DBR region of the wavelength tunable DBR semiconductor layer.
Figure 11B:
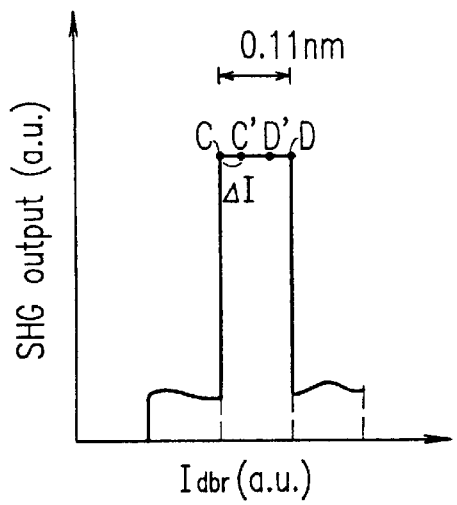
Figure 11C:
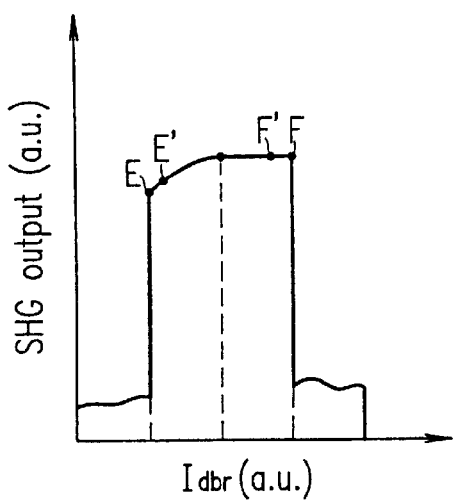
Figure 11D:
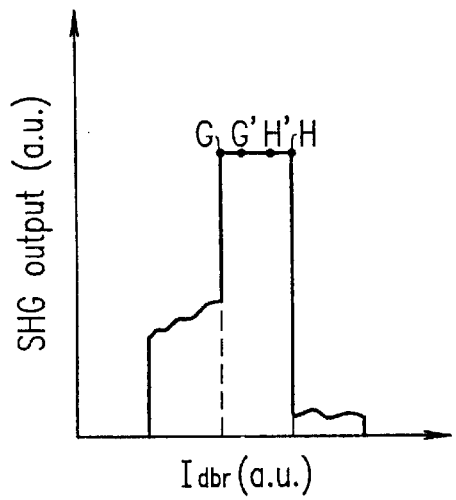

FIG. 9 is a block diagram of a construction in which a control circuit 26 is added to a short-wavelength light source 24. FIG. 10 is a flowchart of a control method for the construction of FIG. 9.

Referring to FIG. 9, SHG output power $P_{2\omega}$ output from the short-wavelength light source 24 is detected by an optical detector 25 and sent to the control circuit 26. The control circuit 26 controls currents injected to the active region and the DBR region of the wavelength tunable DBR semiconductor laser included in the short-wavelength light source 24 ($I_{op}$ and $I_{dbr}$, respectively).

First, the current $I_{op}$ injected to the active region of the wavelength tunable DBR semiconductor laser (i.e., a driving current) is set at a predetermined value. Then, the current $I_{dbr}$ injected to the DBR region is scanned in the range of 0 to 100 mA. At this time, the blue light power (SHG output power) $P_{2\omega}$ is simultaneously detected by the optical detector 25. When the maximum blue light (second harmonic wave light) power is obtained, a current $I'_{dbr}$ injected to the DBR region at that moment is stored in a memory of the control circuit. Thereafter, the current $I_{dbr}$ to be injected to the DBR region is once returned to 0 mA and then set at the current $I'_{dbr}$.

By following the above procedure, it is possible to stably fix the oscillation wavelength of the wavelength tunable DBR semiconductor laser within the flat portion near the peak power of the SHG output power characteristic (tuning curve characteristic) of the optical wavelength conversion device, and thus to stably obtain 5 mW SHG output power from 100 mW semiconductor laser power, The reason why the current injected to the DBR region is once returned to 0 mA is to avoid an occurrence of a hysteresis characteristic when the wavelength tunable DBR semiconductor laser is tuned.

Alternatively, in place of the ACC driving for constant power output from the wavelength tunable DBR semiconductor laser, APC driving can be employed by providing a photodiode upstream of the wavelength tunable DBR semiconductor laser. In such a case, the SHG output power can be further stabilized for the following reason.

In general, in a wavelength tunable DBR semiconductor laser, the oscillation wavelength shifts at a rate of 0.02 nm/10 mA as the current injected to the active region changes. In a conventional short-wavelength light source, therefore, it is impossible to employ the APC driving for the wavelength tunable DBR semiconductor laser. On the contrary, when the optical wavelength conversion device of this example is used, which has a wavelength width of 0.13 nm in the flat portion near the peak power of the tuning curve characteristic, the oscillation wavelength of the wavelength tunable DBR semiconductor laser exists in the flat portion of the power characteristic (tuning curve characteristic) of the optical wavelength conversion device even if the APC driving is employed for the wavelength tunable DBR semiconductor laser. Accordingly, by employing the APC driving for the wavelength tunable DBR semiconductor laser, the SHG output power can be stabilized.

Moreover, the APC driving can also be employed for the SHG output power if the oscillation wavelength of the wavelength tunable DBR semiconductor laser is fixed within the flat portion of the power characteristic (tuning curve characteristic) of the optical wavelength conversion device.

During second harmonic generation, if the phase match relationship is maintained, the SHG output power changes in proportion to the second power of the fundamental wave light power. In this example, the flat portion of the tuning curve characteristic is defined as a wavelength width in which the power level decreases by 5% from the peak power. In the state where the oscillation wavelength of the wavelength tunable DBR semiconductor laser exists in the flat portion of the tuning curve characteristic of the optical wavelength conversion device, as the fundamental wave light power increases, the SHG output power increase, and as the fundamental wave light power decreases, the SHG output power decreases. Accordingly, by controlling the driving current (the current injected to the active region) of the wavelength tunable DBR semiconductor laser which outputs laser light as the fundamental wave light, the SHG output power can be controlled to be a constant value. This further stabilizes the SHG output power.

The APC driving can be employed for the SHG output power because the wavelength width of the flat portion of the tuning curve characteristic of the optical wavelength conversion device is larger than the longitudinal mode interval of the oscillation wavelength of the semiconductor laser. This is one of the greatest effects of the present invention. This effect is especially convenient for applications to optical disk systems and the like since this allows for stable operation of a servo system and the like, thereby providing a large practical effect.

In this example, the domain-inverted type optical wavelength conversion device of the short-wavelength light source has a flat portion near the peak power of the SHG output power characteristic with respect to the fundamental wave light wavelength (the tuning curve characteristic), and the wavelength width in which the power level is 95% or more of the peak power level (the allowable wavelength width) is typically 0.13 nm. This value is larger than the interval of mode hopping (typically, 0.11 nm) of the wavelength tunable DBR semiconductor laser of the short-wavelength light source. Accordingly, it is possible to fix the oscillation wavelength of the wavelength tunable DBR semiconductor laser within the flat portion of the tuning curve characteristic by adjusting the current amount injected to the DBR region. As a result, stable SHG output power can be obtained under any conditions, providing an enormous practical effect.

In this example, the case of using the three-segmented optical wavelength conversion device having two phase adjusting sections has been described. In the case of using a two-segmented optical wavelength conversion device having one phase adjusting section, the wavelength width in which the power level is 95% or more of the peak power level (the allowable wavelength width) is 0.06 nm. As described above, in the wavelength tunable DBR semiconductor laser having the about 1 mm long active region, the longitudinal oscillation mode interval is about 0.11 nm. It is therefore difficult to fix the oscillation wavelength within the allowable wavelength width of 0.06 nm.

In the above case, the definition of the flat portion near the peak power of the tuning curve characteristic may be appropriately revised from the above-described definition "the portion in which the power level decreases by 5% from the peak power level". For example, it can be defined as "the portion in which the power level decreases by 20% from the peak power level". Alternatively, it can be defined as "the portion in which the power level decreases by 15% from the peak power level". The wavelength width of the flat portion in which the power level decreases by 15% from the peak power level is 0.11 nm or more in the SHG output power characteristic (the tuning curve characteristic) of the two-segmented domain-inverted type optical wavelength conversion device. This is larger than the above-mentioned longitudinal oscillation mode interval. This is effective for a system which receives a comparative large power variation.

Alternatively, the longitudinal mode interval may be reduced by increasing the length of the active region. For example, in a wavelength tunable DBR semiconductor laser having a 1.5 mm long active region, the longitudinal mode interval is 0.07 nm, which is substantially the same as the allowable wavelength width, 0.06 nm, in which the power level decreases by 5% from the peak power. In this way, the SHG output power can be stabilized.

EXAMPLE 2

In this example, a control method by the control circuit for obtaining more stable SHG output power will be described.

As described above, in a wavelength tunable DBR semiconductor laser having a 1 mm long active region, the oscillation wavelength thereof shifts toward a longer wavelength as the current injected to the DBR region increases, while repeating a continuous change of a wavelength width of 0.01 nm and a discontinuous change of a wavelength width of 0.1 nm, as shown by the solid line in FIG. 6. On the contrary, when the injected current decreases, the oscillation wavelength shifts toward a shorter wavelength while repeating the changes in the same manner as that in the increase case described above, as shown by the dash line in FIG. 6. As a result, a hysteresis characteristic as shown in FIG. 6 is generated. In this case, point A (a point immediately after a mode hopping for both cases where the current injected to the DBR region increases and decreases) in FIG. 6, for example, is a stable point where mode hopping does not easily occur, while point B for the current increase and point C for the current decrease are unstable points where mode hopping easily occurs. These points are examined together with the graphs shown in FIGS. 11A to 11D representing changes of the SHG output power with respect to the current $I_{dbr}$ injected to the DBR region of the wavelength tunable DBR semiconductor laser.

In FIGS. 11A to 11D, the dash lines represent values of the injected current $I_{dbr}$ with which mode hopping occurs. The interval between the adjacent dash lines corresponds to a wavelength shift width by which the wavelength continuously shifts when the injected current $I_{dbr}$ varies, which is specifically 0.01 nm.

Since the values of the injected current $I_{dbr}$ after mode hopping are stable points, points A, C, E, and G in FIGS. 11A to 11D, respectively, are stable points for the increase of the injected current $I_{dbr}$, while points B, D, F, and H in FIGS. 11A to 11D, respectively, are stable points for the decrease of the injected current rag.

Specifically, the setting of the current $I_{dbr}$ injected to the DER region for realizing stable operation is performed in the following manner. Assuming that SHG output powers $P_N$ and $P_{N+1}$ of different levels are obtained from different levels $I_N$ and $I_{N+1}$ ($I_N > I_{N+1}$) of the current $I_{dbr}$ injected to the DBR region, the injected current $I_{dbr}$ satisfying the following conditions is obtained for each of the increase and decrease of the injected current.

In the case of the increase of the current, the injected current $I_{dbr}$ is set so that the following three conditions are satisfied.

(1) $P_{N+1} - P_N > 0$ (2) $P_{N+1} - P_N$ is maximum.

The injected current $I_{dbr}$ is actually set at points A', C', B', and G' shown in FIGS. 11A to 11D, respectively.

In the case of the decrease of the current, the injected current $I_{dbr}$ is set so that the following three conditions are satisfied.

(1) $P_{N+1} - P_N < 0$ (2) $P_{N+1} - P_N$ is maximum.

(3) $I_{dbr} - I_{N+1} + \Delta I$

The injected current $I_{dbr}$ is actually set at points B', D', F', and H' shown in FIGS. 11A to 11D, respectively.

The code $\Delta I$ denotes a difference between the original stable point (e.g., point A) and the point at which the injected current $I_{dbr}$ is actually fixed (e.g., point A'), as shown in FIGS. 11A to 11D. The difference $\Delta I$ is provided to ensure exact operation and is desirably set at a value not exceeding a half of a current value at which mode hopping occurs. For example, since mode hopping is repeated every 5 mA in this example, stable operation is ensured when $\Delta I$ is about 2 mA.

After the determination of the value of the injected current $I_{dbr}$ for ensuring stable operation, the current $I_{dbr}$ is once returned to 0 mA and 100 mA in the case of the increase and decrease of the injected current, respectively. The injected current $I_{dbr}$ is then increased or decreased to the determined value again, to be finally fixed at the stable point.

The above-described control can be effectively performed for the short-wavelength light source including the wavelength tunable DBR semiconductor laser and the optical wavelength conversion device, where the wavelength width of the flat portion near the peak power (allowable wavelength width) of the power characteristic of the optical wavelength conversion device is approximately the same as the longitudinal mode interval of the wavelength tunable DBR semiconductor laser. In such a case, the SHG output power is stabilized, and thus a more practical short-wavelength light source can be provided.

EXAMPLE 3

A short-wavelength light source of this example and the operation thereof will be described. The short-wavelength light source of this example includes: a three-segmented domain-inverted type optical wavelength conversion device having an SHG output power characteristic with respect to the fundamental wave light wavelength (tuning curve characteristic) which has a flat portion near the peak power; and a wavelength tunable DBR semiconductor laser having two electrodes (an active region and a DBR region). This short-wavelength light source needs no electric cooling element for keeping the module temperature constant.

Figure 17:
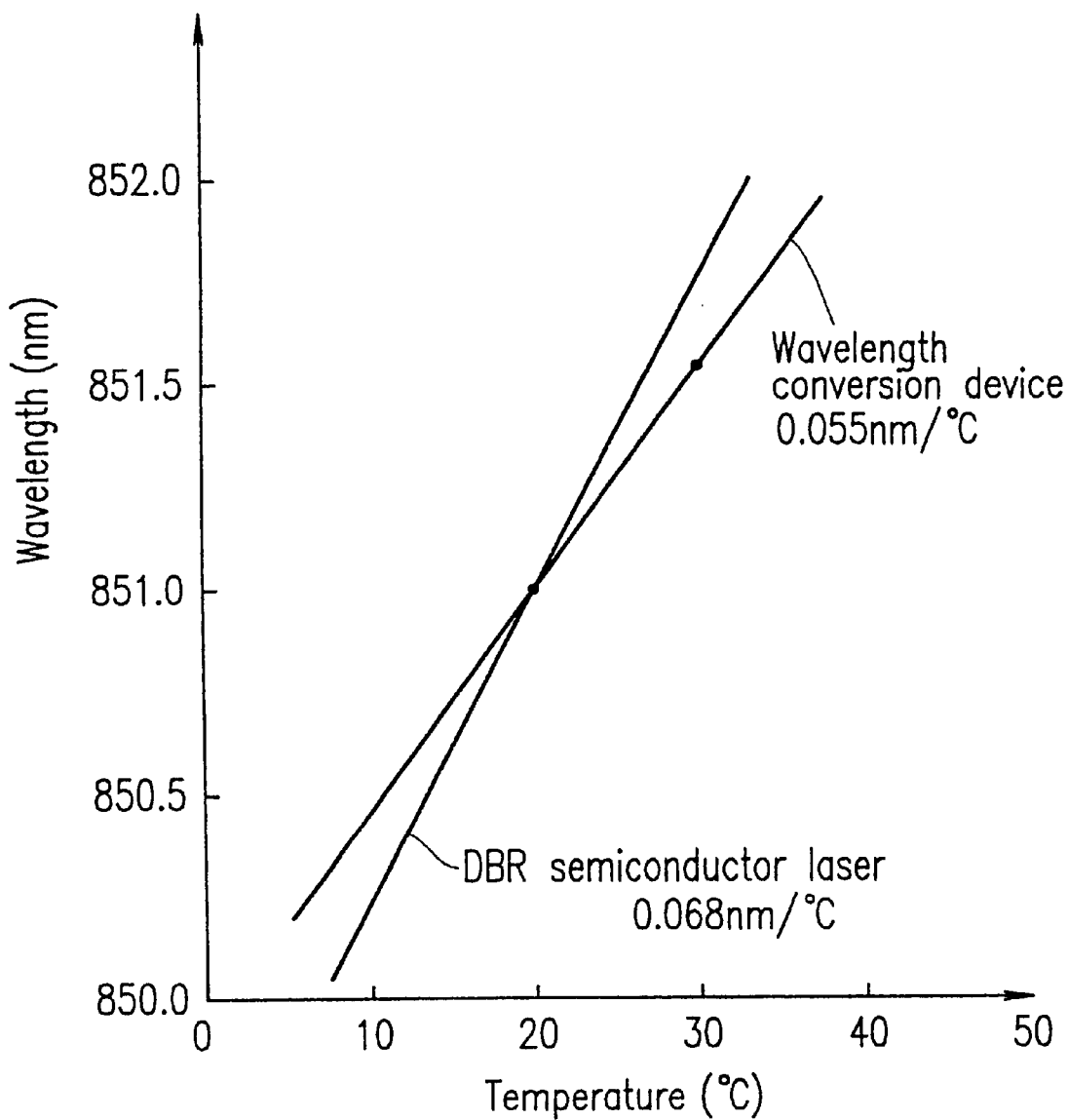
FIG. 17 is a graph showing the temperature dependency of each of the oscillation wavelength of the wavelength tunable DBR semiconductor laser and the phase match wavelength of the optical wavelength conversion device.

In a conventional short-wavelength light source, which includes: the domain-inverted type optical wavelength conversion device formed on an Mg-doped $LiNbO_2$ substrate; and the wavelength tunable DBR semiconductor laser having an about 1 mm long AlGaAs active region, exhibits a temperature dependency of the operation characteristic as shown in FIG. 17. As the module temperature increases, both the oscillation wavelength of the wavelength tunable DBR semiconductor laser and the phase match wavelength of the domain-inverted type optical wavelength conversion device shift toward a longer wavelength. Accordingly, if the module temperature fails to be kept constant using an electric cooling element, a displacement is generated between the phase match wavelength and the oscillation wavelength due to an ambient temperature change, causing a large variation in the SHG output power obtained by wavelength conversion.

On the contrary, in this example, the SHG output power is detected, and the oscillation wavelength of the wavelength tunable DBR semiconductor laser is controlled so that the oscillation wavelength is fixed within the flat portion of the SHG output power characteristic (the tuning curve characteristic) of the optical wavelength conversion device, thereby to stabilize the SHG output power.

Figure 12A:
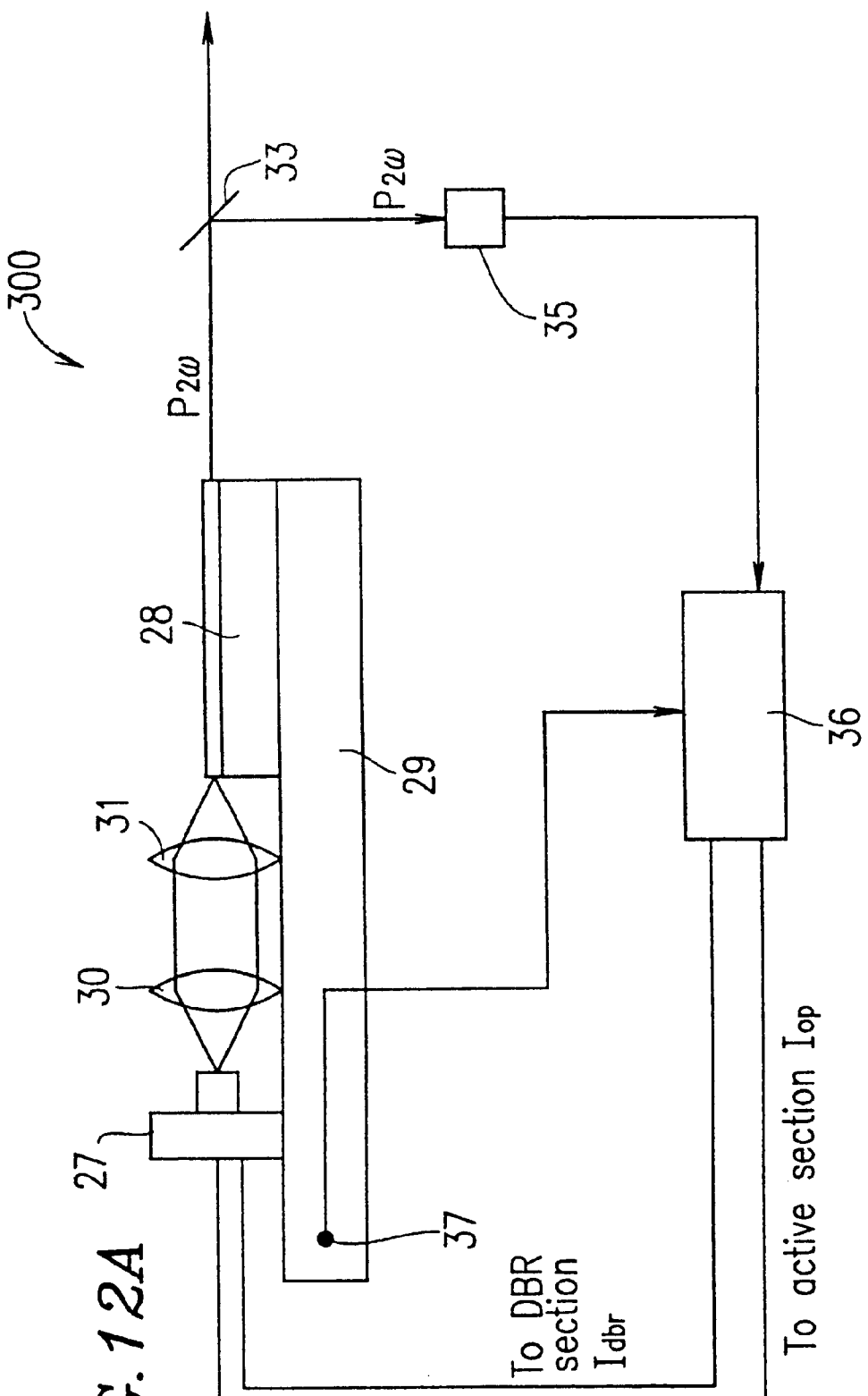
FIG. 12A is a view schematically illustrating a short-wavelength Light source of Example 3 according to the present invention.

FIG. 12A schematically shows a short-wavelength light source 300 of this example having no electric cooling element.

An optical wavelength conversion device 28 and a wavelength tunable DBR semiconductor laser 27 are secured to a module 29. The module 29 is provided with a thermistor 37 for temperature detection. The optical wavelength conversion device 28 includes three domain-inverted regions and an optical waveguide. Laser light output from the AlGaAs wavelength tunable DBR semiconductor laser 27 (oscillation wavelength: 851 nm, output power: 100 mW) is coupled to the optical waveguide of the optical wavelength conversion device 28 as fundamental wave light via a collimator lens 30 and a focusing lens 31. Since the optical waveguide of the optical wavelength conversion device 28 is formed on an x-cut substrate, it can transmit the TE mode light output from the semiconductor laser 27. Thus, light coupling is possible without using a half-wave plate.

The laser light coupled to the optical wavelength conversion device 28 is wavelength-converted by the periodic domain-inverted regions to be output from the output end face of the optical waveguide.

The output SHG output power $P_{2\omega}$ is reflected from a beam splitter 33 to be guided to an optical detector 35. The optical detector 35 sends a signal indicating the detection level of the output second harmonic wave light component $P_{2\omega}$ to a control circuit 36. The control circuit 36 controls currents injected to the active region and the DBR region of the wavelength tunable DBR semiconductor laser 27 ($I_{op}$ and $I_{dbr}$, respectively) so as to control the oscillation wavelength of the wavelength tunable DBR semiconductor laser 27.

In the short-wavelength light source 300 having the above construction, specifically, 70 mW light was coupled to the optical waveguide with using light output from the wavelength tunable DBR semiconductor laser 28 having a wavelength of 851 nm and an power of 100 mW.

In operation, a current was injected to the DBR region of the wavelength tunable DBR semiconductor laser 27 to match the oscillation wavelength of the wavelength tunable DBR semiconductor laser 27 with the phase match wavelength of 852 nm of the optical wavelength conversion device 28. Specifically, when a current of 50 mA was injected to the DBR region, the oscillation wavelength of the wavelength tunable DBR semiconductor laser 27 was changed to 852 nm to be fixed within the flat portion of the SHG output power characteristic (the tuning curve characteristic) of the optical wavelength conversion device 28. Thus, 5 mW blue light (wavelength: 426 nm) was obtained.

Figure 13:
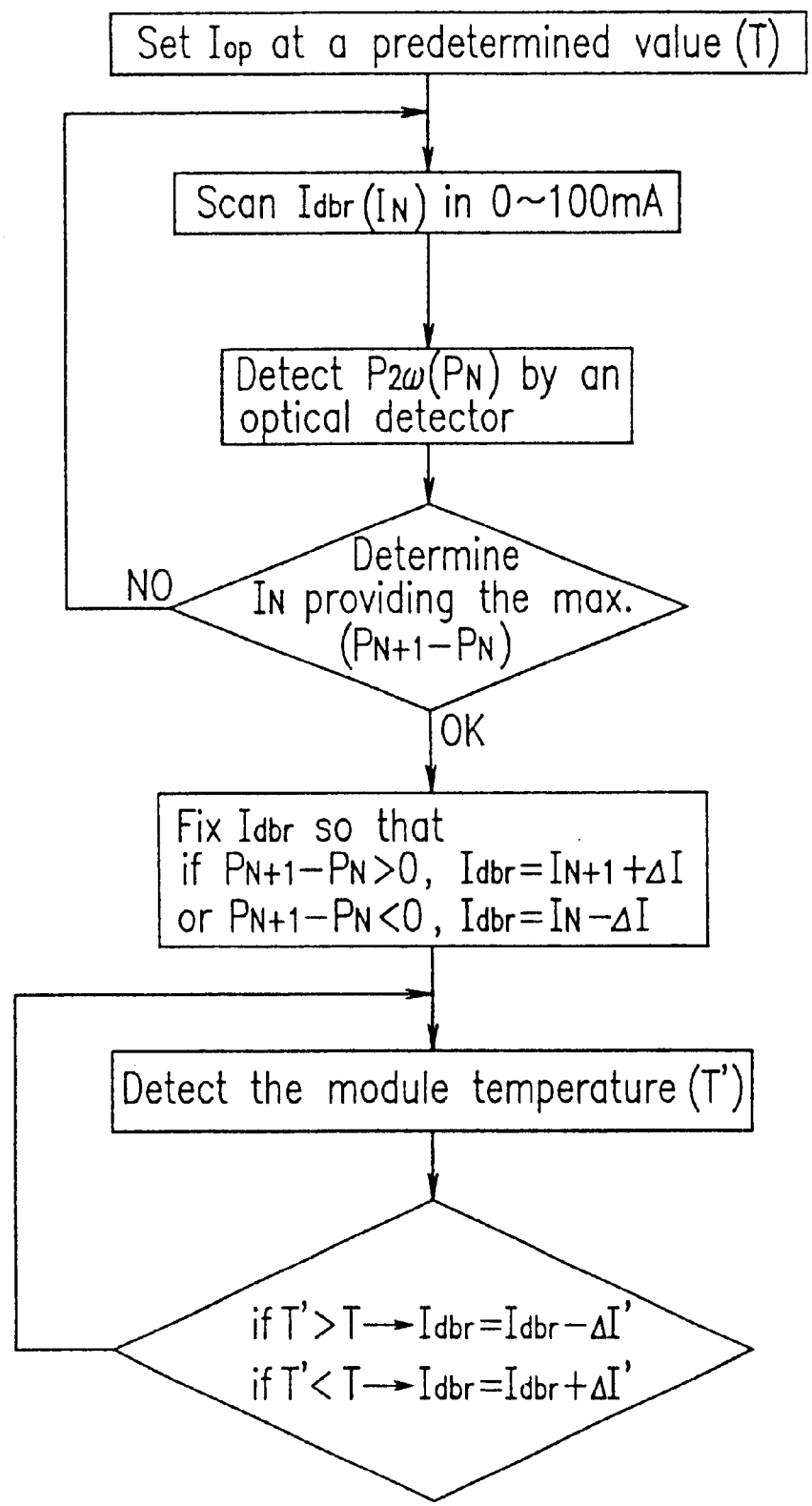
FIG. 13 is a flowchart of a control method executed for the short-wavelength light source of FIG. 12A to stabilize the SHG output power.

FIG. 13 is a flowchart of a control method for stabilizing the SHG output power while monitoring the temperature by the thermistor in the short-wavelength light source 300 of this example.

First, by a control method similar to that described in Example 2, the oscillation wavelength of the wavelength tunable DBR semiconductor laser 27 is fixed within the flat portion (corresponding to the wavelength width in which the power level decreases by 5% from the peak power level (allowable wavelength width)) of the SHG output power characteristic (tuning curve characteristic) of the optical wavelength conversion device 28.

If the relationship between the oscillation wavelength and the phase match wavelength is displaced due to a change in ambient temperature after the fixation, the SHG output power reduces. In such a case, whether the current injected to the DBR region should be increased or decreased can be determined by detecting the change in ambient temperature (module temperature) (e.g., a change from T to T').

For example, when the temperature increases (i.e., T<T'), the oscillation wavelength of the wavelength tunable DBR semiconductor laser shifts toward a longer wavelength, and the SHG output power reduces at the moment when the oscillation wavelength comes out of the allowable wavelength width of the flat portion. In such a case, by decreasing the current injected to the DBR region so that the temperature of the DBR region decreases, the oscillation wavelength can be controlled to resume the position within the flat portion. When the temperature decreases (i.e., T>T'), the current injected to the DBR region should be increased so that the temperature of the DBR region increases.

When the wavelength width of the flat portion of the SHG output power characteristic of the optical wavelength conversion device is 0.13 nm, the temperature range in which the oscillation wavelength of the wavelength tunable DBR semiconductor laser is fixed within the flat portion is about ±5° C. By predicting this relationship and also detecting ambient temperature, it is possible to fix the oscillation wavelength within the flat portion of the power characteristic. For example, when ambient temperature increases, the oscillation wavelength becomes larger than the phase match wavelength. In this case, by reducing the current $I_{dbr}$ injected to the DBR region, the oscillation wavelength can be fixed within the flat portion again.

By following the above procedure, 5 mW SHG output power was obtained with an power variation within ±10% at an ambient temperature in the range of 0° C. to 60° C. In this example, the value of the injected current $I_{dbr}$ m corresponding to the mode hopping interval shown in FIG. 6 is 5 mA. Accordingly, $\Delta I'$ corresponding to $\Delta I$ described above with respect to FIGS. 11A to 11D is set at 5 mA.

Alternatively, stabilization of SHG output power can be realized even when no temperature monitor is provided, by repeating the control method as described in Example 2 when the SHG output power decreases. In this case, a longer time is required to fix the oscillation wavelength within the flat portion of the characteristic again under control during the decrease of the SHG output power, compared with the control method following the flowchart shown in FIG. 13. However, the control circuit can be simplified. This control method is, therefore, suitable for a device used in a system in which no problem will arise even when a comparatively longer time is taken for adjusting power variation.

In this example, the case using three-segmented domain-inverted type optical wavelength conversion device having two phase adjusting sections has been described. A two-segmented domain-inverted type optical wavelength conversion device having one phase adjusting section may also be used to stabilize SHG output power as described above, by employing the control method shown in FIG. 13 with, as described in Example 1, the flat portion near the peak power of the SHG output power characteristic (tuning curve characteristic) of the optical wavelength conversion device being defined as "the portion in which the power level decreases by 20% from the peak power level". This control method can be effectively employed for a system which receives comparatively large power variation.

Alternatively, the longitudinal oscillation mode interval of the wavelength tunable DBR semiconductor laser can be reduced by increasing the length of the active region. For example, when the length of the active region of the wavelength tunable DBR semiconductor laser is 1.5 mm, the longitudinal mode interval is 0.07 nm. This is close to the allowable wavelength width, 0.06 nm, in which the power level decreases by 5% from the peak power, of the power characteristic of the domain-inverted type optical wavelength conversion device. Thus, SHG output power can be stabilized.

In this example, ACC driving has been used to keep the power of the wavelength tunable DBR semiconductor laser constant. Alternatively, APC driving can be employed by providing a photodiode upstream of the wavelength tunable DBR semiconductor laser. In this case, the SHC output power can be further stabilized. Under the condition where the oscillation wavelength of the wavelength tunable DBR semiconductor laser is fixed within the flat portion of the SHG output power characteristic of the optical wavelength conversion device and the SHG output power is stabilized, the driving current for the semiconductor laser can be subjected to APC driving so that the SHG output power is converged into a certain constant value, so as to further stabilize the SHG output power. By such an APC driving, the SEG output power can be further stabilized. In second harmonic generation, the SHG output power can be controlled using the relationship of being in proportion to the second power of the variation of the fundamental wave light power. Even if the fundamental wave light power varies, the oscillation wavelength exists in the flat portion of the SHG power characteristic. Accordingly, the fundamental wave light power can be controlled so that the SHG output power can be made constant. Thus, the SHG output power is stabilized.

The APC driving of the SHG output power is only possible when the wavelength width of the flat portion of the tuning curve characteristic of the optical wavelength conversion device is larger than the longitudinal mode interval of the oscillation wavelength of the semiconductor laser. This is one of the greatest effects of the present invention. This effect is especially convenient for applications to optical disk systems and the like since this allows for stable operation of a servo system and the like, thereby providing a large practical effect.

EXAMPLE 4

In Examples 1 and 2 above, the temperature of the module on which the wavelength tunable DBR semiconductor laser and the optical wavelength conversion device are mounted is kept constant by an electric cooling element. Accordingly, even when ACC driving is employed for the semiconductor laser, the power of the semiconductor laser, as the fundamental wave light power, is kept substantially constant. On the contrary, in Example 3 above, since the module temperature is not controlled, but varies depending on a change of ambient temperature, the power of the semiconductor laser largely varies with a change of ambient temperature. If ACC driving is employed in this case, the power of the semiconductor laser decreases at a high temperature, while it increases at a low temperature. Moreover, since the shape of the module changes with the temperature change, the efficiency of the optical coupling from the semiconductor laser to the optical waveguide changes.

In this example, in order to overcome the above problem occurring when the module temperature is not controlled, the fundamental wave light component output from the optical waveguide without being converted by the optical wavelength conversion device is detected by an optical detector. Using the detected results, the wavelength tunable DBR semiconductor laser is driven by an APC method so that the detected level is constant. Furthermore, together with this APC driving, the current injected to the DBR region of the wavelength tunable DBR semiconductor laser is controlled, so as to fix the oscillation wavelength at the phase match wavelength of the domain-inverted type optical wavelength conversion device, thereby to stabilize the SHG output power.

In the wavelength tunable DBR semiconductor laser used in this example, the oscillation wavelength shifts at a rate of 0.02 nm/10 mA with a change in the current injected to the active region. It was conventionally impossible, therefore, to employ APC driving for such a semiconductor laser. In this example, however, an optical wavelength conversion device having a tuning curve characteristic of which flat portion near the peak power has a wavelength width of 0.13 nm is used. With this wavelength width, the oscillation wavelength can exist in the flat portion of the SHG output power characteristic (tuning curve characteristic) of the optical wavelength conversion device even if APC driving is performed for the wavelength tunable DBR semiconductor laser. Thus, the wavelength tunable DBR semiconductor laser can be driven by the APC method, stabilizing the SHG output power.

In this example, the oscillation wavelength of the wavelength tunable DBR semiconductor laser has already been fixed within the flat portion of the SHG output power characteristic of the optical wavelength conversion device, to stabilize the SHG output power. Under these conditions, in order to further stabilize the SHG output power, the driving current for the semiconductor laser is driven by the APC method so that the SHG output power is converged into a certain constant value. By this APC driving, the SHG output power can be further stabilized. In second harmonic generation, the SHG output power can be controlled using the relationship of being in proportion to the second power of the variation of the fundamental wave light power. Even if the fundamental wave light power varies, the oscillation wavelength remains in the flat portion of the SHG power characteristic. Accordingly, the fundamental wave light power can be controlled so that the SHG output power is made constant. Thus, the SHG output power is further stabilized.

The APC driving of the SHG output power is only possible when the wavelength width of the flat portion of the tuning curve characteristic of the optical wavelength conversion device is larger than the longitudinal mode interval of the oscillation wavelength of the semiconductor laser. This is one of the greatest effects of the present invention. This effect is especially convenient for applications to optical disk systems and the like since this allows for stable operation of a servo system and the like, thereby providing a large practical effect.

Figure 12B:
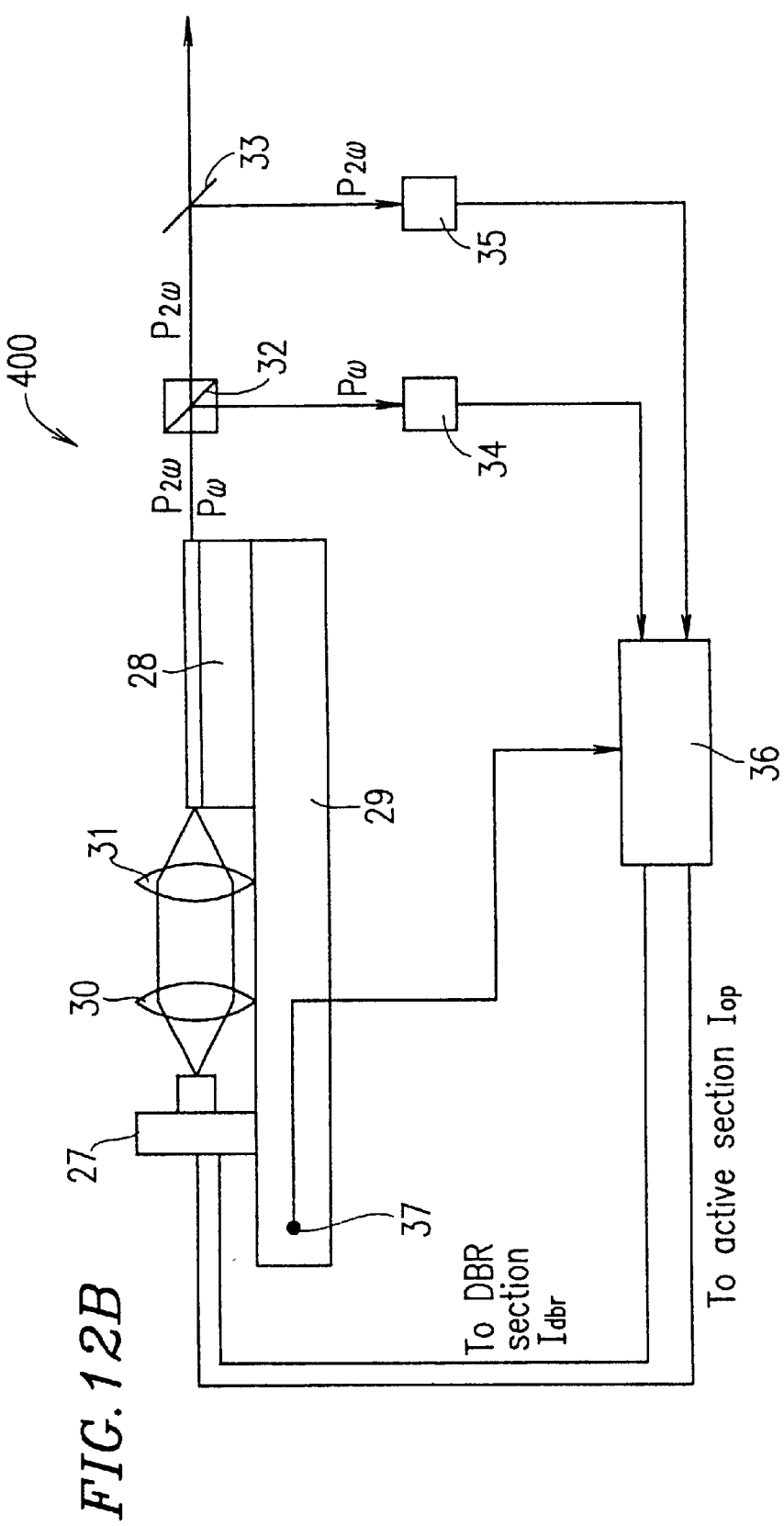
FIG. 12B is a view schematically illustrating a short-wavelength light source of Example 4 according to the present invention.

FIG. 12B schematically shows a short-wavelength light source 400 of this example.

An optical wavelength conversion device 28 and a wavelength tunable DBR semiconductor laser 27 are secured to a module 29. The optical wavelength conversion device 28 includes three domain-inverted regions and an optical waveguide. Laser light output from the AlGaAs wavelength tunable DBR semiconductor laser 27 (oscillation wavelength: 851 nm, power: 100 mW) is coupled to the optical waveguide of the optical wavelength conversion device 28 as fundamental wave light via a collimator lens 30 and a focusing lens 31. Since the optical waveguide of the optical wavelength conversion device 28 is formed on an x-cut substrate, it can transmit the TE mode light output from the semiconductor laser 27. Thus, light coupling is possible without using a half-wave plate.

The laser light coupled to the optical wavelength conversion device 28 (fundamental wave light) is wavelength-converted by the periodic domain-inverted regions, second harmonic wave light $P_{2\omega}$ obtained by the conversion is output from the output end face of the optical waveguide, together with an unconverted fundamental wave light component $P_\omega$.

The output fundamental wave light component $P_\omega$ and the second harmonic wave light $P_{2\omega}$ are separated by a wavelength selective mirror 32 composed of a dielectric multilayer film. The fundamental wave light component $P_\omega$ is guided to an optical detector 34, which then sends a signal indicating the detection level of the fundamental wave light component $P_\omega$ to a control circuit 36. The second harmonic wave light $P_{2\omega}$ is reflected from a beam splitter 33 to be guided to an optical detector 35, which then sends a signal indicating the detection level of the second harmonic wave light $P_{2\omega}$ to the control circuit 36. The control circuit 36 controls currents injected to the active region and the DBR region of the wavelength tunable DBR semiconductor laser 27 ($I_{op}$ and $I_{dbr}$, respectively) so as to control the oscillation wavelength of the wavelength tunable DBR semiconductor laser 27.

In this example, a signal sent from a thermistor 37 is not used in the above-described control.

Figure 14:
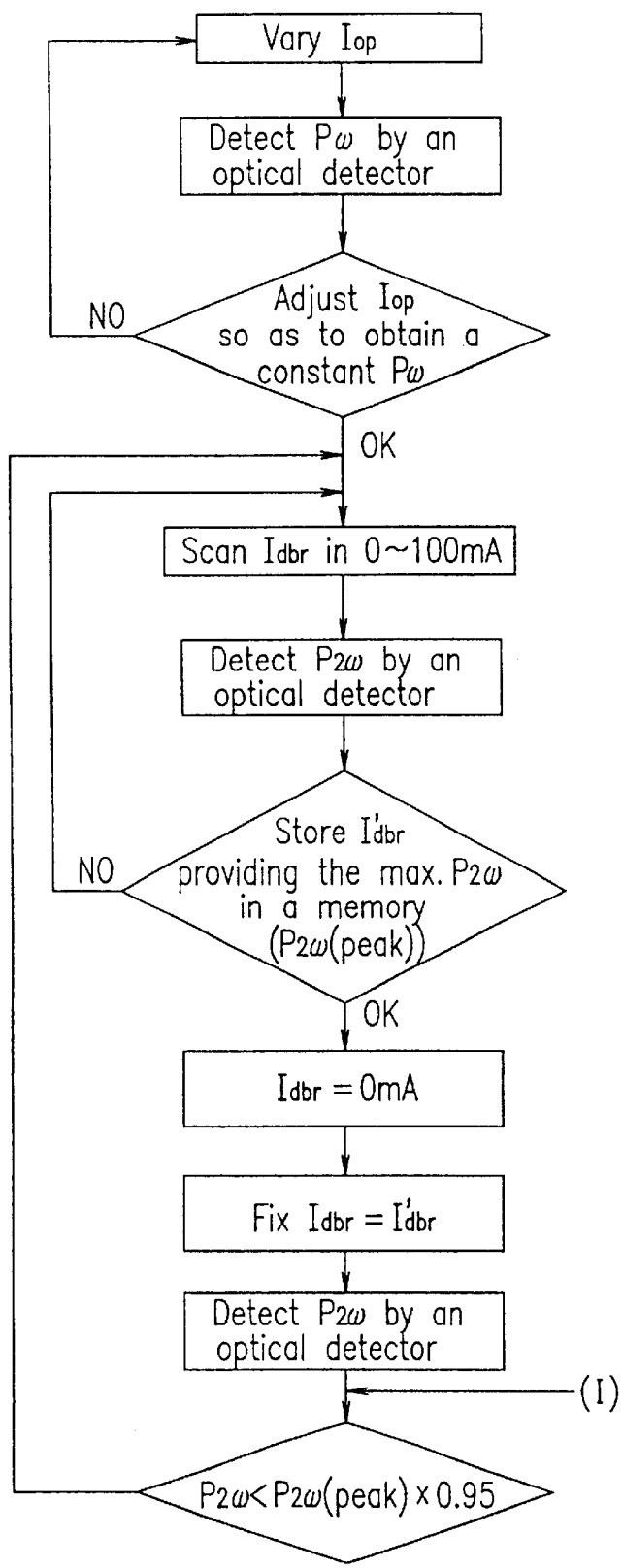
FIG. 14 is a flowchart of a control method executed for the short-wavelength light source of FIG. 12B to stabilize the SHG output power.
Figure 15:
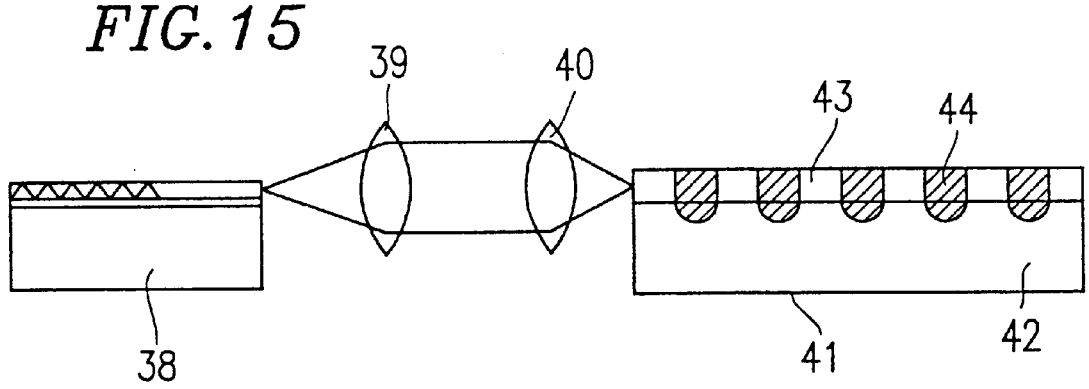
FIG. 15 is a view schematically illustrating a conventional short-wavelength light source.
Figure 16A:
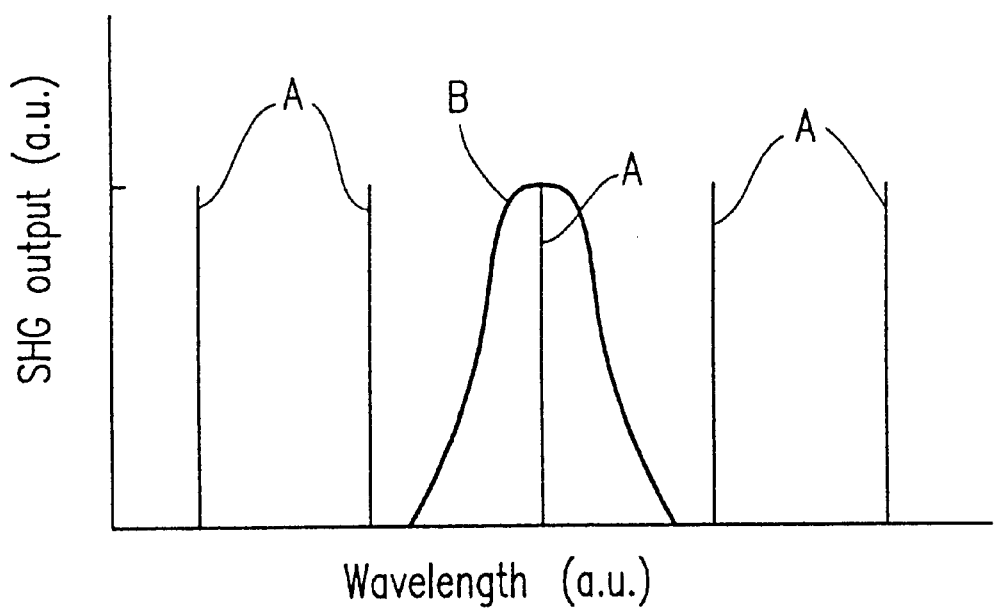
FIGS. 16A and 16B are graphs showing the conventional relationships between the oscillation wavelength of a wavelength tunable DBR semiconductor laser and the SHG output power of an optical wavelength conversion device.
Figure 16B:
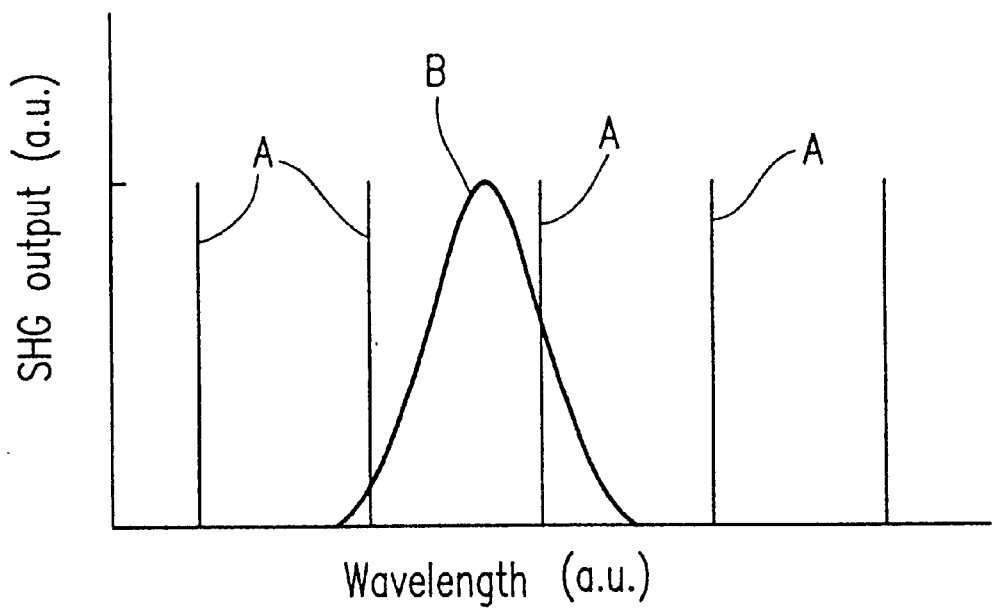

FIG. 14 is a flowchart of a control method for stabilizing the SHG output power in the short-wavelength light source 400 of this example.

First, in order to keep constant the power of the wavelength tunable DBR semiconductor laser coupled to the optical waveguide of the optical wavelength conversion device, the current $I_{op}$ injected to the active region of the wavelength tunable DBR semiconductor laser (i.e., the driving current) is controlled so that the signal detected by the optical detector 34 is maintained in a predetermined level. This control is generally performed in the order of milliseconds.

Next, in order to fix the oscillation wavelength of the wavelength tunable DBR semiconductor laser within the flat portion near the peak power of the SHG output power characteristic (tuning curve characteristic) of the optical wavelength conversion device, the current $I_{dbr}$ injected to the DBR region is controlled. More specifically, the injected current $I_{dbr}$ is scanned in the range of 0 to 100 mA. Simultaneously, blue light (second harmonic wave light) power $P_{2\omega}$ is detected by the optical detector 35. When an injected current $I'_{dbr}$ at which the blue light (second harmonic wave light) power becomes maximum is obtained, the value of the injected current $I'_{dbr}$ is stored in a memory of the control circuit. Thereafter, the current $I_{dbr}$ to be injected to the DBR region is once returned to 0 mA, and then set again at the obtained value $I'_{dbr}$.

By following the above procedure, it is possible to stably fix the oscillation wavelength of the wavelength tunable DBR semiconductor laser within the flat portion near the peak power of the SHG output power characteristic (tuning curve characteristic) of the optical wavelength conversion device, and thus to stably obtain 1.5 mW SHG output power from 50 mW semiconductor laser power. The reason why the current injected to the DBR region is once returned to 0 mA is to avoid an occurrence of a hysteresis characteristic when the wavelength tunable DBR semiconductor laser is tuned.

In the wavelength tunable DBR semiconductor laser 27 used in the short-wavelength light source 400 of this example, the longitudinal oscillation mode interval is typically 0.11 nm. The wavelength width of the flat portion of the SHG output power characteristic (tuning curve characteristic) of the optical wavelength conversion device 28 is typically 0.13 nm. In consideration of the above, the control of the current $I_{dbr}$ to be injected to the DBR region for fixing the oscillation wavelength of the wavelength tunable DBR semiconductor laser 27 within the is flat portion near the peak power of the SHG output power characteristic (tuning curve characteristic) of the optical wavelength conversion device 28 is performed in the following manner. The SHG output power is detected at a period longer then the detection period of the fundamental wave light (specifically, every several seconds), and the control of the current $I_{dbr}$ is performed when the level of the SHG output power has decreased by 3% from the peak power.

By the above control method, 1.5 mW blue light (second harmonic wave light) power can be obtained stably over the temperature range of 0 to 60° C.

Thus, by controlling the light from the wavelength tunable DBR semiconductor laser 27 (fundamental wave light) coupled to the optical waveguide of the optical wavelength conversion device 28 to be constant, as in this example, the SHG output power obtained from the optical wavelength conversion device 28 can be kept constant even if the level of the light output from the semiconductor laser 27 and the efficiency of the coupling thereof to the optical waveguide change due to a change of ambient temperature. This provides a large practical effect.

In the short-wavelength light source 400 of this example, the reason why the SHG output power obtained from the optical wavelength conversion device 28 can be stabilized without controlling the temperature of the module 29 using an electric cooling element and the like is that the optical wavelength conversion device used in this example has an SHG output power characteristic (tuning curve characteristic) of which the flat portion near the peak power has a wavelength width larger than the longitudinal oscillation mode interval of the wavelength tunable DBR semiconductor laser 27. This is one of the greatest effects of the present invention.

When the oscillation wavelength of the wavelength tunable DBR semiconductor laser 27 has been fixed within the flat portion of the power characteristic (tuning curve characteristic) of the optical wavelength conversion device 28, APC driving can be employed for the SHG output power.

In the flowchart shown in FIG. 14, the indication (I) represents that the SHG output power $P_{2\omega}$ has been detected at that point. In second harmonic generation, It is possible to control the SHG output power using the relationship of being in proportion of the second power of the fundamental wave light power. Even if the fundamental wave light power varies, the oscillation wavelength exists in the flat portion of the SHG power characteristic. Accordingly, the fundamental wave light power can be controlled so that the SHG output power is made constant. Thus, the SHG output power is further stabilized. The APC driving of the SHG output power is very convenient for applications to optical disk systems and the like since this allows for stable operation of a servo system and the like, thereby providing a large practical effect.

In the above description of this example, the current $I_{dbr}$ injected to the DBR region for fixing the oscillation wavelength of the wavelength tunable DBR semiconductor laser 27 within the flat portion near the peak power of the SHG output power characteristic (tuning curve characteristic) of the optical wavelength conversion device 28 is controlled when the level of the SHG output power decreases by 3% from the peak power. This threshold level can be freely set in consideration of the conditions of the system. For example, for a system which accepts power variation up to about 10%, the above control may be set so as to be performed when the SHG output power decreases by 10% from the peak power. By this control, substantially the same effect of stabilizing the SHG output power can be obtained.

Substantially the same effect of stabilizing the SHG output power can also be obtained by using the control method described in Example 2 for the control of the current $I_{dbr}$ injected to the DBR region, to fix the oscillation wavelength of the wavelength tunable DBR semiconductor laser 27 within the flat portion near the peak power of the SHG output power characteristic (tuning curve characteristic) of the optical wavelength conversion device 28.

Thus, in the above examples, the present invention has been applied to the short-wavelength light source including: the domain-inverted type optical wavelength conversion device having the periodic domain-inverted regions and the optical waveguide, and the wavelength tunable DBR semiconductor laser, as an example. The phase adjusting section can be designed and formed with high precision by a semiconductor process, and uniform phase matching conditions can be easily maintained inside the optical waveguide in the length direction. Accordingly, the optical wavelength conversion device having an SHG output power characteristic which has a flat portion near the peak power of the tuning curve can be easily fabricated with high precision. Further, a dielectric crystal such as LiNbO$_3$ and LiTaO$_3$ (which may be generically denoted by LiTa$_x$Nb$_{1-x}$O$_3$ ($0 \leq x \leq 1$)) is a suitable material for the fabrication of the optical wavelength conversion device used in the present invention by the above-described semiconductor process, since a crystal having a diameter of 2 to 3 inches can be easily produced by a CZ method.

In the above examples, the present invention has been described using the domain-inverted type optical wavelength conversion device employing the optical waveguide type quasi phase match method as an example. However, in the case where a watt-level semiconductor laser light is coupled to the optical waveguide type optical wavelength conversion device as fundamental wave light for the purpose of obtaining higher SHG output power, the device may have an optical defect due to an excessively large power density of the coupled light. If a domain-inverted type optical wavelength conversion device of a bulk type quasi phase match method is used, the power density can be reduced even in such a case, thereby realizing generation of watt-level SHG output power. In the domain-inverted type optical wavelength conversion device of the bulk type quasi phase match method, also, it is possible to design and fabricate the optical wavelength conversion device having an SHG output power characteristic (tuning curve characteristic) which has a flat portion near the peak power. Stabilization of the SHG output power is realized by the control as described in the above examples.

A film having a refractive index dispersion may be formed between the nonlinear optical crystals to form the phase adjusting section, so as to realize the optical wavelength conversion device having an SHG output power characteristic (tuning curve characteristic) which has a flat portion near the peak power. Thus, by using a crystal which utilizes refractive index dispersion to realize phase match, such as a KTP crystal and a KNbO$_3$ crystal, to fabricate the optical wavelength conversion device, the effects of the present invention described above can be obtained. Thus, a stable short-wavelength light source using the power of the wavelength tunable semiconductor laser as fundamental wave light is realized.

EXAMPLE 5

The short-wavelength light source (blue light source) employing APC driving so as to obtain constant SHG output power, as described in Examples 1 to 4, has effects as described above even when the wavelength is modulated. In this example, this point will be described, using as an example a short-wavelength light source including a three-segmented domain-inverted type optical wavelength conversion device where the SHG output power characteristic with respect to fundamental wave light wavelength exhibits a flat peak characteristic and a wavelength tunable DBR semiconductor laser having two electrodes (an active region and a DBR region).

Figure 18:
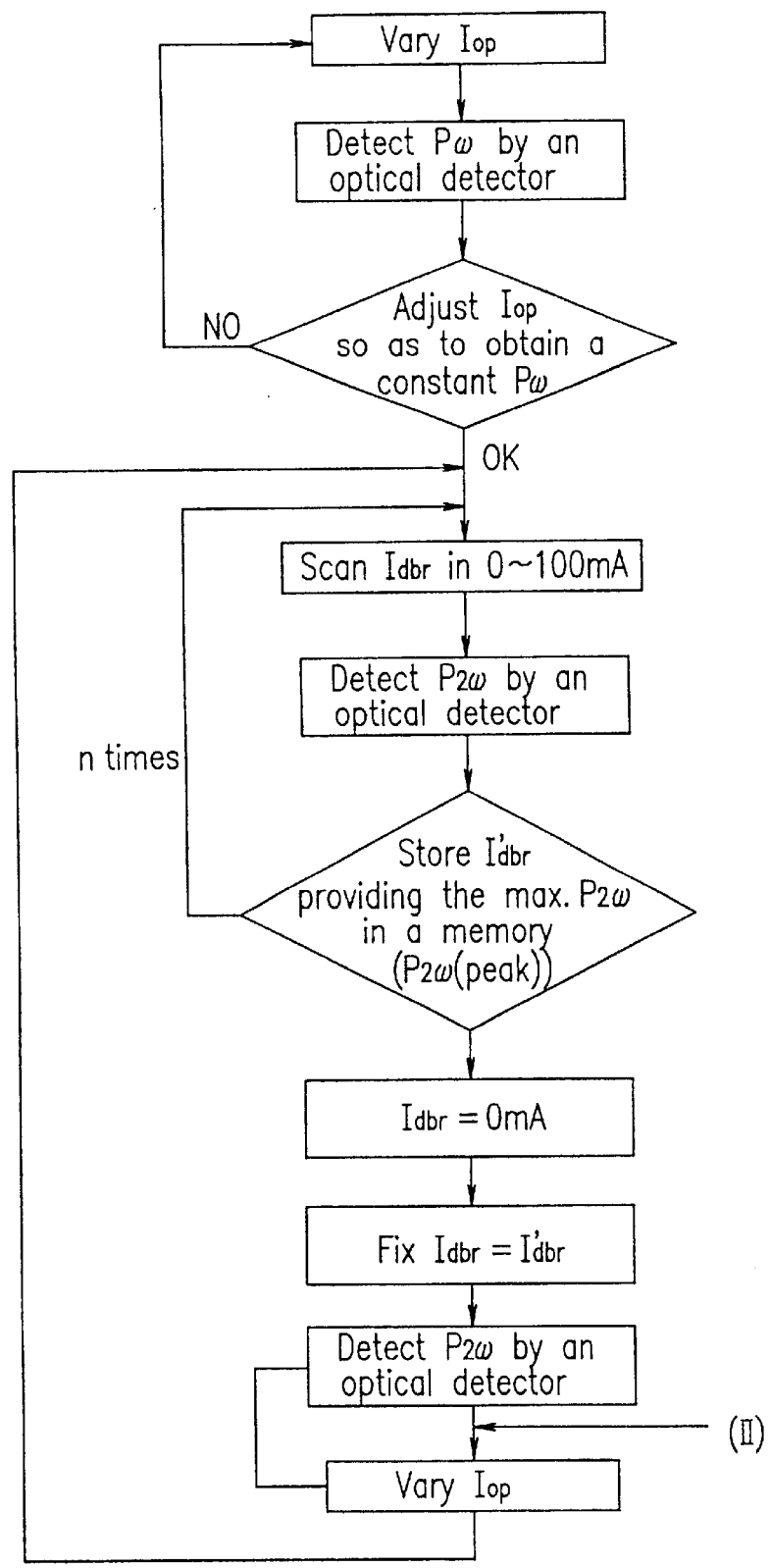
FIG. 18 is a flowchart of a control method in Example 5 according to the present invention executed for the short-wavelength light source of FIG. 12B to stabilize the SHG output power.

FIG. 18 is a flowchart of a control method for stabilizing the second harmonic wave light output according to the above technique for the short-wavelength light source 400 described with reference to FIG. 12B. In this example, the power of the wavelength tunable DBR semiconductor laser (fundamental wave light power) is set at 100 mW.

First, in order to keep constant the power of the wavelength tunable DBR semiconductor laser coupled to the optical waveguide of the optical wavelength conversion device, the current $I_{op}$ injected to the active region of the wavelength tunable DBR semiconductor (i.e., driving current) is controlled so that the detected signal output from the optical detector 34 for detecting the fundamental wave light power $P_\omega$ output from the optical waveguide is kept at a constant level (the first control). This control is performed in the order of milliseconds, to adjust so that the fundamental wave light power $P_\omega$ output from the optical waveguide is constant. Thus, APC driving for the fundamental wave light power is realized.

Next, the current $I_{dbr}$ injected to the DBR region is controlled in order to fix the oscillation wavelength of the wavelength tunable DBR semiconductor laser within the flat portion near the power peak of the SHG output power characteristic (tuning curve characteristic) of the optical wavelength conversion device (the second control). More specifically, the injected current $I_{dbr}$ is scanned in the range of 0 to 100 mA. Simultaneously, blue light (second harmonic wave light) power $P_{2\omega}$ is detected by the optical detector 35. When an injected current $I'_{dbr}$ at which the blue light (second harmonic wave light) power becomes maximum is obtained, the value of the injected current $I'_{dbr}$ is stored in a memory of the control circuit. Thereafter, the current $I_{dbr}$ to be injected to the DBR region is once returned to 0 mA, and then set again at the obtained value $I'_{dbr}$.

By following the above procedure, it is possible to stably fix the oscillation wavelength of the wavelength tunable DBR semiconductor laser within the flat portion near the peak power of the SHG output power characteristic (tuning curve characteristic) of the optical wavelength conversion device, and thus to stably obtain second harmonic wave light having a peak power of 14 mW (duty 33%, average light power: 4.7 mW) from 100 mW semiconductor laser power, for example. The reason why the current injected to the DBR region is once returned to 0 mA is to avoid an occurrence of a hysteresis characteristic when the wavelength tunable DBR semiconductor laser is tuned. In the wavelength tunable DBR semiconductor laser 27 used in the short-wavelength light source of this example, the longitudinal oscillation mode interval is typically 0.11 nm.

Thereafter, the driving current $I_{op}$ is adjusted again so that the blue light (second harmonic wave light) power $P_{2\omega}$ becomes a desired set value of $P_{2\omega}(0)$ (the third control). In the first control, the fundamental wave light power $P_\omega$ is detected by the optical detector 34. In the third control, the blue light (second harmonic wave light) power $P_{2\omega}$ is detected by the optical detector 34, which is then sent to the control circuit 36 for feedback power control. In the flowchart shown in FIG. 18, the indication (II) represents the comparison of the SHG output power with the set value $P_{2\omega}(0)$. The APC control is performed so as to obtain the set value, which is, for example, 15 mW as SHG peak power (duty: 33%, average light power: 5 mW).

In the above control method, also, the oscillation wavelength of the wavelength tunable DBR semiconductor laser 27 coupled to the optical waveguide of the optical wavelength conversion device 28 is fixed within the flat portion near the peak of the wavelength match characteristic curve of the optical wavelength conversion device 28. Accordingly, as the driving current increases, the blue light (second harmonic wave light) power increases, realizing APC operation. As a result of the above-described control, the average power of the blue light (second harmonic wave light) can be controlled to be 5 mW and the peak power thereof can be stably controlled to be 15 mW.

Thus, the short-wavelength light source including the optical wavelength conversion device exhibiting a peak flat SHG output power characteristic with respect to the fundamental wave light wavelength and the wavelength tunable DBR semiconductor laser can stabilize the blue light (second harmonic wave light) peak power even during modulation operation. The practical effect is therefore great.

In this example, APC driving for the blue light (second harmonic wave light) power is employed as the third control. In the case where high-precision control of the peak power is not required, stabilization of the peak power may be performed by the first and second controls. In this case, however, it is required to pre-recognize the level of the fundamental wave light power.

As described above, the short-wavelength light source in which modulated peak power is controlled is especially effective when it is used for optical information processing apparatus such as an optical disk drive and a photoprinter.

Figure 19:
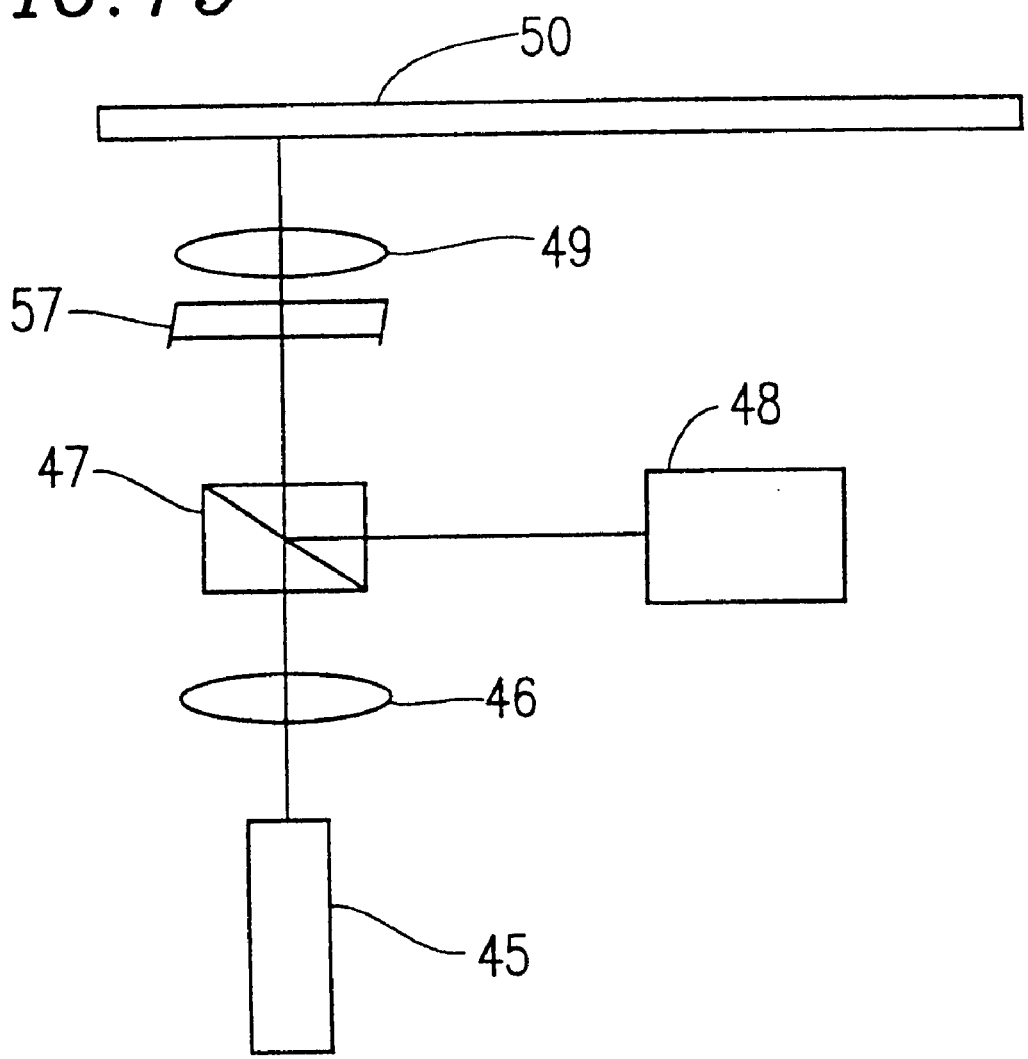
FIG. 19 is a view schematically illustrating an information recording/reproduction system using a phase transfer type optical disk, including a short-wavelength light source of Example 5 according to the present invention.

FIG. 19 schematically illustrates an information recording/reproduction system using a phase change type optical disk, including the short-wavelength light source according to the present invention.

Referring to FIG. 19, light output from a short-wavelength light source 45 is collimated by a lens 46, passes through a polarization beam splitter 47 and a λ/4 plate 57, and is converged on an optical disk 50 via an objective lens 49. Light reflected from the optical disk 50 is collimated by the objective lens 49, passes through the λ/4 plate 57, and is reflected from the polarization beam splitter 47 to be guided to a detector 48 where a signal is read.

In the phase change type optical disk, information (recorded marks) is recorded utilizing the difference in the refractive index between the amorphous state and the crystalline state of a material constituting a recording layer. More specifically, a recorded mark is formed by exposing the crystalline recording layer to laser light to raise the temperature of the exposed portion above the melting point of the material and then rapidly cool so as to cause the change to the amorphous state. The recording mark can be deleted by increasing the temperature of the recording layer to a temperature (less than the melting point) at which the amorphous portion changes to a crystalline state.

Thus, in the phase change optical disk, a recording mark is formed by a thermal phenomenon of the recording layer. In order to obtain uniform recording marks, it is required to control the laser power emitted during recording and deletion. The short-wavelength light source of this example, where the blue light peak power is controlled according to the flowchart shown in FIG. 18, allows for formation and deletion of uniform recording marks, realizing a stable recording/reproduction system.

When an optical wavelength conversion device having no flat peak SHG output power characteristic is used for the short-wavelength light source, it is difficult to control the peak power during modulation, failing to delete a mark with a signal intensity of 20 dB or more. On the contrary, by using the short-wavelength light source of this example, uniform mark formation with a deletion rate of about 30 dB and a signal intensity of 50 dB or more is realized.

Figure 20:
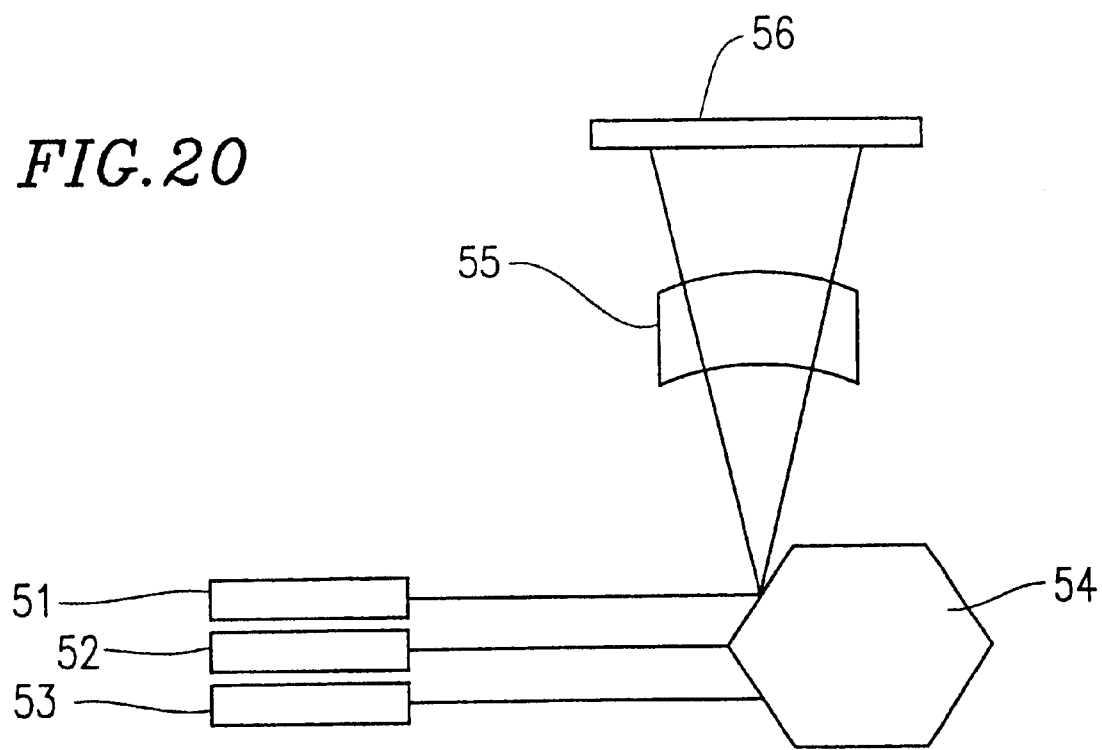
FIG. 20 is a view schematically illustrating a photoprinter system, including the short-wavelength light source of Example 5 according to the present invention.

FIG. 20 schematically illustrates a photoprinter system including the short-wavelength light source of this example.

The photoprinter system includes a red laser light source 51, a green coherent light source 52, and a blue laser light source short-wavelength light source) 53 of which power during modulation is stabilized as set forth in this example are used as light sources. Light beams output from the light sources 51, 52, and 53 are oriented by a polygon mirror 54 and converged on a color paper sheet 56 via a Fθ lens 55. In this way, digital image data is drawn on the color paper sheet 56. In order to obtain a very fine image on the color paper sheet 56, the light sources 51 to 53 need to be controlled with high precision. This can be attained by using the short-wavelength light source of this example which can stabilize blue light peek power according to the flowchart shown in FIG. 18, as the blue light source 53.

In this example, the effect obtained during light source modulation was described. The short-wavelength light source as described in Examples 1 to 4, which performs power stabilization control for continuous light, has a large practical effect when it is used for applications where modulation of a light source is not required, such as a photoprinter using reproduction of information from an optical disk and an external modulator.

In Examples 1 to 5, the wavelength tunable DBR semiconductor laser having two electrodes has been used as a wavelength tunable semiconductor laser. Alternatively, the short-wavelength light source may use output light of a wavelength tunable semiconductor laser which can receive feedback of light having a specific wavelength from an external cavity mirror, as fundamental wave light. In this construction, also, the effects as described above can be obtained. In this case, a reflective grating, a low pass filter, an etharon, or the like may be used as the optical wavelength conversion device.

The present invention is further intended to stabilize the power of the optical wavelength conversion device utilizing a nonlinear optical effect and provide a device structure which can change the phase match wavelength stably while maintaining a high efficiency characteristic. Specifically, a phase adjusting section is provided between nonlinear optical crystals having an identical phase matching conditions to allow the phase match wavelength to be stably changed by varying the refractive index or length of the phase adjusting section. Examples of the present invention based on the above intention will be described with respect to the relevant drawings.

EXAMPLE 6

First, the principal of tuning phase match wavelength of the wavelength conversion device will be described.

Figure 21A:
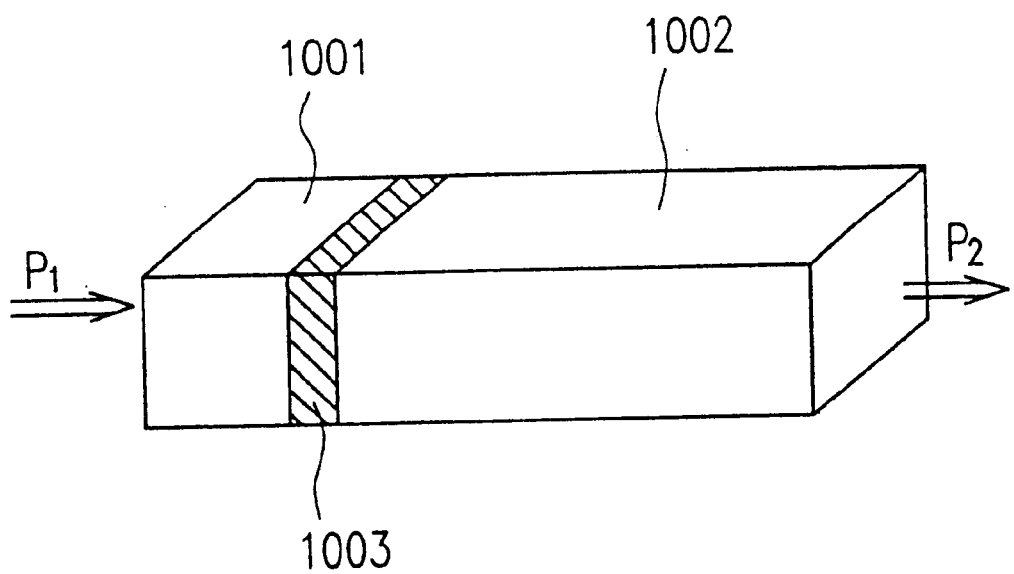
FIG. 21A is a perspective view of an optical wavelength conversion device of Example 6 according to the present invention.
Figure 21B:
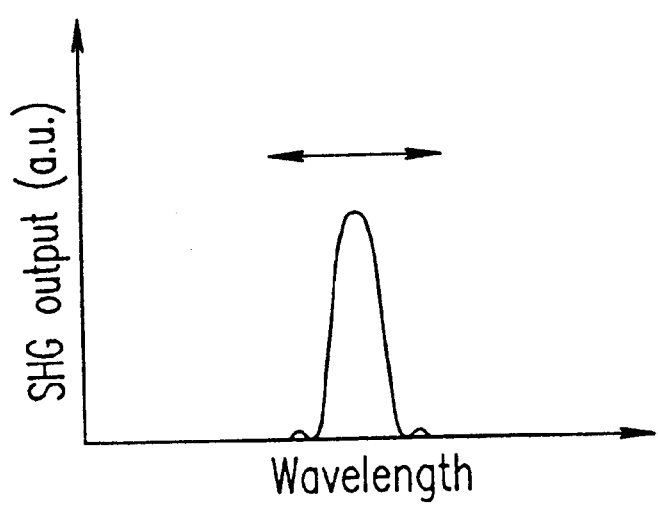
FIG. 21B is a graph showing the phase matching characteristic of the optical wavelength conversion device of FIG. 21A.

FIG. 21A illustrates an optical wavelength conversion device according to the present invention, and FIG. 21B shows the phase matching characteristic of the optical wavelength conversion device of the present invention.

The optical wavelength conversion device of the present invention includes two nonlinear optical crystals 1001 and 1002 having the same phase matching conditions, and a phase adjusting section 1003 formed between the two crystals 1001 and 1002. Fundamental light P1 incident on one end of the nonlinear optical crystal 1001 of the optical wavelength conversion device passes through the nonlinear optical crystal 1001, the phase adjusting section 1003, and the nonlinear optical crystal 1002 in this order, to be converted into second harmonic wave light P2.

Hereinbelow, assuming that the wavelengths of the fundamental wave light P1 and the second harmonic wave light P2 are λ and λ/2, respectively, the generation of the second harmonic wave light P2 will be described.

When the phase matching conditions are satisfied, the refractive indices Nw and N2w actually experienced by the fundamental wave light and the second harmonic wave light in the nonlinear optical crystals 1001 and 1002 are the same. In the phase adjusting section 1003, if the relationship of Nw=N2w is also satisfied, the fundamental wave light and the second harmonic wave light phase-match with each other in the nonlinear optical crystal 1002 while maintaining the relationship between the fundamental wave light and the second harmonic wave light generated in the crystal 1001, irrespective of the existence of the phase adjusting section 1003, causing no variation in the phase match wavelength. However, by forming the phase adjusting section 1003 made of a material having a dispersion different from that of the nonlinear optical crystals 1001 and 1002, the phase relationship between the fundamental wave light and the second harmonic wave light generated in the nonlinear optical crystal 1002 becomes different from that generated in the nonlinear optical crystal 1002, causing an interference effect.

Figure 22:
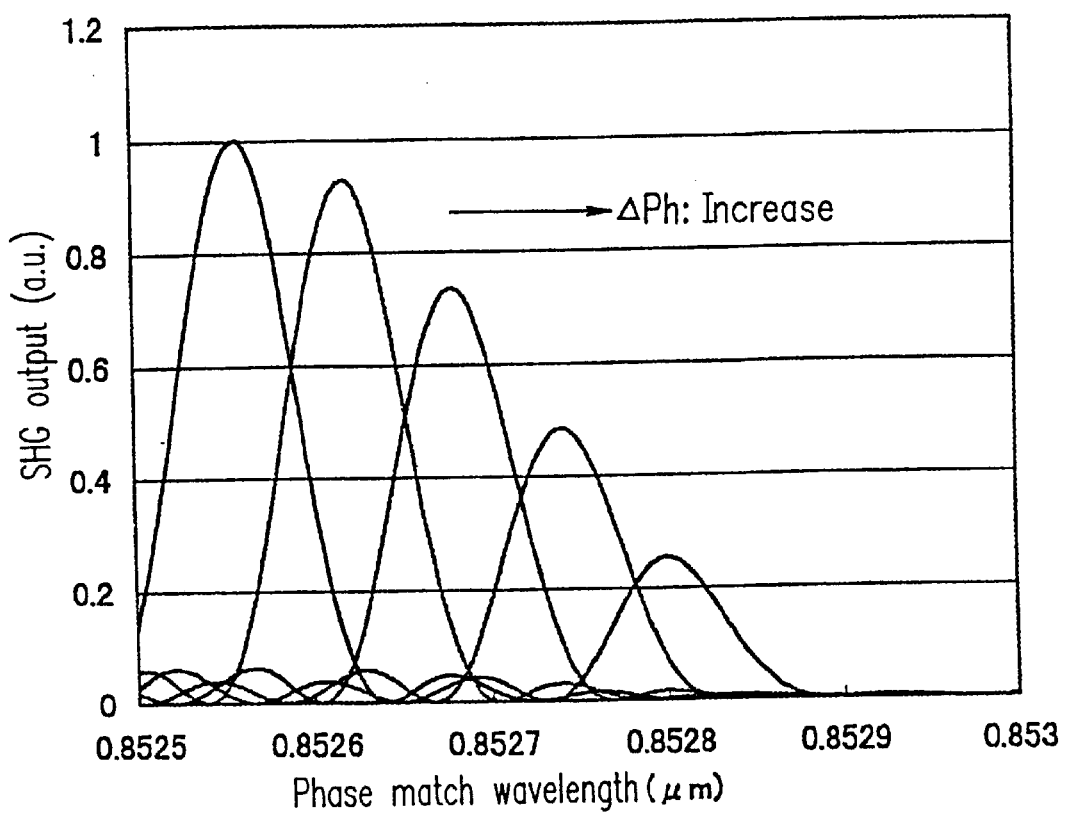
FIG. 22 is a graph showing a change of the phase matching characteristic of the optical wavelength conversion device of FIG. 21A.

The calculation results of the phase matching characteristic obtained in the above case are shown in FIG. 22. When the change amount in the phase relationship in the phase adjusting section 1003, Ph=λ/2(N2w−Nw), is ΔPh, as ΔPh changes, the peak value of the phase matching characteristic (phase match curve) shifts, as shown in FIG. 22. The conversion efficiency reduces to about a half when ΔPh/Ph is about 0.5.

From the above results, the inventors of the present application found that by varying ΔPh of the phase adjusting section 1003, the phase match wavelength can be changed although the conversion efficiency reduces.

Widening the tunable range of phase match wavelength was then examined.

The phase match wavelength can be changed by varying ΔPh of the phase adjusting section 1003, as described above. However, the resultant change amount of the phase match wavelength is limited. In examination for widening the change amount, it was found that the wavelength tunable range of the optical wavelength conversion device can be widened by increasing the number of the phase adjusting sections 1003. This will be described in detail, taking an optical wavelength conversion device having a periodic domain-inverted structure formed on an LiNbO$_3$ crystal as an example.

Figure 23:
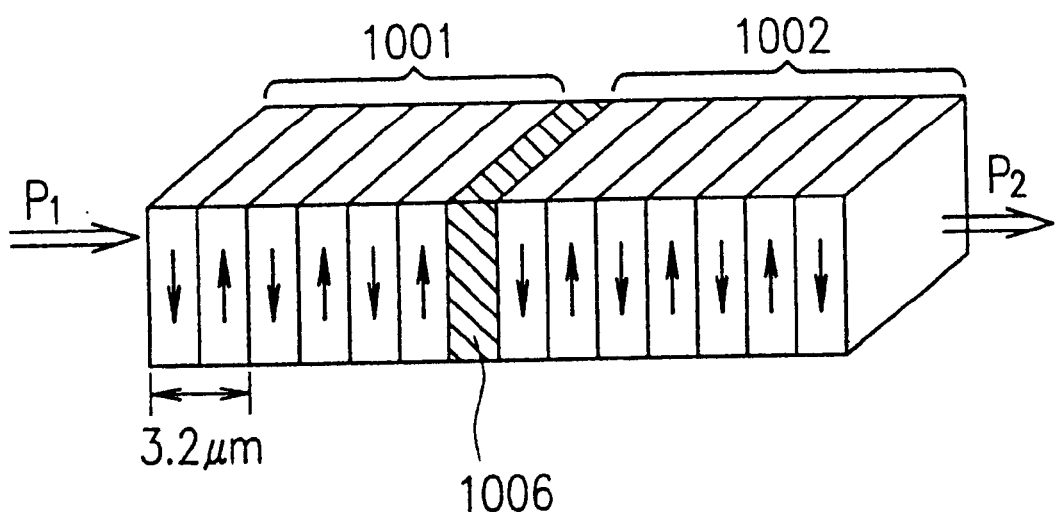
FIG. 23 is another perspective view of the optical wavelength conversion device of Example 6 according to the present invention.

FIG. 23 illustrates an optical wavelength conversion device according to the present invention.

In this device, a crystal 1006 is disposed as a phase adjusting section between crystals 1001 and 1002 having periodic domain-inverted structure formed on an LiNbO$_3$ crystal. The refractive index of the crystal 1006 can be changed by applying a voltage thereto. The period of the domain-inverted structure is about 3.2 μm, and the center wavelength of the phase match wavelength is about 852.5 nm The difference ΔPh is generated by changing the refractive index of the liquid crystal 1006, and thus the phase match wavelength can be varied.

Figure 24:
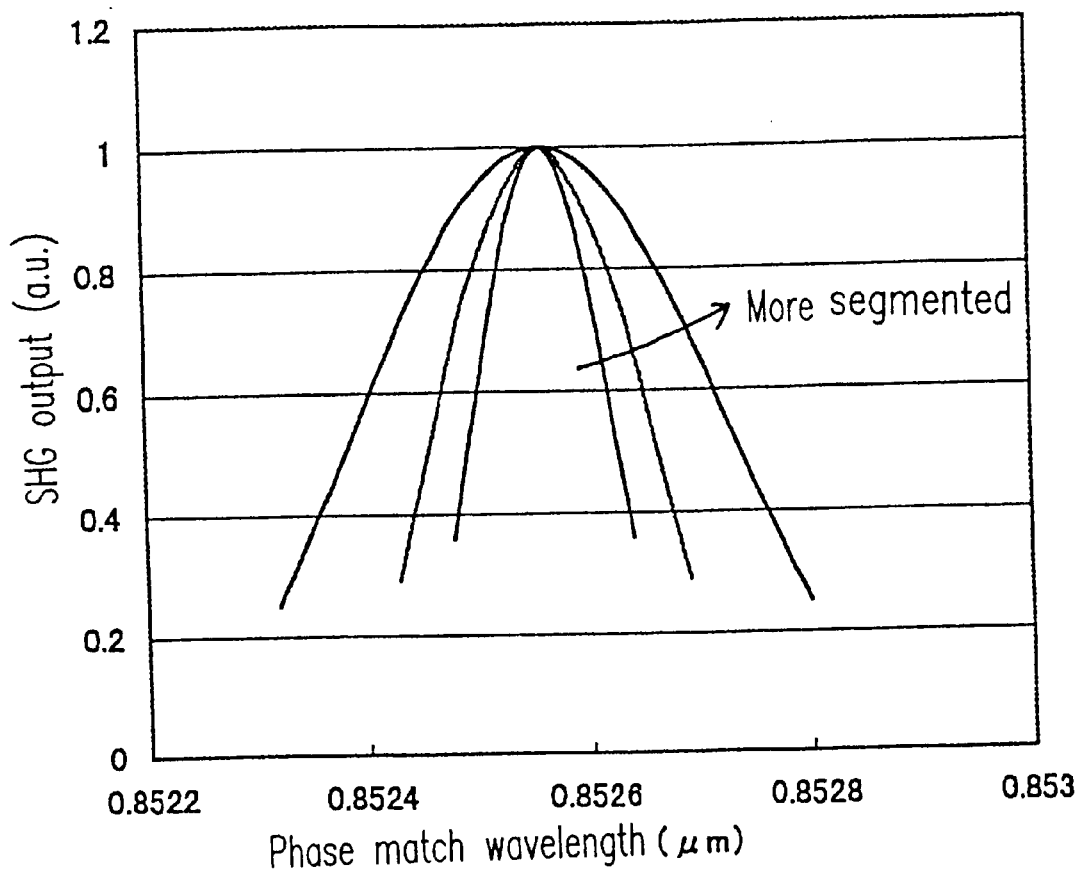
FIG. 24 is a graph showing a change of the phase matching characteristic with the change of the number of phase adjusting sections in the optical wavelength conversion device of Example 6.

The number of segmented nonlinear optical crystals was increased to provide a plurality of phase adjusting sections and the relationship between the phase match wavelength tunable range and the number of crystals was examined. FIG. 24 shows the relationship between the phase match wavelength and the conversion efficiency when a plurality of phase adjusting sections are provided.

From FIG. 24, it is found that as the number of segmented crystals increases, the phase match wavelength tunable range is widened. When the device length is 10 mm, the wavelength tunable range (full width at half maximum) is about 0.14 nm for two-segmented structure, about 0.2 nm for three-segmented structure, and about 0.34 nm for five-segmented structure, increasing in proportion to the number of segmented crystals.

In the case of $LiNbO_3$ crystal, the wavelength tunable range can be easily determined based on the above results. In the case of the device using a $LiNbO_3$ crystal having a length of 10 nm, when the wavelength tunable range of $\Delta\lambda$ in full width at half maximum is required, the number of segmented crystals can be $\Delta\lambda/0.07$ nm. Also, the number of segmented crystals can be estimated as $\Delta\lambda/0.07$ nm×(10 mm/L) when the device length is L. In this way, the wavelength tunable range can be easily widened by increasing the number of segmented crystals.

The substantially the same effects as those described above were obtained in the case of MgO-doped $LiNbO_3$ crystal.

Then, the length of the plurality of crystals was examined.

The wavelength tunable characteristic in the case where the lengths of the crystals on both sides of the phase adjusting section are different in a two-segmented structure was examined. As a result, it was found that the position of the phase adjusting section is quite influential to the wavelength tunable characteristic. However, it was found that as the number of phase adjusting sections increases, the difference in the crystal length influences the phase match wavelength tunable characteristic. More specifically, in a three-segmented structure, as the variation in the crystal length increases, the phase match wavelength tunable range is narrowed. For example, while a 10% or less variation in the crystal length does not influence the phase match wavelength tunable range, a 40% or more variation reduces the phase match wavelength tunable range by about 10%. As the variation is greater, the phase match wavelength tunable range becomes smaller.

From the above results, it is found that the variation in length between segmented crystals is preferably suppressed to 40% or less. It is more preferable to suppress the variation to 10% or less if a more efficient characteristic is desired.

The phase match wavelength tunable wavelength conversion device may have a construction including a fine-movable stage.

In such a case, the distance between crystals is controlled with high precision using a fine-movable stage including a piezo-element. This allowed for precise control of the phase match wavelength. In this case, it is important to insert a material having a dispersion property between the crystals. The dispersion property hardly differs between fundamental wave light and second harmonic wave light in a gas atmosphere. Accordingly, ΔPh is not generated even if the length of the phase adjusting section is changed. Using liquid such as matching oil or a plastic material, ΔPh is generated and thus the phase match wavelength can be varied.

The relationship between ΔPh and the conversion efficiency when the number of segmented crystals is increased is as follows. When the value of ΔPh/Ph becomes about 0.5, the conversion efficiency reduces to about 50%. Accordingly, the range in which the phase adjusting section can vary the value of ΔPh is preferably set at a range in which the value of ΔPh /Ph is about 0.5 or less. If the range in which the phase adjusting section can vary the value of ΔPh exceeds the above range, reduction of the conversion efficiency becomes great.

Thus, it is not preferable to increase the range in which the phase adjusting section can vary the value of ΔPh because this reduces the conversion efficiency. Accordingly, the increase of the wavelength tunable range is preferably achieved by increasing the number of segmented crystals to increase the number of phase adjusting sections.

The phase match wavelength tunable wavelength conversion device can be used for, not only second harmonic generation, but also parametric generation. A wavelength conversion device realizing parametric generation in a periodic domain-inverted structure has been applied for a wavelength tunable light source. Conventionally, however, a different periodic domain-inverted structure is required to tune the generated wavelength, which makes it difficult to perform continuous wavelength tuning. Second harmonic generation, which is one type of parametric generation, allows for phase match wavelength tuning with a similar device structure. It is therefore useful to utilize the present invention for parametric generation since a continuous wavelength tunable device can be realized. The present invention is also applicable to wavelength conversion for sum frequency generation, differential frequency generation, and the like.

In this example, the case of a single pass of fundamental wave light for optical wavelength conversion has been described. This is especially effective when the optical wavelength conversion device is inserted in a cavity to achieve high efficiency.

For example, a linear optical crystal or a nonlinear optical crystal having a domain-inverted structure is inserted in a cavity composed of two cavity mirrors. The power of fundamental wave light inside the cavity is increased by allowing the fundamental wave light to resonate in the cavity, to increase the conversion efficiency. In such a construction, however, it is difficult to control the cavity length, as well as the length, position and refractive index of the crystal, and the like, so that the oscillation conditions of the fundamental wave light and the phase matching conditions are satisfied simultaneously. This problem can be overcome by inserting the optical wavelength conversion device of this example in the cavity. More specifically, the phase adjusting section is adjusted so that the phase matching conditions are satisfied under the conditions where the distance between the mirrors of the cavity has been adjusted 80 that the oscillation conditions of fundamental wave light are satisfied.

Moreover, a double cavity structure where fundamental wave light and second harmonic wave light are oscillated simultaneously in the cavity can also be realized. In the double cavity structure, fundamental wave light and second harmonic wave light must satisfy the oscillation conditions in the cavity simultaneously. Accordingly, extremely strict conditions for the refractive index, the cavity length, and the wavelength stability are required. Using the optical wavelength conversion device of this example, since the phase relationship between the fundamental wave light and the second harmonic wave light in the cavity can be controlled, such double cavity conditions can be easily satisfied.

Thus, inserting the optical wavelength conversion device of this example in a cavity structure is practically effective.

The phase adjusting section is made of a material having a different refractive index dispersion. In order to further enhance operational characteristics of the optical wavelength conversion device, it is desired to use a material having a refractive index (in particular, a refractive index for fundamental wave light) substantially identical to that of the nonlinear optical material. If a material having a refractive index different from that of crystals is inserted between the crystals, Fresnel reflection is generated due to the difference in the refractive index, causing a propagation loss of the fundamental wave light or the second harmonic wave light. Accordingly, such Fresnel loss during the phase control can be reduced by using a material having a refractive index close to that of the crystals.

When It is difficult to form the phase adjusting section of a material having a refractive index equal to that of the nonlinear optical material (when an appropriate material is not found), it is desirable to deposit a reflection prevention film at the interface between the phase adjusting section and the nonlinear optical crystal.

For example, a highly nonlinear material such as $LiNbO_3$ and $LiTaO_3$ has a refractive index as high as 2 or more. Therefore, it is difficult to use a material having a refractive index equal to such a high value for the phase adjusting section. By depositing an about 140 nm thick $SiO_2$ film as a reflection prevention film, the reflectance of fundamental wave light at the interface can be suppressed to 0.1% or less. By using such a reflection prevention film, the Fresnel loss in the phase adjusting section can be reduced, and thus the conversion efficiency of the optical wavelength conversion device can be increased.

In the case where a single-layer film is used as the reflection prevention film, such a film is effective only for either fundamental wave light or second harmonic wave light. Regarding the influence of Fresnel reflection, the influence of attenuation of the fundamental wave light is greater than the influence of the second harmonic wave light. Accordingly, when a single-layer reflection prevention film is used, the reflection prevention film is preferably formed for the fundamental wave light. A multilayer reflection prevention film can be provided with the reflection prevention function for both the fundamental wave light and the second harmonic wave light. It is therefore preferable to use a multilayer reflection prevention film to provide the reflection prevention function for both the fundamental wave light and the second harmonic wave light.

In this example, the optical wavelength conversion device using bulk crystal has been described. Substantially the same construction can be realized when an optical waveguide is formed on a nonlinear optical crystal. In such a case, propagating light beams are subjected to optical wavelength conversion inside an optical waveguide, so that light confinement is strengthened and a long interaction distance is obtained, realizing high efficiency wavelength conversion. This construction is therefore effective.

Next, how the difference in the domain-inverted period between the segmented regions influences the phase match wavelength tunable characteristic was examined.

Assuming the case where the domain-inverted period is slightly different between a first domain-inverted region and a second domain-inverted region which are isolated from each other by a phase adjusting section, the influence was calculated. As a result, it was found that when the difference in the domain-inverted period is 0.02% or more, the wavelength tunable range does not change so largely, but the maximum of the conversion efficiency reduces. This indicates that in order to enhance the conversion efficiency, the difference in the domain-inverted period needs to be suppressed to 0.02% or less.

Likewise, the same level of precision is required for the difference in the phase match wavelength between two crystals having the same phase matching conditions. In other words, the difference in the phase match wavelength is desirably 0.2% or less for a crystal having substantially identical phase match wavelength.

EXAMPLE 7

In this example, widening the allowance range of phase match wavelength using the optical wavelength conversion device according to the present invention will be described.

The allowable width of phase match wavelength can be greatly widened by inserting a phase adjusting section between crystals having an approximately identical phase match wavelength. For example, assume that the crystal is segmented into three, and two phase adjusting sections are inserted. The phase matching characteristic of the optical wavelength conversion device exhibits a flat peak characteristic (flat peak phase match curve) as shown in FIG. 25 when the thicknesses t1 and t2 of the phase adjusting sections substantially satisfy the relationship:

$$t1+t2=2n\pi/(\beta 2\omega-2\beta\omega)$$

wherein n=0, 1, 2, 3, . . . , and $\beta\omega$ and $\beta 2\omega$ denote the propagation constant of fundamental wave light and second harmonic wave light, respectively. If the phase match wavelength has a flat peak characteristic, a stable power characteristic is obtained even if the wavelength of fundamental wave light varies.

Figure 25:
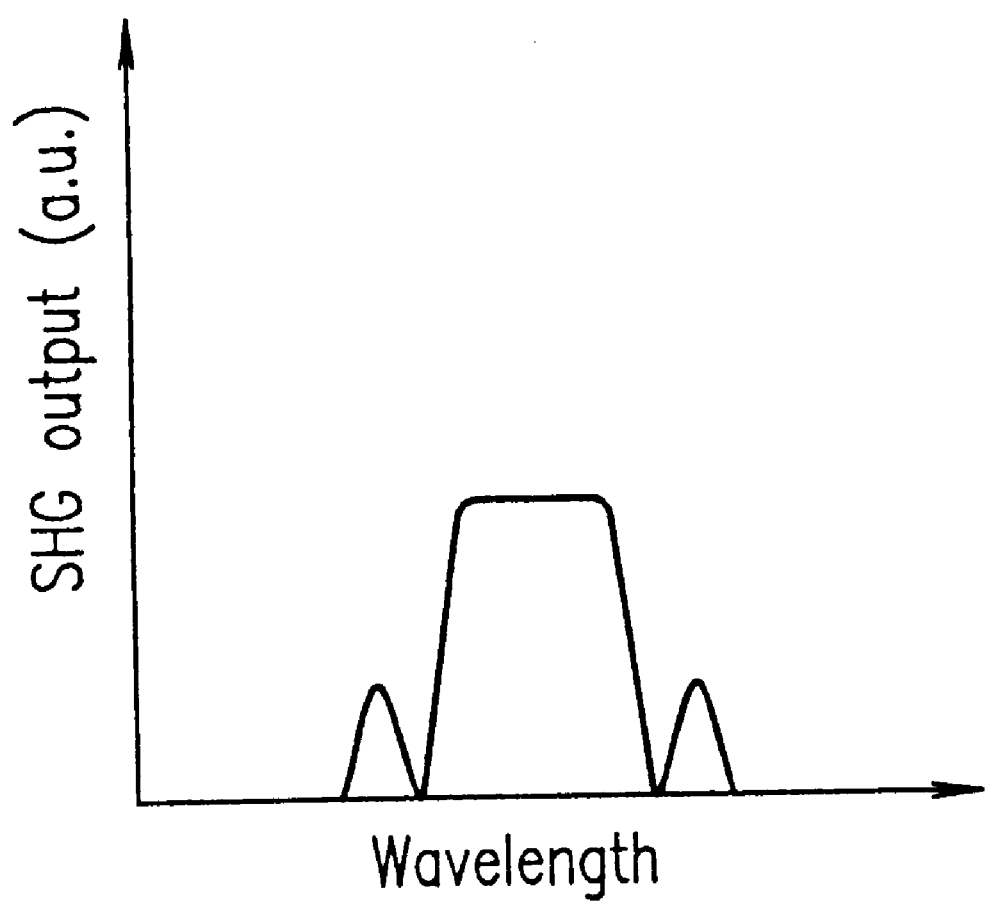
FIG. 25 is a graph showing the phase matching characteristic of an optical wavelength conversion device having a phase shift structure.
Figure 26A:
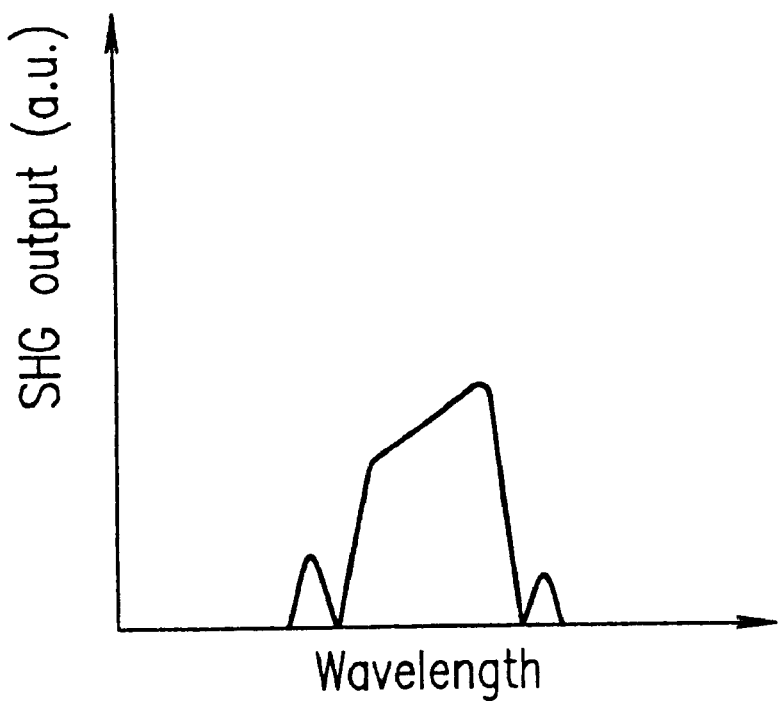
FIGS. 26A and 26B are graphs showing non-uniform phase matching characteristics of the optical wavelength conversion device having a phase shift structure, in the case where the flat peak portion is tilted and in the case where two peaks exist in the flat peak portion, respectively.
Figure 26B:
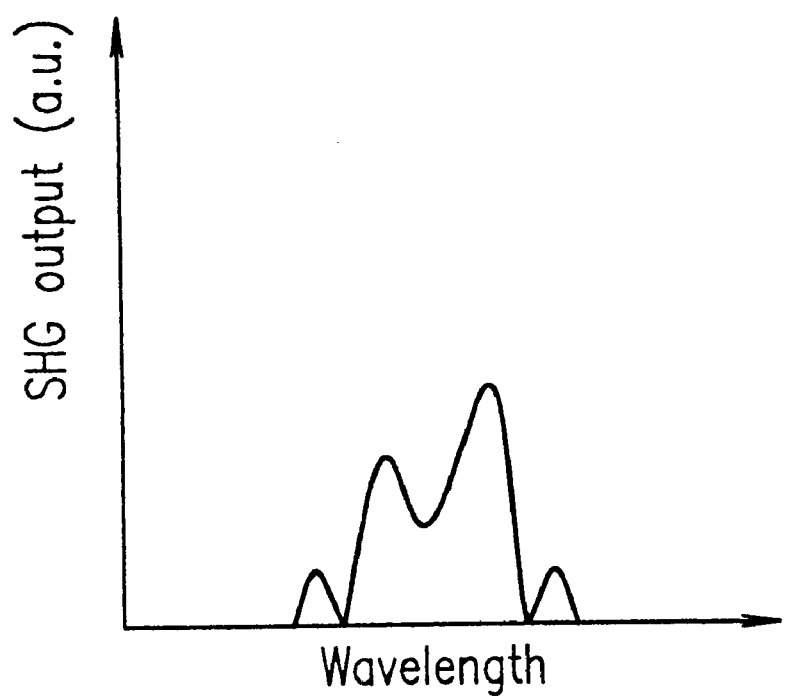

However, when a domain-inverted structure was actually fabricated according to a design and the phase matching characteristic of the resultant optical wavelength conversion device was measured, it was found to be extremely difficult to obtain an optical wavelength conversion device having a flat peak phase matching characteristic as shown in FIG. 25, resulting in inferior yield. More specifically, when an optical wavelength conversion device is actually fabricated, characteristics different from the design, such as tilting of the flat peak portion and existence of a plurality of peaks, as shown in FIGS. 26A and 26B, are obtained in most cases, resulting in a yield of several percent. The reasons for these problems are as follows. In order to realize a phase matching characteristic as designed, an extremely high level of uniformity is required for the propagation constant and the domain-inverted period over the entire length of the device. In order to realize a value close to a designed value, the uniformity of 0.01% or less is required for the refractive index variation. For example, in order to realize the above conditions for an optical waveguide type device, the line width of the optical waveguide needs to be controlled with a precision of 0.05 $\mu$m or less, or the thickness of the optical waveguide needs to be controlled with a precision of several angstroms or less. It is practically very difficult to realize this precision over the device length of 10 mm.

The inventors of the present invention succeeded in overcoming the above problem by adjusting the phase relationship between fundamental wave light and second harmonic wave light in the phase adjusting section. In other words, non-uniformity of the phase match curve (tuning curve) of the phase matching characteristic caused by a fabrication error was compensated for by adjustment in the phase adjusting section. As a result, the yield of the device having a flat peak phase matching characteristic increased by several percents to 50%. In the case where the characteristic of the phase adjusting section is fixed, the yield is determined only by the fabrication precision. However, the tuning curve can be controlled by changing the refractive index or length of the phase adjusting section, resulting in improving the yield.

Moreover, using the phase adjusting section, the power modulation is also possible. More specifically, since the profile of the tuning curve can be changed, the power can be freely adjusted in the range of 100% to 0% by changing the phase adjusting section while the wavelength of fundamental wave light is kept fixed.

In this example, the nonlinear optical crystal has been used. Substantially the same effects as those described above can also be obtained by forming an optical waveguide on the nonlinear optical crystal. By using an optical waveguide, higher efficiency is obtained, and it is possible to integrate the phase adjusting section on the optical waveguide. In this case, it is possible to change the refractive index of the phase adjusting section depending on the applied electric field utilizing an electro-optic effect, as well as changing the refractive index of the phase adjusting section depending on the temperature. It is also possible to change the effective refractive index of the phase adjusting section by using a liquid crystal material as a cladding layer constituting part of the optical waveguide and as the phase adjusting section and changing the refractive index of the liquid crystal material.

In this example, the nonlinear optical crystal satisfying the phase matching conditions is used. Alternatively, a crystal having a periodic domain-inverted structure or an optical waveguide can also be used. When a domain-inverted structure is used, although the phase matching conditions are actually quasi phase matching conditions, substantially the same characteristic as that described above is obtained. When a domain-inverted structure is used, the wavelength can be phase-matched with an arbitrary wavelength, realizing high efficiency characteristic. This is therefore useful.

EXAMPLE 8

In this example, a method for changing the phase match state of a portion of a nonlinear optical crystal, as a method for controlling the phase match state of the optical wavelength conversion device, will be described.

Figure 27:
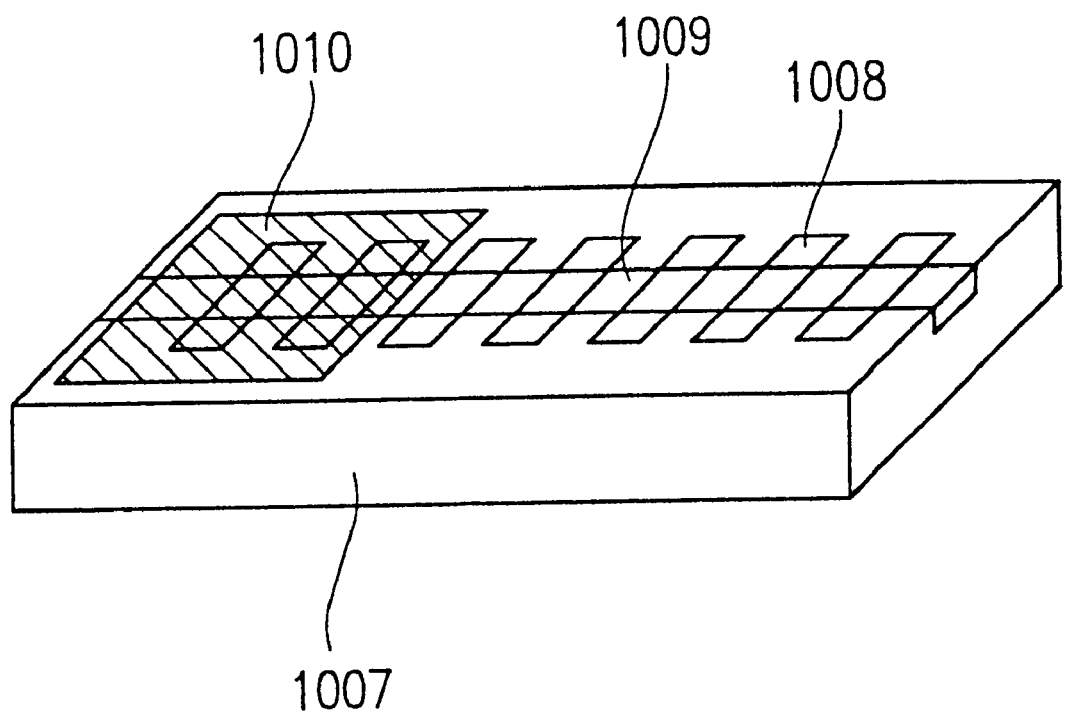
FIG. 27 is a perspective view of an optical wavelength conversion device of Example 8 according to the present invention.

FIG. 27 shows an optical wavelength conversion device of this example. On an x-cut MgO:LiNbO$_3$ substrate 1007 is formed a domain-inverted structure 1008 having a period of 3.2 µm over the entire device length of 10 mm. An optical waveguide 1009 is formed on the domain-inverted structure 1008 by proton exchange and annealing. For example, the optical waveguide 1009 has a width of 5 µm and a depth of 2.5 µm. The phase match wavelength is 850 nm, and second harmonic wave light having a wavelength of 425 nm is output. The conversion efficiency in 1000%/W.

A thin film heater 1010 is formed in the vicinity of the incident portion of the optical waveguide 1009 over the length of 3.3 mm, forming a refractive index modulation portion. By providing the heater 1010, the temperature distribution of the optical waveguide 1009 can be changed, to change the refractive index.

Figure 28A:
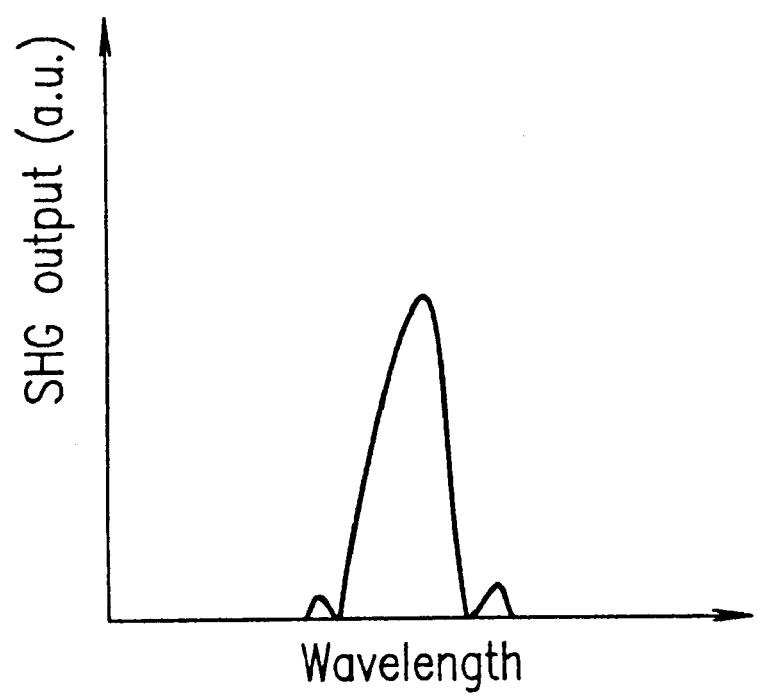
Figure 28B:
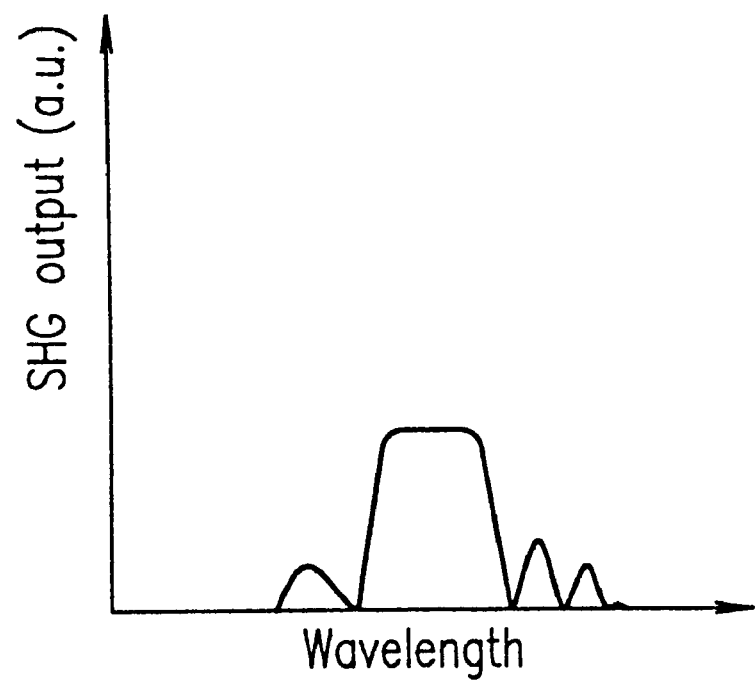

The change in thephase matching characteristic with the temperature change will be described with reference to FIGS. 28A and 28B. FIG. 28A shows the phase matching characteristic obtained when a current is not applied to the heater 1010, i.e., when the temperature is not changed. FIG. 28B shows the phase matching characteristic obtained when the temperature of the heater 1010 is changed by about 10° C. By changing the temperature as described above, although the conversion efficiency reduced to about 400%/W, the allowance range of phase match wavelength increased, realizing a flat peak phase matching characteristic.

Next, the relationship between the phase matching characteristic and the length of the heater 1010 was observed by changing the length of the heater 1010. It was found that in order to widen the allowance range of phase match wavelength, the length of the heater 1010 needs to be 15% to 40% of the entire device length. Also, in order to realize a flat peak phase match wavelength characteristic, the length of the heater 1010 needs to be about 30% of the entire device length and this needs to be realized with a precision of ±5%.

The position of the heater 1010 is important. Specifically, it needs to be formed in the vicinity of an end of the device. If the heater 1010 is formed in the middle of the device, the widening of the allowance range of phase match wavelength is not performed efficiently. However, the heater 1010 needs to be away from an end face of the optical waveguide 1009 by several micrometers. If the heater 1010 is formed on an end face of the optical waveguide 1009, fundamental wave light is absorbed by a metal portion of the heater 1010 located at the end face thereof, increasing the temperature and thus damaging the end face. Accordingly, the heater 1010 should be slightly away from the end face.

Hereinbelow, another optical wavelength device using a refractive index modulation will be described.

As described in Example 7, the widening of the wavelength allowance range of the optical wavelength conversion device is possible by forming crystals having the identical phase matching characteristic and the phase adjusting section. Fabricating such an optical wavelength conversion device, however, requires high precision. In order to overcome this problem, one method for controlling the phase matching characteristic by modulating the phase adjusting section has been described in Example 7. In this example, the phase matching characteristic is controlled by forming a refractive index modulation section in a portion of the crystal.

Figure 29:
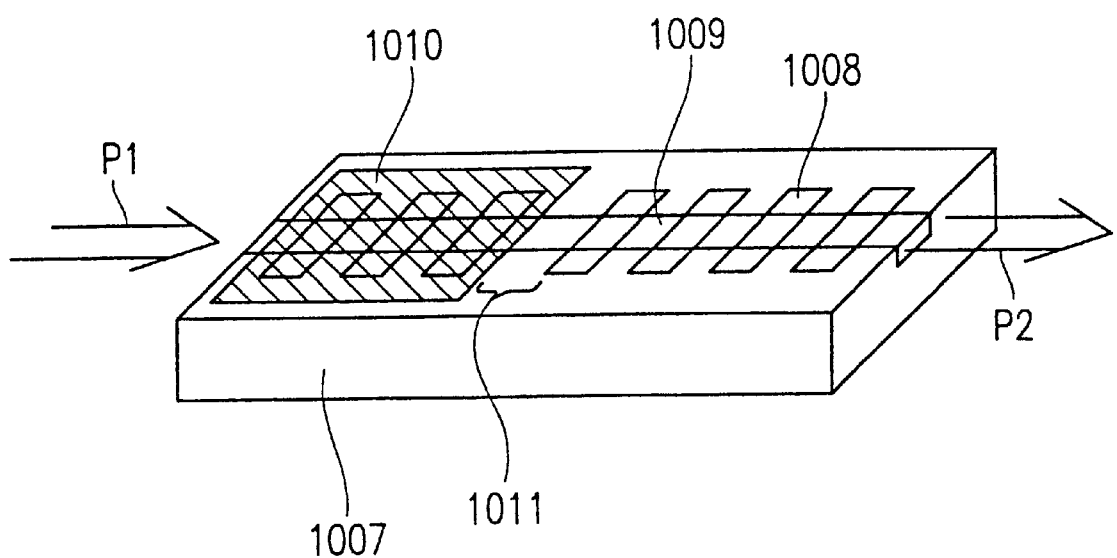
FIG. 29 is a perspective view of another optical wavelength conversion device of Example 8 according to the present invention.

FIG. 29 is a perspective view of another optical wavelength conversion device of this example, in which the wavelength allowance range is widened by a two-segmented structure.

Referring to FIG. 29, on an MgO-doped X Plate LiNbO$_3$ substrate 1007 is formed a domain-inverted structure 1008 having a period of 3.2 µm over the length of 10 mm. A phase adjusting section 1011 where no domain-inverted strips exist over a length of 1.6 µm is formed at a position apart from an end of the device by about 1.6 mm. A heater 1010 having a length of about 1.6 mm is formed on the substrate between the end and the phase adjusting section 1011.

In such a construction, when the temperature of the heater 1010 is not increased, the phase matching characteristic is slightly displaced from the flat peak characteristic. When the temperature of the heater 1010 is increased by about 3° C., an ideal flat peak characteristic is realized. This indicates that with the phase adjusting section 1011 formed, a desired control can be obtained by about one-third of temperature change, compared with the case having no phase adjusting section. Thus, the structure having the phase adjusting section 1011 is advantageous since the control to obtain a flat peak phase matching characteristic is possible by a slight change in the refractive index.

The optical wavelength conversion device where the phase matching characteristic thereof is modulated by modulating the refractive index using a thin film heater or the like as described above is especially effective when the optical wavelength conversion device is directly coupled with a semiconductor laser to realize a short-wavelength light source. In this case, a small-size coherent light source is realized by using a base, on which the optical waveguide type optical wavelength conversion device and the semiconductor laser are directly coupled and fixed. Further, by widening the wavelength allowance range of the optical wavelength conversion device by a method according to the present invention, a stable power characteristic is obtained.

If a high-power semiconductor laser is used as a light source, heat from the semiconductor laser is conducted to the optical wavelength conversion device via the base, forming a heat concentration in the vicinity of the incident portion of the optical wavelength conversion device. This heat distribution may change the phase matching characteristic of the optical wavelength conversion device, failing to obtain the phase matching characteristic as designed.

In order to overcome the above problem, a heater for adjusting the refractive index of the optical waveguide (adjusting heater) is formed in the vicinity of the incident portion of the optical wavelength conversion device. As a result, a flat peak wavelength allowance range characteristic is realized by adjusting the temperature of the adjusting heater even when heat is conducted from the semiconductor laser, allowing a stable power characteristic to be obtained. The adjusting heater is so small that it only occupies an area equal to a half of the area of the optical wavelength conversion device. Therefore, power consumption can be reduced to a half or less of that conventionally used.

The method using the heater as described above may be combined with the method for changing the refractive index of the phase adjusting section, so as to modulate the phase matching characteristic.

In this example, the thin film heater 1010 has been used as the refractive index modulation section. Alternatively, a cladding layer made of a liquid crystal material may be used. By forming a cladding layer of a liquid crystal material and changing the refractive index of the liquid crystal portion by an electric field, the effective refractive index of the optical waveguide can be changed. Using a liquid crystal material is effective since smaller power consumption is required. As another method, the effective refractive index can be changed by applying an electric field to the crystal using an electro-optic effect.

In this example, the optical wavelength conversion device having two segmented nonlinear optical crystals has been used. The present invention is also applicable to a device having a larger number of segmented crystals. This is effective since by increasing the number of segmented crystals, the wavelength allowance range can be more widened more.

EXAMPLE 9

In this example, a coherent light generator (a coherent light source) including a semiconductor laser and an optical wavelength conversion element, which enables an invariably stable power characteristic, will be described.

More specifically, this example defines the wavelength tunable range of the phase match wavelength of the optical wavelength conversion device, which is necessary for stabilizing SHG output power from the optical wavelength conversion device when a coherent light source is fabricated from a semiconductor laser and the optical wavelength conversion device.

Figure 30:
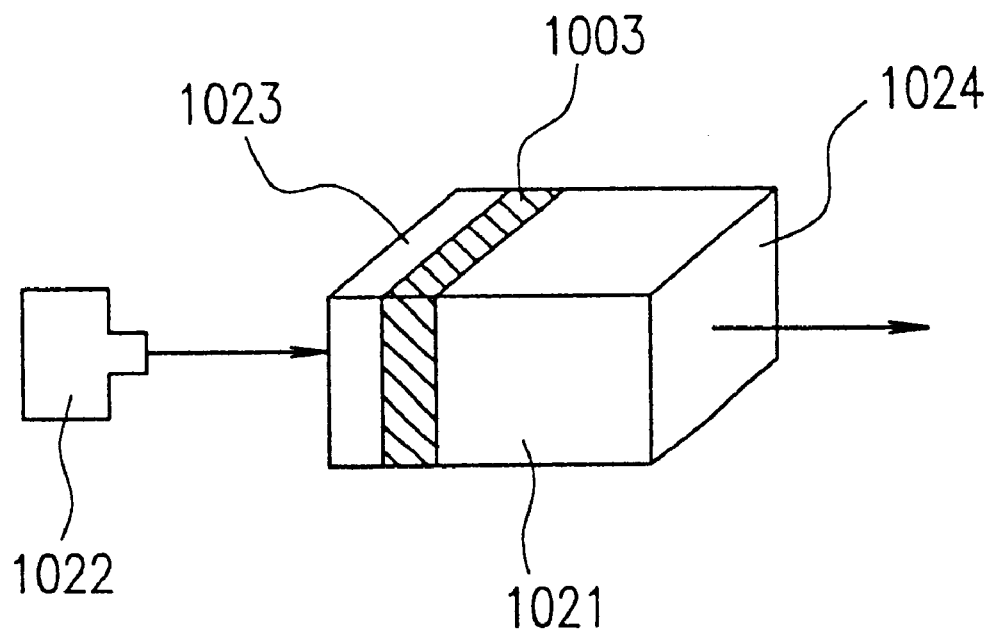
FIG. 30 is a view illustrating a coherent light generator according to the present invention.

FIG. 30 illustrates a coherent light source of this example, which includes an optical wavelength conversion device 1021 and a semiconductor laser 1022. The optical wavelength conversion device 1021 includes an incident section 1023 and an output section 1024. The semiconductor laser 1022 has a function of tuning the output wavelength, so that the output wavelength is tuned to a wavelength which satisfies the phase matching conditions of the optical wavelength conversion device 1021, thereby to stabilize the output power.

In such a construction, a characteristic required to stabilize the SHG output power from the optical wavelength conversion device 1021 was examined.

The oscillation wavelength of a semiconductor laser can be tuned by optical feedback utilizing a grating feedback and a wavelength filter. It can also be tuned by integrating a DBR grating on a portion of an optical waveguide of the semiconductor laser and tuning a reflection wavelength of the DBR grating using a temperature change and a plasma effect. However, a semiconductor laser oscillates only at longitudinal mode intervals depending on a cavity structure of the semiconductor laser. Accordingly, a tunable oscillation wavelength is provided only intermittently. For example, the oscillation wavelength can be controlled at intervals of about 0.1 nm.

Figure 31A:
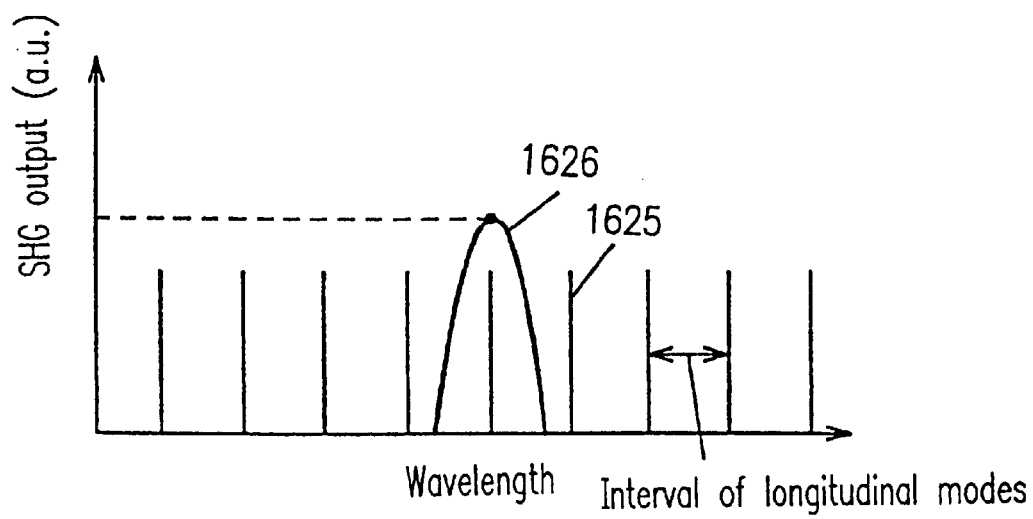
FIGS. 31A and 31B are graphs showing the relationships between the oscillation wavelength of a semiconductor laser and the phase matching characteristic when the maximum value of a tuning curve of the optical wavelength conversion device and the oscillation wavelength of the semiconductor laser are matched with each other (FIG. 31A), and when the oscillation wavelength is displaced from the vicinity of the maximum value (FIG. 31B)
Figure 31B:
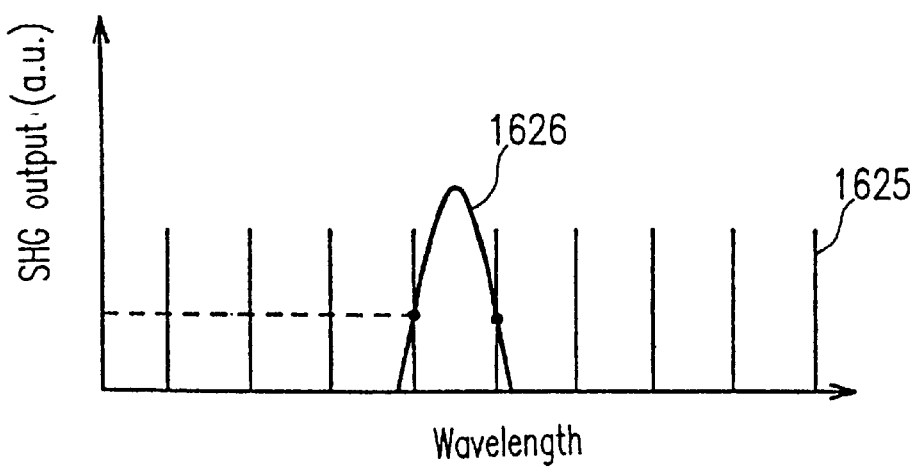

An optical wavelength conversion device generally has a very small wavelength allowance range. For example, in a waveguide type optical wavelength conversion device made of $LiNbO_3$ having a length of 10 mm, the full width at half maximum is 0.1 nm or less. The relationship between the phase matching characteristic of the optical wavelength conversion device and the oscillation wavelength of the semiconductor laser is schematically shown in FIGS. 31A and 31B. In FIGS. 31A and 31B, the reference numerals 1625 and 1626 denote an oscillation mode (longitudinal mode) of the semiconductor laser and a tuning is curve of the optical wavelength conversion device, respectively.

In FIG. 31A, the peak of the tuning curve 1626 and the oscillation mode 1625 of the semiconductor laser overlap each other. In such a case, the maximum SHG output power is obtained by positioning the longitudinal mode 1625 at the peak point of the tuning curve 1626. In the case where the peak of the tuning curve 1626 is located around the middle of the interval between the oscillation modes 1625 of the semiconductor laser, as shown in FIG. 31B, the maximum SHG output power is not obtained even if the oscillation wavelength is adjusted accordingly. The resultant coherent light source fails to provide stable SHG output power even if the wavelength of the semiconductor laser is adjusted accordingly.

In order to overcome the above problem, it is necessary to adjust the phase match wavelength to the center of the oscillation wavelength of the semiconductor laser by tuning the phase match wavelength of the optical wavelength conversion device. In other words, the optical wavelength conversion device requires a characteristic in which the phase match wavelength can be tuned over a wavelength range wider than the longitudinal mode of the oscillation wavelength of the semiconductor laser used.

The above feature was confirmed using an optical wavelength conversion device having a structure where a $LiNbO_3$ crystal having a periodic domain-inverted structure is segmented into five regions (a structure having four phase adjusting sections). The tunable range of the phase match wavelength of this structure is 0.34 nm in full width at half maximum. However, when the phase match wavelength was tuned within the range of 0.1 nm which to the longitudinal mode interval of the semiconductor laser, the reduction in the power was only about 5% even when the phase match wavelength shifted from the center of the phase match wavelength by ±0.05 nm. It is therefore possible to stabilize the power with a variation of 5% or less even when the phase match wavelength largely changes due to a change of ambient temperature, by controlling both the oscillation wavelength of the semiconductor laser and the phase match wavelength of the optical wavelength conversion device simultaneously. As a result, a coherent light source having a stable power is realized.

Widening of the tunable wavelength range of the wavelength tunable laser is also possible by using parametric oscillation.

Parametric oscillation is possible by using an optical wavelength conversion device having a periodic domain-inverted structure and a laser light source. Such parametric oscillation enables generation of a signal light beam having a wavelength $\lambda 2$ and an idler light beam having a wavelength $\lambda 1$, which satisfy the relationship of $1/\lambda 3=1/\lambda 1+1/\lambda 2$ when a fundamental wave light having the wavelength $\lambda 3$ is input. This means that a light beam having a wavelength satisfying the above relationship can be output while tuning using the fundamental wave light having the wavelength $\lambda 3$, realizing a tunable laser light source.

High efficiency wavelength conversion is conventionally possible by an optical wavelength conversion device having a periodic polarization structure which utilizes the above parametric oscillation. For example, an optical wavelength conversion device made of $LiNbO_3$ has been put into practical use. However, in a coherent light source utilizing conventional parametric generation, a plurality of domain-inverted structures having different periods are formed and the oscillation wavelength is tuned by changing the domain-inverted period. Therefore, the oscillation wavelength is tunable in a discrete manner, which makes it difficult to perform continuous wavelength conversion. In this example, by using the optical wavelength conversion device according to the present invention, the phase match wavelength can be tuned continuously. Thus, a coherent light source capable of changing the oscillation wavelength continuously can be realized. Moreover, by forming a plurality of domain-inverted regions having different periods, a coherent light source where the phase match wavelength can be continuously tuned over a wide range is realized. A stable power characteristic with high efficiency having a small variation is also realized.

EXAMPLE 10

In this example, an optical information processing apparatus according to the present invention will be described.

Figure 32:
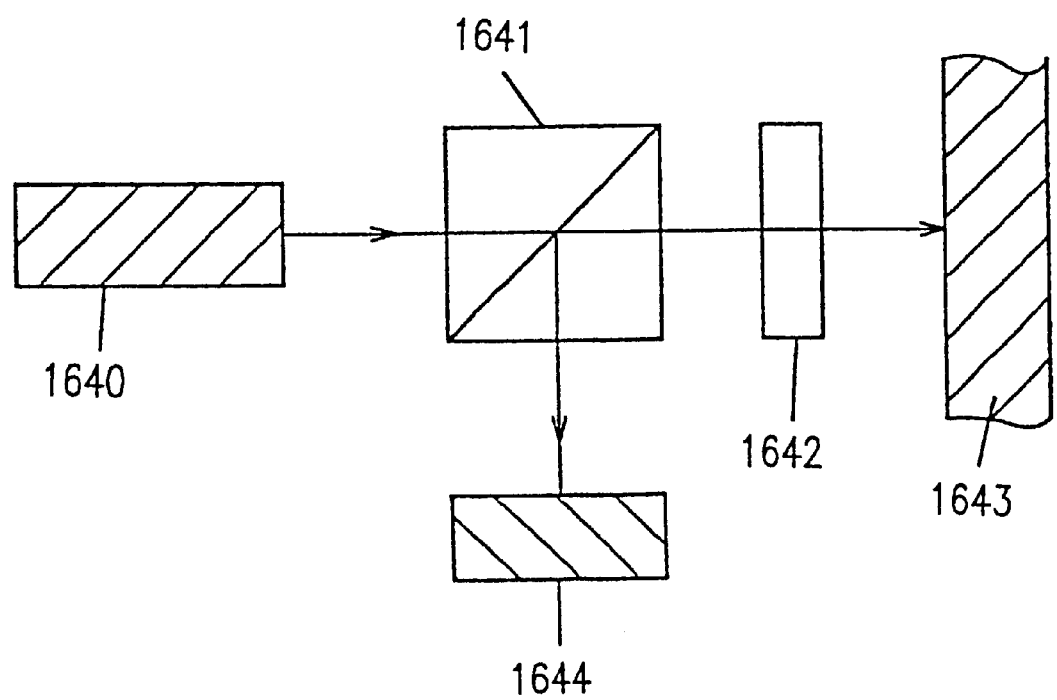
FIG. 32 is a view illustrating an optical information processing apparatus according to the present invention.

FIG. 32 illustrates a construction of the optical information processing apparatus according to the present invention. Referring to FIG. 32, a light beam having a power of 10 mW output from a coherent light generator 1640 having the features described in Example 9 passes through a beam splitter 1641 and is incident on an optical disk 1643 as an information reproduction medium via a lens 1642. Then, a reflected light beam from the optical disk 1643 is collimated by the lens 1642 and reflected from the beam splitter 1641, to be incident on an optical detector 1644 to be read as a signal. It is also possible to write information on the optical disk 1643 by modulating the intensity of the output of the coherent light generator 1640.

According to the present invention, since the phase match wavelength of the optical wavelength conversion device of the coherent light generator 1640 is stably tuned, the output power of the coherent light generator 1640 is stabilized, enabling suppression of the power variation depending on an external temperature change to 5% or less.

Since high-power blue light can be generated, not only reading but also writing of information to the optical disk 1643 are possible. Moreover, since the size of the device can be markedly reduced by using the semiconductor as a light source of fundamental wave light, the processing apparatus can be used for small-size personal optical disk reading/recording apparatus.

Hereinbelow, an optical wavelength conversion device utilizing a nonlinear optical effect for stabilizing the output power thereof, and a coherent light generator and an optical information processing apparatus using such an optical wavelength conversion device.

EXAMPLE 11

Hereinbelow, an optical wavelength conversion device according to the present invention allowing for second harmonic generation over a wide wavelength range will be described.

As described in Example 1, the optical wavelength conversion device according to the present invention has a wide allowable wavelength width and has a flat portion near the peak power of the tuning curve characteristic. As a result, the output power variation in response to a wavelength variation of fundamental wave light is extremely small. Moreover, the reduction in wavelength conversion efficiency due to the widening of the allowable wavelength width is minimized, achieving both a widened allowable wavelength width and a high efficiency characteristic simultaneously.

A specific construction of the optical wavelength conversion device of this example will be described with reference to FIG. 36. This construction is the same as that of Example 1 (FIG. 1). The corresponding components are therefore denoted by the same reference numerals, and detailed description is omitted here in some cases.

Figure 36:
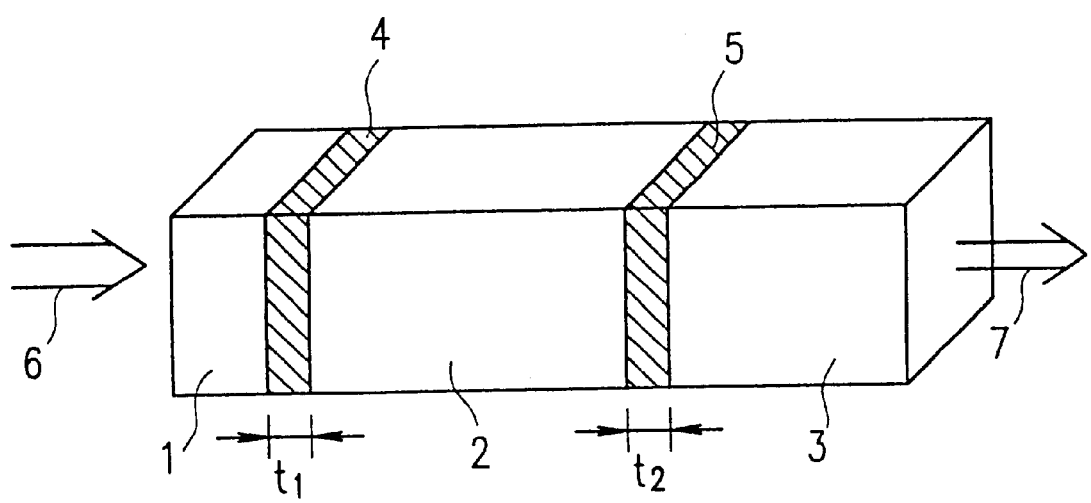
FIG. 36 is a view illustrating an optical wavelength conversion device according to the present invention.

As shown in FIG. 36, the optical wavelength conversion device includes a plurality of nonlinear optical crystals, i.e., three nonlinear optical crystals 1, 2, and 3 in this example, which satisfy substantially the same phase matching conditions. Phase adjusting sections 4 and 5 having thicknesses of t1 and t2, respectively, are inserted between the adjacent nonlinear optical crystals 1, 2, and 3.

Conventionally, a method for combining crystals having different phase matching conditions has been proposed. In this method, crystals having different phase matching conditions are combined so as to sum the phase match wavelengths in the respective crystals thereby to widen the wavelength allowance range. However, when crystals having different phase matching conditions are combined, the phase relationship between the fundamental wave light and the second harmonic wave light generated in each crystal largely varies even if the length of each crystal and the wavelength of each light beam slightly vary. This variation exhibits an interference effect, and the SHG output power greatly varies in response to a wavelength change of the fundamental wave light. In order to overcome this problem, a construction in which the phase relationship between the fundamental wave light and the second harmonic wave light in each crystal equally changes is desired. Thus, the use of crystals having identical phase matching conditions allows widening the allowance range of phase match wavelength.

The inventors of the present application examined various methods for widening the allowance range of phase match wavelength using a structure made of crystals having identical phase matching conditions, and found that a construction in which the lengths of respective crystals are optimized and a phase adjusting section is formed between every adjacent pairs of crystals can realize widening of the allowance range of phase match wavelength.

When no phase adjusting section is formed between the crystals having the same phase matching conditions, the phases of the fundamental wave light and the second harmonic wave light are matched with each other over the entire crystal. However, the allowance range of phase match wavelength is extremely narrowed. On the contrary, when a phase adjusting section is formed between the crystals, a phase difference is generated between the fundamental wave light and the second harmonic wave light in the phase adjusting section. This phase difference between the fundamental wave light and the second harmonic wave light is kept constant during the propagation through the next crystal. As for the wavelength variation of the fundamental wave light, also, the phase match state thereof in each crystal equally changes and the phase difference generated in the phase adjusting section hardly changes. This is because the phase matching conditions in the crystals upstream and downstream the phase adjusting section are identical to each other, and the relationship of the phase velocity between the fundamental wave light and the second harmonic wave light are also identical to each other.

Accordingly, the phase difference generated in the phase adjusting section is kept constant irrespective of the length of each crystal, and a displacement from the phase matching conditions in response to the wavelength variation of the fundamental wave light occurs simultaneously. As a result, although the second harmonic wave light generated in each crystal has a phase difference generated in the phase adjusting section, the relationship is always constant even if the wavelength of the fundamental wave light varies. This merely reduces a variation of the interference effect between the second harmonic wave light components generated in the respective crystals. As a result, the power variation of the second harmonic wave light with respect to the wavelength of the fundamental wave light can be greatly reduced, realizing a significantly flat phase matching characteristic.

The above description is also applicable to the construction of Example 1 of the present invention.

Figure 37A:
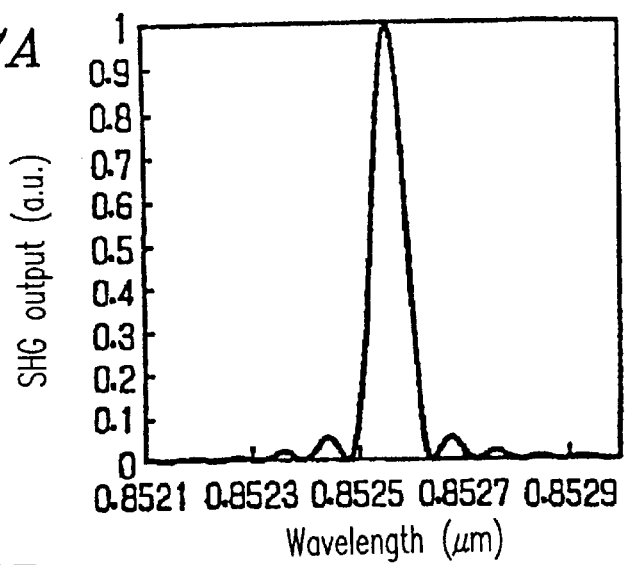
FIG. 37A is a graph showing simulation results of the SHG output powers of a conventional optical wavelength conversion device having no phase adjusting section.

FIG. 37A shows the phase matching characteristic (tuning curve characteristic) of a conventional optical wavelength conversion device having no phase adjusting section, which is also shown as FIG. 2A, representing the output power characteristic of the second harmonic wave light with respect to the fundamental wave light described in Example 1 with reference to FIG. 2A.

Figure 37B:
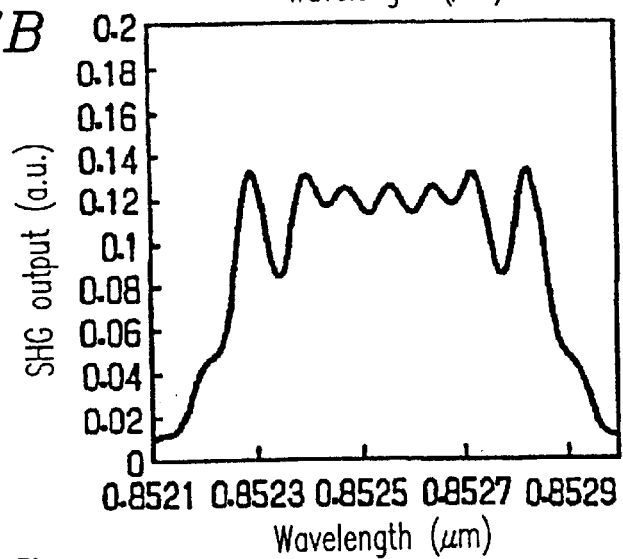
FIG. 37B is a graph showing simulation results of the SHG output powers of a conventional optical wavelength conversion device configured by combining crystals having different phase matching conditions.

FIG. 37B shows the tuning curve characteristic of a conventional optical wavelength conversion device intended to widen the allowance range of phase match wavelength by combining a plurality of crystals having different phase matching conditions. This represents the case of combining three crystals having different phase match wavelengths. Although the wavelength allowance range is significantly widened compared with FIG. 37A, the SHG output power greatly varies in response to the wavelength variation of the fundamental wave light. In particular, the power variation is significant in the vicinity of the power peak, and a power variation of 10% or more with respect to the peak maximum value is observed. This is due to the difference in the phase match wavelength between the crystals.

Figure 37C:
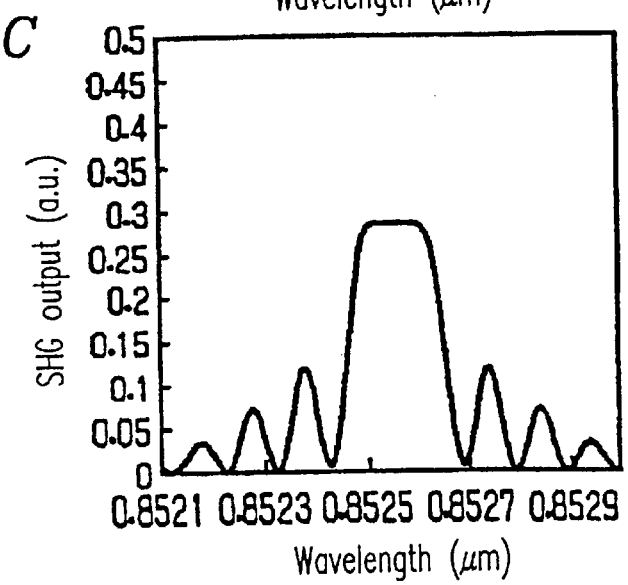
FIG. 37C is a graph showing simulation results of the SHG output powers of the optical wavelength conversion device of FIG. 36 according to the present invention.

FIG. 37C shows the phase matching characteristic (tuning curve characteristic) of the optical wavelength conversion device according to the present Invention, which is also shown as FIG. 2B. As described in Example 1, the output power intensity of the second harmonic wave light is very flat at the peak near the maximum value of the tuning curve characteristic, with a power variation within several percents. Further, in FIG. 37C, the wavelength range (allowable wavelength width) in which the SHG power level with respect to the fundamental wave light wavelength decreased by 5% from the peak level is widened about six times, compared with FIG. 37A. In FIG. 37C, although the conversion efficiency decreases as the allowable wavelength width is widened, the conversion efficiency of the level of 29% of the conversion efficiency obtained in FIG. 37A is still obtainable (in FIG. 37B, it decreases to the level of about 12%).

As described above, according to the present invention, a tuning curve having a flat peak is obtained by providing a phase adjusting section between crystals having identical phase matching conditions. Also, a wavelength conversion efficiency higher than that obtained conventionally is realized.

Hereinbelow, the phase matching conditions of the nonlinear optical crystal constituting the optical wavelength conversion device will be described.

The optical wavelength conversion device shown in FIGS. 1 and 36 includes nonlinear optical crystals having identical phase matching conditions combined with each other via a phase adjusting section. The acceptable difference in the phase matching conditions between the crystals was examined.

The difference in the phase matching conditions between the crystals can be represented by the difference in the phase match wavelength between the crystals. Therefore, a change in the tuning curve generated when crystals having different phase matching conditions were combined was observed. As a result, it was found that when crystals having phase match wavelengths different from each other by 0.1% were combined with each other to fabricate an optical wavelength conversion device, the symmetry of the tuning curve was not obtained, making it difficult to obtain a flat peak tuning curve. This tendency was significant as the difference in the phase match wavelength increased.

From the above examination, it was clarified that the acceptable difference in the phase match wavelength for realizing a flat peak tuning curve is as narrow as 0.02% or less. In other words, the acceptable difference in the phase match wavelength between the nonlinear optical crystals is desirably 0.02% or less in order to realize a peak flat tuning curve with a wide allowance range of wavelength.

Hereinbelow, the design of the optical wavelength conversion device according to the present invention will be described again.

Figure 38A:
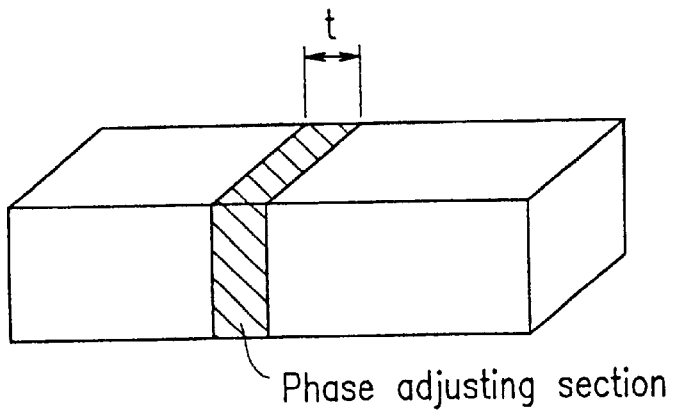
FIG. 38A is a view schematically illustrating an optical wavelength conversion device having a two-segmented structure.

Assume that propagation losses of the fundamental wave light and the second harmonic wave light in a crystal is negligibly small and that two light beams are propagating in a substantially identical shape in the crystal. When a length t of a phase adjusting section of a two-segmented optical wavelength conversion device shown in FIG. 38A satisfies expression (2) below described in Example 1, the tuning curve characteristic has a flat peak portion.

$$t=(2n+1)\pi/(\beta(2\omega)-2\cdot\beta(\omega)) \quad (2)$$

wherein $\beta(2\omega)$ denotes the propagation constant of the second harmonic wave light, $\beta(\omega)$ denotes the propagation constant of the fundamental wave light. And n=0, 1, 2, 3, . . . .

The above expression can be changed to a more general equation:

$$t(2n+\alpha)\pi/(\beta(2\omega)-2\cdot\beta(\omega)) \quad (2a)$$

Figure 38B:
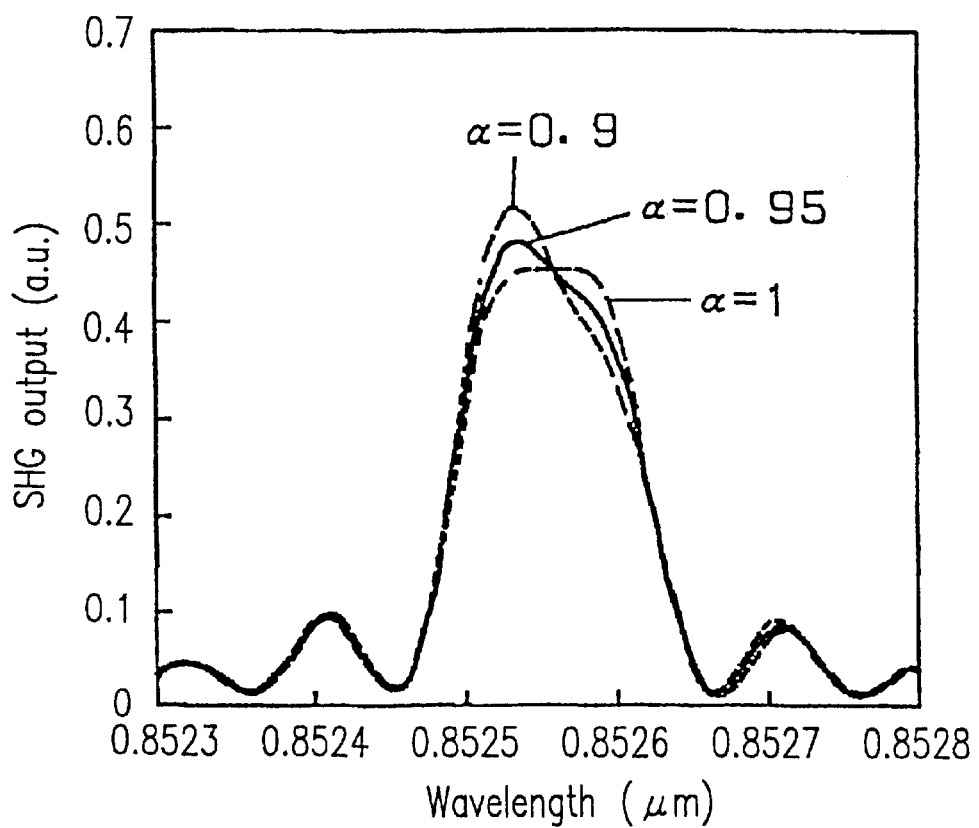
FIG. 38B is graph showing a tuning curve obtainable by the device shown in FIG. 38A.

FIG. 38B shows a tuning curve obtained when the value of $\alpha$ in the above expression (2a) is varied. From this graph, it is found that $\alpha=1$ is optimum for the two-segmented structure. When the value of a increases or decreases from this optimal value, the symmetry of the wavelength dependency of the phase matching characteristic is lost. As described in Example 1, it is within the range of $\alpha=0.95$ to 1.05 that the symmetry of the tuning curve characteristic is less than 5%. The device can be used without a problem arising as long as the value of $\alpha$ falls within this range. When the length of the phase adjusting section is optimized, the symmetry of the tuning curve is 5% or less in the range of $\alpha=0.9$ to 1.1, thereby exhibiting a substantially flat peak.

Next, the length of the crystal was examined.

Figure 39A:
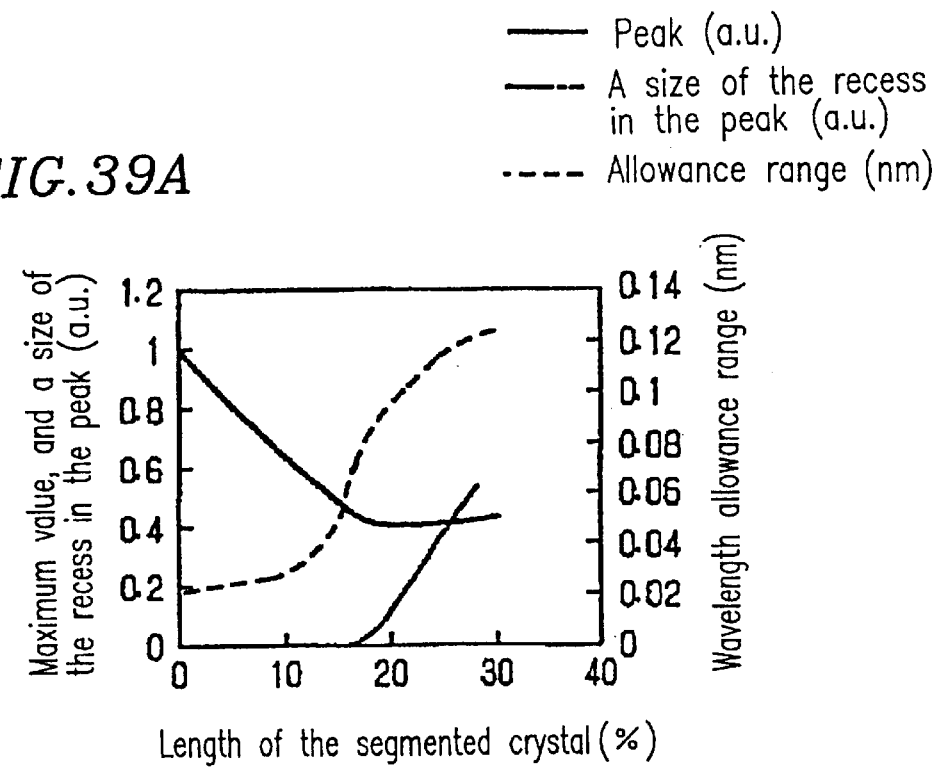
FIG. 39A is graphs showing relationships among a length of one sub-crystal with respect to the entire length of a two-segmented optical wavelength conversion device, a size of a recess in the vicinity of a peak of an obtainable tuning curve, and the wavelength allowance range.

The relationship between the phase matching characteristic and the length of one of two crystals changed with respect to the total length is described as follows with reference to FIGS. 39A and 39B. FIG. 39A shows the relationship among the rate of the length of one crystal with respect to the entire device length, the size of a recess in the flat portion near the peak of the tuning curve, and the wavelength allowance range (which is set at the wavelength width in which the SHG output power reduces from the maximum value by 5%). When the crystal length exceeds about 17% of the entire device length, the recess becomes larger and the wavelength allowance range is greatly widened. Accordingly, in order to suppress the generation of recesses near the peak of the tuning curve as much as possible, the length of the crystal needs to be about 17% or less of the entire device length. On the other hand, in order to widen the allowance range twice or more, the length of the crystal needs to be about 13% or more of the entire device length.

From the above, it is preferable to set the length of the crystal at a value in the range of about 13% to about 17% of the entire device length, so as to suppress the generation of a recess near the peak of the tuning curve. If the length is not within the above range, the tuning curve has two peaks. In such a case, in the peak detection to be performed when feedback of the power characteristic is performed to control the wavelength of the fundamental wave light and thus stabilize the second harmonic wave light, it is difficult to specify the phase match wavelength between the peaks and thus to stabilize the power.

Figure 39B:
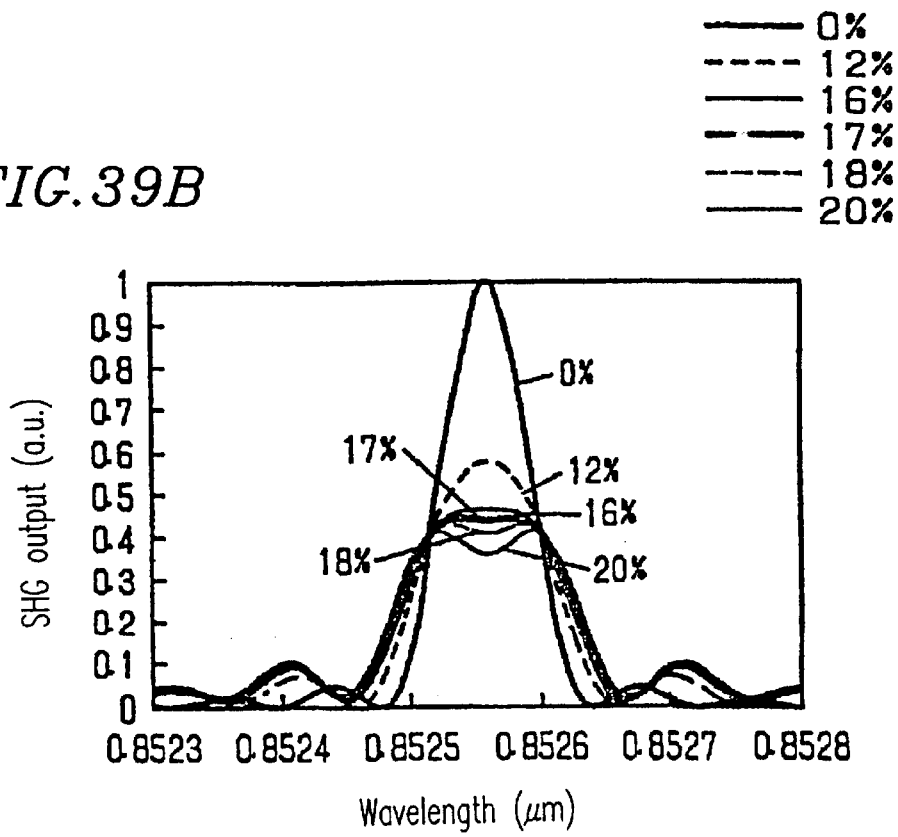
FIG. 39B is a graph showing several tuning curves with different lengths of the one sub-crystal with respect to the entire length of the two-segmented optical wavelength conversion device as parameters.

When the influence of the recess in the peak portion is not taken into consideration, it is observed from FIG. 39B that the length of the crystal is preferably set at value in the range of about 13% to about 18% of the entire device length so that the maximum of second harmonic wave light does not decrease to 95% or less of the original value.

FIG. 39B shows several tuning curves for various rates of the length of a crystal to the entire device length used as parameters. It is observed from FIG. 39B that when the crystal length increases, the recess near the peak becomes larger. When the crystal length is 17% of the entire device length, the tuning curve becomes substantially flat near the peak, allowing for realizing a stable and wide phase matching characteristic. In the case where the propagation loss is negligible in the two-segmented structure, the position of the phase adjusting section does not depend on the positional relationship between the shorter crystal and the longer crystal, thereby realizing a good tuning curve.

As a result, it is preferable that in order to widen the allowance range of phase match wavelength by combining two or more crystals having a substantially identical phase matching conditions via a phase adjusting section, the length of one of the crystals is preferably 13% to 18% of the entire device length.

The above examination was performed assuming that the propagation losses of fundamental wave light and second harmonic wave light are not so large. An experiment was performed for the case where the propagation loss is large by using an actual device. As result, a flat peak tuning curve was obtained when the length of the crystal is 5% to 30% of the entire device length. Accordingly, it is preferable to set the length of one crystal at a value in the range of 5% to 30% of the entire device length.

As a result, in the two-segmented structure, a structure having a flat peak phase matching characteristic is realized when the thickness t of the phase adjusting section formed between the crystals satisfies the relationship:

$$t=(2n+\alpha)\pi/(\beta(2\omega)-2\cdot(\omega)) \quad (2a)$$

and $\alpha$ is in the range of 0.9 to 1.1. This range of $\alpha$ is applied when the propagation 1188 is comparatively small. When the propagation loss is comparatively large, or when the power density of propagating light varies depending on the position, the range of $\alpha$ of 0.5 to 1.5 is effective.

In the three-segmented structure where three nonlinear optical crystals and two phase adjusting sections (having thicknesses of t1 and t2) are combined, the tuning curve has a flat peak characteristic when the lengths t1 and t2 of the phase adjusting sections satisfy expressions (3) and (4) described in Example 1:

$$t1=(2n+\alpha1)\pi/(\beta(2\omega)-2\cdot(\omega)) \quad (3)$$

$$t2=(2m+\alpha2)\pi/(\beta(2\omega)-2\cdot(\omega)) \quad (4)$$

wherein n and m=0, 1, 2, 3, . . . , and expression:

$$t1+t2=2J\pi/(\beta(2\omega)-2\cdot\beta(\omega)) \quad (5)$$

wherein J=0, 1, 2, 3, . . . is satisfied since $\alpha1+\alpha2=2$.

If the relationships of expressions (3) to (5) are not satisfied, the tuning curve becomes dissymmetric and the slope of the flat peak portion becomes large, thus making it difficult to obtain a flat power characteristic. As described in Example 1, the flat portion near the peak power of the tuning curve characteristic is substantially flat in the vicinity of $\alpha1=0.79$ and $\alpha2=1.21$. The symmetry is 5% or less when $\alpha1$ is in the range of 0.7 to 0.9, at which $\alpha2=2-\alpha1$ is set. Substantially the same characteristic is exhibited when the values of $\alpha1$ and $\alpha2$ are changed.

Next, the length of the crystal was examined.

Figure 40A:
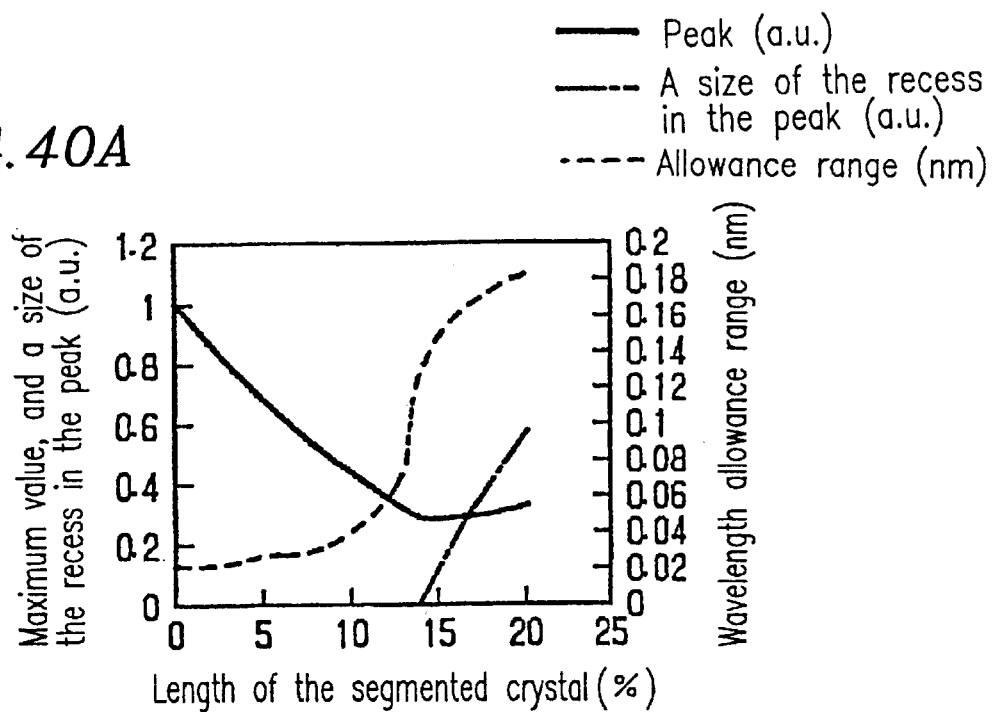
FIG. 40A is graphs showing relationships among a length of one sub-crystal with respect to the entire length of a three-segmented optical wavelength conversion device, a size of a recess in the vicinity of a peak of an obtainable tuning curve, and the wavelength allowance range.
Figure 40B:
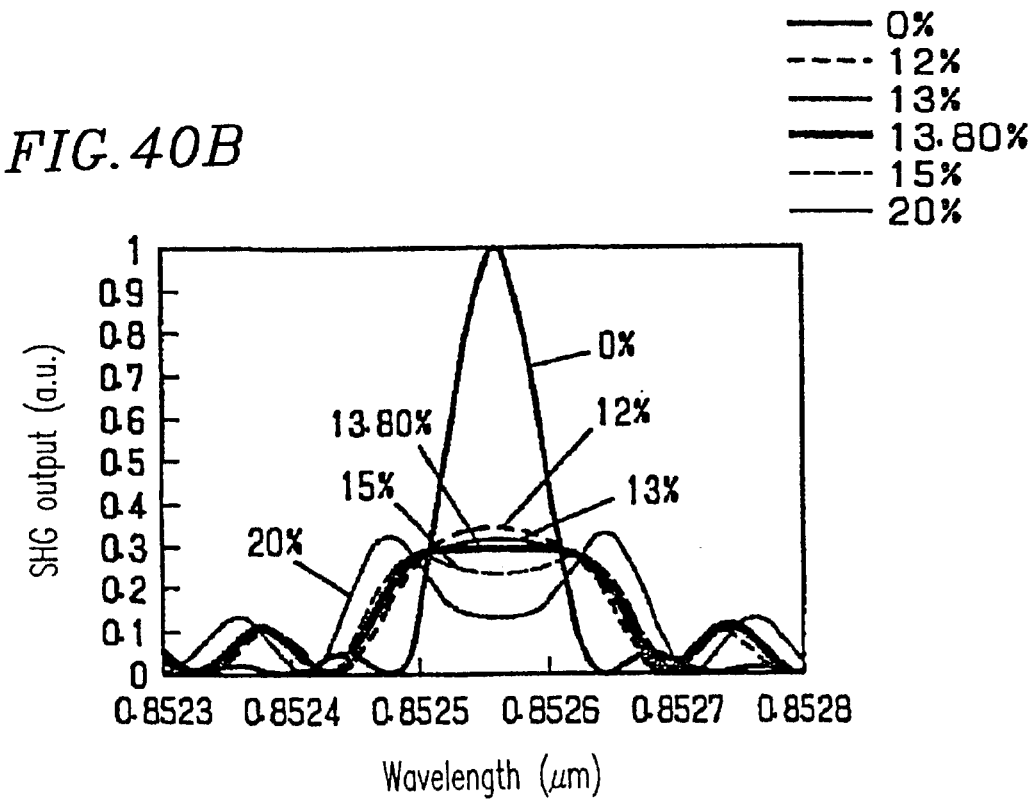
FIG. 40B is a graph showing several tuning curves with different lengths of the one sub-crystal with respect to the entire length of the three-segmented optical wavelength conversion device as parameters.

In the three-segmented structure, a flat peak tuning curve is obtained when the lengths of the crystals located on both ends are equal as described above. Referring to FIGS. 40A and 40B, the relationship between the rate of the length of the crystals on both ends to the entire device length and the phase matching characteristic will be described. FIG. 40A shows the relationship among the rate of the length of one crystal to the entire device length, the size of a recess in the peak portion of the tuning curve, and the wavelength allowance range. When the value for the crystal length becomes larger than about 13% of the entire device length, the recess becomes larger and the wavelength allowance range is greatly widened. Accordingly, in order to suppress the generation of a recess near the peak of the tuning curve as much as possible, the length of the crystal needs to be about 14% or less of the entire device length. On the other hand, in order to widen the allowance range twice or more, the length of the crystal needs to be about 10% or more of the entire device length.

From the above, it is preferable to set the length of the crystal at a value in the range of about 10% to about 14% of the entire device length, so as to suppress the generation of a recess near the peak of the tuning curve. If the length is not within the above range, the tuning curve has two peaks. The problems arising from this are as described in the case of the two-segmented structure.

When the influence of the recess in the peak portion is not taken into consideration, it is observed from FIG. 40B that the length of the crystal is preferably set at a value in the range of about 13% to about 15% of the entire device length so that the maximum of second harmonic wave light does not decrease to 95% or less of the original value.

FIG. 40B shows several tuning curves for various rates of the length of a crystal to the entire device length used as parameters. It is observed from FIG. 40B that when the crystal length increases, the recess near the peak becomes larger. When the crystal length is 13.8% of the entire device length, the tuning curve becomes substantially flat near the peak, allowing for realizing a stable and wide phase matching characteristic.

As a result, a structure having a flat peak phase matching characteristic is realized when the lengths t1 and t2 of the phase adjusting sections provided between the crystals satisfy expressions (3) and (4) above and the length of the crystals on both ends is in the range of about 13% to about 15% with the phase adjusting section in the range of $\alpha1=0.7$ to 0.9.

The above examination was performed assuming that the propagation losses of the fundamental wave light and the second harmonic wave light are not so large. An experiment was performed for the case where the propagation loss is large by using an actual device. As a result, a flat peak tuning curve was obtained when the length of the crystal is in the range of 8% to 25% of the entire device length. Accordingly, it is preferable to set the length of one crystal at a value in the range of 8% to 25% of the entire device length. This range of $\alpha1$ is applied when the propagation loss of a crystal is comparatively small. When the propagation loss of a crystal is comparatively large, or when the power density of propagating light varies depending on the position, the range of $\alpha1$ of 0.5 to 1.5 is effective.

The phase matching characteristic obtained when the optical wavelength conversion device having the two-segmented or three-segmented structure according to the present invention, i.e., the SHG output power and the allowance range of phase match wavelength, are shown in Table 1 below using the value obtained when the domain-inverted structure is not divided (assuming that the total length of the nonlinear optical device is the same).

TABLE 1

| Device structure | SHG output | Allowance range of phase match wavelength (95% or more) |
|---|---|---|
| No division | 1 | 1 |
| Two-segmented | 0.45 | 3 |
| Three-segmented | 0.29 | 6 |

As described above, according to the present invention, the allowance range of phase match wavelength can be greatly widened while suppressing reduction of the SHG output power.

The design of the wavelength allowance range using the phase adjusting section for the second harmonic wave light utilizing a nonlinear optical effect has been described. The above design is also applicable to the case of using harmonic generation other than the second harmonic generation, e.g., sum frequency generation, and the case of parametric oscillation. Second harmonic generation is one type of sum frequency generation and parametric oscillation as described in the previous examples. Thus, the relationship for second harmonic generation is applicable to the sum frequency generation and parametric oscillation.

Accordingly, in the expression of thickness t of the phase adjusting section:

$$t=(2n+\alpha)\pi/(\beta2\omega-2\cdot\beta\omega) \qquad (2a)$$

$\beta2\omega$ and $\beta\omega$ are replaced with $\beta3$, $\beta1$, and $\beta2$, to obtain the following expression, $$t=(2n+\alpha)\pi/(\beta3-\beta1\beta2) \qquad (2c)$$

wherein n=0, 1, 2, 3, . . . , $\beta1$ denotes the propagation constant of light having a wavelength $\lambda1$ in the phase adjusting section, $\beta2$ denotes the propagation constant of light having a wavelength $\lambda2$ in the phase adjusting section, and $\lambda3$ denotes the propagation constant of light having a wavelength $\lambda3$ in the phase adjusting section.

The value of $\alpha$ and the conditions to be satisfied by the length t of the crystal are the same as those described above with reference to second harmonic generation. Widening of the allowance range of phase match wavelength is possible by a similar design. Thus, an optical wavelength conversion device capable of widening the wavelength allowance range by sum frequency generation or parametric oscillation is realized.

The above-mentioned structure of the present invention is also be applicable to the differential frequency generation using three light beams respectively having wavelengths $\lambda1$, $\lambda2$, and $\lambda3$. In this case, a light having a wavelength of $\lambda2$ and a light having a wavelength of $\lambda3$ are incident on the nonlinear optical crystal to emit a light having a wavelength of $\lambda1$. The relationship to be satisfied among the wavelengths $\lambda1$, $\lambda2$, and $\lambda3$ is the same as that in the sum frequency generation. Accordingly, widening of the allowance range of phase match wavelength can be similarly realized by employing the above-mentioned design scheme of the phase adjusting section.

The phase adjusting section can be a film having the thickness satisfying the relationship:

$$t=(2n+\alpha)\pi/(\beta2\omega-2\cdot\beta\omega) \qquad (2a)$$

described above and having a refractive index dispersion. In order to further enhance the operational characteristics of the optical wavelength conversion device, it is preferable to use a material having a refractive index substantially identical to that of the nonlinear optical material. When a material having a refractive index different from that of crystals is inserted between the crystals, Fresnel reflection is generated at the interface due to the difference in the refractive index, causing a propagation loss of fundamental wave light or second harmonic wave light. Accordingly, such Fresnel loss in the phase adjusting section can be reduced by using a material having a refractive index close to that of the crystals.

The phase adjusting section and the nonlinear optical crystals are preferably bonded to each other. When the nonlinear optical crystals are used for the optical wavelength conversion, high precision stability is required. That is, when a variation due to temperature change and mechanical vibration arises, the light phase state changes between crystals, degrading the characteristics. These problems can be avoided by bonding the nonlinear optical crystals and the phase adjusting section.

It is more preferable to form the phase adjusting section in one crystal. Since the conventional structure is formed by combining crystals having different phase matching conditions, it is difficult to form portions having different phase matching conditions in one crystal. On the other hand, according to the present invention, the optical wavelength conversion device can be formed by forming the phase adjusting section in part of the crystal. For example, the composition of part of the crystal may be changed by diffusion or ion exchange to form the phase adjusting section.

Alternatively, an optical waveguide may be formed on the nonlinear optical crystal, and the phase adjusting section may be formed in part of the optical waveguide by ion exchange, metal diffusion, addition of a cladding layer, or the like. In this method, since the optical waveguide exists on the surface of a substrate, the phase adjusting section can be easily formed. Moreover, since the light power density is high in the optical waveguide, high efficiency wavelength conversion is realized.

In the case where it is difficult to form the phase adjusting section using a material having a refractive index equal to that of the nonlinear optical material, it is desirable to form a reflection prevention film at the interface between the phase adjusting section and the nonlinear optical material as described in Example 6. When a reflection prevention film is inserted, it is necessary to consider the difference in the propagation constant between the fundamental wave light and the second harmonic wave light in the reflection prevention film. More specifically, when reflection prevention films are formed on both sides of the phase adjusting section, the relationship:

$$2 \times t12 \times (\beta 2a - 2 \times \beta a) + t11(\beta 2\omega - 2 \times \beta \omega) = (2n + \alpha) \times \pi$$

wherein t12 denotes the thickness of the reflection prevention film, βa and β2a denote the propagation constants of the fundamental wave light and the second harmonic wave light, respectively, in the reflection prevention film, t11 denotes the thickness of the phase adjusting section, and βω and β2ω denote the propagation constants of the fundamental wave light and the second harmonic wave light, respectively, in the phase adjusting section. When the reflection prevention film is a multilayer film, each of the values of βa and β2a may be an average value of the values in the layers.

In this example, the optical wavelength conversion device using bulk crystal has been described. Substantially the same construction can be realized when an optical waveguide is formed on a nonlinear optical crystal. Propagating light beams are subjected to optical wavelength conversion in the optical waveguide, so that light confinement is strengthened and a long interaction distance is obtained, realizing high efficiency wavelength conversion. This construction is therefore effective.

In this example, optimization in two-segmented and three-segmented structures as the design of segmented structure has been described in detail. As the number of segmented regions increases, the allowance range can be further widened. However, as the allowance range of phase match wavelength is widened, the conversion efficiency reduces proportionally. Accordingly, in order to obtain high efficiency and wide allowance range, two-segmented or three-segmented structure is appropriate.

The inventors of the present application found that the concept of the phase adjusting section described above can be applied to quasi phase match.

Figure 41:
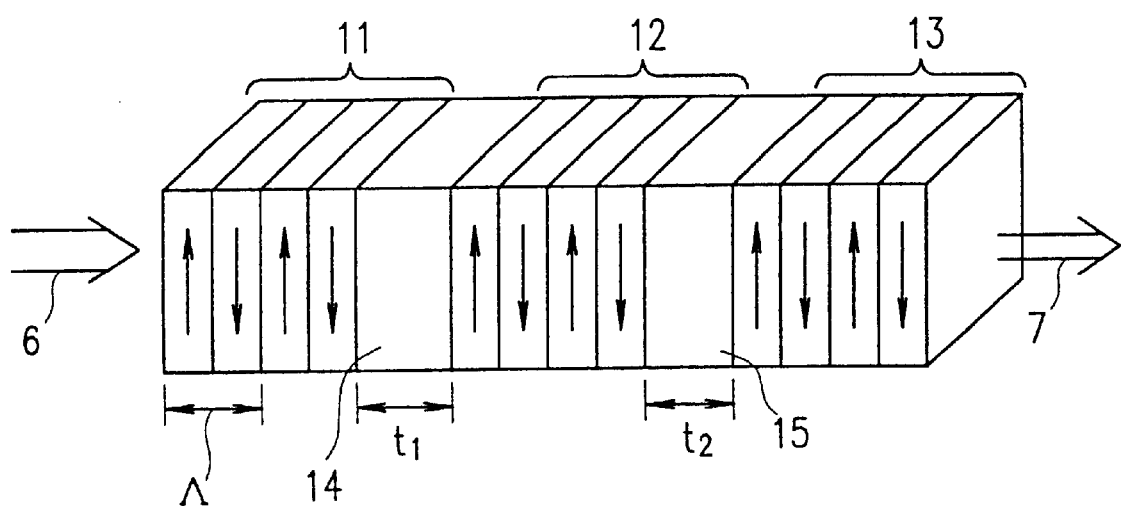
FIG. 41 is a view illustrating a quasi phase match type optical wavelength conversion device according to the present invention.

As shown in FIG. 41, in a structure including domain-inverted regions 11, 12, and 13 formed in a substrate, and phase adjusting sections 14 and 15 formed between the domain-inverted regions 11, 12, and 13, the domain-inverted period Λ satisfies the relationship:

$$\Lambda = 2m\pi/(\beta(2\omega) - 2 \cdot \beta(\omega))$$

wherein m=0, 1, 2, 3, . . . , β(2ω) denotes the propagation constant of the second harmonic wave light in the phase adjusting section, and β(ω) denotes the propagation constant of the fundamental wave light in the phase adjusting section.

In order that the domain-inverted structures have the same phase matching conditions, the same domain-inverted period is set. As for the design of the length t of the phase adjusting section, a design which satisfies the relationship represented by expression (1) can be applied, as in the case of the structure composed of combined crystals.

In quasi phase match, the domain-inverted structure and the phase adjusting section can be easily formed by only changing the periodic domain-inverted structure. For example, the periodic domain-inverted structure can be easily fabricated by using a photolithographic patterning technique. Thus, the structure having the phase adjusting section in the periodic domain-inverted structure can be easily fabricated. The length of the phase adjusting section can be precisely controlled. Since propagation loss hardly occurs in the phase adjusting section, a high efficiency optical wavelength conversion device can be fabricated. In the case where the optical wavelength conversion device is formed by combining crystals, a material having a different phase matching characteristic needs to be provided between the crystals as the phase adjusting section. Accordingly, the thickness of the phase adjusting section must be controlled precisely and a loss may be generated at crystal junction. In the case of quasi phase match, however, since the phase adjusting section and the domain-inverted region are formed of one crystal, Fresnel reflection due to a loss at junction and the difference in refractive index is not generated at all.

Next, how the difference in the domain-inverted period between the divided regions influences the tuning curve was examined.

Assuming the case where the domain-inverted period la slightly different between a first domain-inverted region and a second domain-inverted region, the influence was calculated. As a result, it was found that when the difference in the domain-inverted period is 0.02% or more, the symmetry of the tuning curve is largely degraded, failing to provide flatness near the peak. This indicates that in order to realize a flat peak tuning curve, the difference in the domain-inverted period needs to be suppressed to 0.02% or less.

As described above, in this example, by forming a phase adjusting section between a plurality of domain-inverted regions having an identical domain-inverted period, the variation in the SHG output power in response to the wavelength variation of the fundamental wave light is extremely reduced and the wavelength allowance range is widened are realized, unlike the conventional optical wavelength conversion device. Moreover, optimal design values for the relationship of lengths of actual domain-inverted regions, the length of the phase adjusting section, and the like was clarified.

EXAMPLE 12

In this example, an optical wavelength conversion device having a stable phase match wavelength characteristic against a defect inside the optical wavelength conversion device, tuning utilizing phase match, or the like will be described.

To discuss in more detail, the inventors of the present invention found that propagation losses of the fundamental wave light and the second harmonic wave light in an optical wavelength conversion device greatly influence the characteristics of the optical wavelength conversion device and that this influence can be drastically reduced when the propagation losses of the fundamental wave light and the second harmonic wave light have an appropriate relationship with each other.

First, the phase matching characteristic of the optical wavelength conversion device when a propagation loss is generated was examined.

Hereinabove, the cases where propagation losses of the fundamental wave light and the second harmonic wave light in the optical wavelength conversion device are small enough to be negligible have been examined. In reality, however, in a construction utilizing an optical waveguide, in particular, a comparatively large propagation loss exists. To prepare for such a case, a tuning curve of an optical wavelength conversion device where a propagation loss exists will be described.

Figure 42A:
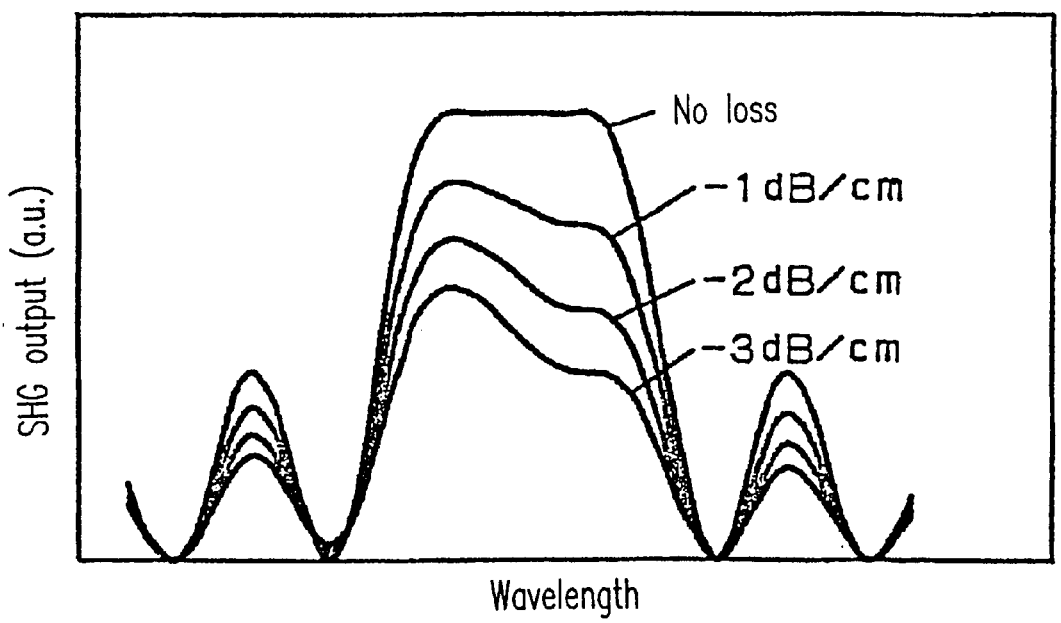
FIG. 42A is a graph showing calculated several tuning curves in the case where only a propagating loss for a fundamental wave light exists.
Figure 42B:
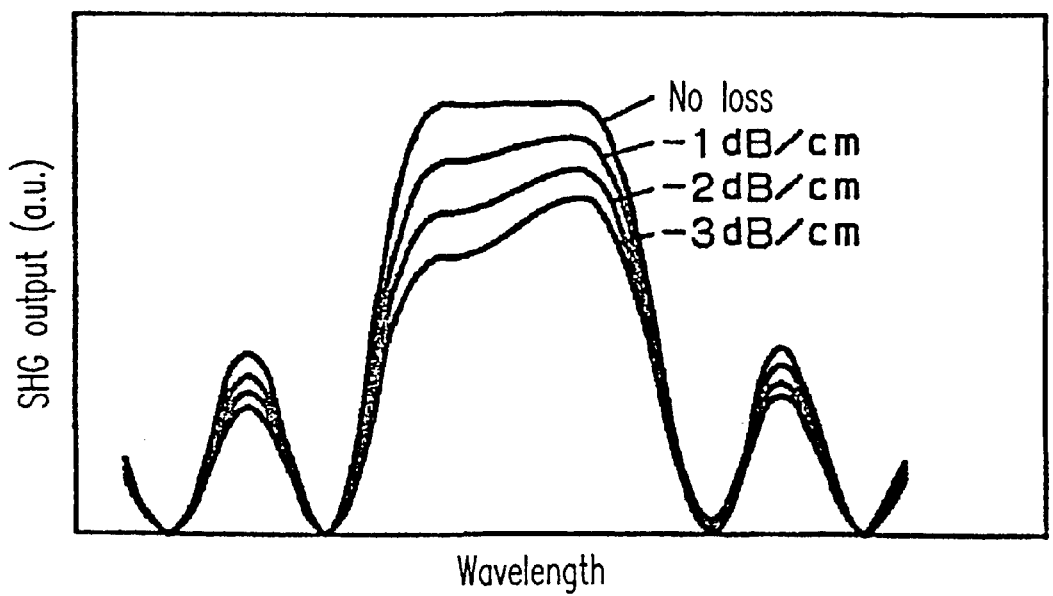
FIG. 42B is a graph showing calculated several tuning curves in the case where only a propagating loss for a second harmonic wave light exists.

FIG. 42A shows the calculation results in the case where a propagation loss of only fundamental wave light exists, and FIG. 42B shows the calculation results in the case where a propagation loss of only second harmonic wave light exists. It is found that the tuning curve is tilted downward in the right direction for the propagation loss of the fundamental wave light, while the tuning curve is tilted upward in the right direction for the propagation loss of the second harmonic wave light.

As the propagation loss of the fundamental wave light is large, the influence of the phase adjusting section in the vicinity of the output portion becomes small. This is because the fundamental wave light is attenuated with propagation, and thus the intensity of the second harmonic wave light generated in the vicinity of the output portion decreases. For example, in a two-segmented structure, it is appropriate that the length of one of the two crystals is about 17% of the entire device length. Therefore, the phase adjusting section is formed in the vicinity of either of the output portion and the incident portion of the device.

For example, in the case where the propagation loss of the fundamental wave light is large, it is desirable to form the phase adjusting section in the vicinity of the incident portion because in that position the phase adjusting section is less influenced by the propagation loss.

The inventors of the present invention have paid attention to the fact that the generation of asymmetry of the tuning curve due to a propagation loss b1 of the fundamental wave light exhibits a reverse effect to the generation of asymmetry of the tuning curve due to a propagation loss b2 of the second harmonic wave light. In other words, the symmetry of the tuning curve may be compensated for by optimizing the propagation loss between the fundamental wave light and the second harmonic wave light.

Figure 43:
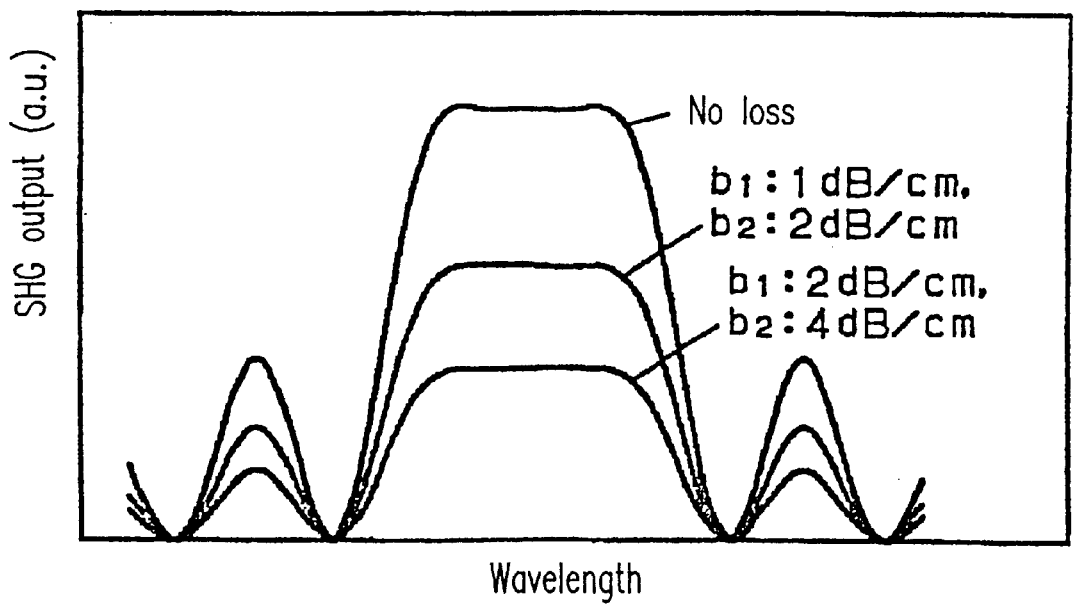
FIG. 43 is a graph showing relationships between propagating losses for the fundamental wave light and second harmonic wave light and tuning curves.

FIG. 43 shows the results of various examinations on the relationship between the propagation losses of the fundamental wave light and the second harmonic wave light and the tuning curve. From this graph, it is found that when the propagation loss b1 of the fundamental wave light and the propagation loss b2 of the second harmonic wave light satisfy the relationship of b2=2×b1, the tuning curve having a symmetric profile with respect to the wavelength of the fundamental wave light is realized, irrespective of the propagation losses of the fundamental wave light and the second harmonic wave light. In this way, by optimizing the relationship between the propagation losses of the fundamental wave light and the second harmonic wave light, the asymmetry of the tuning curve occurring due to the propagation loss can be made small enough to be negligible.

In reality, it has been confirmed that when the propagation lose b2 of the second harmonic wave light is as small as 6 dB/cm or less, substantially the symmetric tuning curve is obtained in the range of 0.5×b1 to 1.5×b1, indicating that it is preferable to fabricate an optical wavelength conversion device having a propagation lose in this range.

The relationship of b2=2×b1 has been found to obtain a flat peak tuning curve in order to widen the allowance range of phase match wavelength. This is very important for an optical wavelength conversion device which satisfies the phase matching conditions.

The phase matching characteristic of the optical wavelength conversion device is largely influenced by the propagation loss, resulting in a decrease of conversion efficiency and complication of the device design due to the generation of asymmetry of the tuning curve and the like.

For example, in the construction for widening the allowance range of the phase match wavelength described above, also, the position and size of the phase adjusting section to be provided are influenced by the propagation loss. As further cases in an optical wavelength conversion device, when functional elements are integrated in the light propagation direction, for example, when electrodes are to be integrated to modulate the intensity of light or when grating elements are to be integrated to utilize diffraction of a portion of second harmonic wave light or fundamental wave light, the operational characteristics of the resultant integrated element are influenced by the propagation losses of the fundamental wave light and the second harmonic wave light. This is because the relationship of the intensities of the fundamental wave light and the second harmonic wave light by the propagation 1088 varies depending on at which position of the optical wavelength conversion device and other elements are to be integrated.

In the case where a portion having a different propagation constant exists due to the presence of a crystal defect or refractive index non-uniformity, or in the case where a defect or disturbance of the domain-inverted period exists in a quasi phase match type device, the resultant tuning curve deviates from a theoretical profile. In such a case, the phase math characteristic is significantly different between the case where fundamental wave light is incident on the incident portion and the case where it is incident on the output portion. Due to this non-reversible characteristic, the device characteristics during reverse propagation differ more than those during forward propagation.

For example, in a cavity type optical wavelength conversion device which effects high efficiency wavelength conversion by disposing an optical wavelength conversion device in a cavity structure and a reflective optical wavelength conversion device, the tuning curve characteristic is different between the forward propagation and the reverse propagation, which greatly influences the reduction of conversion efficiency.

On the contrary, according to the present invention, the influence of the propagation loss can be neglected when functional elements are to be integrated to the optical wavelength conversion device if the above-described relationship of b2=2×b1 is satisfied, making the device design very easy. This is because the change along the incident light propagation direction made on the optical wavelength conversion characteristic by the propagation loss of the fundamental wave light, and the corresponding change made by the propagation loss of the second harmonic wave light, are canceled by each other. In this way, the optical wavelength conversion device is provided with a reversible characteristic to the incident light propagation direction.

Thus, an optical wavelength conversion device which is hardly influenced by a defect and non-uniformity even when a reverse propagation light is used.

In this example, the optimal relationship of the propagation loss has been described for the construction where the fundamental wave light having a wavelength $\lambda$ is wavelength-converted into the second harmonic wave light having a wavelength $\lambda/2$. Similarly, there exists an optimal relationship of the propagation loss for parametric conversion, sum frequency generation, and differential frequency generation using three light beams respectively having wavelengths $\lambda 1$, $\lambda 2$, and $\lambda 3$.

Specifically, the propagation distance dependency of the device characteristic due to the propagation loss can be neglected when the propagation losses for the wavelengths $\lambda 1$, $\lambda 2$, and $\lambda 3$ are identical to each other. Accordingly, in the wavelength conversion among the three wavelengths, the propagation losses of these wavelengths are preferably made identical to each other. If the propagation losses are comparatively small, i.e., if they are 6 dB/cm or less, a good characteristic is obtained if the difference between the propagation losses is 20% or less.

EXAMPLE 13

In this example, a coherent light generator (a coherent light source) including a semiconductor laser and an optical wavelength conversion device, which enables an invariably stable power characteristic, will be described.

More specifically, this example defines the wavelength allowance range and tuning curve characteristic of an optical wavelength conversion device which are necessary for stabilizing SHG output power from the optical wavelength conversion device when a coherent light source is fabricated from a semiconductor laser and the optical wavelength conversion device.

Figure 44:
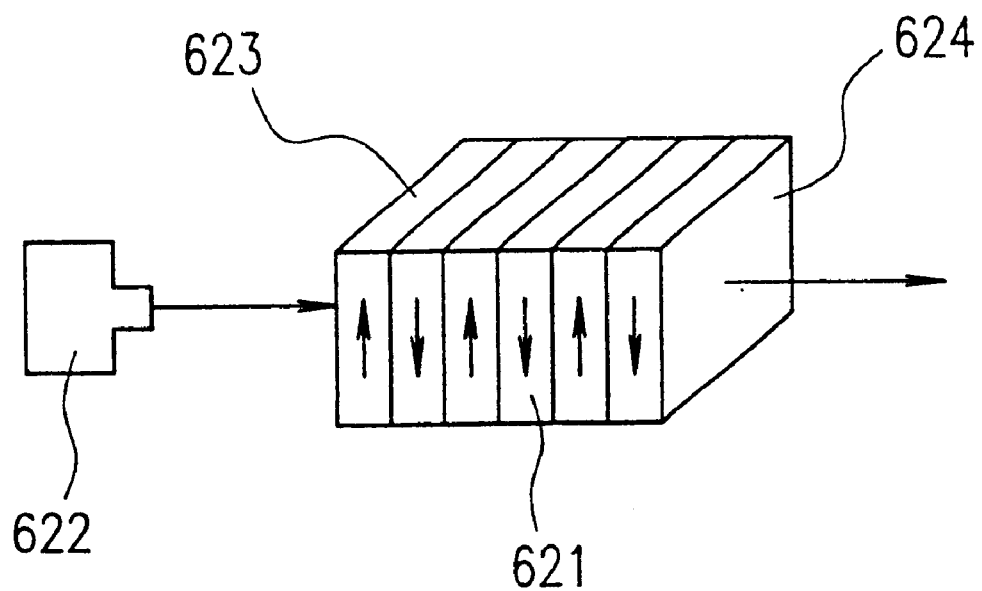
FIG. 44 is a view illustrating a coherent light generator according to the present invention.

FIG. 44 illustrates a coherent light source, which includes an optical wavelength conversion device 621 and a semiconductor laser 622. The optical wavelength conversion device 621 includes an incident section 623 and an output section 624. The semiconductor laser 622 has a function of varying the output wavelength, so that the output wavelength is tuned to a wavelength which satisfies the phase matching conditions of the optical wavelength conversion device 621, thereby to stabilize the output power.

In such a construction, a characteristic required to stabilize the SHG output power from the optical wavelength conversion device 621 was examined.

The oscillation wavelength of a semiconductor laser can be varied by optical feedback utilizing grating feedback and a wavelength filter. It can also be varied by integrating a DBR grating on a portion of an optical waveguide of the semiconductor laser and varying a reflection wavelength at the DBR grating using a temperature change and a plasma effect. However, a semiconductor laser oscillates only at each longitudinal mode determined depending on a cavity structure of the semiconductor laser. Accordingly, a tunable oscillation wavelength is provided only intermittently. For example, the oscillation wavelength can be controlled at intervals of about 0.1 nm.

Figure 45A:
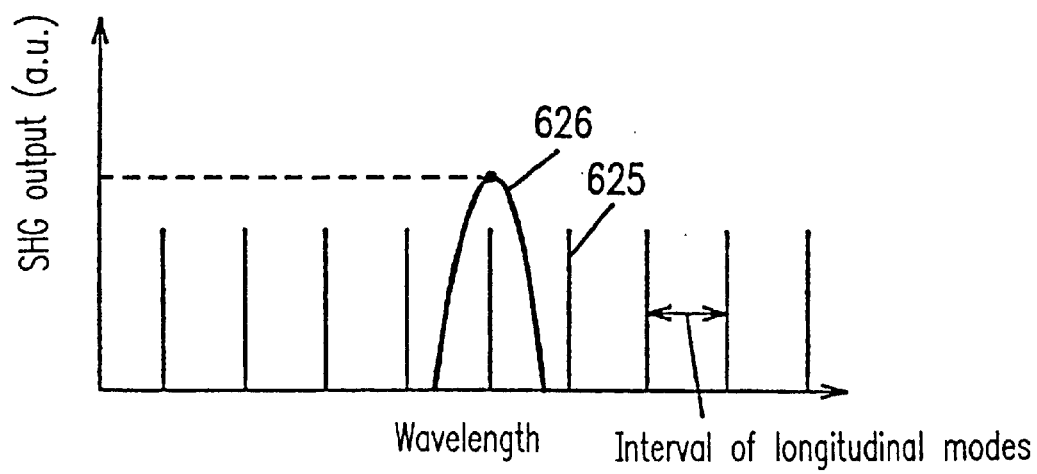
FIGS. 45A and 45B are graphs showing the relationships between the oscillation wavelength of a semiconductor laser and the phase matching characteristic when the maximum value of a tuning curve of the optical wavelength conversion device and the oscillation wavelength of the semiconductor laser are matched with each other (FIG. 45A), and when the oscillation wavelength is displaced from the vicinity of the maximum value (FIG. 45B)
Figure 45B:
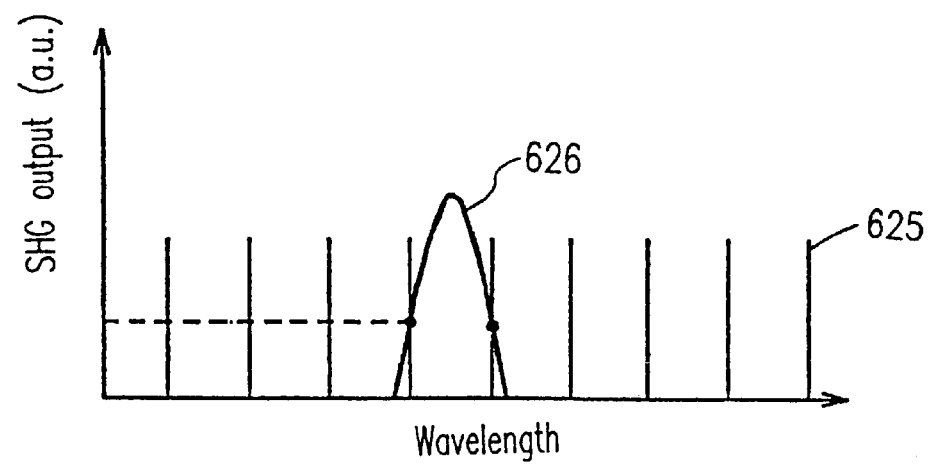

An optical wavelength conversion device generally has a very small wavelength allowance range. For example, in a waveguide type optical wavelength conversion device made of LiNbO$_3$ having a length of 10 mm, the full width at half maximum is 0.1 nm or less. The relationship between the phase matching characteristic of the optical wavelength conversion device and the oscillation wavelength of the semiconductor laser is schematically shown in FIGS. 45A and 45B. In FIGS. 45A and 45B, the reference numerals 625 and 626 denote an oscillation mode (longitudinal mode) of the semiconductor laser and a tuning curve of the optical wavelength conversion device, respectively.

In FIG. 45A, the peak of the tuning curve 626 and the oscillation mode 625 of the semiconductor laser overlap each other. In such a case, the maximum SHG output power is obtained by positioning the longitudinal mode 625 at the peak point of the tuning curve 626. In the case where the peak of the tuning curve 626 is located around the middle of the interval between the oscillation modes 625 of the semiconductor laser, as shown in FIG. 45B, the maximum SHG output power is not obtained even if the oscillation wavelength la adjusted accordingly. The resultant coherent light source falls to provide stable SHG output power even if the wavelength of the semiconductor laser is adjusted accordingly.

Figure 46A:
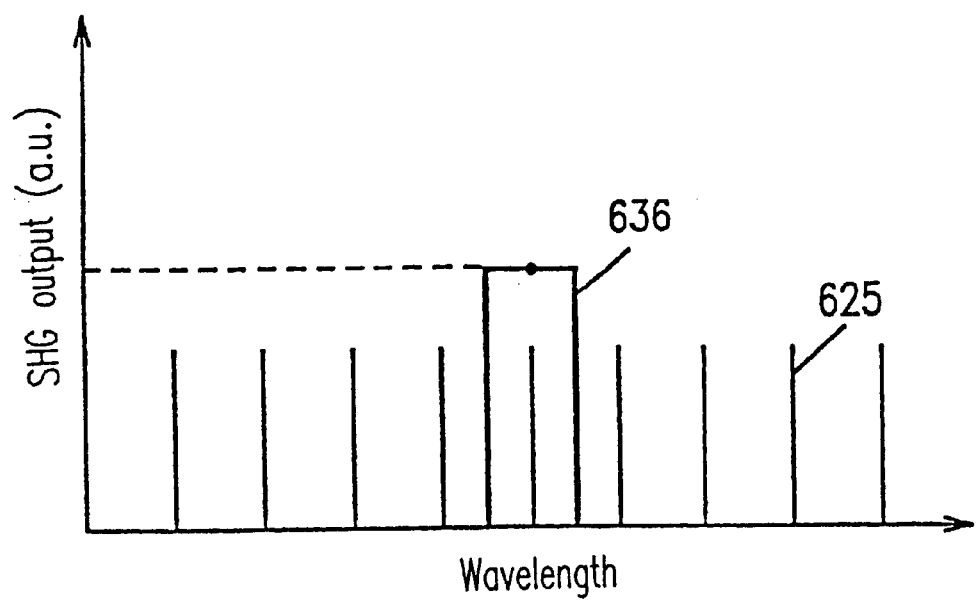
FIGS. 46A and 46H are graphs showing the relationships between the oscillation wavelength of a semiconductor laser and the phase matching characteristic when the maximum value of a tuning curve of the optical wavelength conversion device and the oscillation wavelength of the semiconductor laser are matched with each other (FIG. 46A), and when the oscillation wavelength is displaced from the vicinity of the maximum value (FIG. 46B), in a coherent light generator according to the present invention.
Figure 46B:
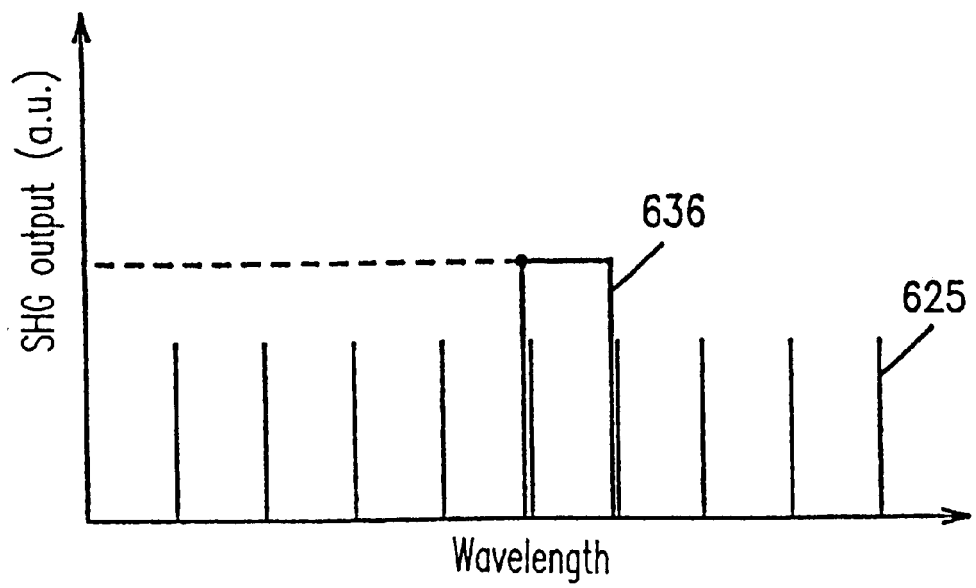

In order to overcome the above problem, the flat portion of the tuning curve of the optical wavelength conversion device needs to be wider than at least the interval of the longitudinal modes 625 of the semiconductor laser. FIGS. 46A and 46B show the case where the flat portion of the tuning curve 636 is wider than the interval of the longitudinal modes 625 of the semiconductor laser. In such a case, the maximum SHG output power is obtained irrespective of the positional relationship between the peak of a tuning curve 636 and the longitudinal mode 625. Thus, the SHG output power can be stabilized by tuning the wavelength of the semiconductor laser.

Next, modulation of the output from the semiconductor laser to modulate the SHG output power to be output from the coherent light source was examined. The results exhibited a problem of chirping of the oscillation wavelength of the semiconductor laser. The chirping of a semiconductor laser as used herein refers to a phenomenon in which when the output power of a semiconductor laser is modulated, the temperature of an active layer of the semiconductor laser changes in proportion to the power intensity, whereby the oscillation wavelength of the semiconductor laser varies.

Figure 47A:
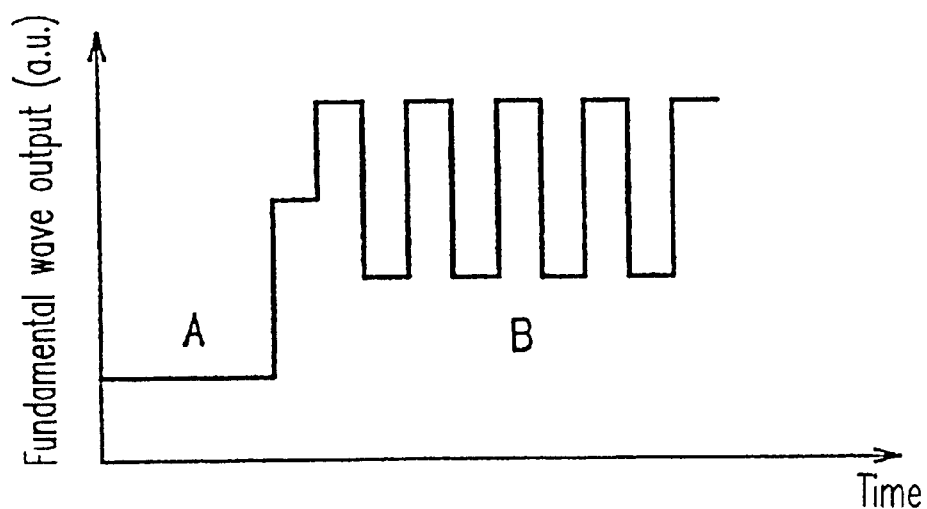
FIG. 47A is a graph showing a modulated power of fundamental wave light in a coherent light generator.
Figure 47B:
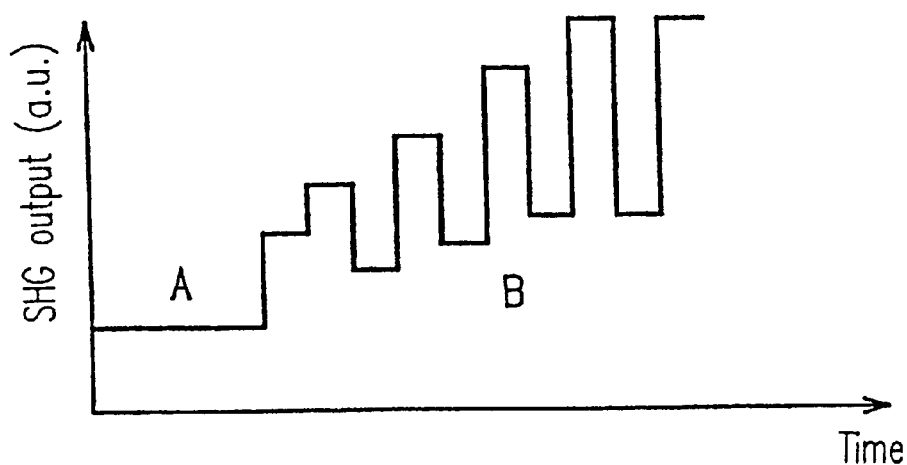
FIG. 47B is a graph showing a power variation of a coherent light generator using a conventional optical wavelength conversion device.

For example, referring to FIG. 47A, when the output power of the semiconductor laser is shifted from a constant state A to a state B in which the output power is modulated at a predetermined frequency, the average light intensity changes. This results in a difference in the temperature of the active layer of the semiconductor laser between the states A and B. The oscillation wavelength therefore changes in a short period of time which is on the order of several tens of $\mu$s at the moment of the shift from the state A to the state B. FIG. 47B shows the SHG output power output from the coherent light source monitored at this moment. As is observed from FIG. 47B, the power gradually changes.

Figure 47C:
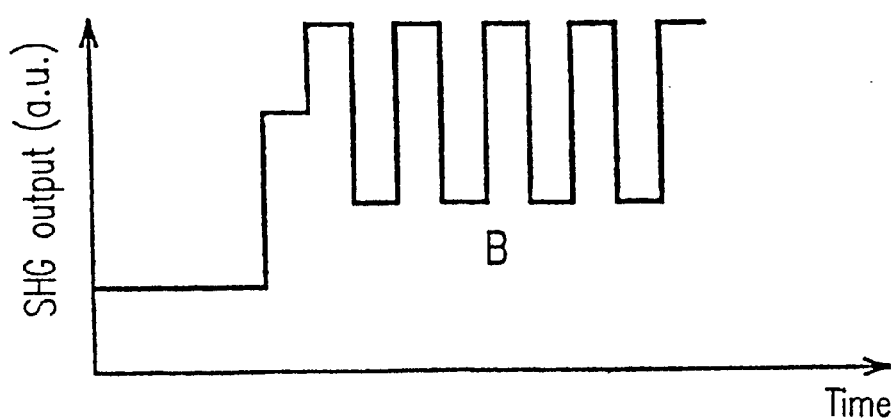
FIG. 47C is a graph showing a power variation of the coherent light generator using the optical wavelength conversion device according to the present invention.

On the contrary, the optical wavelength conversion device having the wavelength allowance range wider than the longitudinal mode interval of the semiconductor laser as shown in FIG. 46B was used and the modulation characteristic of the semiconductor laser was measured. As a result, a stable modulation characteristic as shown in FIG. 47C was obtained. In further analysis of this modulation characteristic, it was found that the chirping wavelength of the oscillation wavelength changed by the longitudinal mode interval of the semiconductor laser at maximum. This means that even if the oscillation wavelength of the semiconductor laser is stabilized by optical feedback, the wavelength of the oscillation mode varies depending on a change of the temperature of the active layer of the semiconductor laser. This causes the oscillation wavelength to vary by the longitudinal mode interval at maximum. In order to stabilize the oscillation wavelength, it was found important that the tuning curve of the optical wavelength conversion device has a flat portion near the peak thereof and that the flat portion is wider than the longitudinal mode interval of the semiconductor laser.

It should be noted that the wavelength allowance range of the optical wavelength conversion device and the conversion efficiency are in the trade-off relationship with each other. In other words, as the wavelength allowance range increases, the conversion efficiency of the optical wavelength conversion device decreases, Therefore, the increase in the wavelength allowance range should be as small as possible.

From the foregoing, in order to stabilize the coherent light source by controlling the wavelength of the semiconductor laser, it is necessary that the tuning curve of the optical wavelength conversion device is flat in the peak portion and the flat peak portion is wider than the longitudinal mode interval of the semiconductor laser. The flatness of the tuning curve depends on the range of the output power variation required for the coherent light source. An output power variation of about 5% is allowed for a normal laser light source. For such a light source, it is sufficient to provide a flatness of 5% or less for the tuning curve in the wavelength range corresponding to the longitudinal mode interval of the semiconductor laser. A tuning curve having a greater flatness may be required for an application which needs a further strict characteristic.

Based on the above examination results, a coherent light source was fabricated from the optical wavelength conversion device of the previous embodiments and a semiconductor laser, and a power stabilizing experiment was performed. In the experiment, the following problem was found. That is, even when the wavelength of the semiconductor laser was matched with the phase match wavelength of the optical wavelength conversion device by adjusting the wavelength of the semiconductor laser to stabilize the SHG output power, the output power largely varied in some cases, failing to stabilize the power as designed. In order to examine the reason for this variation of the SHG output power, the wavelength of the fundamental wave light was continuously changed to observe a change in the SHG output power, as shown in FIG. 48.

As a result, it was found that the SHG output power was fluctuated at short intervals in the range of the wavelength allowance range of the optical wavelength conversion device. The reason for this was found that the fundamental wave light and the second harmonic wave light were Fresnel-reflected at incident and output end faces of the optical wavelength conversion device and the reflected light beams interference each other, thereby making the SHG output power unstable. In other words, reflected light beams from incident and output end faces interfere each other, and the degree of the interference of the light beams reflected from the end faces changes due to a change in the optical path length of the optical wavelength conversion device caused by the change in the wavelength. For these reasons, the output power becomes unstable. Substantially the same output power variation was also observed in the case where the SHG output power was modulated by modulating the fundamental wave light power.

As described above, when the semiconductor laser is modulated, the wavelength of the semiconductor laser changes. Accordingly, it is difficult to stabilize the power even if the optical wavelength conversion device having a widened wavelength allowance range is used, resulting in greatly increasing the noise level of SHG output power. In order to overcome this problem, a reflection prevention film against the second harmonic wave light and the fundamental wave light is formed on at least one of the incident portion and the output portion. Such a reflection protection film formed on the end faces can prevent Fresnel reflection and thus reduce the interference of reflected light beams. As a result, a coherent light source having a satisfactory stable power characteristic is realized.

In general, in a semiconductor laser, problems such as a noise increase and an output power variation occur when a light beam once output outside is returned to an active layer of the semiconductor laser. In order to overcome these problems, the reflection prevention film for the fundamental wave light is preferably formed on both the incident portion and the output portion. On the other hand, the reflection prevention film for the second harmonic wave light may be formed on either one of the incident portion and the output portion. Preferably, it is formed on the output portion, because loss of the power by Fresnel reflection at the end face is prevented by forming the reflection prevention film for the second harmonic wave light on the output portion, and thus higher SHG output power is obtained.

It is therefore preferable to form a reflection prevention film having a reflection prevention effect for both the fundamental wave light and the second harmonic wave light on the output portion, and a reflection prevention film for the fundamental wave light on the incident portion.

The problem of unstable SHG output power due to interference of light beams reflected from the incident and output end faces can also be overcome by a method of superimposing a radio frequency current on a driving current of the semiconductor laser. This method will be described as follows.

One of the reasons for the interference of light beams reflected from end faces of a semiconductor laser is that the light beams interfere with each other due to a high coherency of the light beams. In order to overcome this problem, the coherency may be reduced to reduce the degree of interference. Specifically, the coherency can be reduced by modulating the driving current of the semiconductor laser using a frequency as high as several hundreds of MHz or more. During this process, the oscillation wavelength of the semiconductor laser tends to shift from a single mode to a multiple mode. This shift of the mode can be prevented by intense light feedback to the active layer using a DBR grating and the like.

Thus, the interference of light beams reflected from the end faces can be reduced by superimposing a radio frequency signal in the semiconductor laser, and thereby the SHG output power can be stabilized.

The aforementioned radio frequency superimposition has an additional feature of greatly increasing the efficiency of the optical wavelength conversion device. The efficiency of the optical wavelength conversion device increases in proportion to the fundamental wave light power. When a semiconductor laser is driven under radio frequency superimposition, pulsed oscillation having a high crest value is obtained, increasing the peak value several times to ten times or more. This results in wavelength conversion of pulsed light with a high intensity, thereby greatly increasing the conversion efficiency. According to the experiment, an improvement of the conversion efficiency two to three times or more was observed. From this aspect, also, it is effective to use a semiconductor laser having radio frequency superimposition.

Moreover, when the oscillation wavelength of the semiconductor laser is widened by the radio frequency superimposition even slightly, the optical wavelength conversion device having a widened wavelength allowance range can obtain a wavelength allowance range wider than the oscillation wavelength of the semiconductor laser. Accordingly, it is possible to convert wavelengths of all light beams efficiently, realizing high frequency wavelength conversion.

EXAMPLE 14

In this example, a coherent light source including a semiconductor laser and an optical wavelength conversion device, which detects a displacement between the oscillation wavelength of the semiconductor laser and the phase match wavelength of the optical wavelength conversion device, will be described. More specifically, the phase match state of the optical wavelength conversion device is detected by detecting a scattering light component of SHG output power obtained from the optical wavelength conversion device.

In order to obtain a stable output power from such a coherent light source including a wavelength tunable semiconductor laser and an optical wavelength conversion device, the oscillation wavelength of the semiconductor laser needs to be identical to the phase match wavelength of the optical wavelength conversion device. Furthermore, in order to stabilize the output, the displacement between the oscillation wavelength of the semiconductor laser and the phase match wavelength of the optical wavelength conversion device is required to be kept monitored, to feedback the detection results to the oscillation wavelength of the semiconductor laser so as to reduce the displacement. Moreover, if the displacement increases so much that the SHG output power becomes almost zero, it is necessary to find the phase match wavelength to fix the oscillation wavelength of the semiconductor laser at the detected phase match wavelength again.

This example describes a construction for detecting the displacement as described above between the oscillation wavelength of the semiconductor laser and the phase match wavelength of the optical wavelength conversion device.

Figure 49:
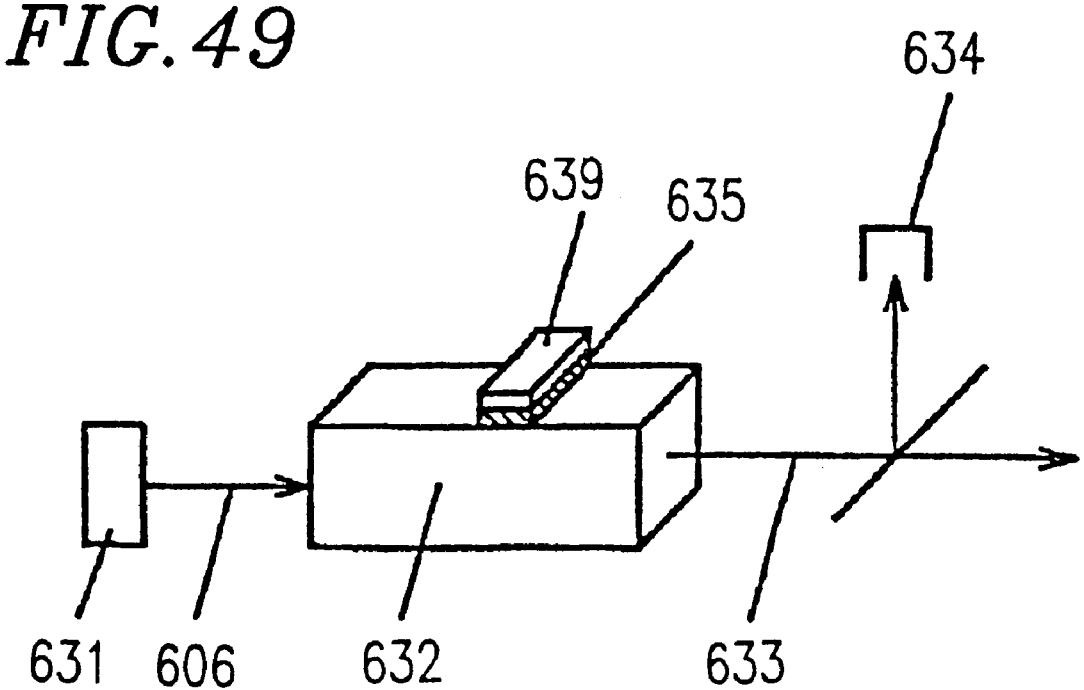
FIG. 49 is a view illustrating a coherent light source according to Example 14 of the present invention.

FIG. 49 illustrates the coherent light source of this example.

Light 606 output from a wavelength tunable semiconductor laser 631 (fundamental wave light) is incident on an optical wavelength conversion device 632, to be converted into second harmonic wave light 633, The intensity of the second harmonic wave light 633 is detected by an optical detector 634 disposed in the vicinity of the output portion of the optical wavelength conversion device 632. A scattering light component of the second harmonic wave light 633 is detected by an optical detector 639 via a filter 635.

Figure 50:
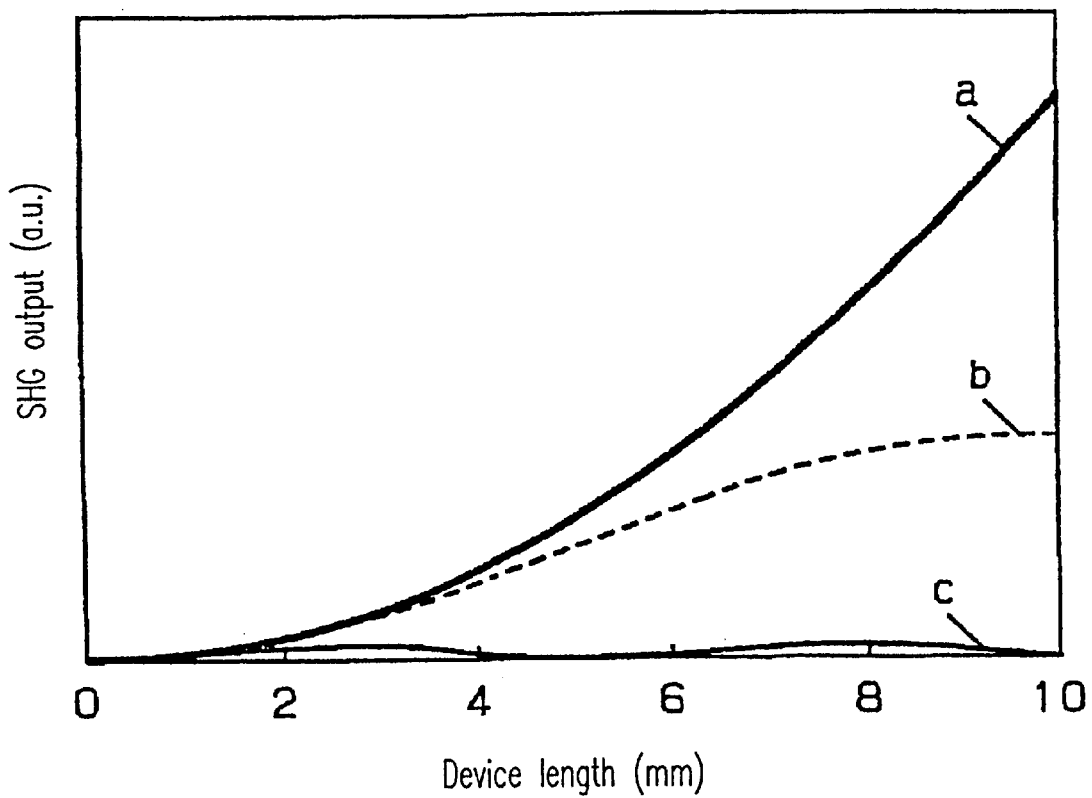
FIG. 50 is a graph showing relationships between a light propagating length and an intensity of the second harmonic wave light in the optical wavelength conversion device.

Referring to FIG. 50, the relationship between the light propagation distance and the intensity of the second harmonic wave light in the optical wavelength conversion device will be described.

A curve a in FIG. 50 represents the characteristic in the case where the oscillation wavelength of the semiconductor laser and the phase match wavelength of the optical wavelength conversion device are matched with each other, while a curve b represents the characteristic in the case where these wavelengths are largely displaced. In the coherent light source shown in FIG. 49, the phase match state of the optical wavelength conversion device can be determined from the difference between the detected levels output from the optical detectors 634 and 639. By disposing a plurality of optical detectors 639 for detecting the scattering light components of the second harmonic wave light from the optical wavelength conversion device 632, the phase match state can be detected more correctly and precisely. By measuring the phase match state and sending the detection results back to the oscillation wavelength of the semiconductor laser in the feedback operation, the optimal phase match state represented by the curve a in FIG. 50 is realized at any time, thereby stabilizing the power of the coherent light source.

Another coherent light source using the optical wavelength conversion device having the phase adjusting section described in the previous examples for achieving power stabilization will be described with reference to FIG. 51.

Figure 51:
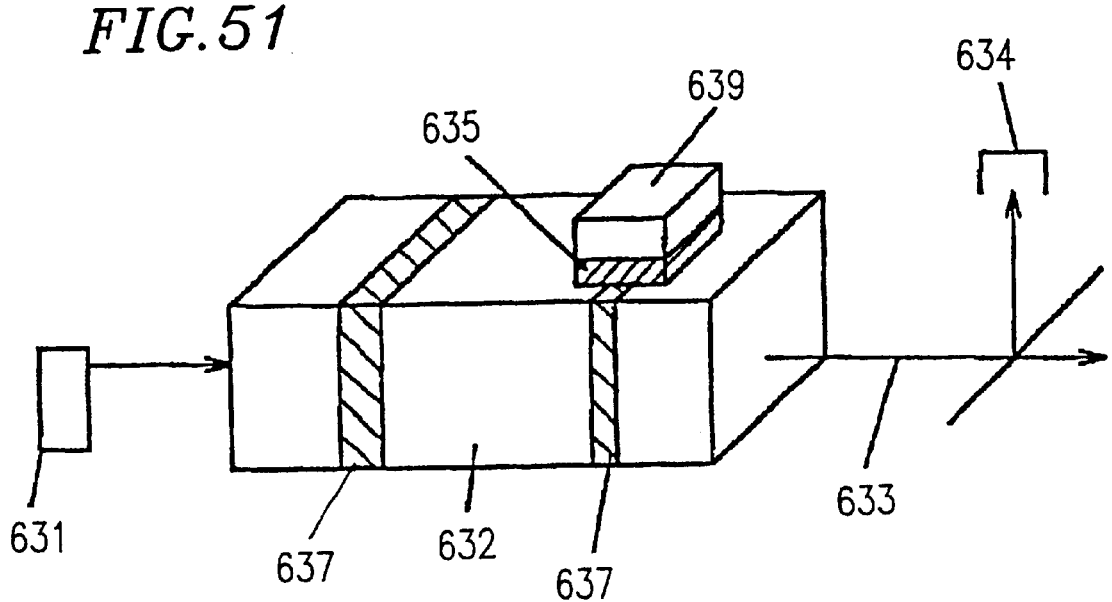
FIG. 51 is a view illustrating another coherent light source according to Example 14 of the present invention.

The coherent light source shown in FIG. 51 enables to detect the magnitude and direction of the displacement between the oscillation wavelength of the semiconductor laser and the phase match wavelength of the optical wavelength conversion device simultaneously.

In this coherent light source, light 606 output from a wavelength tunable semiconductor laser 631 (fundamental wave light) is incident on an optical wavelength conversion device 632, to be converted into second harmonic wave light 633. The intensity of the second harmonic wave light 633 is detected by an optical detector 634 disposed in the vicinity of the output portion of the optical wavelength conversion device 632. A scattering light component of the second harmonic wave light 633 output from the optical wavelength conversion device 632 is detected by an optical detector 639 via a filter 635.

The construction of FIG. 51 is different from the construction of FIG. 49 in that the optical wavelength conversion device 632 has a phase adjusting section 637 and the optical detector 639 for detecting the scattering light component is disposed in the vicinity of the phase adjusting section 637.

In the construction of FIG. 49, it is not possible to determine whether the oscillation wavelength of the semiconductor laser should be adjusted to the longer wavelength side or the shorter wavelength side to resume the optical state (curve a), when the oscillation wavelength of the semiconductor laser and the phase match wavelength of the optical wavelength conversion device are slightly displaced from the optical state (curve a). Accordingly, it is not possible to adjust a displacement instantaneously when the displacement is generated. It is therefore necessary to vary the oscillation wavelength both in the longer wavelength side and the shorter wavelength side and then select the direction in which the resultant SHG output power becomes larger as the result of the adjustment. This adjustment requires a significant amount of time.

Figure 52A:
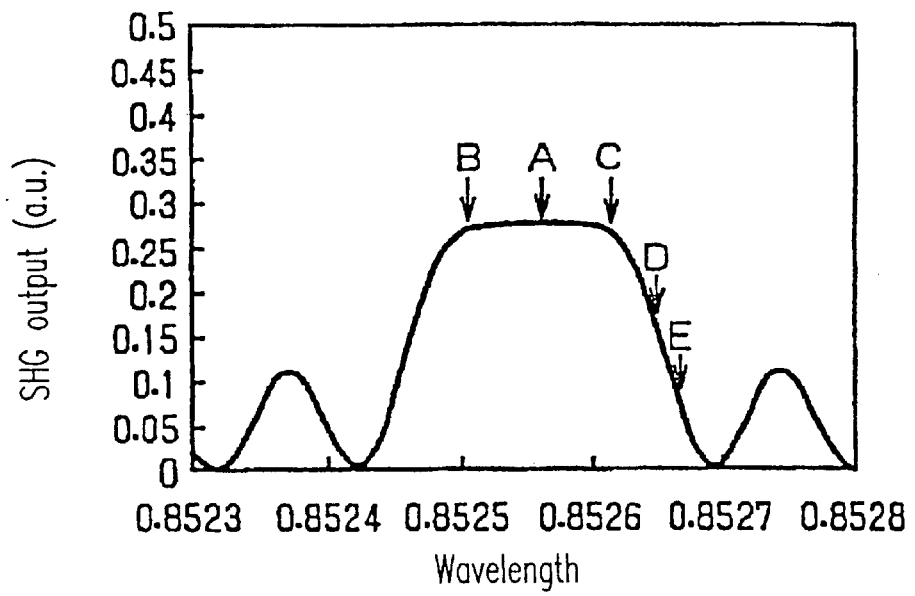
FIG. 52A is a graph showing the phase matching characteristic of an optical wavelength conversion device included in the coherent light source of FIG. 51.
Figure 52B:
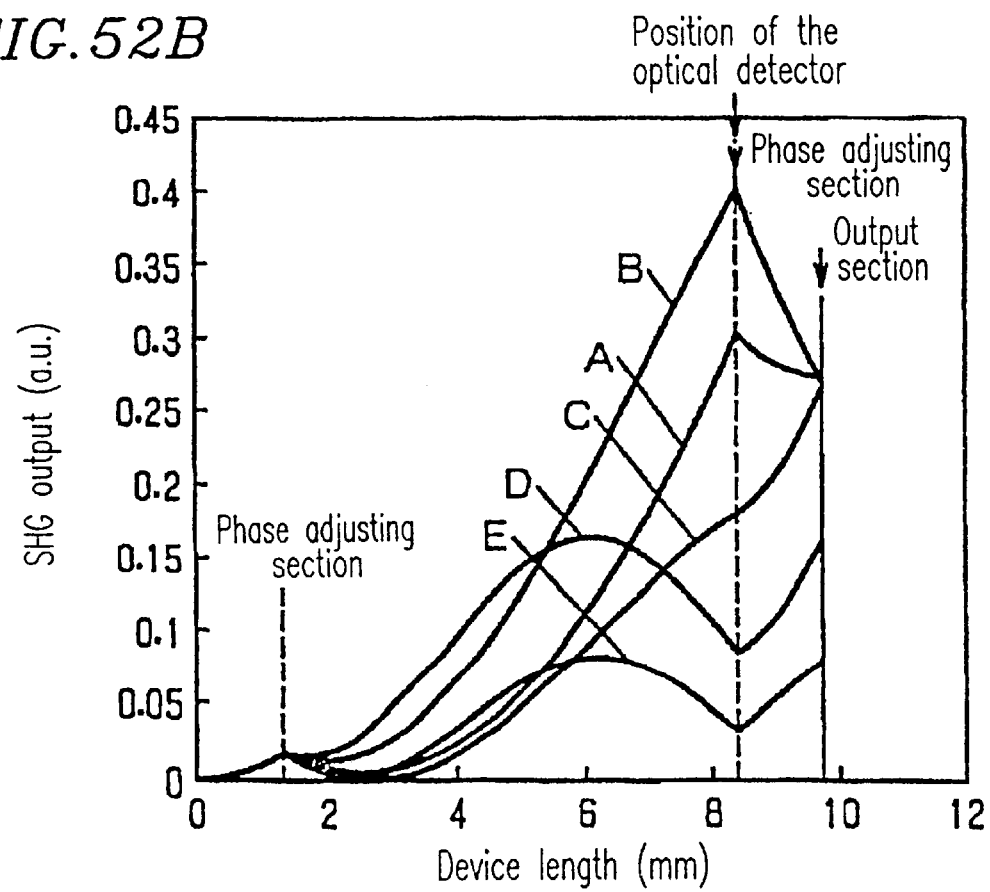
FIG. 52B is a graph showing relationships between a light propagating length and an intensity of the second harmonic wave light at several wavelengths indicated in FIG. 52A.

FIG. 52A shows the phase matching characteristic (tuning curve) of the optical wavelength conversion device Included in the configuration of FIG. 51, and FIG. 52B shows the relationship between the light propagation distance and the intensity of second harmonic wave light for each of wavelengths denoted by A to E in FIG. 52A. It is found from FIGS. 52A and 52B that the characteristics shown in FIG. 52B are largely different among the flat peak portion of the tuning curve.

Based on the above, a second harmonic wave light intensity P21 in the vicinity of the output end face, for example, and a second harmonic wave light intensity P22 at the position upstream for P21 are measured and compared. In a phase matchstate, P21=P22 is realized. If P21>P22, the fundamental wave light wavelength is larger than the second harmonic wave light wavelength. If P21<P22, the fundamental wave light wavelength is smaller than the second harmonic wave light wavelength.

In this way, by disposing the optical detector on the phase adjusting section, the magnitude and direction (i.e., which becomes greater than the other) of the displacement between the oscillation wavelength of the semiconductor laser and the phase match wavelength of the optical wavelength conversion device can be detected instantaneously and precisely. Accordingly, by sending the results to the semiconductor laser in the feedback operation and controlling the oscillation wavelength (wavelength of the output light) of the semiconductor laser, the optimal phase match state can be maintained.

The detection of the second harmonic wave light by the optical detector 634 in the vicinity of the output portion described above may be performed by directly detecting the second harmonic wave light from the optical wavelength conversion device or by detecting the scattering light component of the second harmonic wave light.

In this example, the second harmonic wave light component has been measured. Alternatively, the phase match state can also be observed by measuring the fundamental wave light component. When the fundamental wave light component is measured, the reverse tendency to that described above is observed, where the fundamental wave light is attenuated in a portion where the SHG output power increases, and increases in a portion where the SHG output power is attenuated. Since the fundamental wave light has a large power level compared with the second harmonic wave light, observation of the fundamental wave light is easy.

In this example, the optical wavelength conversion device is made of a bulk optical crystal. Alternatively, substantially the same characteristic is obtained by using an optical wavelength conversion device having a periodic domain-inverted structure.

EXAMPLE 15

In this example, a coherent light generator using an optical wavelength conversion device according to the present invention is described.

A high-efficiency stable optical wavelength conversion device can be obtained by the construction described in the previous examples. As a coherent light generator using such an optical wavelength conversion device, a short-wavelength light source was fabricated. The short-wavelength light source includes a semiconductor laser having a 850 nm wavelength band, a focusing optical system, and the optical wavelength conversion device. A light beam output from the semiconductor laser is focused on an end face of a waveguide of the optical wavelength conversion device by means of the focusing optical system, to excite a propagation mode. A wavelength-converted second harmonic wave light beam is output from the other end face of the waveguide of the optical wavelength conversion device.

The short-wavelength light source (coherent light is generator) of this example including the high-efficiency optical wavelength conversion device of the present invention succeeded in outputting a 10 mW blue second harmonic wave light using the semiconductor laser having a power of about 100 mW. With the widened wavelength allowance range and the flat peak tuning characteristic of the employed optical wavelength conversion device, a stable power characteristic irrespective to a wavelength variation is obtained. As a result, the power variation can be suppressed to 5% or less.

A wavelength of the 400 nm band is desired in the wide range of application fields including printing, bioengineering, and special measurement fields such as fluorescent spectral characteristics, as well as an optical disk field. The short-wavelength light source using the optical wavelength conversion device of the present invention can be used in such application fields in view of both the output power characteristics and the operation stability.

In this example, a light beam output from the semiconductor laser is coupled to the optical waveguide via the focusing optical system. Alternatively, the semiconductor laser and the optical waveguide can be directly coupled. Specifically, when an optical waveguide of TE mode propagation is used, the electric field distribution in the optical waveguide can be matched with the propagation mode of the semiconductor laser, allowing for high-efficiency coupling without the necessity of a converging lens. According to an experiment, direct coupling with a coupling efficiency of 80% was possible, confirming that substantially the same coupling efficiency as that of the lens-intermediate coupling was obtained. Such direct coupling is promising since a small-size, low-cost light source can be realized.

Further, parametric oscillation may be used to increase the wavelength tunable region of a wavelength-tunable laser.

Parametric oscillation can be realized by using an optical wavelength conversion device having a periodic domain-inverted structure and a laser light source. Such parametric oscillation enables generation of a signal light beam having a wavelength $\lambda 2$ and an idler light beam having a wavelength $\lambda 1$, which satisfy the relationship of $1/\lambda 3 = 1/\lambda 1 + 1/\lambda 2$ when fundamental wave light having the wavelength $\lambda 3$ is input. This means that a light beam having a wavelength satisfying the above relationship can be output after tuning of the wavelength of fundamental wave light having the wavelength $\lambda 3$, realizing a tunable laser light source.

When the optical wavelength conversion device of the present invention is used for the construction allowing for the parametric oscillation, the optical wavelength conversion device can provide a widened wavelength allowance range and thus output stable power.

Moreover, widening of the wavelength tunable range, which is difficult in the conventional parametric oscillation method, can be realized according to the present invention.

More specifically, when parametric oscillation is performed using a periodic domain-inverted structure having a period $\Lambda$, it is possible to generate a light beam having a wavelength $\lambda 1$ and a light beam having a wavelength $\lambda 2$ which satisfy the relationship of $\Lambda = 2m\pi/(\beta 3 - \beta 1 - \beta 2)$. Conventionally, however, since the wavelength allowance range satisfying the conditions of $\Lambda$ is narrow, the conditions for wavelengths satisfying the generation conditions in the same periodic structure are narrowed, resulting in an extremely narrow wavelength tunable range. On the contrary, when the optical wavelength conversion device of the present invention is used, the allowance range of phase match wavelength can be widened with the flat peak tuning curve. This enables to widen the allowance range for the wavelength variation of the fundamental wave light. In the case of the parametric oscillation, it is also possible to widen the wavelength allowance ranges for signal light and idler light. As a result, the wavelength tunable range of the output wavelength can be greatly widened, which is difficult in the conventional optical wavelength conversion device.

Furthermore, due to the flat peak tuning curve, the oscillation wavelength can be tuned while the power intensity is kept substantially constant.

EXAMPLE 16

In this example, an optical information processing apparatus according to the present invention will be described.

Figure 53:
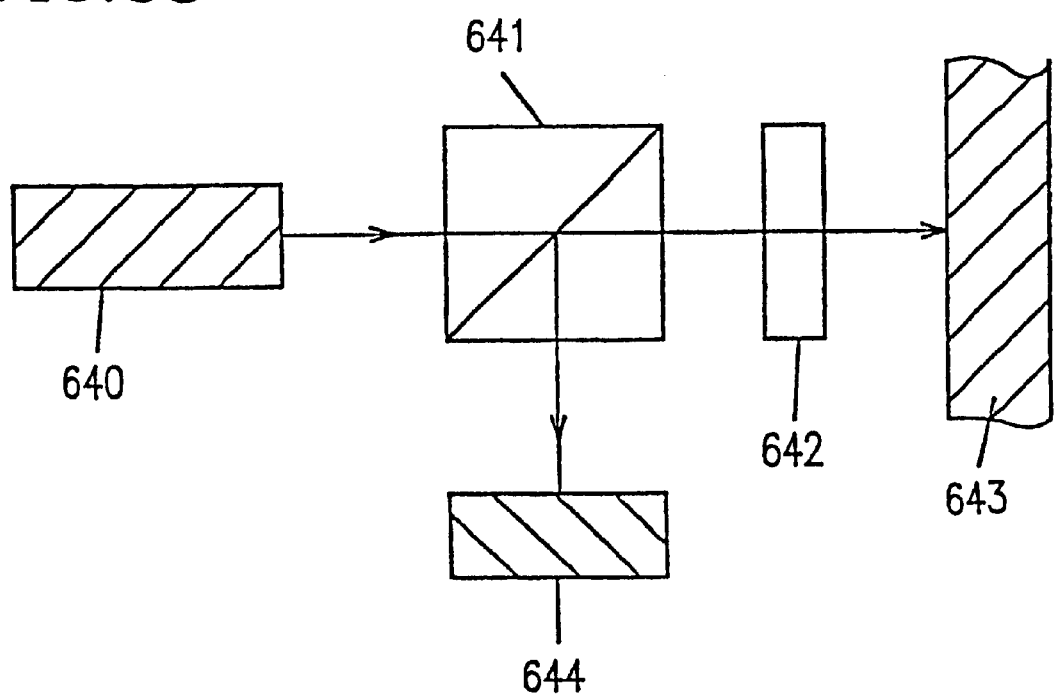
FIG. 53 is a view illustrating an optical information processor according to the present invention.

FIG. 53 illustrates a construction of the optical information processing apparatus according to the present invention. Referring to FIG. 53, a light beam having a power of 10 mW output from a coherent light generator 640 having the features described in the previous example passes through a beam splitter 641 and is incident on an optical disk 643 as an information reproduction medium via a lens 642. Then, a reflected light beam from the optical disk 643 is collimated by the lens 642 and reflected from the beam splitter 641, to be incident on an optical detector 644 to be read as a signal. It is also possible to write information on the optical disk 643 by modulating the intensity of the output of the coherent light generator 640.

According to the present invention, since the allowance range of the optical wavelength conversion device of the coherent light generator 640 is widened, the output power of the coherent light generator 640 is stabilized, enabling suppression of the power variation depending on an external temperature change to 5% or less.

Furthermore, since high-power blue light can be generated, not only reading but also writing of information to the optical disk 643 can be realized. Moreover, since the size of the device can be markedly reduced by using the semiconductor as a light source of fundamental wave light, the processing apparatus can be used for small-size personal optical disk reading/recording apparatus.

It is required to modulate the output power of the coherent light generator 640 to write information to the optical disk 643. In the optical information processing according to the present invention, the output power of the coherent light generator 640 is modulated by modulating the power intensity of the semiconductor laser. The oscillation wavelength varies when the wavelength of the semiconductor laser is modulated. However, as described above, since the optical wavelength conversion device has a flat peak phase matching characteristic, instability of the SHG output power due to the modulation of the semiconductor laser is not generated. As a result, a stable modulated power characteristic is obtained, realizing a low noise characteristic.

The aspect ratio of output beams can be optimized by optimizing the width of the optical waveguide of the optical wavelength conversion device. For example, the aspect ratio of output beams can be made close to 1:1 by providing a layer having a high refractive index and a width smaller than the width of the optical waveguide on the optical waveguide to form a waveguide structure. This enables improvement of the light focusing characteristic of an optical pickup without using a beam shaping prism and the like, realization of a high transmission efficiency, an excellent light focusing characteristic, and low cost. Furthermore, noise of dispersed light generated during the beam shaping can be reduced, to realize simplification of the optical pickup.

Moreover, further embodiments of the invention will be described below.

Specifically, the following explanation describes a method for obtaining a phase matching characteristic which has a wide wavelength allowance range and a flat peak portion by forming a specific periodic domain-inverted structure for the optical wavelength conversion device. More specifically, a nonlinear optical device having a domain-inverted structure which combines a single period structure and a linear chirping structure, and a nonlinear optical device obtained when the periodic domain-inverted structure is modulated using a function f(z), are described below with reference to several embodiments.

(Principle of Quasi Phase Match)

First, optical wavelength conversion and phase match by a quasi phase match type SHG device will be described.

Optical wavelength conversion utilizing a quadratic nonlinear optical effect is performed by methods such as second harmonic generation, parametric generation, sum frequency generation, and differential frequency generation. In either of these methods, wavelength conversion of light is performed by interaction of three light beams respectively having wavelength $\lambda 1$, wavelength $\lambda 2$, and wavelength $\lambda 3$. These wavelengths must satisfy the relationship:

$$1/\lambda 1 = 1/\lambda 2 + 1/\lambda 3 \tag{6}$$

For example, the second harmonic generation corresponds to the case of $\lambda 2 = \lambda 3$, where expression (6) above is changed to:

$$1/\lambda 1 = 2/\lambda 2 \tag{7}$$

indicating that a light beam having wavelength $\lambda 2$ which is a half of wavelength $\lambda 1$ of fundamental wave light is generated.

In the parametric generation, light beams having wavelengths $\lambda 2$ and $\lambda 3$ are generated from the fundamental wave light having wave length $\lambda 1$. In the sum frequency generation, a light beam having wavelength $\lambda 1$ is generated from light beams having wavelengths $\lambda 2$ and $\lambda 3$. In the differential frequency generation, a light beam having wavelength $\lambda 3$ is generated from light beams having wavelengths $\lambda 1$ and $\lambda 2$.

In the above wavelength conversion, the phase matching conditions must be satisfied to realize high-efficiency wavelength conversion. The phase match in this context means that the phases of wavelengths $\lambda 1$, $\lambda 2$, and $\lambda 3$ of the three light beams related to the wavelength conversion match with one another in a medium transmitting the light beams (e.g., a nonlinear optical crystal and an optical waveguide) and satisfy the relationship:

$$N1 \cdot 2\pi/\lambda 1 = N2 \cdot 2\pi/\lambda 2 + N3 \cdot 2\pi/\lambda 3 \tag{8}$$

wherein N1, N2, and N3 denote the refractive indices of the light beams of wavelength $\lambda 1$, wavelength $\lambda 2$, and wavelength $\lambda 3$ actually experienced by these light beams (effective refractive indices), which are different between the case where the light beams pass through an optical waveguide and the case where they pass through a bulk crystal. They are also different when the polarization directions of the light beams are different.

The relationship of the phases of the three wavelengths in the quadratic nonlinear optical effect is expressed as follows with respect to the distance z (position) in a propagation direction:

$$A \cdot \exp\{i(-N1 \cdot 2\pi/\lambda 1 + N2 \cdot 2\pi/\lambda 2 + N3 \cdot 2\pi/\lambda 3)z\} \tag{9}$$

The light conversion efficiency with respect to the distance is proportional to the second power of the definite integral value of expression (9) with respect to the distance z. For example, when expression (8) is not satisfied, expression (9) is changed to:

$$A \cdot \exp\{i \cdot \beta \cdot z\} \tag{10}$$

The integral value of expression (10) becomes an oscillation function, which is less than a value of $A/\beta$.

When expression (8) is satisfied, expression (9) is changed to:

$$A \tag{11}$$

The integral value thereof becomes $A \cdot z$, which increases in proportion to the distance. This state corresponds to the case where the phase matching conditions are satisfied, where the conversion efficiency increases in proportion to the second power of the distance, allowing for high-efficiency conversion.

In general, however, any substance has wavelength dispersion, which changes the refractive index thereof depending on the wavelength of light. Accordingly, it is difficult to satisfy expressions (6) and (7) simultaneously. This problem can be overcome by employing the quasi phase matching which utilizes periodical inversion of non-linear polarization. In such quasi phase matching, a nonlinear grating structure having a period $\Lambda$ is provided to enable to add a grating-dependent propagation vector to the relationship among propagation constants represented by expression (8). In other words, when a domain-inverted structure having a period $\Lambda$ is formed in a nonlinear optical crystal, the phase relationship represented by expression (9) is changed to:

$$A' \cdot \exp\{i(-N1 \cdot 2\pi/\lambda 1 + N2 \cdot 2\pi/\lambda 2 + N3 \cdot 2\pi/\lambda 3 - q \cdot 2\pi/\Lambda)z\} \tag{12}$$

wherein $q = 1, 2, 3, \ldots,$. The resultant structure is called as a primary periodic structure when $q=1$, and as a quadratic periodic structure when $q=2$. In short, the phase matching conditions can be satisfied by canceling the phase mismatch amount $(-N1 \cdot 2\pi/\lambda 1 + N2 \cdot 2\pi/\lambda 2 + N3 \cdot 2\pi/\lambda 3)$ with the nonlinear grating structure.

The domain-inverted period for satisfying the quasi phase matching conditions can be induced as follows from expression (6) in the case of the primary periodic structure:

$$N1 \cdot 2\pi/\lambda 1 + N2 \cdot 2\pi/\lambda 2 + N3 \cdot 2\pi/\lambda 3 = 2\pi/\Lambda \tag{13}$$

In the case of second harmonic generation, for example, the following is obtained from expression (13):

$$\Lambda = \lambda 1 / 2\pi (N2 - N1) \tag{14}$$

(Phase Mismatch Amount)

Figure 54A:
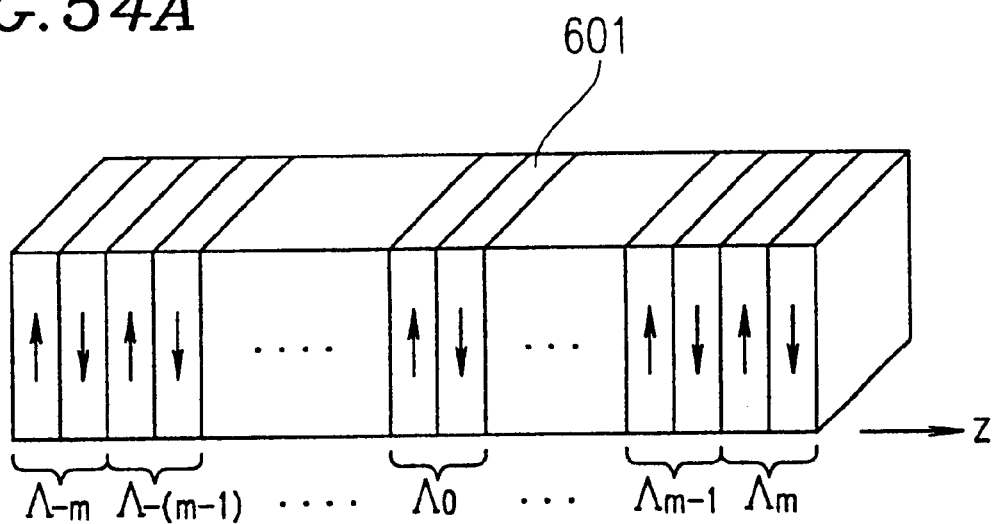
FIG. 54A is a view illustrating a domain-inverted structure of an optical wavelength conversion device according to the present invention.

The inventors of the present application have found that the allowance range of phase match wavelength can be controlled efficiently by controlling the phase mismatch state of the periodic domain-inverted structure. In more detail, a structure as shown in FIG. 54A is used as the domain-inverted structure, which includes domain-inverted regions 601 having domain-inverted periods represented by $\Lambda_{-m}, \Lambda_{-(m-1)}, \ldots, \Lambda_{-2}, \Lambda_{-1}, \Lambda_0, \Lambda_1, \Lambda_2, \ldots, \Lambda_{m-1}, \Lambda_m$. Thus, the entire length L of the grating is:

$$L = \Lambda_{-m} + \Lambda_{-(m-1)} + \ldots + \Lambda_{-2} + \Lambda_{-1} + \Lambda_0 + \Lambda_1 + \Lambda_2 + \ldots + \Lambda_{m-1} + \Lambda_m.$$

By assuming f(z) as the distribution function of the phase mismatch amount, the following expressions are obtained:

$$f(i \bigstar \Lambda_0) = (\Lambda_1 + \Lambda_2 + \ldots + \Lambda_i) - i \bigstar \Lambda_0 \text{ and}$$

$$f(-i \bigstar \Lambda_0) = (\Lambda_{-1} + \Lambda_{-2} + \ldots + \Lambda_{-i}) - i \bigstar \Lambda_0$$

wherein $i = 1, 2, 3, \ldots$.

Normalization of the phase mismatch amount f(z) is expressed as follows:

$$f(z)/\Lambda_0 \tag{15}$$

Hereinafter, the above normalized value is used as the phase mismatch amount.

The phase matching conditions in the period $\Lambda_0$ of the domain-inverted structure is represented by expression (14), and the phase matching conditions are satisfied by the wavelength $\lambda 0$ of fundamental wave light which satisfies expression (14).

Generation of a phase mismatch amount in a conventional domain-inverted structure will be described.

Figure 55A:
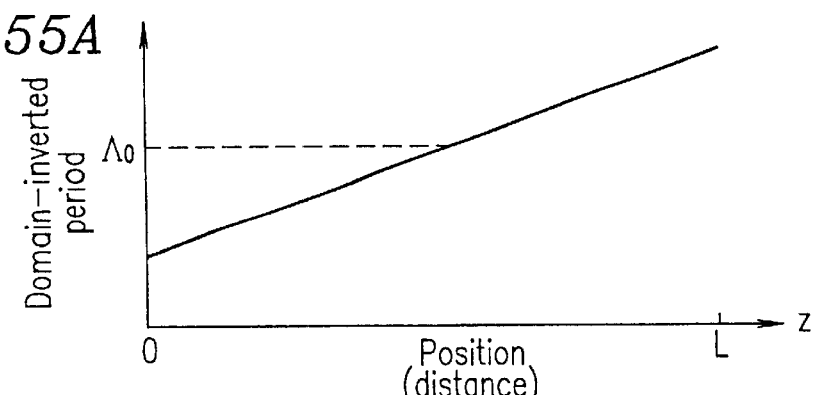
FIGS. 55A and 55B are graphs showing a distribution of domain-inverted period and a distribution of phase mismatch amount, respectively, of a linear chirping domain-inverted structure.
Figure 55B:
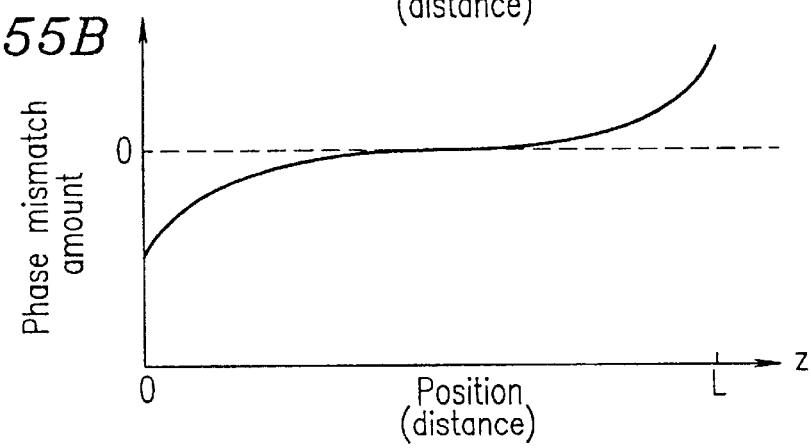

Referring to FIGS. 55A and 55B, how a phase mismatch amount is generated when the period of the domain-inverted structure is shifted from $\Lambda_0$ for the fundamental wave light having a center wavelength $\lambda 0$ will be described.

For example, in the case of the conventional structure described above in which the period changes in a chirping fashion, the change in the domain-inverted period with respect to the distance in the z direction is as shown in FIG. 55A. Since the period changes along a straight line, the corresponding phase mismatch amount is an integral of a linear function, which can be represented by a quadratic, thus exhibiting a change as shown in FIG. 55B.

Figure 55C:
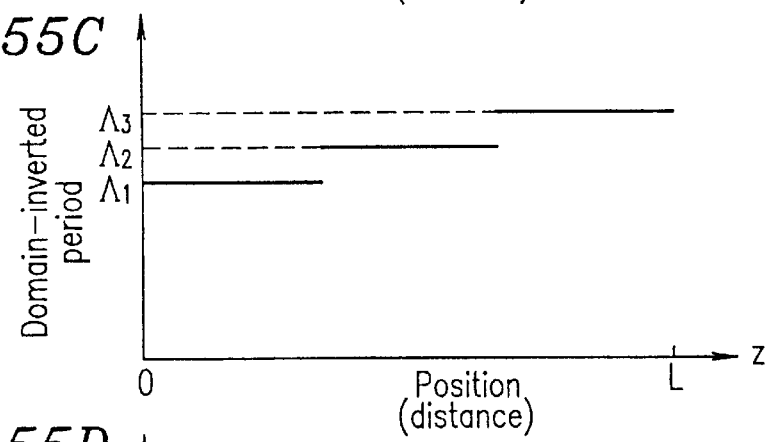
FIGS. 55C and 55D are graphs showing a distribution of domain-inverted period and a distribution of phase mismatch amount, respectively, of a segmented periodic domain-inverted structure.
Figure 55D:
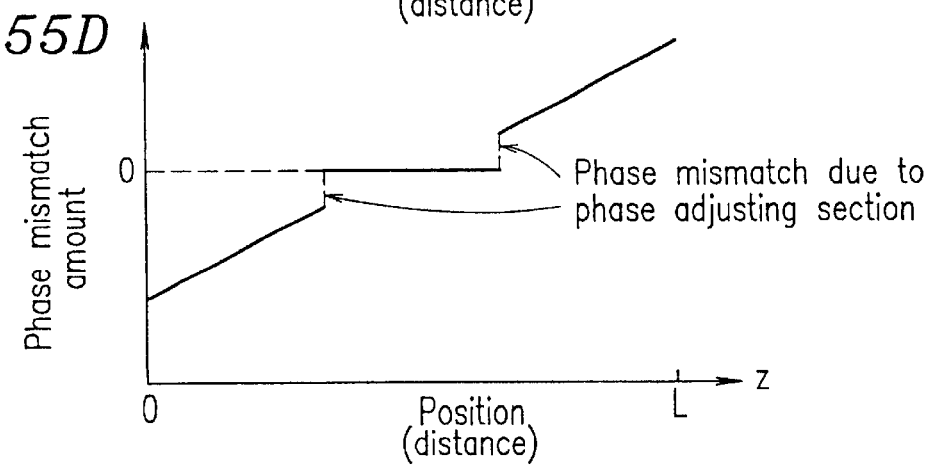

FIGS. 55C and 55D show the change of the domain-inverted period with respect to the distance in the z direction and the relationship between the phase mismatch amount and the distance, respectively, for another domain-inverted structure. This domain-inverted structure is segmented into three regions to increase the allowance range of phase match wavelength as in the conventional case, and includes such three regions having different periods $\Lambda 1$, $\Lambda 2$, and $\Lambda 3$ and phase adjusting sections $\delta 1$ and $\delta 2$. In FIG. 55D, the phase mismatch amounts with respect to the center period $\Lambda 2$ are shown. The phase mismatch amount in this case is a sum of the phase mismatch amount generated in the phase adjusting sections and the phase mismatch amounts generated in the respective segmented domains inverted regions each having a different period. A phase mismatch amount can also be exhibited in the similar manner for the case when forming a phase shift section in a periodic domain-inverted structure.

Figure 56A:
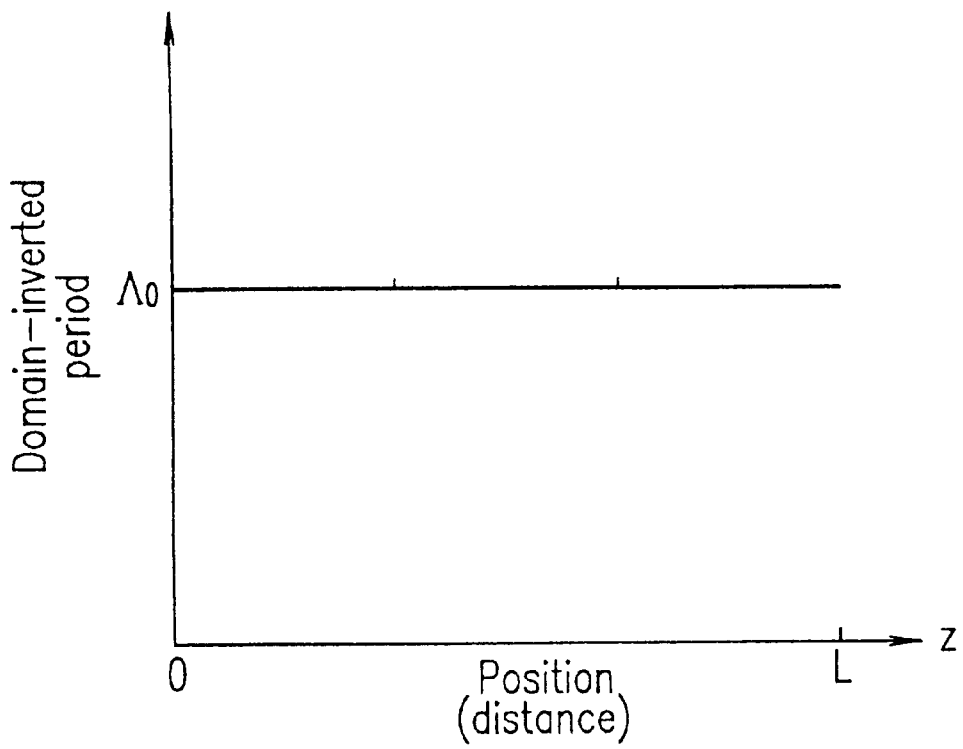
FIGS. 56A and 56B are graphs showing a distribution of domain-inverted period and a distribution of phase mismatch amount, respectively, of a domain-inverted structure having a phase shift section.
Figure 56B:
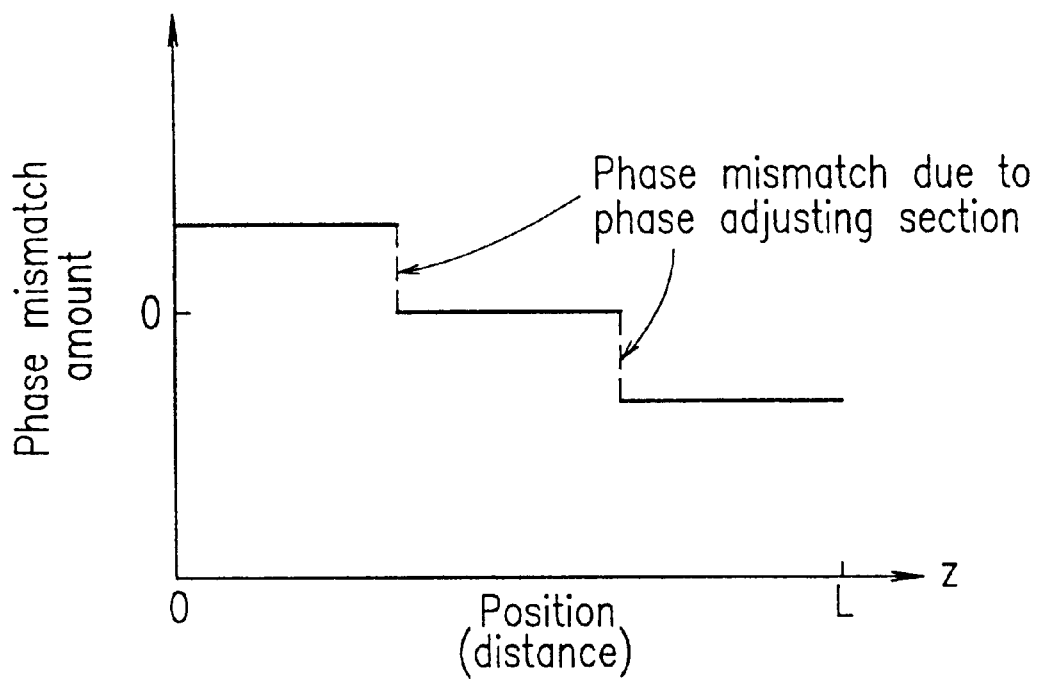

In a structure where only a phase shift is provided, the domain-inverted period is constant. Therefore, as shown in FIG. 56A, the domain-inverted period is constant irrespective of the distance z. The phase mismatch amount is, however, generated in the phase control section as shown in FIG. 56B.

(Problem on Quasi Phase Match)

A problem of the optical wavelength conversion device utilizing the quasi phase matching is related to the allowance range of phase matching wavelength.

In the wavelength conversion by the quasi phase matching, the phase matching conditions can be satisfied in a quasi manner using a nonlinear grating, to realize high conversion efficiency in proportion to the second power of the length of the device. In this case, however, the wavelength allowance range which satisfies the phase matching conditions is narrowed in inverse proportion to the working length of the grating. For example, in a quasi phase match type SHG device using $LiNbO_3$ having a length of 10 mm, when light having a wavelength of 850 nm is attempted to be converted into second harmonic wave light having a wavelength of 425 nm, the required period of domain-inverted structure is about 3.2 $\mu$m. In this case, the wavelength allowance range of fundamental wave light for satisfying the quasi phase matching conditions is 0.1 nm or less in the full width at half maximum. This value is extremely strict for obtaining stable wavelength conversion, causing a problem of unstable output power depending on an environmental change such as a change in ambient temperature.

Hereinbelow, the present invention will be described by way of examples with reference to the relevant drawings.

EXAMPLE 17

In this example, an optical wavelength conversion device having a wide wavelength allowance range according to the present invention will be described. The wavelength allowance range of the optical wavelength conversion device is widened by controlling the distribution of phase mismatch amount.

Figure 54B:
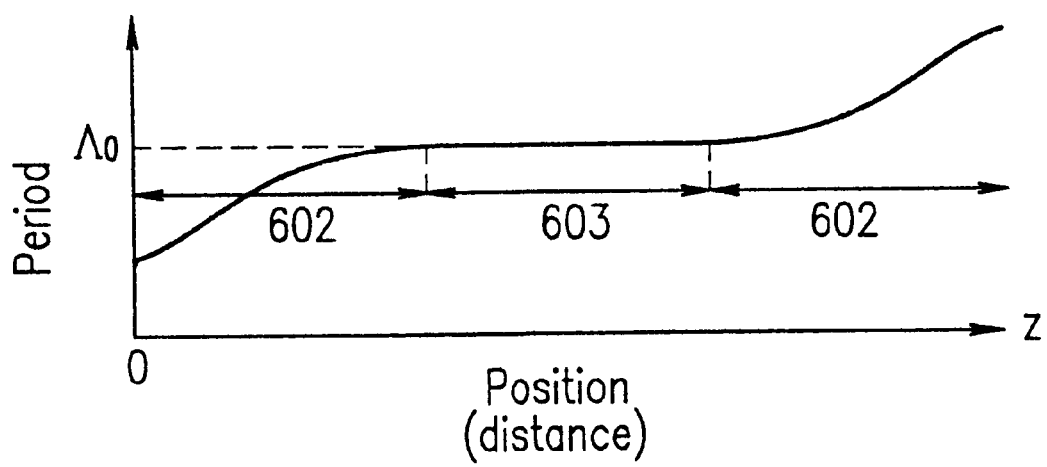
FIG. 54B is a graph showing a distribution of domain-inverted periods of the domain-inverted structure of FIG. 54A.

The inventors of the present application have found a novel method for widening the allowance range of phase match wavelength in an optical wavelength conversion device. The allowance range of phase match wavelength is widened by partially changing the period of the periodic domain-inverted regions 601 as shown in FIG. 54A. More specifically, as shown in FIG. 54B, the allowance range of phase match wavelength is widened by combining a single period section 603 and chirping period sections 602 having a chirping-like periodic structure. This enables, not only to provide a wide wavelength allowance range, but also to suppress the change in the SHG output power in response to the wavelength variation of the fundamental wave light to an extremely low level. This means that a tuning curve with a flat peak (referred to as the "flat peak tuning curve") is obtained. Moreover, the reduction in the wavelength conversion efficiency due to the widening of the wavelength allowance range can be minimized. Thus, widening of the wavelength allowance range and a high efficiency characteristic can be attained simultaneously. Furthermore, the freedom in the design of the phase matching characteristic increases, enabling to freely set the widening rate of the wavelength allowance range.

As described before, some conventional structures allow for widening the allowance range of phase match wavelength. These conventional structures include, for example, 1) the segmented periodic structure (a structure including domain-inverted sub-structures having different periods) and 2) the chirping periodic structure. In such conventional structures, however, while the wavelength allowance range can be greatly widened, large rippling is generated near the peak of the phase match curve, and thus it is difficult to keep the SHG output power stable.

On the contrary, according to the present invention, both widening of the wavelength allowance range and realization of a flat peak phase matching characteristic are possible by uniquely improving the domain-inverted structure. In other words, according to the present invention, attention is paid to the phase mismatch amount, and the distribution of phase mismatch amount is controlled so as to be able to design the phase matching characteristic.

Figure 57A:
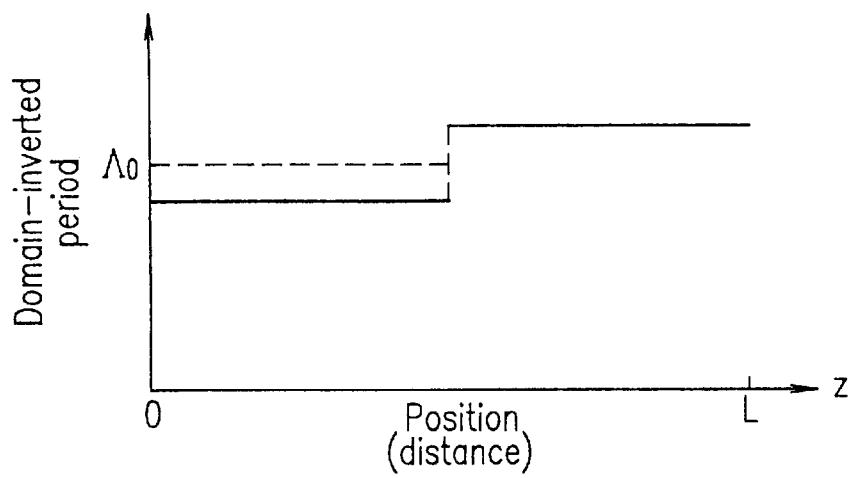
FIGS. 57A and 57B are graphs showing a distribution of domain-inverted period and a distribution of phase mismatch amount, respectively, of a two-segmented polarization periodic inversion structure.
Figure 57B:
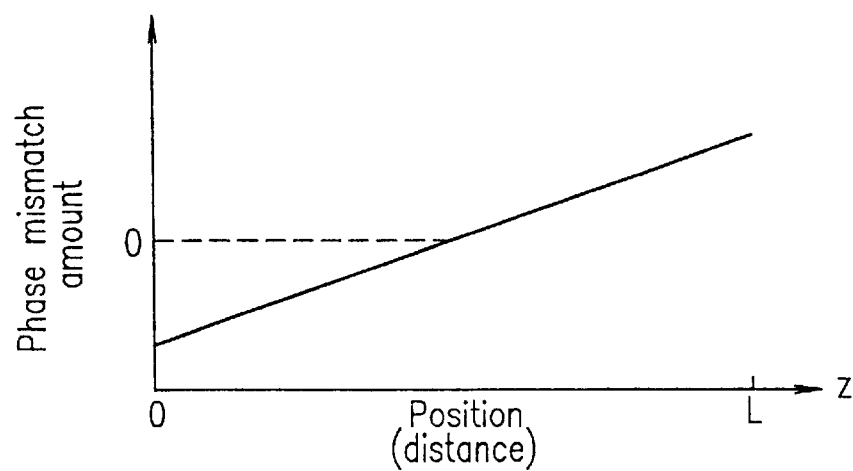
Figure 57C:
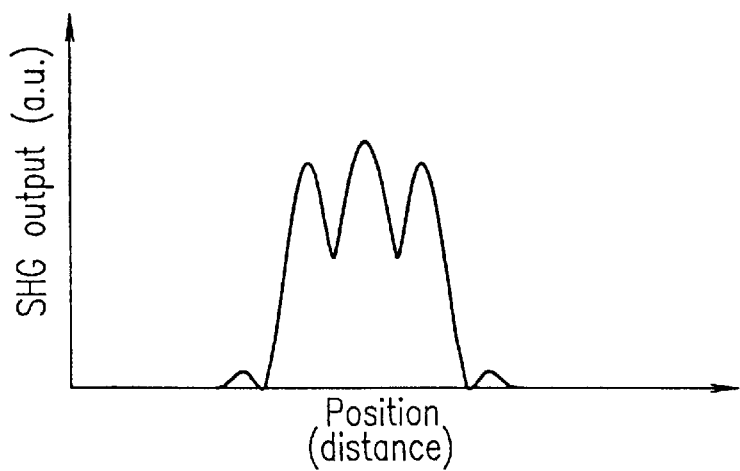
FIG. 57C is a graph showing a resultant phase matching characteristic (tuning curve)

FIGS. 57A and 57B show the relationship between the domain-inverted period and the distance in the z direction and the relationship between the phase mismatch amount and the distance in the z direction, respectively, in a two-segmented periodic structure. As is understood from FIG. 57A, the two-segmented periodic structure is formed by combining two different periodic sub-structures at the center of the domain-inverted structure. In this case, the generation of a phase mismatch amount is represented by the combination of a linear function and a phase shift as shown in FIG. 57B. The phase matching characteristic obtained in this case exhibits large rippling as shown in FIG. 57C.

Figure 58A:
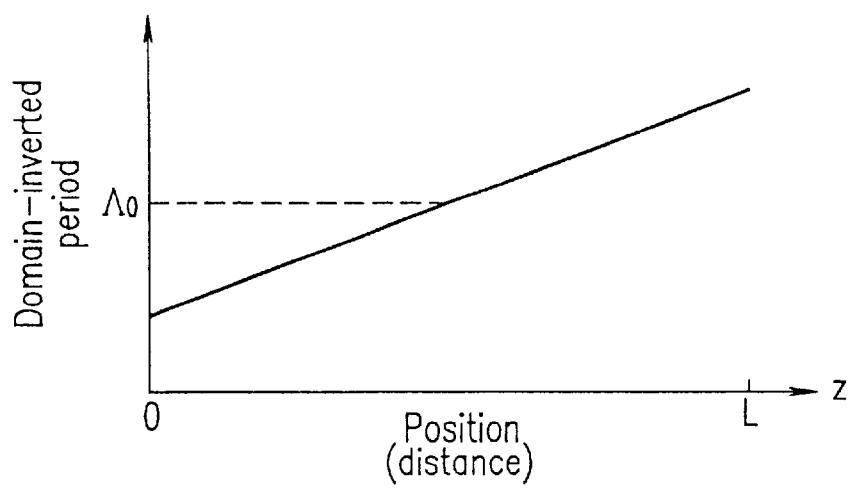
FIGS. 58A and 58B are graphs showing a distribution of domain-inverted period and a distribution of phase mismatch amount, respectively, of a segmented periodic domain-inverted structure using a linear chirping period.
Figure 58B:
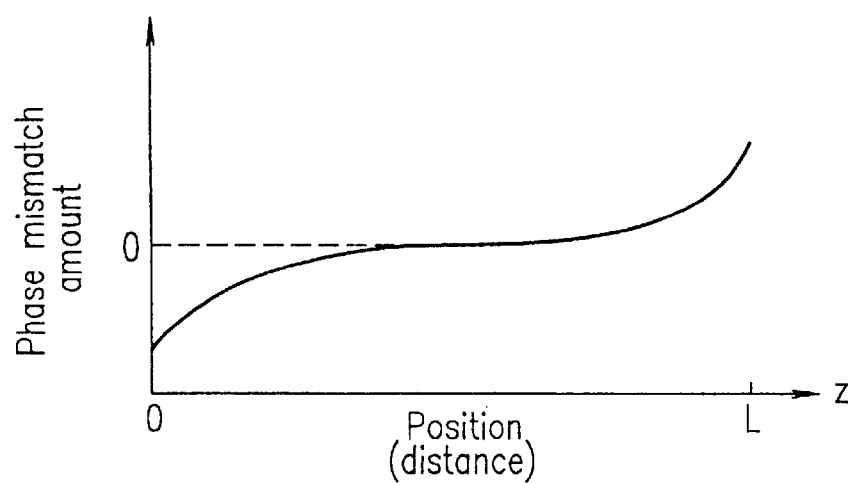
Figure 58C:
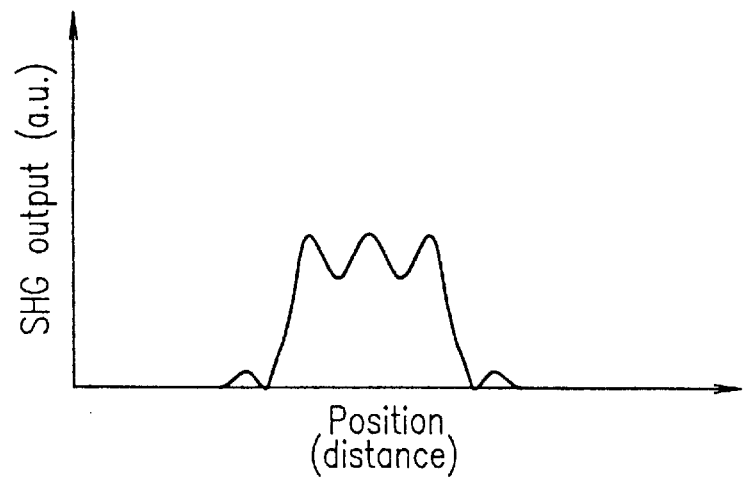
FIG. 58C is a graph showing a resultant phase matching characteristic (tuning curve)

FIGS. 58A and 58B show the relationship between the domain-inverted period and the distance in the z direction and the relationship between the phase mismatch amount and the distance in the z direction, respectively, in a conventional chirping structure. In this case, a phase mismatch amount is generated depending on a quadratic. The phase matching characteristic obtained in this case is shown in FIG. 58C. The rippling near the peak is considerably reduced compared with that in FIG. 57C. In consideration of the above, the inventors of the present application presumed that the rippling was reduced because the phase mismatch amount was generated depending on a quadratic, not a linear function, in the case of the chirping structure.

Based on this presumption, the inventors of the present application examined some structures in which the phase mismatch amount was generated depending on different functions.

First, a structure in which the phase mismatch amount is generated depending on a high-degree power function was examined. A structure which was symmetrical with respect to the period $\Lambda_0$ as a center was assumed as the domain-inverted structure to calculate the phase matching characteristic. In other words, in the period $\Lambda(z)=\Lambda_0+f(z)$ of domain-inverted structure, the following expressions:

$$f(z) = a \cdot |z|^m \quad z > 0$$
$$f(z) = -a \cdot |z|^m \quad z < 0$$

were established so as to design using f(z) as a power function of an odd function which is symmetric with respect to the center of the periodic domain-inverted structure, thus to obtain a phase match curve (a tuning curve, i.e., a phase matching characteristic) having a profile closest to a flat peak profile for several values of the degree m of the power function. The results are shown in FIG. 59.

In FIG. 59, curve (1) represents the results when $a=\Lambda_0 \times 1.2 \times 10^{-4}$ and m=1, curve (2) represents the results when $a=\Lambda_0 \times 2.5 \times 10^{-6}$ and m=2, curve (3) represents the results when $a=\Lambda_0 \times 6.3 \times 10^{-12}$ and m=3, and curve (4) represents the results when $a=\Lambda_0 \times 3.2 \times 10^{-15}$ and m=4.

More specifically, in FIG. 59, curve (1) corresponds to the case of a two-segmented periodic structure where two domain-inverted sub-structures having different periods are combined. Curve (2) corresponds to the case of a linear chirping structure where the domain-inverted period changes linearly. As is observed from FIG. 59, both curves (1) and (2) largely fluctuate near their peaks, failing to obtain a flat peak characteristic. On the contrary, curve (3) succeeds in obtaining a flat peak characteristic. In curve (4), the maximum value decreases.

From the above results, it is found that a flat peak phase matching characteristic, can be obtained when the degree m of a power function is in the range of 2<m<4 in the case of the power function. In particular, as shown by curve (3) in FIG. 59, a satisfactory flat phase matching characteristic is obtained when the degree m is close to 3. This indicates that a flat peak phase matching characteristic is realized by a larger value of the degree m compared with the case of the conventional linear chirping structure (where m=2).

It is also found that in order to realize a better flat peak phase matching characteristic, some restrictions are required for the function f(z) on which the distribution of phase mismatch amount depends.

The function f(z) is preferably an odd function using the center of the domain-inverted structure as an origin. Such a function allows for realizing a structure having a symmetric phase matching characteristic providing the highest efficiency. However, when light propagation loss is decreased and conversion efficiency is enhanced, the symmetry of the efficiency of conversion into second harmonic wave light in the domain-inverted structure is sometimes lost due to the phenomenon where the intensity of fundamental wave light decreases by being converted into second harmonic wave light (pump depression) and the like. In such a case, the center of the domain-inverted structure is likely to be slightly displaced.

FIG. 60 shows a distribution of normalized phase match amount in the case where a flat peak phase matching characteristic is obtained. Curves (1), (2), (3), and (4) in FIG. 60 correspond to curves (1), (2), (3), and (4) in FIG. 59, respectively.

As is observed from FIG. 60, the phase mismatch amounts at both ends of the domain-inverted structure are concentrated an the range of about 0.5 to 1. Although the amounts are near 2 only in the case of curve (4), the phase match curve in this case is considerably different from the flat peak profile, as is observed from FIG. 59.

It is confirmed from the above that the phase matching characteristic is close to the flat peak profile when the phase mismatch amounts at both ends of the domain-inverted structure are in the range of about 0.5 to 1, irrespective of the degree m of the function f(z). When the phase mismatch amounts are outside the above range, rippling is too large to obtain a good characteristic.

Furthermore, in the observation of the generation of the phase mismatch amount shown in FIG. 60, it was presumed that functions other than a high-degree power function may be used as the function f(z) for realizing a flat peak phase matching characteristic. In order to confirm this presumption, a trigonometric function was used to calculate using the period Ac as the center period:

$$\Lambda(z) = \Lambda_0 + f(z)$$
$$f(z) = a \cdot |\sin(bz)|^m \quad z > 0$$
$$f(z) = -a \cdot |\sin(bz)|^m \quad z < 0$$

First the value of b was examined. As the value of b increases, f(z) fluctuates since it is a sine function, widely reducing the conversion efficiency. A flat-peak, high-efficiency phase matching characteristic was obtained only when f(z) was an increase or decrease function. From the above, it was clarified that b·(L/2)<0.5π should be satisfied for the distance L/2 from the center of the domain-inverted structure to one end thereof.

Figure 61A:
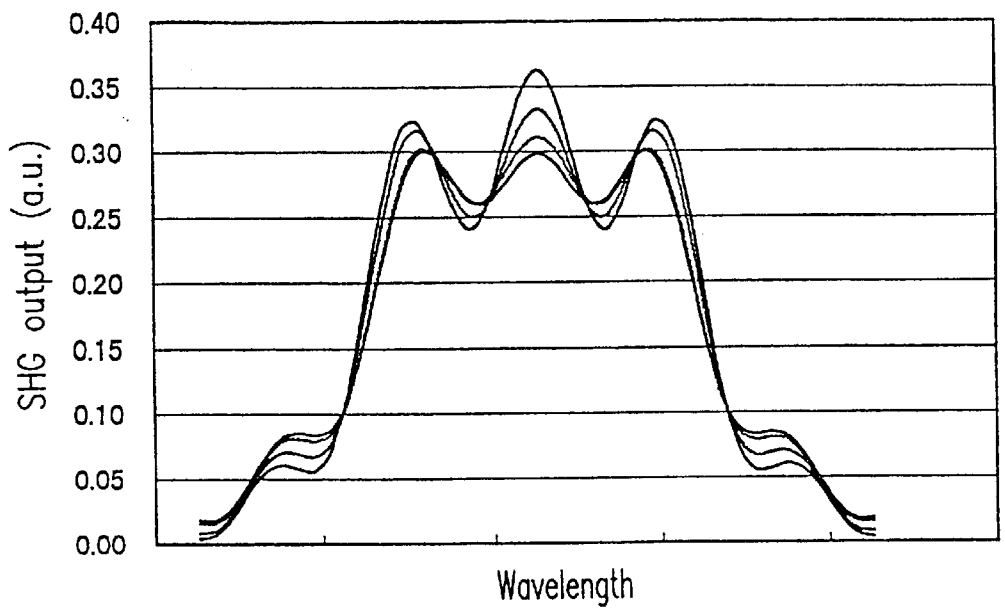
FIGS. 61A(*a*) and 61A(*b*) are graphs showing a phase matching characteristic and a distribution of phase mismatch amount, respectively, of the domain-inverted structure according to the present invention in the case where a function f(z) on which the distribution of phase mismatch amount depends is a trigonometric function (degree m=2), FIGS. 61B(*a*) and 61B(*b*) are graphs showing a phase matching characteristic and a distribution of phase mismatch amount, respectively, of the domain-inverted structure according to the present invention in the case where a function f(z) on which the distribution of phase mismatch amount depends is a trigonometric function (degree m=3), FIGS. 61C(*a*) and 61C(*b*) are graphs showing a phase matching characteristic and a distribution of phase mismatch amount, respectively, of the domain-inverted structure according to the present invention in the case where a function f(z) on which the distribution of phase mismatch amount depends is a trigonometric function (degree m=4), and FIGS. 61D(*a*) and 61D(*b*) are graphs showing a phase matching characteristic and a distribution of phase mismatch amount, respectively, of the domain-inverted structure according to the present invention in the case where a function f(z) on which the distribution of phase mismatch amount depends is a trigonometric function (degree m=4)
Figure 61A:
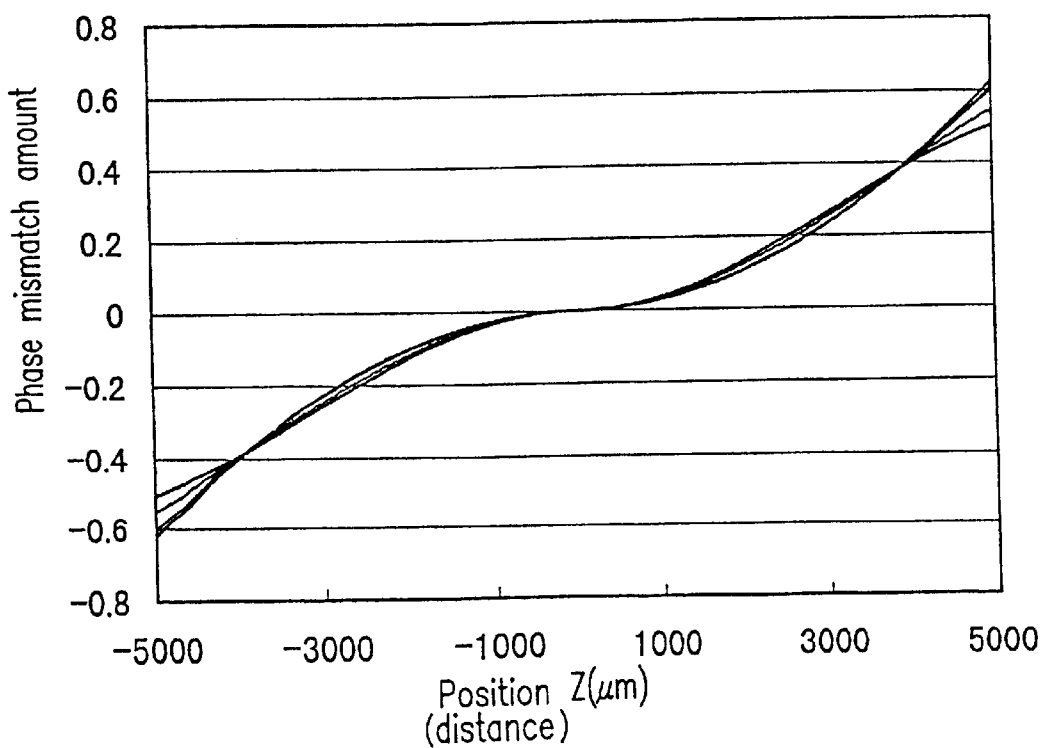
Figure 61B:
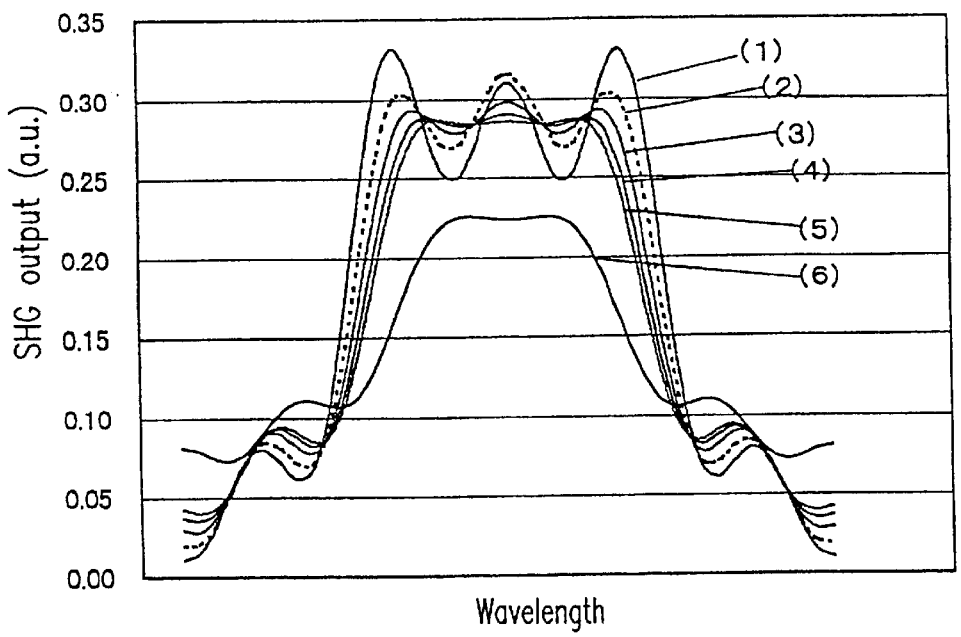
Figure 61B:
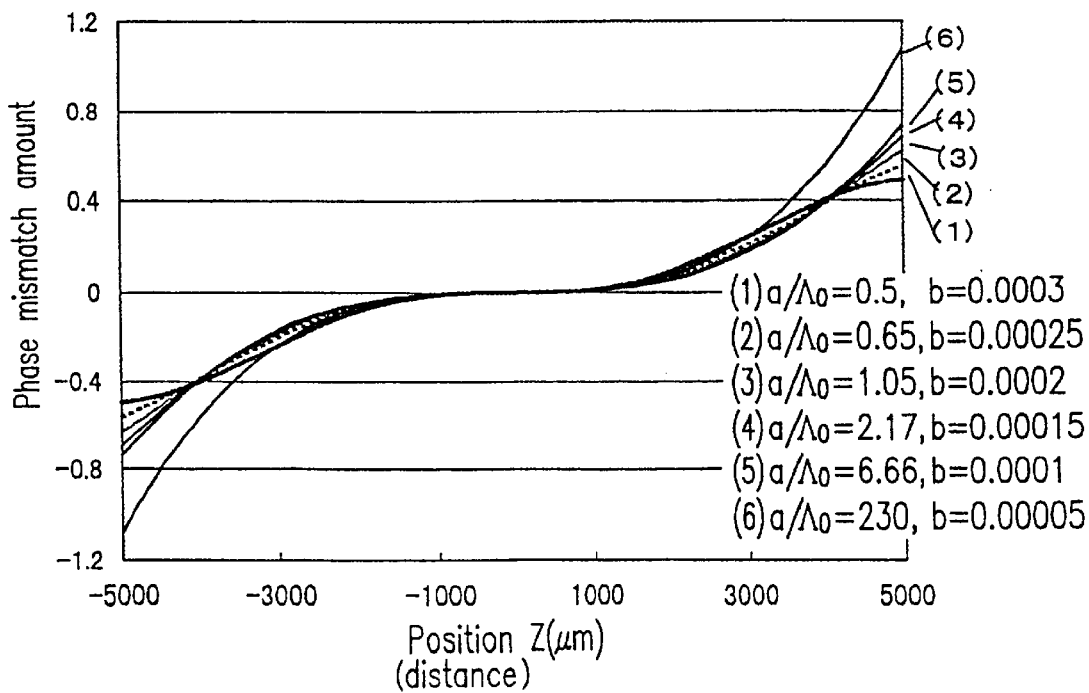
Figure 61C:
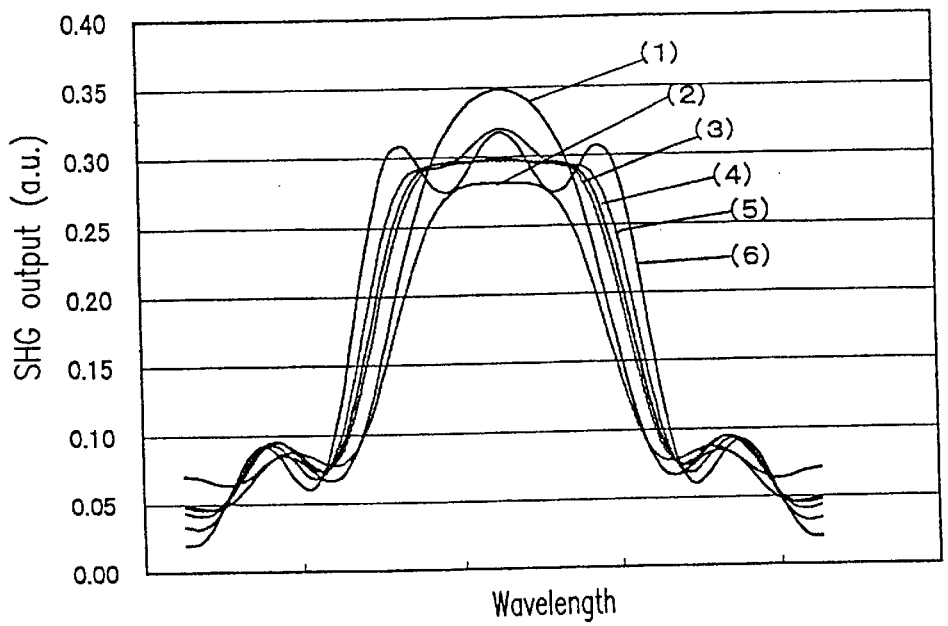
Figure 61C:
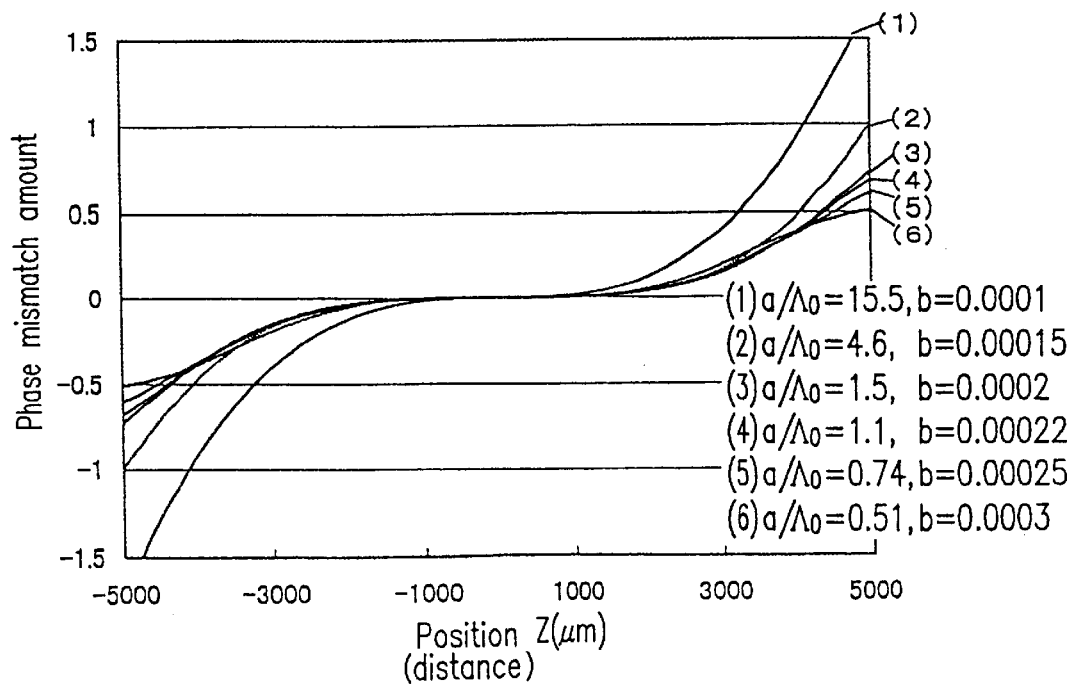
Figure 61D:
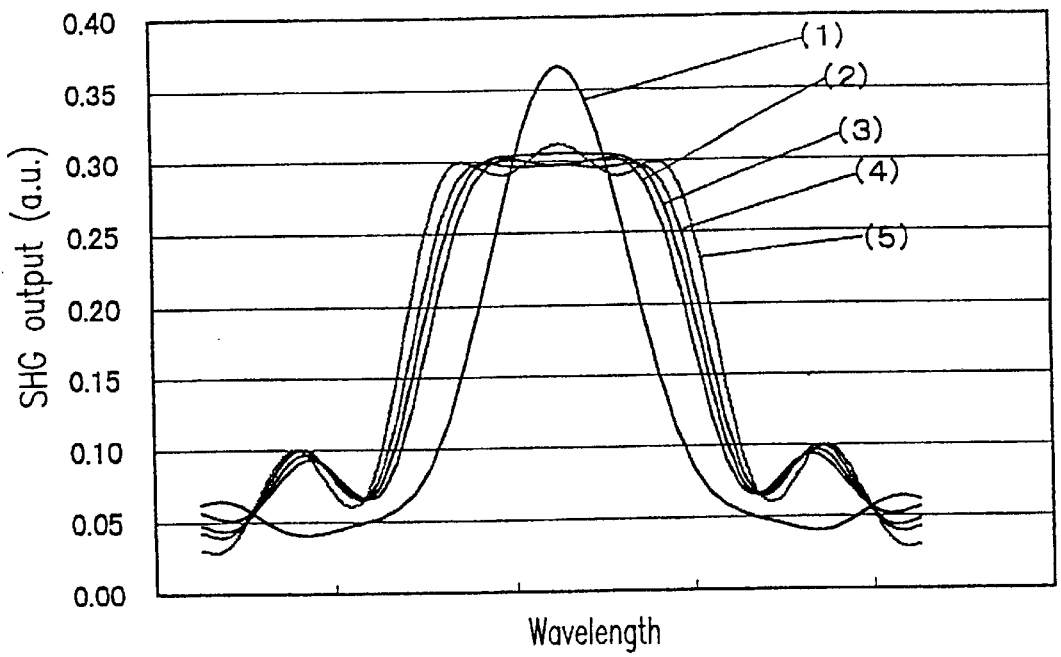
Figure 61D:
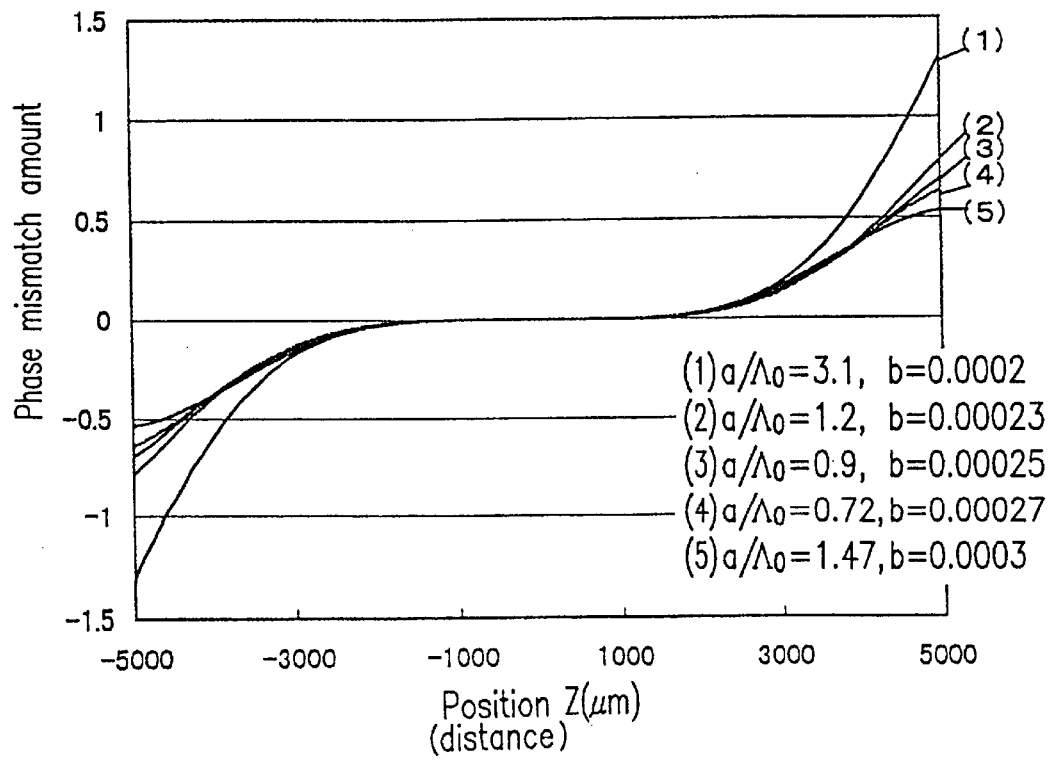

Next, in order to examine the degree m, the relationship between the value of m and the phase matching characteristic was calculated as in the case of the polynominal expression. The results are shown in FIGS. 61A(a) through 61D(b). FIGS. 6LA(a) and 61A(b) show the phase match curves and the distributions of normalized phase mismatch amounts, respectively, in the case of m=2. FIGS. 61B(a) and 61B(b) show the phase match curves and the distributions of normalized phase mismatch amounts, respectively, in the case of m=3, FIGS. 61C(a) and 61C(b) show the phase match curves and the distributions of normalized phase mismatch amounts, respectively, in the case of m=4, and FIGS. 61D(a) and 61D(b) show the phase match curves and the distributions of normalized phase mismatch amounts, respectively, in the case of m=5.

Referring to FIGS. 61A(a), 61B(a), 61C(a), and 61D(a), while rippling was generated in the flat pea portion in the case of m=2, in FIG. 61A(a), a substantially flat peak characteristic was obtained in any of the cases of m=3 to 5 in FIGS. 61B(a), 61C(a), and 61D(a). For example, in the case of m=3 in FIG. 61B(a), curves (3), (4), and (5) exhibited a substantially flat peak characteristic. The phase mismatch amounts for these curves were about 0.6 to 0.7. In the case of m=4 in FIG. 61C(a), curves (3), (4), and (5) exhibited a substantially flat peak characteristic. The phase mismatch amounts for these curves were about 0.6 to 0.7. In the case of m=5 in FIG. 61D(a), curves (2), (3), (4), and (5) exhibited a substantially flat peak characteristic. The phase mismatch amounts for these curves were about 0.5 to 0.8.

With respect to the cases of m=3 to 5 in FIGS. 61B(a), 61C(a), and 61D(a), values of a and m employed for the calculations are indicated in the corresponding figures. From these results, it is understood that a flat peak curve is obtained only when the value of b is set in the range of 0.00005 to 0.0003.

Although not illustrated, in the case of m=6, the peak values greatly decreased.

It was found from the above that a flat peak characteristic was obtained when the degree m was in the range of 2<m<6 wherein m is a real number.

Referring to FIGS. 61A(b), 61B(b), 61C(b), and 61D(b), as for the distribution of phase mismatch amount, it is found that all of the normalized phase mismatch amounts at both ends of the domain-inverted structure are in the range of 0.5 to 1. When the normalized phase mismatch amount exceeds 1, the conversion efficiency is widely reduced. When it is less than 0.5, rippling of the phase match curve increases.

From the above, it is found that in order to obtain a flat peak phase match curve, the phase mismatch amounts in both ends of the periodic structure should be restricted to the range of 0.5 to 1.

The flat peak phase matching characteristic was also obtained when a power function of a tan(z) function was used as the function f(z) on which the distribution of phase mismatch amount depends.

As a result, a flat peak characteristic was realized by using a power function having a degree larger than two or a trigonometric function (a sine function or a tangent function) as the function f(z) on which the distribution of the phase mismatch amount depends. A flat peak characteristic was also realized by combining a power function and a trigonometric function, e.g., $f(x)=ax^n \star |\sin(bx)|^m$ or $f(x)=ax^n \star |\tan(bx)|^m$. A flat peak characteristic was obtained when $2<n \star m<6$.

The distribution of phase mismatch amount which can realize a flat peak phase matching characteristic was analyzed using FIGS. 60, 61A(b), 61B(b), 61C(b), and 61D(b).

From the analysis, it is found that in order to obtain a distribution of phase mismatch amount which realizes a flat peak phase matching characteristic, the following structure is necessary. That is, a substantially single period substructure (the period $\Lambda_0$ thereof matches with the center wavelength of the phase match wavelengths) needs to exist in the center of the domain-inverted structure. Also, the phase mismatch amount needs to gradually increase toward both ends of the periodic domain-inverted structure. Further, it is observed that the function f(z) has a portion where the slope thereof increases in any of the distribution of phase mismatch amount shown in the figures. Moreover, the degree m needs to be 2 or more for both the power function and the sine function. It is necessary to have a portion where the quadratic differential coefficient of f(z) increases toward both ends of the periodic domain-inverted structure. Furthermore, the normalized value of $|f(z)/\Lambda_0|$ of the phase mismatch amounts in both ends of the domain-inverted structure should be in the range of 0.5 to 1. By obtaining the distribution of phase mismatch amount which satisfies the above conditions, the phase matching characteristic can be designed to have a flat peak portion.

Next, a method for realizing the distribution of phase mismatch amount shown in FIG. 60 using a simpler construction was examined.

In order to realize a flat peak phase matching characteristic, the periodic domain-inverted structure should have the distribution of phase mismatch amount shown in FIG. 60. In other words, by obtaining a distribution close to the distribution of phase mismatch amount described above with reference to FIGS. 60 and 61A(a) through 61D(b), the periodic domain-inverted structure is provided with a flat peak phase matching characteristic. More specifically, in order to obtain a distribution close to the distribution of phase mismatch amount realizing a flat peak phase matching characteristic, the domain-inverted structure needs to have a single period structure having a center period $\Lambda_0$ in the center portion thereof and have increased phase mismatch amount near both ends thereof.

Figure 62A:
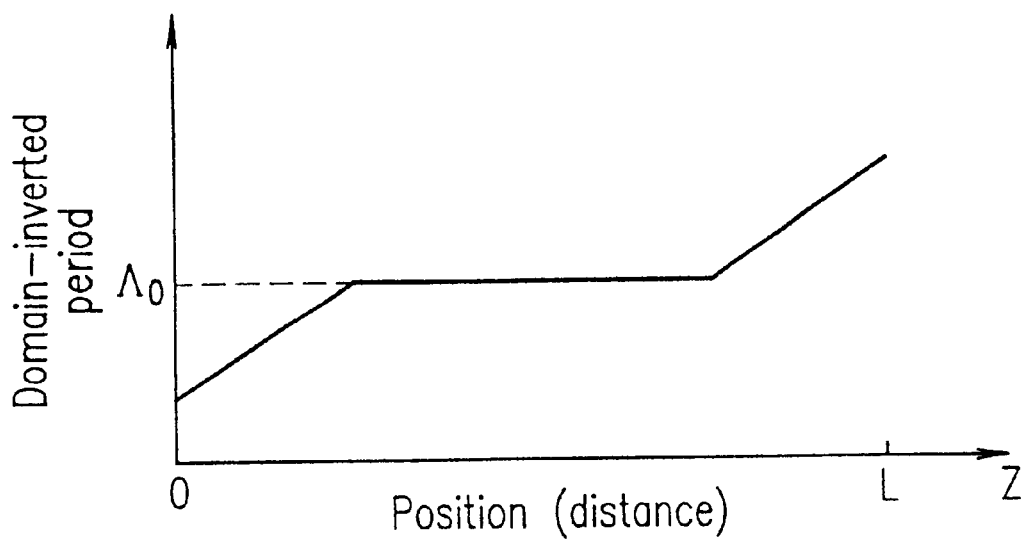
FIGS. 62A and 62B are graphs showing a phase matching characteristic and a distribution of phase mismatch amount, respectively, of a domain-inverted structure according to the present invention.
Figure 62B:
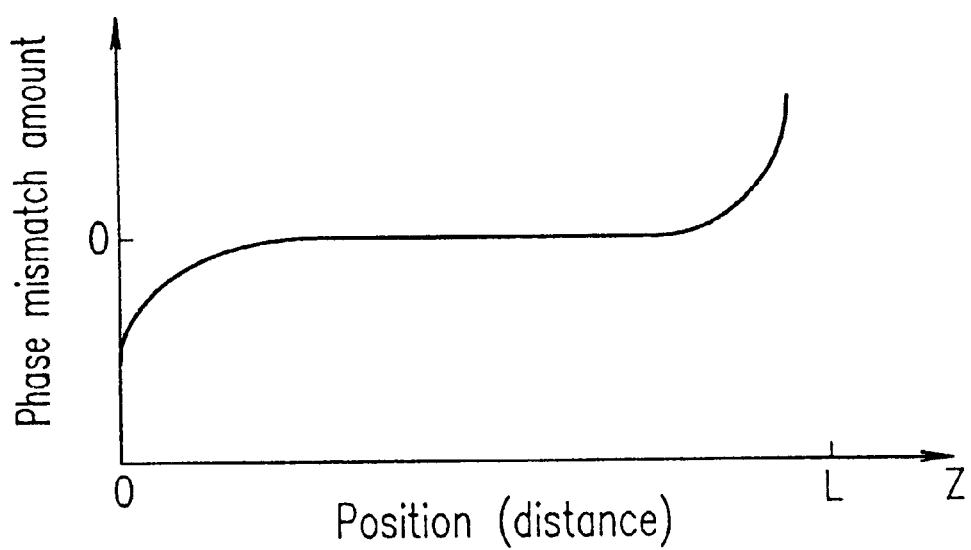
Figure 63A:
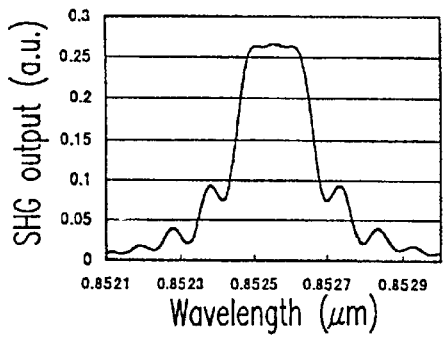
FIGS. 63A, 63C, 63E, and 63G are graphs showing phase matching characteristics obtained when the distributions of phase mismatch amounts are as represented in FIGS. 63B, 63D, 63P, and 63H, respectively (five-segmented structure)
Figure 63B:
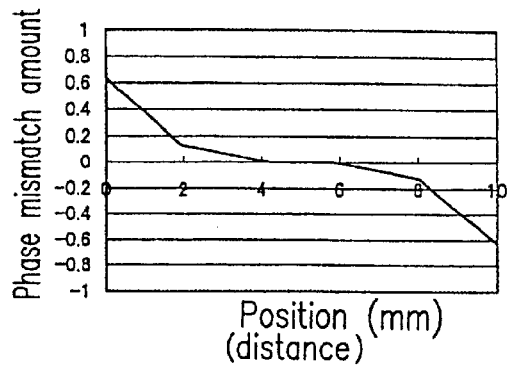
Figure 63C:
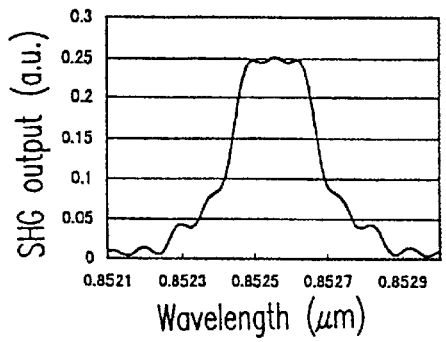
Figure 63D:
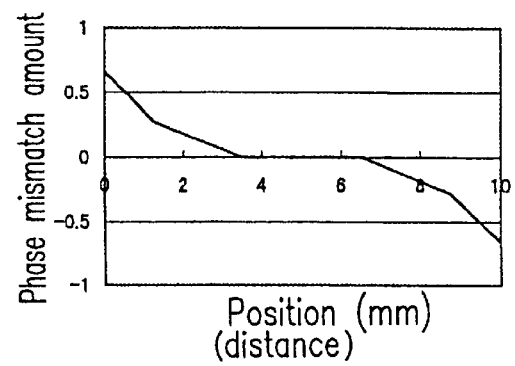
Figure 63E:
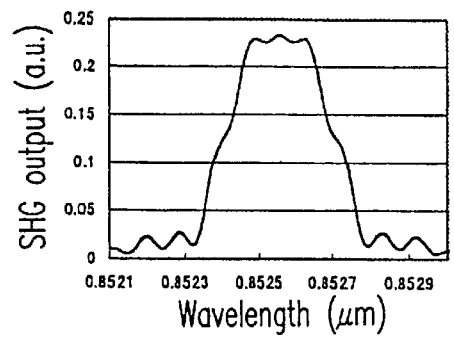
Figure 63F:
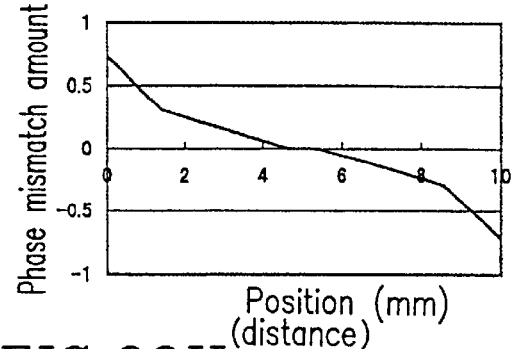
Figure 63G:
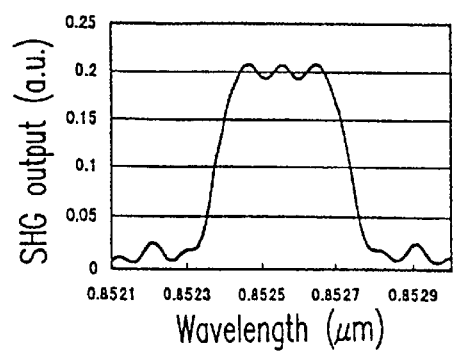
Figure 63H:
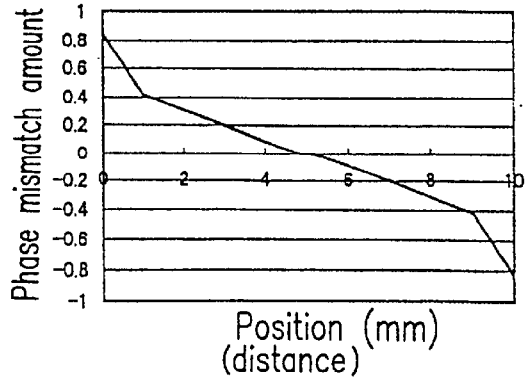
Figure 64A:
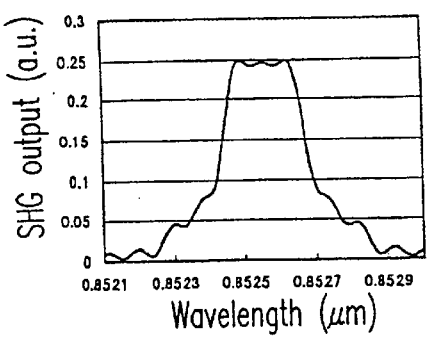
FIGS. 64A, 64C, 64E, and 64G are graphs showing phase matching characteristics obtained when the distributions of phase mismatch amounts are as represented in FIGS. 64B, 64D, 64F, and 64H, respectively (seven-segmented structure)
Figure 64B:
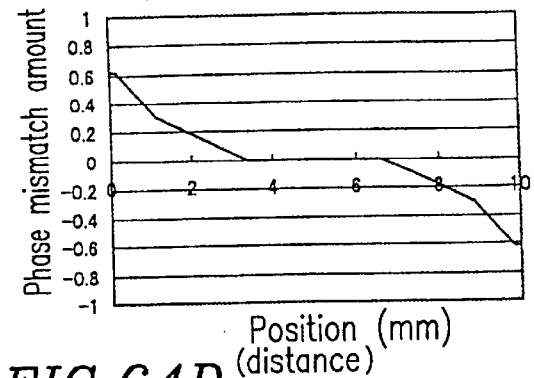
Figure 64C:
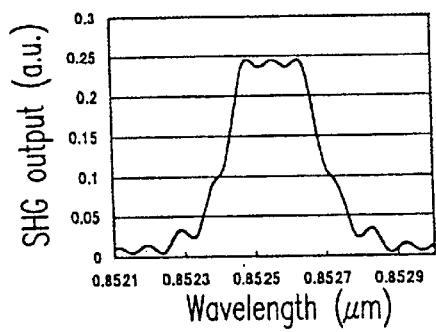
Figure 64D:
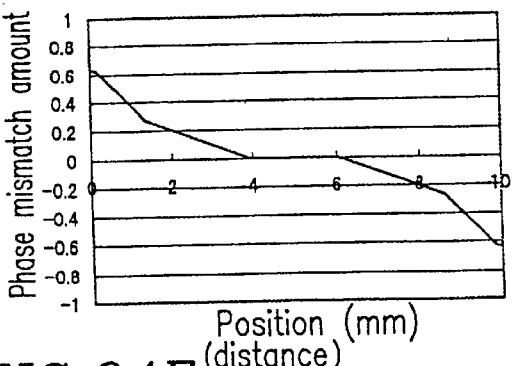
Figure 64E:
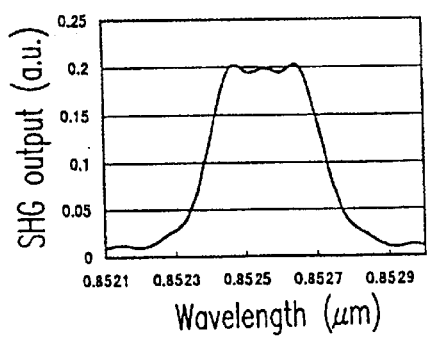
Figure 64F:
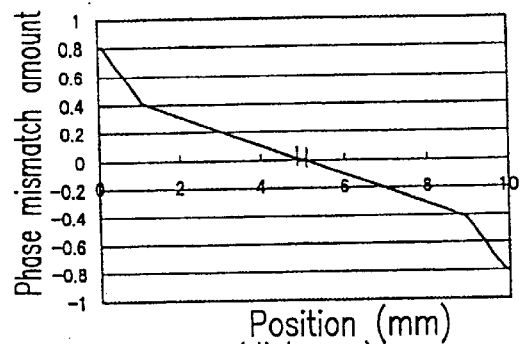
Figure 64G:
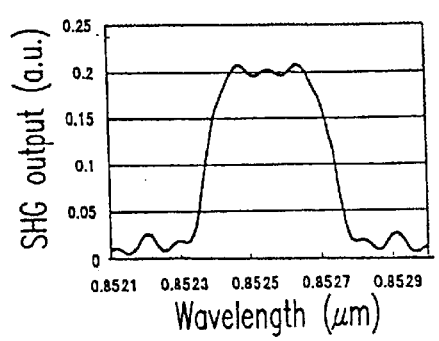
Figure 64H:
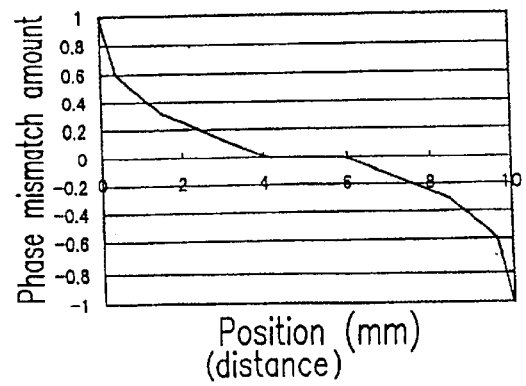

In view of the above, a characteristic of the distribution of phase mismatch amount as shown in FIG. 62A and 62B was considered. As shown in FIG. 62A, the domain-inverted structure has a period $\Lambda_0$ at the center portion and the domain-inverted period changes in a chirping fashion toward both ends thereof. As shown in FIG. 62B, the distribution of phase mismatch amount is such that the phase mismatch amount is zero in the center portion having a single period and increases or decreased depending on the distance towards both ends. The slope of the changes in the phase mismatch amount is also set so as to increase or decrease towards both ends. With such a structure obtained by combining the single period structure and the chirping period structure, a phase matching characteristic substantially identical to that shown in FIG. 59 is realized.

Other structures having a distribution close to the distribution of phase mismatch amount shown in FIG. 60 were also examined.

That is, when the center period is $\Lambda_0$, domain-inverted regions having periods of $\Lambda_0+\alpha 1$ and $\Lambda_0+\alpha 2$ are formed toward one end of the domain-inverted structure, and domain-inverted regions having periods of $\Lambda_0-\alpha 1$ and $\Lambda_0-\alpha 2$ are formed toward the other end of the domain-inverted structure ($\alpha 2>\alpha 1$). This corresponds to a five-segmented domain-inverted structure where the distribution of phase mismatch amount which changes depending on a power function is simplified to a structure where the period changes between two regions. In this structure, the domain-inverted period changes at two stages from the center toward both ends. The change amount is larger as the region is closer to the end of the structure. This is a structure approximating a power function, where the phase mismatch increases as the region is closer to the ends of the periodic structure.

In the calculations actually performed, simulations were respectively performed for the distributions of phase mismatch amounts having a dependency on the grating length (distance) as shown in FIGS. 63B, 63D, 63F, and 63H to obtain the phase matching characteristics for the respective cases. As a result, the characteristics as shown in FIGS. 63A, 63C, 63E, and 63G were obtained. By comparing the illustrated characteristics, it is understood that a structure having a characteristic close to a flat peak characteristic can be obtained by changing the dependency on the grating length (distance). This allows for freely designing the allowance range of phase match wavelength. It is also understood that as the phase mismatch amounts at both ends of a grating increase, the allowance range widens. A substantially flat peak phase matching characteristic was realized when the phase mismatch amounts at both ends are in the range of 0.5 to 1.

The above structure is different from a phase shift structure, where phase shift portion is inserted into a domain-inverted structure having a uniform period, in that the phase matching characteristic is applicable to a wider range of wavelengths. For example, in the case of a phase shift structure in which a phase match wavelength region is segmented into three portions having substantially the same sizes, the allowance range for a 0.85 µm phase match wavelength is widened by about 0.1 to 0.13 nm. In the case of the structure of the present invention the wavelength allowance range can be widened by 0.2 nm or more.

A flatter peak characteristic can be realized by increasing the number of segmented regions. For example, for a seven-segmented structure, simulation was performed for the distributions of phase mismatch amounts having a dependency on the grating length (distance) as shown in FIGS. 64B, 64D, 64F, and 64H to obtain the phase matching characteristics for the respective cases. As a result, the characteristics as shown in FIGS. 64A, 64C, 64E, and 64G were obtained. From these figures, it is understood that a characteristic close to a flat peak characteristic can be realized and that the wavelength allowance range can be freely designed, even when the number of segmented regions is increased.

As is understood from the above, in order to widen the wavelength allowance range which realizes a flat peak phase matching characteristic, it is necessary that a single period portion satisfying the phase matching conditions is formed in the center, the phase mismatch amount increases toward both ends, and the slope of the increase of the phase mismatch amount increases toward both ends. In other words, it is found that the wavelength allowance range of the phase matching characteristic can be widened with a flat peak portion when the domain-inverted structure includes a single period sub-structure in the center, a chirping sub-structure where the domain-inverted period $\Lambda$ decreases toward one end thereof, and a chirping sub-structure where the domain-inverted period $\Lambda$ increases toward the other end thereof.

The optical wavelength conversion device of this example can be of a bulk type or an optical waveguide type. In the case where the present invention is applied to an optical waveguide type device, light confinement can be strengthened by performing optical wavelength conversion for respective propagating light beams, and the interaction distance can be prolonged. Accordingly, high-efficiency wavelength conversion is possible. In the case where the present invention is applied to an bulk type device, conversion efficiency can be greatly improved by disposing a crystal in a cavity structure.

A short-period domain-inverted structure can be produced using $LiNbO_3$, $LiTaO_3$, and KTP, to realize a high-efficiency optical wavelength conversion device.

EXAMPLE 18

In this example, another phase shift domain-inverted structure according to the present invention will be described.

Conventionally, a phase shift domain-inverted structure is used to increase the wavelength allowance range. Such a phase shift domain-inverted structure includes a phase shift section (phase control section) inserted between domain-inverted sub-structures having an identical period so as to increase the allowance range of phase match wavelength. In this structure, a phase mismatch amount is generated in the phase shift section.

Figure 65A:
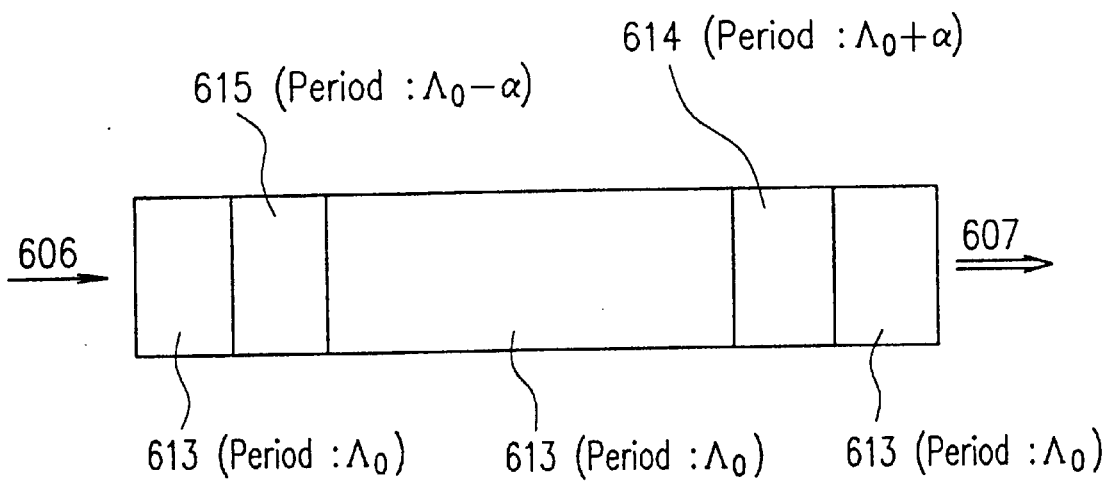
FIGS. 65A and 65B are views illustrating a phase matching characteristic and a distribution of phase mismatch amount, respectively, of a domain-inverted structure having phase adjusting sections according to the present invention.
Figure 65B:
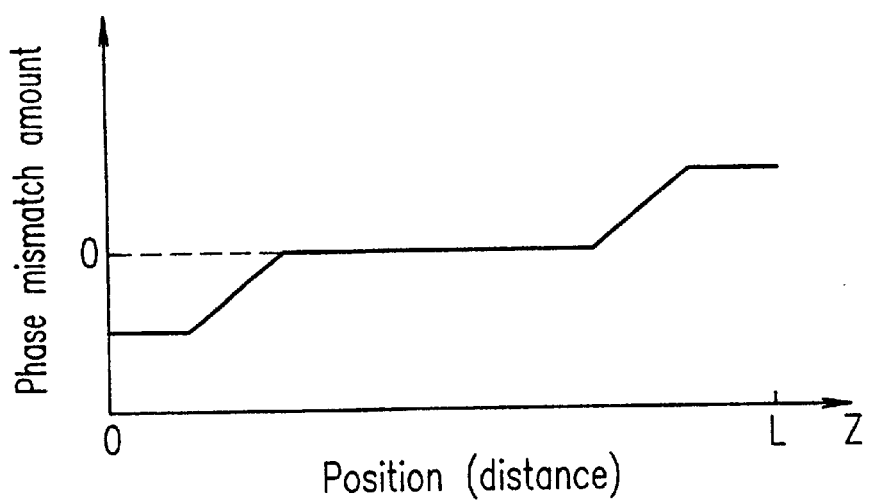

In this example, a phase mismatch amount is generated by inserting a periodic sub-structure having a domain-inverted period different from that of the adjacent periodic sub-structures. Specifically, as shown in FIG. 65A, domain-inverted regions 614 and 615 having different periods are inserted between domain-inverted regions 613 having a domain-inverted period $\Lambda_0$, as phase adjusting sections, instead of conventional phase shift sections. The phase adjusting section 614 has a period $\Lambda_0+\alpha$ providing a phase shift $+\delta$, and the phase adjusting section 615 has a period $\Lambda_0-\alpha$ providing a phase shift $-\delta$. FIG. 65B shows the phase mismatch amount with respect to the distance. As is clear from FIG. 65B, phase shift is performed by the phase adjusting sections 614 and 615 with a distribution of phase mismatch amount. The phase matching characteristic in this case is substantially the same as the case of the conventional phase shift sections providing a phase shift $\delta$. When fundamental wave light 606 is incident on such a structure, second harmonic wave light 607 is obtained.

The structure of this example enables to provision of a larger widening rate of the allowance range of the flat peak phase match wavelength characteristic compared with the conventional phase shift structure. For example, in the case of a conventional phase shift structure in which a phase match wavelength region is segmented into three portions having substantially the same sizes, the allowance range for a 0.85 $\mu$m phase match wavelength is widened by about 0.1 to 0.13 nm. In the case of the structure of this example, it can be widened by about 0.18 nm or more. With this increase in the design value of the widening rate of the wavelength allowance range, an optical wavelength conversion device having a more stable power characteristic can be fabricated.

By employing the optical wavelength conversion device as described in Examples 17 and 18 as set forth above, a coherent light generator (a coherent light source) or an optical information processing apparatus of the present invention, as described in Examples 13 through 16, can be obtained, resulting in the similar advantages as described previously.

Thus, according to the present invention, in the short-wavelength light source including the optical wavelength conversion device and the wavelength tunable DBR semiconductor laser, the optical wavelength conversion device receives light output from the wavelength tunable DBR semiconductor laser as the fundamental wave light, and outputs the second harmonic wave light obtained by converting the wavelength of the fundamental wave light. The SHG output power characteristic of the optical wavelength conversion device has a flat portion near the maximum power. The injected current for tuning the oscillation wavelength of the wavelength tunable DBR semiconductor laser is controlled so that the oscillation wavelength is fixed within the flat portion of the SHG output power characteristic of the optical wavelength conversion device. In this way, the resultant SHG output power can be kept constant.

Since the oscillation wavelength of the wavelength tunable DBR semiconductor laser is fixed within the flat portion of the SHG output power characteristic, the auto power control (APC) driving can be employed for controlling the driving current for the wavelength tunable semiconductor laser so that the second harmonic wave light output is kept constant.

Furthermore, the fundamental wave light power to be coupled to the waveguide is controlled so as to be kept constant, and the injected current for tuning the oscillation wavelength of the wavelength tunable semiconductor laser is controlled so as to be fixed in the flat portion of the SHG output power characteristic. By these controls, a short-wavelength light source which can provide a stable SHG output power even in the case where temperature control for compensating for the temperature change due to a change in ambient temperature is not performed. This allows for application to various fields, providing a large practical effect.

According to the present invention, in the optical wavelength conversion device including a plurality of nonlinear optical crystals and a phase adjusting section disposed between the adjacent crystals, the phase difference between the fundamental wave light and the second harmonic wave light in the phase adjusting section is modulated. By this modulation, it is possible to vary the phase match wavelength in a wide wavelength range while avoiding reduction in the conversion efficiency. This enables stabilization of the power of the optical wavelength conversion device. This provides a large practical effect.

According to the present invention, in the optical wavelength conversion device including a plurality of nonlinear optical crystals and a phase adjusting section disposed between the adjacent crystals, the phase matching conditions of the nonlinear optical crystals are made identical to each other. This enables greatly widening the allowance range of the phase match wavelength of the optical wavelength conversion device and realize a flat peak phase matching characteristic (tuning curve). As a result, the output power of the optical wavelength conversion device can be stabilized, thereby resulting in a large practical effect being provided.

When the optical wavelength conversion device has a periodic domain-inverted structure, the periodic domain-inverted structure is divided into a plurality of segmented regions having an identical period, and a phase adjusting section is inserted between the segmented regions. As a result, the allowance range of the phase match wavelength of the optical wavelength conversion device is greatly widened, and a flat peak phase matching characteristic (tuning curve) can be realized. This enables stabilization of the output power of the optical wavelength conversion device, and thus a large practical effect can be provided.

According to the present invention, by optimizing the relationship between the oscillation losses of the fundamental wave light and the second harmonic wave light in the optical wavelength conversion device, the variation in the phase matching characteristic (tuning curve) of the optical wavelength conversion device with respect to the propagation length generated by the propagation loss can be greatly reduced. By this feature, the design of the optical wavelength conversion device can be made easy, and the influence of the propagation loss on the operational characteristics of functional elements to be integrated on the optical wavelength conversion device can be greatly reduced. Moreover, since the input/output characteristics of the optical wavelength conversion device is made reversible with respect to the propagation direction of light, the efficiency of a cavity type optical wavelength conversion device and a reflective optical wavelength conversion device utilizing such a reversibility can be greatly improved.

The present invention further realizes a coherent light generator (coherent light source) including the optical wavelength conversion device and the semiconductor laser can exhibit a stabilized output power. The phase match wavelength of the optical wavelength conversion device is varied to be tuned to the oscillation wavelength of the semiconductor laser. Therefore, a high-power coherent light source is obtained, and thus a large practical effect can be provided.

Alternatively, the allowance range of the phase match wavelength is set to be wider than the longitudinal mode interval of the semiconductor laser, and the tuning curve is designed to have a flat peak portion within the allowance range of the phase match wavelength. It is therefore possible to fix the oscillation wavelength of the semiconductor laser at a value within the allowance range of the phase match wavelength of the optical wavelength conversion device. As a result, the power variation of the coherent light output is suppressed, allowing provision of a coherent light source having a stable output power characteristic.

According to the present invention, in the coherent light generator (coherent light source) including the optical wavelength conversion device and the semiconductor laser, a scattering light component of the second harmonic wave light from the optical wavelength conversion device is detected, so as to detect a displacement between the oscillation wavelength of the semiconductor laser and the phase match wavelength of the optical wavelength conversion device. The detected displacement is fed back to the semiconductor laser, and the oscillation wavelength of the semiconductor laser is controlled to be matched with the phase match wavelength of the optical wavelength conversion device. Thus, the output power of the coherent light source can be kept constant.

Moreover, using the optical wavelength conversion device having a phase adjusting section according to the present invention, the magnitude and direction of a displacement between the oscillation wavelength of the is semiconductor laser and the phase match wavelength of the optical wavelength conversion device can be detected simultaneously. As a result, wavelength stabilization by feedback is made easier, realizing a short-time wavelength stabilization.

Thus, according to the present invention, the optical wavelength conversion device includes a domain-inverted structure having a single period sub-structure and a chirping period sub-structure, to realize a flat peak phase matching characteristic. Further, a novel technique for designing the phase matching characteristic of the optical wavelength conversion device is provided by using the distribution of phase mismatch amount. As a result, the degree of the design freedom for the allowance range of phase match wavelength of the optical wavelength conversion device is greatly widened, actually succeeding in widening the wavelength allowance range by one and a half times or more compared with the conventional case. Thus, an optical wavelength conversion device having a stable power characteristic is realized.

The coherent light generator (coherent light source) according to the present invention, including the optical wavelength conversion device and a semiconductor laser, realizes stabilized output power. More specifically, the optical wavelength conversion device of the coherent light generator has a wider wavelength allowances range than the longitudinal mode interval of the semiconductor laser, and a tuning curve characteristic which is flat in the range of the wavelength allowance range. This allows the wavelength of the semiconductor laser to be invariably stabilized within the wavelength allowance range. As a is result, the power variation of coherent light is suppressed, and thus a coherent light source having a stable power characteristic is realized. The practical effect of such a coherent light generator is great.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light source comprising:

an optical wavelength conversion device;

a wavelength tunable semiconductor laser;

a control circuit for controling an oscillation wavelength of light output of the wavelength tunable semiconductor laser; and a second harmonic, optical detector for detecting an output power of a second harmonic wave of the optical wavelength conversion device; wherein;

the optical wavelength conversion device includes at least two non-linear optical crystals having substantially the same phase matching conditions and at least one phase adjusting section disposed between the non-linear optical crystals to adjust a phase relationship of a fundamental wave and the second harmonic wave, such that the output power of the second harmonic wave versus wavelength produces an output power characteristic curve having a flat portion near a maximum power of the second harmonic wave;

the control circuit controls a driving current of the wavelength tunable semiconductor laser, based on the output power of the second harmonic wave detected by the second harmonic optical detector, so that the oscillation wavelength of the wavelength tunable semiconductor laser is maintained substantially within the flat portion of the output power characteristic of the optical wavelength conversion device; and a bandwidth of the flat portion of the output power characteristic curve is wider than a longitudinal mode interval of the wavelength tunable semiconductor laser.

2. A light source according to claim 1, wherein said control circuit controls the driving current of the wavelength tunable semiconductor laser to maintain an output power of the fundamental wave of the wavelength tunable semiconductor laser at a substantially constant value during a time period when the oscillation wavelength of the wavelength tunable semiconductor laser is maintained substantially within the flat portion of the output power characteristic curve of the optical wavelength conversion device.

3. A light source according to claim 2, wherein:

two output powers of the second harmonic wave, $P_N$ and $P_{N+1}$, are obtained for different driving currents, $I_N$ and $I_{N+1}$ ($I_{N+1}>I_N$), applied for controlling the oscillation wavelength of the wavelength tunable semiconductor laser; and the control circuit controls the driving current $I_{dbr}$ to be at a value of $I_{dbr}=I_{N+1}+\Delta I$ for the different current levels, $I_N$ and $I_{N+1}$, such that the conditions;

(1) $(P_{N+1}-P_N)>0$; and (2) an absolute value of $(P_{N+1}-P_N)$ is maxium;

are satisfied when the driving current increases, whereby the oscillation wavelength of the wavelength tunable semiconductor laser is maintained substantially within the flat portion of the output power characteristic curve of the optical wavelength conversion device.

4. A light source according to claim 2, wherein:

two output powers of the second harmonic wave, $P_N$ and $P_{N+1}$, are obtained for different driving currents, $I_N$ and $I_{N+1}$ ($I_{N+1} > I_N$), applied for controlling the oscillation wavelength of the wavelength tunable semiconductor laser; and the control circuit controls the driving current to be at a value of $I_{dbr} = I_N - \Delta I$ for the different current levels, $I_N$ and $I_{N+1}$, such that the conditions;

(1) $(P_{N+1} - P_N) < 0$; and (2) an absolute value of $(P_{N+1} - P_N)$ is maximum;

are satisfied when the driving current decreases, whereby the oscillation wavelength of the wavelength tunable semiconductor laser is maintained substantially within the flat portion of the output power charateristic curve of the optical wavelength conversion device.

5. A light source according to claim 1, wherein the control circuit controls the oscillation wavelength of the wavelength tunable semiconductor laser so that the output power of the fundamental wave of the wavelength tunable semiconductor laser is maintained at a substantially constant value within the flat portion of the output power characteristic curve, thereby maintaining the output power the second harmonic wave detected by the second harmonic optical detector at a power level in the flat portion of the output power characteristic curve.

6. A light source according to claim 1, further comprising:

a fundamental optical detector for detecting the output light of the wavelength tunable semiconductor laser, wherein;

the control circuit controls the driving current of the wavelength tunable semiconductor laser so that the output power of the fundamental wave of the wavelength tunable semiconductor laser detected by the fundamental optical detector is maintained substantially at a predetermined constant value; and the control circuit controls the oscillation wavelength of the wavelength tunable semiconductor laser so that the output power of the second harmonic wave detected by the second harmonic optical detector is maintained substantially at a power level in the flat portion of the output power characteristic curve.

7. A light source according to claim 1, wherein:

the control circuit controls the oscillation wavelength of the wavelength tunable semiconductor laser by controlling the driving current of the wavelength tunable semiconductor laser by auto current control using a predetermined current value, so that an output power of the fundamental wave of the wavelength tunable semiconductor laser is maintained at a substantially constant value, thereby maintaining the second harmonic wave constant value; and the output power of the fundamental wave of the wavelength tunable semiconductor laser is maintained at a substantially constant value by controlling the oscillation wavelength of the wavelength tunable semiconductor laser, thereby maintaining the output power of the second harmonic wave detected by the second harmonic optical detector at a power level in the flat portion of the output power characteristic curve.

8. A light source according to claim 1, wherein the flat portion of the output power characteristic curve has a bandwidth in which the output power of the second harmonic wave increases when a driving current of the wavelength tunable semiconductor laser increases and the output power of the second harmonic wave decreases when the driving current decreases.

9. A light source according to claim 1, wherein the fundamental wave is wavelength-converted into the second harmonic wave by the non-linear optical crystals of the optical wavelength conversion device.

10. A light source according to claim 9, wherein:

the number of the non-linear optical crystals is two and the number of the phase adjusting section is one; and a length t of the phase adjusting section satisfies;

$$t(2m\pi+\alpha)n/(\beta(2\omega)-2\cdot\beta(\omega))$$

where;

$\alpha = 0.5$ to $1.5$;

$n = 0, 1, 2, \ldots$;

$\beta(2\omega)$ denotes a propagation constant of the second harmonic wave in the phase adjusting section; and $\beta(\omega)$ denotes a propagation constant of the fundamental wave in the phase adjusting section.

11. A light source according to claim 9, wherein:

the number of the non-linear optical crystals is three and the number of the phase adjusting sections is two; and lengths t1 and t2 of the phase adjusting sections satisfy;

$$t1 = (2n+\alpha 1)n/(\beta(2\omega)-2\cdot\beta(\omega))$$

$$t2 = (2m+\alpha 2)n/(\beta(2\omega)-2\cdot\beta(\omega))$$

where;

$\alpha 1 + \alpha 2 = 2$;

$n = 0, 1, 2, 3 \ldots$;

$m = 0, 1, 2, 3 \ldots$;

$t1 + t2 = 2J n/(\beta(2\omega)-2\beta(\omega))$;

$J = 0, 1, 2, 3 \ldots$;

$\beta(2\omega)$ denotes a propagation constant of the second harmonic wave in the phase adjusting sections; and $\beta(\omega)$ denotes a propagation constant of the fundamental wave in the phase adjusting sections.

12. A light source according to claim 1, wherein the wavelength tunable semiconductor laser at least includes:

at least two electrodes;

an active region including one of the at least two electrodes; and a distributed Bragg reflector (DBR) region including one of the at least two electrodes.

13. A light source according to claim 1, wherein the optical wavelenth conversion device includes a periodic domain-inverted structure providing quasi phase matching for optical wavelength conversion.

14. A light source according to claim 1, wherein the optical wavelength conversion device includes an optical waveguide.

15. A light source according to claim 1, wherein the optical wavelength conversion device is provided on an $LiTa_xNb_{1-x}O_3$ substrate ($0 \leq x \leq 1$).

16. A light source according to claim 1, wherein the wavelength tunable semiconductor laser includes grating means to feed back a specific wavelength from an external reflection mirror, thereby varying the light having the specific wavelength so as to vary the oscillation wavelength of the wavelength tunable semiconductor laser.

17. An optical information processing apparatus comprising:

a light source including;

an optical wavelength conversion device;
a wavelength tunable semiconductor laser;
a control circuit for controlling an oscillation wavelength of light output of the wavelength tunable semiconductor laser; and
a second harmonic optical detector for detecting an output power of a second harmonic wave of the optical wavelength conversion device;
a signal optical detector; and
a converging optical system, wherein;
the optical wavelength conversion device includes at least two non-linear optical crystals having substantially the same phase matching conditions and at least one phase adjusting section disposed between the non-linear optical crystals to adjust a phase relationship of a fundamental wave and the second harmonic wave, such that the output power of the second harmonic wave versus wavelength produces an output power characteristic curve having a flat portion near a maximum power of the second harmonic wave;
the control circuit controls a driving current of the wavelength tunable semiconductor laser, based on the output power of the second harmonic wave detected by the second harmonic optical detector, so that the oscillation wavelength of the wavelength tunable semiconductor laser is maintained substantially within the flat portion of the output power characteristic curve of the optical wave length conversion device:
a bandwidth of the flat portion of the output power characteristic curve is wider than a longitudinal mode interval of the wavelength tunable semiconductor laser; and
coherent light output emitted by the light source is converged by the converging optical system so as to be incident on an information reproduction medium, light reflected from the information reproduction medium being read as a signal by the signal optical detector, thereby processing the information from the information reproduction medium.

18. A coherent light generator comprising:
a non-linear optical crystal;
a wavelength tunable laser light source;
first optical detector;
a second optical detector; and
control circuit for controlling an oscillation wavelength of the wavelength tunable laser light source; wherein;
a first light emitted from the laser light source is converted into a second light in the optical wavelength conversion device;
the first optical detector detects an intensity of scattered light of one of the first light and the second light that is scattered from the non-linear optical crystal;
the second optical detector detects an intensity of the one of the first light and the second light in the vicinity of an output portion of the non-linear optical crystal; and
the oscillation wavelength of the wavelength tunable laser light source is controlled by the control circuitry based on the intensities detected by the first optical detector and second optical detector.

19. A coherent light generator according to claim 18, wherein;
the coherent light generator includes an optical wavelength conversion device including:
the non-linear optical crystal; and
a phase adjusting section; and
the first optical detector is disposed in the vicinity of the phase adjusting section.

20. An optical information processing apparatus comprising:
a coherent light generator including;
non-linear optical crystal;
a wavelength tunable laser light source;
a first optical detector;
a second optical detector; and
control circuitry for controlling an oscillation wavelength of the wavelength tunable laser light source;
a signal optical detector; and
a converging light system, wherein;
a first light emitted from the laser light source is converted into a second light in the optical wavelength conversion device;
the first optical detector detects an intensity of scattered light of one of the first light and the second light that is scattered from the non-linear optical crystal;
the second optical detector detects an intensity of the one of the first light and the second light in the vicinity of an output portion of the non-linear optical crystal;
the oscillation wavelength of the wavelength tunable laser light source is controlled by the control circuitry based on the intensities detested by the first optical detector and second optical detector; and
coherent light emitted by the coherent light generator is converged by the converging light system so as to be incident on an information reproduction medium, light reflected from the information reproduction medium being read as a signal by the signal optical detector, thereby processing the information from the information reproduction medium.

21. An optical wavelength conversion device comprising:
a non-linear optical crystal; and
a periodic domain-inverted structure formed on the non-linear optical crystal;
wherein the domain-inverted structure includes a single period portion having a single period $\Lambda_0$ and chirp period portions having a chirp periodic structure.

22. An optical wavelength conversion device according to claim 21, wherein the single period portion is located in the vicinity of the center of the domain-inverted structure and the chirp period portions are located in the vicinity of respective ends of the domain-inverted structure.

23. An optical wavelength conversion device according to claim 21, wherein:
an absolute value of a normalized value of a phase mismatch amount at each end of the optical wavelength conversion device;
$|f(L/2)/\Delta_0|$;
where L denotes a total length of the domain-inverted structure;
is in the range of 0.4 to 1.

24. An optical wavelength conversion device according to claim 21, wherein fundamental wave is converted into second harmonic wave in the non-linear optical crystal, and a propagation loss of the fundamental wave is approximately one half of a propagation loss of the second harmonic wave.

25. An optical wavelength conversion device comprising:
a non-linear optical crystal; and
a periodic domain-inverted structure provided on the non-linear optical crystal, wherein;

periods of the domain-inverted structure are domain-inverted periods represented by;

$\Lambda_{-m}, \Lambda_{-(m-1)}, \ldots, \Lambda_{-2}, \Lambda_{-1}, \Lambda_0, \Lambda_1, \ldots, \Lambda_{m-1}, \Lambda_m$, the domain-inverted periods have a distribution f(z) of phase mismatch amount, the distribution f(z) satisfies;

$f(i \star \Lambda_0) = (\Lambda_1 + \Lambda_2 + \ldots + \Lambda_i) - i \star \Lambda_0$;
$f(-i \star \Lambda_0) = (\Lambda_{-1} + \Lambda_{-2} + \ldots + \Lambda_{-i}) - i \star \Lambda_0$;
$f(i \star \Lambda_0) = -f(-i \star \Lambda_0)$; and
$f(z) = 0$ for $z \approx 0$;

where $i = 1, 2, 3, \ldots$; and a quadratic differential coefficient of the periods becomes larger at a position closer to ends of the non-linear optical crystal.

26. An optical wavelength conversion device according to claim 25, wherein:

the distribution f(z) is;

$$f(z) = a \cdot |\sin(bz)|^m \quad z > 0; \text{ and}$$
$$f(z) = -a \cdot |\sin(bz)|^m \quad z < 0;$$

where;
$2 < m < 6$;
$b \cdot L/2 < 0.5n$; and
L denotes a total length of the domain-inverted structure.

27. An optical wavelength conversion device according to claim 25, wherein:

the distribution f(z) is;

$$f(z) = a \cdot |z|^m \quad z > 0; \text{ and}$$
$$f(z) = -a \cdot |z|^m \quad z < 0;$$

where $2 < m < 4$.

28. An optical wavelength conversion device according to claim 25, wherein:

an absolute value of a normalized value of a phase mismatch amount at each end of the optical wavelength conversion device;

$|f(L/2)/\Delta_0|$;

where L denotes a total length of the domain-inverted structure;

is in the range of 0.4 to 1.

29. An optical wavelength conversion device according to claim 25, wherein fundamental wave is converted into second harmonic wave in the non-linear optical crystal, and a propagation loss of the fundamental wave is approximately one half of a propagation loss of the second harmonic wave.

30. An optical wavelength conversion device comprising:

a plurality of non-linear optical crystals each non-linear optical crystal including first domain-inverted structure having a first period; and a phase adjusting section to adjust a phase of a wave propagating in the plurality of non-linear optical crystals, the phase adjusting section disposed between two of the plurality of non-linear optical crystals, wherein the phase adjusting section includes a second domain-inverted structure having a second period different from the first period of the first domain-inverted structure of the plurality of non-linear optical crystals.

31. An optical wavelength conversion device according to claim 30, wherein:

an absolute of a normalized value of a phase mismatch amount at each end of the optical wavelength conversion device;

$|f(L/2)/\Delta_0|$;

where L denotes a total length of the domain-inverted structure;

is in the range of 0.4 to 1.

32. An optical wave length conversion device according to claim 30, wherein a fundamental wave is converted into second harmonic wave in the non-linear optical crystal, and a propagation loss of the fundamental wave is approximately one half of a propagation loss of the second harmonic wave.

33. A coherent light generator comprising:

an optical wavelength conversion device including;
  a non-linear optical crystal; and
  a periodic domain-inverted structure formed on the non-linear optical crystal; and a laser light source; wherein;

the domain-inverted structure includes a single period portion having a single period $\Lambda_0$ and chirp period portions having a chirped periodic structure; and a first wavelength of light emitted by the laser light source is converted to a second wavelength of light by the optical wavelength conversion device.

34. A coherent light generator according to claim 33, wherein the laser light source is a semiconductor laser having a wavelength tuning function.

35. A coherent light generator according to claim 34, wherein the semiconductor laser is subjected to radio frequency superimposition.

36. A coherent light generator according to claim 33, wherein a wavelength allowance bandwidth of the optical wavelength conversion device is wider than a longitudinal mode interval of the semiconductor laser.

37. A coherent light generator comprising:

an optical wavelength conversion device including;
  a non-linear optical crystal; and
  a periodic domain-inverted structure provided on the non-linear optical crystals; and a laser light source, wherein;
  periods of the domain-inverted structure are domain-inverted periods represented by;

$\Lambda_{-m}, \Lambda_{-(m-1)}, \ldots, \Lambda_{-2}, \Lambda_{-1}, \Lambda_0, \Lambda_1, \ldots, \Lambda_{m-1}, \Lambda_m$, the domain-inverted periods have a distribution f(z) of phase mismatch amount, the distribution f(z) satisfies;

$f(i \star \Lambda_0) = (\Lambda_1 + \Lambda_2 + \ldots + \Lambda_i) - i \star \Lambda_0$;
$f(-i \star \Lambda_0) = (\Lambda_{-1} + \Lambda_{-2} + \ldots + \Lambda_{-i}) - i \star \Lambda_0$;
$f(i \star \Lambda_0) = -f(-i \star \Lambda_0)$; and
$f(z) = 0$ for $z \approx 0$;

where $i = 1, 2, 3, \ldots$;

a quadratic differential c!efficient of the periods becomes larger at a position closer to ends of the non-linear optical crystal; and a first wavelength of light emitted by the laser light source is converted to a second wavelength of light by the optical wavelength conversion device.

38. A coherent light generator according to claim 37, wherein the laser light source is a semiconductor laser having a wavelength-tuning function.

39. A coherent light generator according to claim 38, wherein the semiconductor laser is subjected to radio frequency superimposition.

40. A coherent light generator according to claim 37, wherein a wavelength allowance bandwidth of the optical wavelength conversion device is wider than a longitudinal mode interval of the semiconductor laser.

41. A coherent light generator comprising:
an optical wavelength conversion device including;
   a plurality of non-linear optical crystals each non-linear optical crystal including a first domain-inverted structure having a first period; and
   a phase adjusting section to adjust a phase of a wave propagating in the plurality of non-linear optical crystals, the phase adjusting section disposed between two of the plurality of non-linear optical crystals; and
a laser light source, wherein;
   the phase adjusting section includes a second domain-inverted structure having a second period different from the first period of the first domain-inverted structure of the plurality of non-linear optical crystals; and
   a wavelength of light emitted by the laser light source is converted to a second wavelength of light by the optical wavelength conversion device.

42. A coherent light generator according to claim 41, wherein the laser light source is a semiconductor laser having a wavelength-tuning in a function.

43. A coherent light generator according to claim 42, wherein the semiconductor laser is subjected to radio frequency superimposition.

44. A coherent light generator according to claim 41, wherein a wavelength allowance bandwidth of the optical wavelength conversion device is wider than a longitudinal mode interval of the semiconductor laser.

45. An optical information processing apparatus comprising:
a coherent light generator including;
   an optical wavelength conversion device including;
      non-linear optical crystal; and
      a periodic domain-inverted structure formed on the non-linear optical crystal; and
   a laser light source;
   an optical detector; and
   a converging optical system, wherein;
      the domain-inverted structure includes a single period portion having a single period $\Lambda_0$ and chirp period portions having a chirped periodic structure;
      a first wavelength of light emitted by the laser light source is converted to a second wavelength of light by the optical wavelength conversion device; and
      coherent light emitted by the coherent light generator is converged by the converging optical system so as to be incident on an information reproduction medium, light reflected from the information reproduction medium being read as a signal by the optical detector, thereby processing the information from the information reproduction medium.

46. An optical information processing apparatus comprising:
a coherent light generator including;
   an optical wavelength conversion device including;
      a non-linear optical crystal; and
      a periodic domain-inverted structure provided on the non-linear optical crystal; and
   a laser light source;
   an optical detector; and
   a converging optical system; wherein;
      periods of the domain-inverted structure are domain-inverted periods represented by;
      $\Lambda_{-m}, \Lambda_{-(m-1)}, \ldots, \Lambda_{-2}, \Lambda_{-1}, \Lambda_0, \Lambda_1, \ldots \Lambda_{m-1}, \Lambda_m$,
      the domain-inverted periods have a distribution $f(z)$ of phase mismatch amount the distribution $f(z)$ satisfies;
      $f(i\bigstar\Lambda_0)=(\Lambda_1+\Lambda_2+\ldots+\Lambda_i)-i\bigstar\Lambda_0$;
      $f(-i\bigstar\Lambda_0)=(\Lambda_{-1}+\Lambda_{-2}+\ldots+\Lambda_{-i})-i\bigstar\Lambda_0$;
      $f(i\bigstar\Lambda_0)=-f(-i\bigstar\Lambda_0)$; and
      $f(z)=0$ for $z\approx 0$;
      where $i=1, 2, 3, \ldots$;
      a quadratic differential coefficient of the periods becomes larger at a position closer to ends of the non-linear optical crystal;
      a first wavelength of light emitted by the laser light source is converted to a second wavelength of light by the optical wavelength conversion device; and
      coherent light emitted by the coherent light generator is converged by the converging optical system so as to be incident on an information reproduction medium, light reflected from the information reproduction medium being read as a signal by the optical detector, thereby processing the information from the information reproduction medium.

47. An optical information processing apparatus comprising:
a coherent light generator including;
   an optical wavelength conversion device including;
      a plurality of non-linear optical crystals each non-linear optical crystal including a first domain-inverted structure having a first period; and
      a phase adjusting section to adjust a phase of a wave propagating in the plurality of non-linear optical crystals, the phase adjusting section disposed between two of the plurality of non-linear optical crystals; and
   a laser light source;
   an optical detector; and
   a converging optical system, wherein
      the phase adjusting section includes a second domain-inverted structure having a second period different from the first period of the first domain-inverted structure of the plurality of non-linear optical crystals;
      a first wavelength of light emitted by the laser light source is converted to a second wavelength of light by the optical wavelength conversion device; and
      coherent light emitted by the coherent light generator is converged by the converging optical system so as to be incident on an information reproduction medium, light reflected from the information reproduction medium being read as a signal by the optical detector, thereby processing the information from the information reproduction medium.

* * * * *

UNITED STATES PATENT AND TRADEMARK OFFICE
CERTIFICATE OF CORRECTION

PATENT NO. : 6,711,183 B1
APPLICATION NO. : 09/313391
DATED : March 23, 2004
INVENTOR(S) : Kiminori Mizuuchi et al.

It is certified that error appears in the above-identified patent and that said Letters Patent is hereby corrected as shown below:

Column 78

Line 11, "controling" should read -- controlling --.

Line 14, "harmonic," should read -- harmonic -- (no comma).

Line 23, "wave," should read -- wave -- (no comma).

Column 79

Line 53, between "harmonic wave" and "constant", insert -- at a --.

Column 80

Line 12, "$t(2m \pi + a) \pi/(\beta(2\omega) - 2\beta(\omega))$" should read -- $t = (2n + \alpha) \pi/(\beta(2\omega) - 2\beta(\omega))$" --.

Column 81

Line 28, " wave length" should read -- wavelength --.

Line 33, "output" should be deleted.

Column 83

Lines 7, 8 and 9, each "★" in the equations should read -- * --.
Line 28 (second line of formula), "<0;" should read -- >0; --.

Column 84

Lines 44, 45 and 46, each "★" in the equations should read -- * --.
Line 49, "clefficient" should read -- coefficient --.

UNITED STATES PATENT AND TRADEMARK OFFICE
CERTIFICATE OF CORRECTION

| | |
|---|---|
| PATENT NO. | : 6,711,183 B1 |
| APPLICATION NO. | : 09/313391 |
| DATED | : March 23, 2004 |
| INVENTOR(S) | : Kiminori Mizuuchi et al. |

It is certified that error appears in the above-identified patent and that said Letters Patent is hereby corrected as shown below:

<u>Column 85</u>

Line 17, between "a" and "wavelength" insert -- first --.

<u>Column 86</u>

Lines 10, 11 and 12, each "★" in the equations should read - * -.

Signed and Sealed this

Twenty-ninth Day of August, 2006

JON W. DUDAS
*Director of the United States Patent and Trademark Office*